(12) United States Patent
Yee et al.

(10) Patent No.: US 11,318,435 B2
(45) Date of Patent: May 3, 2022

(54) 3D PRINTING OF METAL CONTAINING STRUCTURES

(71) Applicant: California Institute of Technology, Pasadena, CA (US)

(72) Inventors: Daryl Wei Liang Yee, Pasadena, CA (US); Julia R. Greer, Pasadena, CA (US); Max L. Lifson, Pasadena, CA (US); Michael A. Citrin, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 16/577,253

(22) Filed: Sep. 20, 2019

(65) Prior Publication Data

US 2020/0156035 A1 May 21, 2020

Related U.S. Application Data

(60) Provisional application No. 62/734,884, filed on Sep. 21, 2018, provisional application No. 62/734,888, filed on Sep. 21, 2018.

(51) Int. Cl.
*B01J 13/00* (2006.01)
*H01M 4/48* (2010.01)
(Continued)

(52) U.S. Cl.
CPC ............ *B01J 13/0056* (2013.01); *B01J 6/001* (2013.01); *B01J 13/0069* (2013.01);
(Continued)

(58) Field of Classification Search
CPC ........ G03F 7/00; G03F 7/0037; G03F 7/0047; G03F 7/032; G03F 7/70375; G03F 7/027;
(Continued)

(56) References Cited

U.S. PATENT DOCUMENTS

| 4,668,595 A | 5/1987 | Yoshino et al. |
| 6,921,464 B2 | 7/2005 | Krasnov et al. |

(Continued)

OTHER PUBLICATIONS

Hashem "Synthesis and characterization of novel carboxymethylcellulose hydrogels and carboxymethylcellulolse-hydrogel-ZnO-nanocomposites." Carbohydrate Polymers 95 (2013) 421-427 (Year: 2013).*

(Continued)

*Primary Examiner* — Tri V Nguyen
(74) *Attorney, Agent, or Firm* — Leydig, Voit & Mayer, Ltd.

(57) ABSTRACT

In an aspect, a method for making a metal-containing material comprises steps of: forming a metal-containing hydrogel from an aqueous precursor mixture using a photopolymerization; wherein the aqueous precursor mixture comprises water, one or more aqueous photosensitive binders, and one or more aqueous metal salts; and thermally treating the metal-containing hydrogel to form the metal-containing material; wherein the metal-containing hydrogel is exposed to a thermal-treatment atmosphere during the step of thermally treating; wherein a composition of the metal-containing material is at least partially determined by a composition of the thermal-treatment atmosphere during the thermally treating step.

30 Claims, 72 Drawing Sheets
(60 of 72 Drawing Sheet(s) Filed in Color)

(51) Int. Cl.
G03F 7/004 (2006.01)
G03F 7/00 (2006.01)
G03F 7/032 (2006.01)
H01M 4/133 (2010.01)
B33Y 80/00 (2015.01)
B33Y 70/00 (2020.01)
H01M 4/02 (2006.01)
B01J 6/00 (2006.01)
C08G 65/00 (2006.01)
C08K 3/28 (2006.01)
G03F 7/20 (2006.01)
C08K 3/14 (2006.01)

(52) U.S. Cl.
CPC .............. C08G 65/002 (2013.01); C08K 3/28 (2013.01); G03F 7/0037 (2013.01); G03F 7/0047 (2013.01); G03F 7/032 (2013.01); G03F 7/70375 (2013.01); H01M 4/133 (2013.01); H01M 4/48 (2013.01); B33Y 70/00 (2014.12); B33Y 80/00 (2014.12); C08G 2210/00 (2013.01); C08K 3/14 (2013.01); H01M 2004/023 (2013.01)

(58) Field of Classification Search
CPC ....... G03F 7/031; B01J 13/0056; H01M 4/48; H01M 4/133
USPC .................. 252/500, 510, 511; 423/338, 420; 524/522, 916
See application file for complete search history.

(56) References Cited

U.S. PATENT DOCUMENTS

| | | | |
|---|---|---|---|
| 7,862,927 B2 | 1/2011 | Krasnov et al. | |
| 9,415,562 B1 | 8/2016 | Schaedler et al. | |
| 10,833,318 B2 | 11/2020 | Greer et al. | |
| 2017/0081489 A1 | 3/2017 | Rodrigues et al. | |
| 2018/0050487 A1 | 2/2018 | Hodgdon et al. | |
| 2018/0148379 A1 | 5/2018 | Schaedler et al. | |
| 2018/0196345 A1 | 7/2018 | Worsley et al. | |
| 2020/0009277 A1 | 1/2020 | Showalter et al. | |
| 2020/0023584 A1 | 1/2020 | Portela et al. | |

OTHER PUBLICATIONS

Abouimrane et al. (2009) "Sulfone-based electrolytes for high-voltage Li-ion batteries," Electrochem. Commun. 11(5): 1073-1076.
Ahmed (publicly available Jul. 2013) "Hydrogel: Preparation, characterization, and applications: A review", Journal of Advanced Research (2015) 6(2): 105-121.
Aitken et al. (2014) "Grain Boundary Sliding in Aluminum Nano-Bi-Crystals Deformed at Room Temperature," Small 10(1): 100-108.
Akimoto et al. (1998) "Synthesis and structure refinement of $LiCoO_2$ Single crystals," Journal of Solid State Chemistry 141(1): 298-302.
Albertus et al. (publicly available Dec. 2017) "Status and challenges in enabling the lithium metal electrode for high-energy and low-cost rechargeable batteries," Nat. Energy (Jan. 2018) 3(1): 16-21.
Amatucci et al. (1996) "$CoO_2$, the end member of the $Li_xCoO_2$ solid solution," J. Electrochem. Soc. 143(3): 1114-1123.
Arthur et al. (2011) "Three-dimensional electrodes and battery architectures," Mrs Bull. 36(7): 523-531.
Bates et al. (1993) "Fabrication and characterization of amorphous lithium electrolyte thin films and rechargeable thin-film batteries," J. Power Sources 43(1-3): 103-110.
Bates et al. (2000) "Thin-film lithium and lithium-ion batteries," Solid State Ion. 135(1-4): 33-45.
Bauer et al. (1998) "Slip casting of ceramic microcomponents," Microsystem technologies 4(3): 125-127.

Beg et al. (1976) "Temperature dependence of lattice dynamics of lithium 7," Phys. Rev. B 14(10): 4266-4273.
Bei et al. (2007) "Compressive strengths of molybdenum alloy micro-pillars prepared using a new technique," Scr. Mater. 57(5): 397-400.
Bei et al. (2008) "Effects of pre-strain on the compressive stress-strain response of Mo-alloy single-crystal micropillars," Acta Mater. 56(17): 4762-4770.
Berto et al. (2015) "Fatigue strength of severely notched specimens made of Ti—6Al—4V under multiaxial loading," Fatigue Fract. Engng. Mater. Struct. 38(5): 503-517.
Bertrand et al. (2007) "Ceramic components manufacturing by selective laser sintering," Applied Surface Science 254(4): 989-992.
Blomgren (publicly available Dec. 2016) "The development and future of lithium ion batteries," J. Electrochem. Soc. (2017) 164(1): A5019-A5025.
Bowen et al. (2014) "Piezoelectric and ferroelectric materials and structures for energy harvesting applications," Energy Environ. Sci. 7: 25-44.
Burek et al. (2009) "Fabrication and microstructure control of nanoscale mechanical testing specimens via electron beam lithography and electroplating," Nano Lett. 10(1): 69-76.
Burek et al. (2011) "Fabrication, microstructure, and mechanical properties of tin nanostructures," Mater. Sci. Eng. A 528(18): 5822-5832.
Burgess et al. (2013) "High spatial resolution energy dispersive X-ray spectrometry in the SEM and the detection of light elements including lithium," Microsc. Anal. 6: S8-S13.
Cai et al. (2004) "Mobility laws in dislocation dynamics simulations," Mater. Sci. Eng. A 387: 277-281.
Cano et al. (Apr. 2018) "Batteries and fuel cells foremerging electric vehicle markets," Nat. Energy 3(4): 279-289.
Cava (2000) "Oxide Superconductors," Journal of the American Ceramic Society 83(1): 5-28.
Chabi et al. (2014) "Ideal three-dimensional electrode structures for electrochemical energy storage," Adv. Mater. 26(15): 2440-2445.
Chamran et al. (2007) "Fabrication of high-aspect-ratio electrode arrays for three-dimensional microbatteries," J. Microelectromechanical Syst. 16(4): 844-852.
Chan et al. (2008) "High-performance lithium battery anodes using silicon nanowires," Nat. Nanotechnol. 3(1): 31-35.
Chartier et al. (2002) "Stereolithography of structural complex ceramic parts," Journal of materials science 37(15): 3141-3147.
Chen et al. (2015) "Ductility and work hardening in nano-sized metallic glasses," Appl. Phys. Lett. 106(6): 061903-1-061903-5.
Chen et al. (publicly available Nov. 2018) "3D printing of ceramics: A review," J. Eur. Ceram. Soc. (Apr. 2019) 39(4): 661-687.
Cheng et al. (publicly available Dec. 2016) "Intergranular Li metal propagation through polycrystalline $Li_{6.25}Al_{0.25}La_3Zr_2O_{12}$ ceramic electrolyte," Electrochimica Acta (Jan. 2017) 223: 85-91.
Cho et al. (2000) "Improvement of structural stability of $LiCoO_2$ cathode during electrochemical cycling by sol-gel coating of $SnO_2$," Electrochem. Solid-State Lett. 3(8): 362-365.
Cirigliano et al. (2014) "3D Architectured Anodes for Lithium-Ion Microbatteries with Large Areal Capacity," Energy Technol. 2(4): 362-369.
Citrin (Defended Sep. 19, 2019) "3D Architected Li-Ion Cathodes," Chapter 6 In; Nanomechanical Properties of Electrodeposited Li and Fabrication of 3D Architected Cathodes for Li-Based Batteries, Doctoral Thesis: 55-76.
Colombo et al. (2010) "Polymer-derived ceramics: 40 years of research and innovation in advanced ceramics," Journal of the American Ceramic Society 93(7): 1805-1837.
Cooperstein et al. (publicly available Oct. 2018) "Hybrid Materials for Functional 3D Printing," Adv. Mater. Interfaces (Nov. 2018) 5(22): 1800996, 15 pages.
Curry (Jul. 2017) "Lithium-ion battery costs and market," Bloom. New Energy Finance, vol. 5, 14 pages.
Deckers et al. (2014) "Additive manufacturing of ceramics: a review," Journal of Ceramic Science and Technology 5(4): 245-260.
Ding et al. (2013) "Dendrite-free lithium deposition via self-healing electrostatic shield mechanism," J. Am. Chem. Soc. 135(11): 4450-4456.

(56) References Cited

OTHER PUBLICATIONS

Dokko et al. (2007) "Sol-gel fabrication of lithium-ion microarray battery," Electrochem. Commun. 9(5): 857-862.
Dologlou (2010) "Self-diffusion in solid lithium," Glass Phys. Chem. 36(5): 570-574.
Doreau et al. (2000) "Stereolithography for manufacturing ceramic parts," Advanced Engineering Materials 2(8): 493-496.
Dubarry et al. (2011) "Identifying battery aging mechanisms in large format Li ion cells," J. Power Sources 196(7): 3420-3425.
Dudney (2005) "Solid-state thin-film rechargeable batteries," Mater. Sci. Eng. B 116(3): 245-249.
Eckel et al. (2016) "Additive manufacturing of polymer-derived ceramics," Science 351 (6268): 58-62.
Exner et al. (2008) "Laser micro sintering: A new method to generate metal and ceramic parts of high resolution with sub-micrometer powder," Virtual Phys. Prototyping 3(1): 3-11.
Fatemi et al. (2011) "Multiaxial fatigue: An overview and some approximation models for life estimation," Int. J. Fatigue 33(8): 948-958.
Ferrari et al. (2015) "Latest advances in the manufacturing of 3D rechargeable lithium microbatteries," J. Power Sources 286: 25-46.
Ferrese et al. (2014) "Mechanical deformation of a lithium-metal anode due to a very stiff separator," J. Electrochem. Soc. 161(9): A1350-A1359.
Flandrois et al. (1999) "Carbon materials for lithium-ion rechargeable batteries," Carbon 37(2): 165-180.
Foster et al. (Mar. 2017) "3D printed graphene based energy storage devices," Sci. Rep. 7:42233, 1-11.
Friedman et al. (2012) "Statistics of dislocation slip avalanches in nanosized single crystals show tuned critical behavior predicted by a simple mean field model," Phys. Rev. Lett. 109(9): 95507-1-095507-5.
Fu et al. (2016) "Graphene oxide-based electrode inks for 3D-printed lithium-ion batteries," Adv. Mater. 28(13): 2587-2594.
Gangulee (1972) "The structure of electroplated and vapor-deposited copper films," J. Appl. Phys. 43(3): 867-873.
Gmeiner et al. (2015) "Stereolithographic ceramic manufacturing of high strength bioactive glass," International Journal of Applied Ceramic Technology 12(1): 38-45.
Goodenough et al. (2013) "The Li-ion rechargeable battery: A perspective," J. Am. Chem. Soc. 135(4): 1167-1176.
Gowda et al. (2010) "Conformal coating of thin polymer electrolyte layer on nanostructured electrode materials for three-dimensional battery applications," Nano Lett. 11(1): 101-106.
Gowda et al. (2012) "3D nanoporous nanowire current collectors for thin film microbatteries," Nano Lett. 12(3): 1198-1202.
Greer et al. (2005) "Size dependence of mechanical properties of gold at the micron scale in the absence of strain gradients," Acta Mater. 53(6): 1821-1830.
Greer et al. (2006) "Nanoscale gold pillars strengthened through dislocation starvation," Phys. Rev. B 73(24): 245410-1-245410-6.
Greer et al. (2011) "Plasticity in small-sized metallic systems: Intrinsic versus extrinsic size effect," Prog. Mater. Sci. 56(6): 654-724.
Griffith et al. (1996) "Freeform fabrication of ceramics via stereolithography," Journal of the American Ceramic Society 79(10): 2601-2608.
Gu et al. (2012) "Size-dependent deformation of nanocrystalline Pt nanopillars," Nano Lett. 12(12): 6385-6392.
Hagedorn et al. (2010) "Net shaped high performance oxide ceramic parts by selective laser melting," Phys. Procedia 5(Part B): 587-594.
Hagedorn (publicly available Sep. 2016) "Laser additive manufacturing of ceramic components: Materials, processes, and mechanisms," in Laser Additive Manufacturing (2017), Elsevier: 163-180.
Hammad Fawey et al. (2016) "In situ TEM studies of micron-sized all-solid-state fluoride ion batteries: Preparation, prospects, and challenges," Microsc. Res. Tech. 79(7): 615-624.
Hamon et al. (2006) "Influence of sputtering conditions on ionic conductivity of LiPON thin films," Solid State Ion. 177(3-4): 257-261.

Han et al. (publicly available Jan. 2019) "High electronic conductivity as the origin of lithium dendrite formation within solid electrolytes," Nat. Energy (Mar. 2019) 4(3): 187-196.
Hansen (2004) "Hall-Petch relation and boundary strengthening," Scr. Mater. 51(8): 801-806.
Herbert et al. (2011) "Mechanical characterization of LiPON films using nanoindentation," Thin Solid Films 520(1): 413-418.
Herbert et al. (May 2018) "Nanoindentation of high-purity vapor deposited lithium films: The elastic modulus," J. Mater. Res. 33(10): 1335-1346.
Hinczewski et al. (1998) "Ceramic suspensions suitable for stereolithography," Journal of the European Ceramic Society 18(6): 583-590.
Hommel et al. (2001) "Deformation behavior of thin copper films on deformable substrates," Acta Mater. 49(19): 3935-3947.
Hosseini et al. (publicly available Aug. 2018) "On the theoretical modeling of fatigue crack growth," J. Mech. Phys. Solids (Dec. 2018) 121: 341-362.
Hu et al. (2016) "3D-printed cathodes of $LiMn_{1-x}Fe_xPO_4$ nanocrystals achieve both ultrahigh rate and high capacity for advanced lithium-ion battery," Adv. Energy Mater. 6(18): 1600856, 8 pages.
Hull et al. (1959) "The deformation of lithium, sodium and potassium at low temperatures: Tensile and resistivity experiments," Philos. Mag. 4(39): 303-315.
Hwang et al. (2012) "Particle size effect of Ni-rich cathode materials on lithium ion battery performance," Mater. Res. Bull. 47(1): 73-78.
Ishizaka et al. (1992) "Systematic change in surface structures on Si(111) clean surfaces with temperature," Philos. Mag. Lett. 65(2): 95-100.
Izumi et al. (2012) "Development of high capacity lithium-ion battery applying three-dimensionally patterned electrode," Electrochimica Acta 79: 218-222.
Jana et al. (publicly available Mar. 2018) "Polymer-derived SiCN cellular structures from replica of 3D printed lattices," Journal of the American Ceramic Society (Jul. 2018) 101(7): 2732-2738.
Jennings et al. (2010) "Microstructure versus size: Mechanical properties of electroplated single crystalline Cu nanopillars," Phys. Rev. Lett. 104(13): 135503-1-135503-4.
Jennings et al. (2011) "Emergence of strain-rate sensitivity in Cu nanopillars: Transition from dislocation multiplication to dislocation nucleation," Acta Mater. 59(14): 5627-5637.
Jennings et al. (2012) "Higher compressive strengths and the Bauschinger effect in conformally passivated copper nanopillars," Acta Mater. 60(8): 3444-3455.
Ji et al. (2007) "Buckling characterization of vertical ZnO nanowires using nanoindentation," Appl. Phys. Lett. 90(3): 033109-1-033109-3.
Jo et al. (2009) "Effect of $LiCoO_2$ cathode nanoparticle size on high rate performance for Li-ion batteries," J. Electrochem. Soc. 156(6): A430-A434.
Johanns et al. (2012) "In-situ tensile testing of single-crystal molybdenum-alloy fibers with various dislocation densities in a scanning electron microscope," J. Mater. Res. 27(3): 508-520.
Johns et al. (2011) "Conformal electrodeposition of manganese dioxide onto reticulated vitreous carbon for 3D microbattery applications," J. Mater. Chem. 21(27): 10153-10159.
Kalyani et al. (2002) "A new solution combustion route to synthesize $LiCoO_2$ and $LiMnzO_2$," J. Power Sources 111 (2): 232-238.
Kiener et al. (2007) "FIB damage of Cu and possible consequences for miniaturized mechanical tests," Mater. Sci. Eng. A 459(1-2): 262-272.
Kim et al. (2010) "Tensile and compressive behavior of tungsten, molybdenum, tantalum and niobium at the nanoscale," Acta Mater. 58(7): 2355-2363.
Kozen et al. (2015) "Atomic layer deposition of the solid eledrolyte LiPON," Chem. Mater. 27(15): 5324-5331.
Krenn et al. (2001) "Ideal strengths of bcc metals," Mater. Sci. Eng. A 319: 111-114.
Kruth et al. (2007) "Consolidation phenomena in laser and powder-bed based layered manufacturing," CIRP annals 56(2): 730-759.
Kunz et al. (2011) "Size effeds in Al nanopillars: Single crystalline vs. bicrystalline," Acta Mater. 59(11): 4416-4424.

(56) References Cited

OTHER PUBLICATIONS

Lagadec et al. (publicly available Dec. 2018) "Characterization and performance evaluation of lithium-ion battery separators," Nat. Energy (Jan. 2019) 4: 16-25.

Lagadec et al. (Jun. 2018) "Designing polyolefin separators to minimize the impact of local compressive stresses on lithium ion battery performance," J. Electrochem. Soc. 165(9): A1829-A1836.

Lee et al. (2005) "Synthesis and rate performance of monolithic macroporous carbon electrodes for lithium-ion secondary batteries," Adv. Fund. Mater. 15(4): 547-556.

Lee et al. (2009) "Uniaxial compression of fcc Au nanopillars on an MgO substrate: The effects of prestraining and annealing," Acta Mater. 57(15): 4404-4415.

Lee et al. (2011) "Plastic deformation of indium nanostructures," Mater. Sci. Eng. A 528(19-20): 6112-6120.

Lee et al. (2014) "Unlocking the potential of cation-disordered oxides for rechargeable lithium batteries," Science 343(6170): 519-522.

LePage et al. (Jan. 2019) "Lithium Mechanics: Roles of Strain Rate and Temperature and Implications for Lithium Metal Batteries," J. Electrochem. Soc. 166(2): A89-A97.

Lewis et al. (publicly available Jan. 2019) "Interphase morphology between a solid-state electrolyte and lithium controls cell failure," ACS Energy Lett. (Feb. 2019) 4(2): 591-599.

Li et al. (2013) "Application of a nonflammable electrolyte containing Pp13TFSI ionic liquid for lithium-ion batteries using the high capacity cathode material Li[Li$_{0.2}$Mn$_{0.54}$Ni$_{0.13}$CO$_{0.13}$]O$_2$," RSC Adv. 3(33): 13907-13914.

Li et al. (2014) "A review of lithium deposition in lithium-ion and lithium metal secondary batteries," J. Power Sources 254:168-182.

Li et al. (publicly available Jan. 2017) "A hybrid three-dimensionally structured electrode for lithium-ion batteries via 3D printing," Mater. Des. (Apr. 2017) 119: 417-424.

Li et al. (Oct. 2017) "Atomic structure of sensitive battery materials and interfaces revealed by cryo-electron microscopy," Science 358(6362): 506-510.

Li et al. (2015) "Solid electrolyte: The key for high-voltage lithium batteries," Adv. Energy Mater. 5(4): 1401408, 6 pages.

Li et al. (publicly available Jul. 2018) "The fabrication of SiBCN ceramic components from preceramic polymers by digital light processing (DLP) 3D printing technology," Journal of the European Ceramic Society (Nov. 2018) 38(14): 4597-4603.

Lin et al. (Mar. 2017) "Reviving the lithium metal anode for high-energy batteries," Nat. Nanotechnol. 12(3): 194-206.

Liu et al. (2011) "Heterogeneous nanostructured electrode materials for electrochemical energy storage," Chem. Commun. 47(5): 1384-1404.

Liu et al. (2011) "Lithium fiber growth on the anode in a nanowire lithium ion battery during charging," Appl. Phys. Lett. 98(18): 183107-1-183107-3.

Liu et al. (2014) "An all-in-one nanopore battery array," Nat. Nanotechnol. 9(12): 1031-1039.

Liu et al. (1986) "The electron-energy-loss spectrum of lithium metal," Philos. Mag. B 53(6): L123-L128.

Lu et al. (2014) "Stable lithium electrodeposition in liquid and nanoporous solid electrolytes," Nat. Mater. 13(10): 961-969.

Lu et al. (publicly available Mar. 2018) "Wood-Inspired High-Performance Ultrathick Bulk Battery Electrodes," Adv. Mater. (May 2018) 30(20): 1706745, 9 pages.

Magagnosc et al. (2014) "Effect of ion irradiation on tensile ductility, strength and fictive temperature in metallic glass nanowires," Acta Mater. 74:165-182.

Manthiram et al. (Feb. 2017) "Lithium battery chemistries enabled by solid-state electrolytes," Nat. Rev. Mater. 2(4): 16103, pp. 1-16.

Masias et al. (publicly available Oct. 2018) "Elastic, plastic, and creep mechanical properties of lithium metal," J. Mater. Sci. (Feb. 2019) 54(3): 2585-2600.

McGrogan et al. (publicly available Jan. 2017) "Compliant Yet Brittle Mechanical Behavior of Li$_2$S—P$_2$S$_5$ Lithium-ion-Conducting Solid Electrolyte," Adv. Energy Mater. (Jun. 2017) 7(12): 1602011, 5 pages.

Mehdi et al. (2015) "Observation and quantification of nanoscale processes in lithium batteries by operando electrochemical (S)TEM," Nano Lett. 15(3): 2168-2173.

Min Han et al. (2013) "Critical-temperature/Peierls-stress dependent size effects in body centered cubic nanopillars," Appl. Phys. Lett. 102(4): 041910-1-041910-5.

Mitteramskogler et al. (2014) "Light curing strategies for lithography-based additive manufacturing of customized ceramics," Additive Manufacturing 1: 110-118.

Mizushima et al. (1980) "LiCoO$_2$ (0<x<-1): A new cathode material for batteries of high energy density," Mater. Res. Bull. 15(6): 783-789.

Monroe et al. (2005) "The impact of elastic deformation on deposition kinetics at lithium/polymer interfaces," J. Electrochem. Soc. 152(2): A396-A404.

Motoyama et al. (2015) "Modeling the nucleation and growth of Li at metal current collector/LiPON interfaces," J. Electrochem. Soc. 162(13): A7067-A7071.

Murdan (2005) "Organogels in drug delivery," Expert Opinion on Drug Delivery 2(3): 489-505.

Narayan et al. (publicly available Aug. 2018) "A large deformation elastic-viscoplastic model for lithium," Extreme Mech. Lett. (Oct. 2018) 24: 21-29.

Neudecker et al. (2000) "'Lithium-free' thin-film battery with in situ plated Li anode," J. Electrochem. Soc. 147(2): 517-523.

Ni et al. (Jul. 2019) "Yield precursor dislocation avalanches in small crystals: The irreversibility transition," Phys. Rev. Lett. 123(3): 035501-1-035501-5.

Nishizawa et al. (1997) "Template Synthesis of Polypyrrole-Coated Spinel LiMn$_2$O$_4$ Nanotubules and Their Properties as Cathode Active Materials for Lithium Batteries," J. Electrochem. Soc. 144(6): 1923-1927.

Nisula et al. (2015) "Atomic layer deposition of lithium phosphorus oxynitride," Chem. Mater. 27(20): 6987-6993.

Nitta et al. (2015) "Li-ion battery materials: Present and future," Mater. Today 18(5): 252-264.

Orsini et al. (1998) "In situ scanning electron microscopy (SEM) observation of interfaces within plastic lithium batteries," J. Power Sources 76(1): 19-29.

Oudenhoven et al. (2011) "All-solid-state lithiumion microbatteries: A review of various three-dimensional concepts," Adv. Energy Mater. 1(1): 10-33.

Pan et al. (2009) "Melt-mediated coalescence of solution-deposited ZnO nanoparticles by excimer laser annealing for thin-film transistor fabrication," Applied Physics A 94: 111-115.

Perre et al. (2010) "Electrodeposited Cu$_2$Sb as anode material for 3-dimensional Li-ion microbatteries," J. Mater. Res. 25(8): 1485-1491.

Pham et al. (2006) "Three-dimensional SiCN ceramic microstructures via nanostereolithography of inorganic polymer photoresists," Advanced Functional Materials 16(9): 1235-1241.

Pham et al. (2007) "Inorganic polymer photoresist for direct ceramic patterning by photolithography," Chemical Communications (39): 4021-4023.

Phani et al. (2011) "Scanning transmission electron microscope observations of defects in as-grown and pre-strained Mo alloy fibers," Acta Mater. 59(5): 2172-2179.

Pikul et al. (2013) "High-power lithium ion microbatteries from interdigitated three-dimensional bicontinuous nanoporous electrodes," Nat. Commun. 4: 1732, pp. 1-5.

Portela et al. (publicly available Jun. 2018) "Impact of node geometry on the effective stiffness of non-slender three-dimensional truss lattice architectures," Extreme Mech. Lett. (Jul. 2018) 22: 138-148.

Porz et al. (publicly available Jul. 2017) "Mechanism of lithium metal penetration through inorganic solid electrolytes," Adv. Energy Mater. (Oct. 2017) 7(20): 1701003, 12 pages.

(56) References Cited

OTHER PUBLICATIONS

Qian et al. (2001) "Methods to study the ionic conductivity of polymeric electrolytes using a.c. impedance spectroscopy," J. Solid State Electrochem. 6(1): 8-15.
Qian et al. (2015) "High rate and stable cycling of lithium metal anode," Nat. Commun. 6: 6362, pp. 1-9.
Reimers et al. (1992) "Electrochemical and in situ X-ray diffraction studies of lithium intercalation in $Li_xCoO_2$," J. Electrochem. Soc. 139(8): 2091-2097.
Ren et al. (2015) "Direct observation of lithium dendrites inside garnet-type lithium-ion solid electrolyte," Electrochem. Commun. 57: 27-30.
Reyes et al. (publicly available Sep. 2018) "Three-dimensional printing of a complete lithium ion battery with fused filament fabrication," ACS Appl. Energy Mater. (Oct. 2018) 1(10): 5268-5279.
Rhodes et al. (2004) "Nanoscale polymer electrolytes: Ultrathin electrodeposited poly (phenylene oxide) with solid-state ionic conductivity," J. Phys. Chem. B 108(35): 13079-13087.
Richter et al. (2009) "Ultrahigh strength single crystalline nanowhiskers grown by physical vapor deposition," Nano Lett. 9(8): 3048-3052.
Roberts et al. (2011) "3D lithium ion batteries—from fundamentals to fabrication," J. Mater. Chem. 21(27): 9876-9890.
Rodrigues et al. (2001) "Novel solution-combustion synthesis of $LiCoO_2$ and its characterization as cathode material for lithium-ion cells," J. Power Sources 102(1-2): 322-325.
Ruiz-Morales et al. (Mar. 2017) "Three dimensional printing of components and functional devices for energy and environmental applications," Energy Environ. Sci. 10: 846-859.
Saidi et al. (2003) "The mechanical behaviour of synthetic, poorly consolidated granular rock under uniaxial compression," Tectonophysics 370(1-4): 105-120.
Saint et al. (2005) "Exploring the Li—Ga room temperature phase diagram and the electrochemical performances of the $Li_xGa_y$ alloys vs. Li," Solid State Ion. 176(1-2): 189-197.
Salea et al. (Apr. 2017) "Metal oxide semiconductor 3D printing: preparation of copper(ii) oxide by fused deposition modelling for multi-functional semiconducting applications," J. Mater. Chem. C 5(19): 4614-4620.
Saleh et al. (publicly available Oct. 2016) "3D inkjet-printed UV-curable inks for multi-functional electromagnetic applications," Additive Manufacturing (Jan. 2017) 13: 143-148.
Saleh et al. (publicly available Jul. 2018) "3D printed hierarchically-porous microlattice electrode materials for exceptionally high specific capacity and areal capacity lithium ion batteries," Addit. Manuf. (Oct. 2018) 23: 70-78.
Schultz (2002) "Lithium: Measurement of Young's Modulus and Yield Strength," tech. rep., Fermi National Accelerator Lab., Batavia, IL (US), pp. 1-6.
Schwentenwein et al. (2015) "Additive manufacturing of dense alumina ceramics," International Journal of Applied Ceramic Technology 12(1): 1-7.
Schwenzel et al. (2003) "Investigation of thin film all solid-state lithium ion battery materials," Ionics 9(5-6): 348-356.
Scrosati (2011) "History of lithium batteries," J. Solid State Electrochem. 15(7-8): 1623-1630.
Shaijumon et al. (2010) "Nanoarchitectured 3D cathodes for Li-Ion microbatteries," Adv. Mater. 22(44): 4978-4981.
Shin et al. (2001) "Investigation of lithium transport through lithium cobalt dioxide thin film sputter-deposited by analysis of cyclic voltammogram," Electrochimica Acta 46(16): 2477-2485.
Sides et al. (2002) "Nanoscale materials for lithium-ion batteries," Mrs Bull. 27(8): 604 607.
Slotwinski et al. (1969) "Temperature dependence of the elastic constants of single crystal lithium," J. Phys. Chem. Solids 30(5): 1276-1278.
Sneddon (1965) "The relation between load and penetration in the axisymmetric Boussinesq problem for a punch of arbitrary profile," Int. J. Eng. Sci. 3(1): 47-57.

Song et al. (2015) "Ceramic fabrication using mask-image-projection-based stereolithography integrated with tape-casting," Journal of Manufacturing Processes 20: 456-464.
Speakman (2011) "Basics of X-ray powder diffraction," Massachusetts Institute of Technology, http://prism.mit.edu/xray, 107 pages.
Sun et al. (2013) "3D printing of interdigitated Li-Ion microbattery architectures," Adv. Mater. 25(33): 4539-4543.
Tariq et al. (2003) "Li material testing-fermilab antiproton source lithium collection lens," in Proceedings of the 2003 Particle Accelerator Conference, vol. 3, pp. 1452-1454, IEEE.
Thackeray et al. (2007) "$Li_2MnO_3$-stabilized $LiMO_2$ (M= Mn, Ni, Co) electrodes for lithium-ion batteries," J. Mater. Chem. 17(30): 3112-3125.
Tikekar et al. (2016) "Design principles for electrolytes and interfaces for stable lithium-metal batteries," Nat. Energy 1(9): 16114, pp. 1-7.
Tippens et al. (Jun. 2019) "Visualizing Chemomechanical Degradation of a Solid-State Battery Electrolyte," ACS Energy Lett. 4(6): 1475-1483.
Trease et al. (2016) "Identifying the Distribution of $Al^{3+}$ in $LiNi_{0.8}Co_{0.15}Al_{0.05}O_2$," Chem. Mater. 28(22): 8170-8180.
Uchic et al. (2004) "Sample dimensions influence strength and crystal plasticity," Science 305(5686): 986-989.
Varma et al. (2016) "Solution combustion synthesis of nanoscale materials," Chem. Rev. 116(23): 14493-14586.
Vitos et al. (1998) "The surface energy of metals," Surf. Sci. 411(1-2): 186-202.
Vyatskikh et al. (Feb. 2018) "Additive Manufacturing of 3D Nano-Architected Metals," Nature Comms 9: 593, pp. 1-8.
Vyatskikh et al. (publicly available Mar. 2018) "Additive manufacturing of polymer-derived titania for one-step solar water purification," Materials Today Communications (Jun. 2018) 15: 288-293.
Wadley et al. (2003) "Fabrication and structural performance of periodic cellular metal sandwich structures," Compos. Sci. Technol. 63(16): 2331-2343.
Wang et al. (2006) "Fabrication of Functionally Graded Materials Via Inkjet Color Printing," Journal of the American Ceramic Society 89(10): 3285-3289.
Wang et al. (2007) "Ionic/electronic conducting characteristics of $LiFePO_4$ cathode materials: The determining factors for high rate performance," Electrochem. Solid-State Lett. 10(3): A65-A69.
Wang et al. (2011) "Chemical distribution and bonding of lithium in intercalated graphite: Identification with optimized electron energy loss spectroscopy," ACS Nano 5(2): 1190-1197.
Wang et al. (2016) "In situ STEM-EELS observation of nanoscale interfacial phenomena in all-solid-state batteries," Nano Lett. 16(6): 3760-3767.
Wang et al. (publicly available Dec. 2016) "A nanoindentation study of the viscoplastic behavior of pure lithium," Scr. Mater. (Mar. 2017) 130: 191-195.
Wang et al. (publicly available Nov. 2017) "New insights on the structure of electrochemically deposited lithium metal and its solid electrolyte interphases via cryogenic TEM," Nano Lett. (Dec. 2017) 17(12): 7606-7612.
Wang et al. (publicly available Jul. 2019) "Characterizing the Li-Solid-Electrolyte Interface Dynamics as a Function of Stack Pressure and Current Density," Joule (Sep. 2019) 3(9): 2165-2178.
Wang et al. (publicly available Apr. 2019) "Electro-Chemo-Mechanical Issues at the Interfaces in Solid-State Lithium Metal Batteries," Adv. Funct. Mater. (Jul. 2019) 29(27): 1900950, 29 pages.
Wei et al. (publicly available Mar. 2018) "3D printing of customized Li-ion batteries with thick electrodes," Adv. Mater. (Apr. 2018) 30(16): 1703027, 7 pages.
Werner et al. (Mar. 2018) "Block copolymer derived 3-D interpenetrating multifunctional gyroidal nanohybrids for electrical energy storage," Energy Environ. Sci. 11(5): 1261-1270.
Whittingham (1978) "Chemistry of intercalation compounds: Metal guests in chalcogenide hosts," Prog. Solid State Chem. 12(1): 41-99.
Whittingham (2004) "Lithium batteries and cathode materials," Chem. Rev. 104(10): 4271-4302.

(56) References Cited

OTHER PUBLICATIONS

Wierzbicki et al. (2013) "Homogenized mechanical properties for the jellyroll of cylindrical Lithium-ion cells," J. Power Sources 241: 467-476.

Wilkes et al. (2013) "Additive manufacturing of $ZrO_2$—$Al_2O_3$: ceramic components by selective laser melting," Rapid Prototyping Journal 19(1): 51-57.

Wolfenstine et al. (2013) "A preliminary investigation of fracture toughness of $Li_7La_3Zr_2O_{12}$ and its comparison to other solid Li-ion conductors," Mater. Lett. 96: 117-120.

Wu et al. (2012) "Designing nanostructured Si anodes for high energy lithium ion batteries," Nano Today 7(5): 414-429.

Wu et al. (publicly available Oct. 2016) "Fabrication of dense zirconia-toughened alumina ceramics through a stereolithography-based additive manufacturing," Ceramics International (Jan. 2017) 43(1, Part B): 968-972.

Xiao et al. (2013) "Suppression of shear banding in amorphous ZrCuAl nanopillars by irradiation," J. Appl. Phys. 113(8): 083514-1-083514-7.

Xie et al. (2007) "Kinetics investigation of a preferential (104) plane oriented $LiCoO_2$ thin film prepared by RF magnetron sputtering," Solid State Ion. 178(19-20): 1218-1224.

Xu (2014) "Electrolytes and interphases in Li-ion batteries and beyond," Chem. Rev. 114(23): 11503-11618.

Xu et al. (2014) "Lithium metal anodes for rechargeable batteries," Energy Environ. Sci. 7(2): 513-537.

Xu et al. (2015) "Highly ordered three-dimensional Ni—$TiO_2$ nanoarrays as sodium ion battery anodes," Chem. Mater. 27(12): 4274-4280.

Xu et al. (publicly available Dec. 2016) "Enhanced strength and temperature dependence of mechanical properties of Li at small scales and its implications for Li metal anodes," Proc. Natl. Acad. Sci. (Jan. 2017) 114(1): 57-61.

Yang et al. (2012) "Yield stress influenced by the ratio of wire diameter to grain size—a competition between the effects of specimen microstructure and dimension in micro-sized polycrystalline copper wires," Philos. Mag. 92(25-27): 3243-3256.

Yang et al. (2013) "Metal foam as positive electrode current collector for $LiFePO_4$-based Li-ion battery," Jpn. J. Appl. Phys. 52(10S): 10MB13-1-10MB13-4.

Yang et al. (2014) "Effects of Pulse Plating on lithium electrodeposition, morphology and cycling efficiency," J. Power Sources (272): 900-908.

Yazami et al. (1983) "A reversible graphite-lithium negative electrode for electrochemical generators," J. Power Sources 9(3): 365-371.

Yee et al. (publicly available Jun. 2019) "Additive Manufacturing of 3D-Architected Multifunctional Metal Oxides," Adv. Mater. (Aug. 2019) 31(33): 1901345, 9 pages.

Yoshima et al. (2012) "Fabrication of micro lithium-ion battery with 3D anode and 3D cathode by using polymer wall," J. Power Sources 208: 404-408.

Zachman et al. (2016) "Site-specific preparation of intact solid-liquid interfaces by label-free in situ localization and cryo-focused ion beam lift-out," Microsc. Microanal. 22(6): 1338-1349.

Zanchetta et al. (2016) "Stereolithography of SiOC ceramic microcomponents," Advanced Materials 28(2): 370-376.

Zhamu et al. (2012) "Reviving rechargeable lithium metal batteries: Enabling next-generation high-energy and high-power cells," Energy Env. Sci 5(2): 5701-5707.

Zhang et al. (2011) "General relationship between strength and hardness," Mater. Sci. Eng. A 529: 62-73.

Zhang et al. (2014) "3D-printed magnetic $Fe_3O_4$/MBG/PCL composite scaffolds with multifunctionality of bone regeneration, local anticancer drug delivery and hyperthermia," J. Mater. Chem. B 2(43): 7583-7595.

Zhang et al. (May 2017) "Electroplating lithium transition metal oxides," Sci. Adv. 3(5): e1602427, pp. 1-8.

Zhou et al. (publicly available Jun. 2017) "Three-dimensional Printing for Catalytic Applications: Current Status and Perspectives," Adv. Fund. Mater. (Aug. 2017) 27(30): 1701134, 13 pages.

Zhu et al. (2008) "Temperature and strain-rate dependence of surface dislocation nucleation," Phys. Rev. Lett. 100(2): 025502-1-025502-4.

Zhu et al. (2013) "Three-Dimensional Ni/$SnO_x$/C Hybrid Nanostructured Arrays for Lithium-Ion Microbattery Anodes with Enhanced Areal Capacity," ACS Appl. Mater. Interfaces 5(7): 2634-2640.

Zocca et al. (2013) "SIOC ceramics with ordered porosity by 3D-printing of a preceramic polymer," J. Mater. Res. 28(17): 2243-2252.

Zocca et al. (2015) "Additive manufacturing of ceramics: issues, potentialities, and opportunities," Journal of the American Ceramic Society 98(7): 1983-2001.

\* cited by examiner

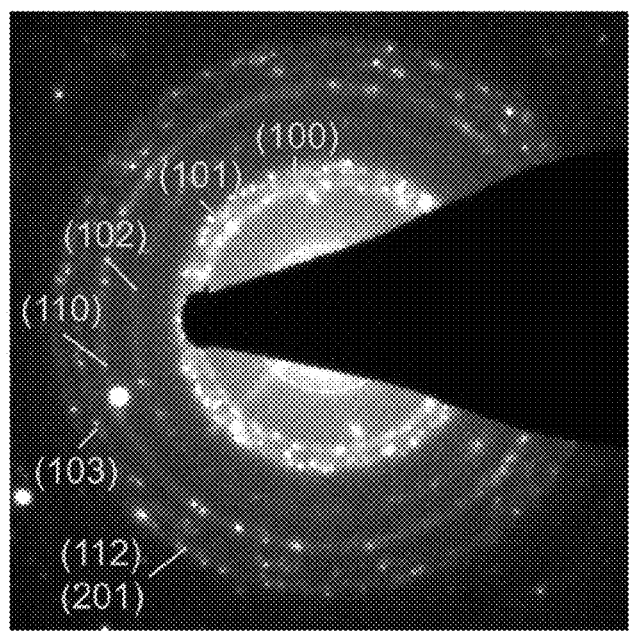
FIG. 6
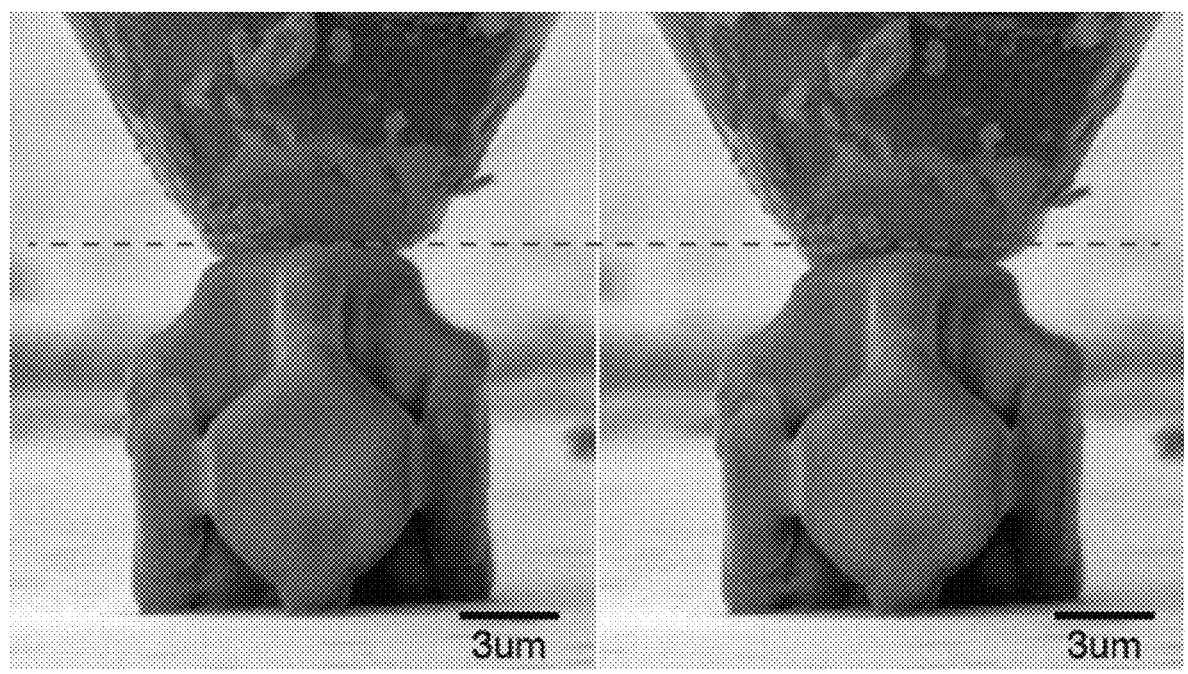
FIG. 7A  FIG. 7B

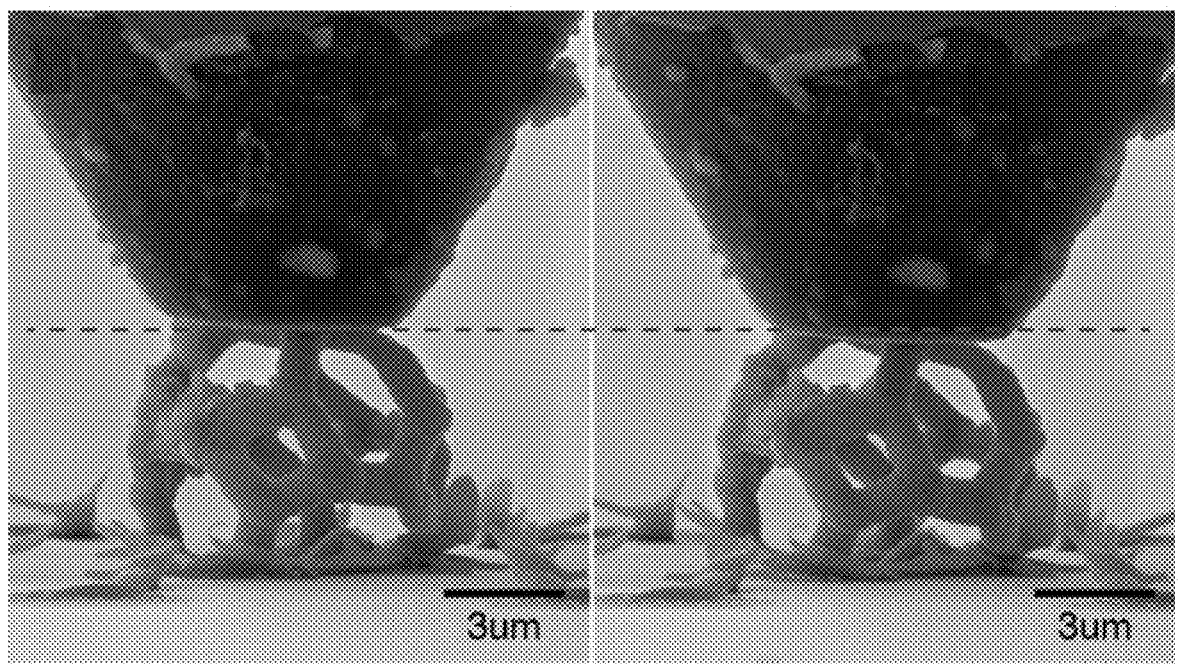
FIG. 7D  FIG. 7E

FIG. 15A  FIG. 15B  FIG. 15C
FIG. 15D
FIG. 15E
FIG. 15F
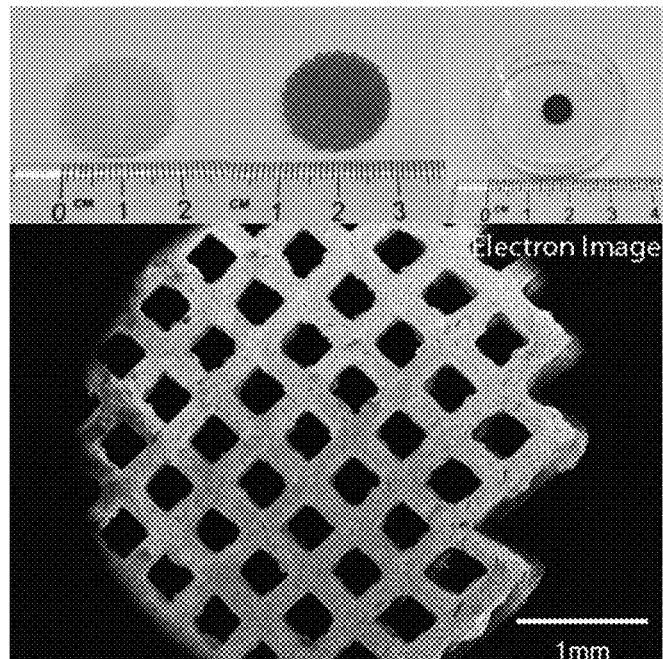
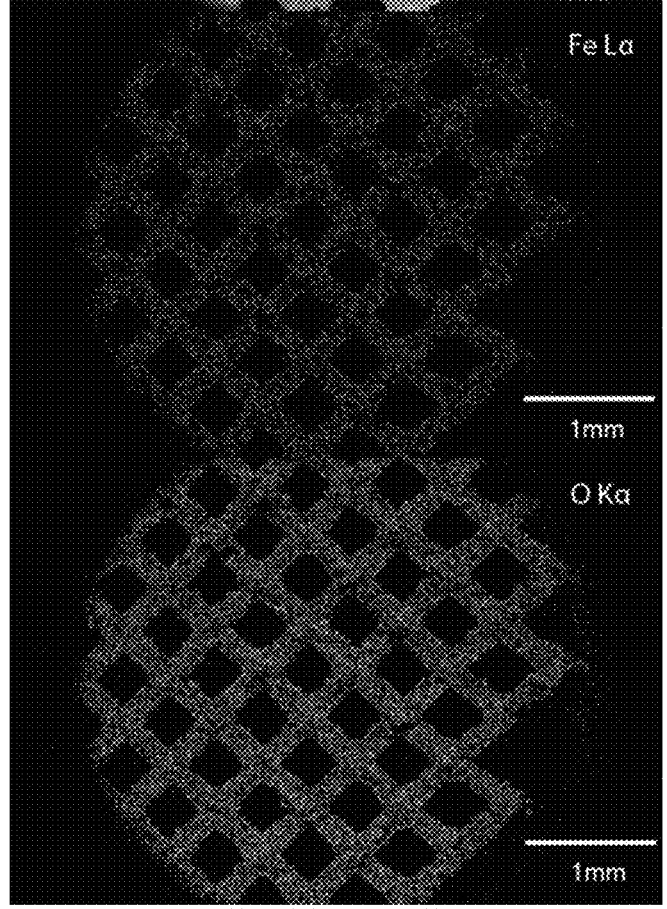

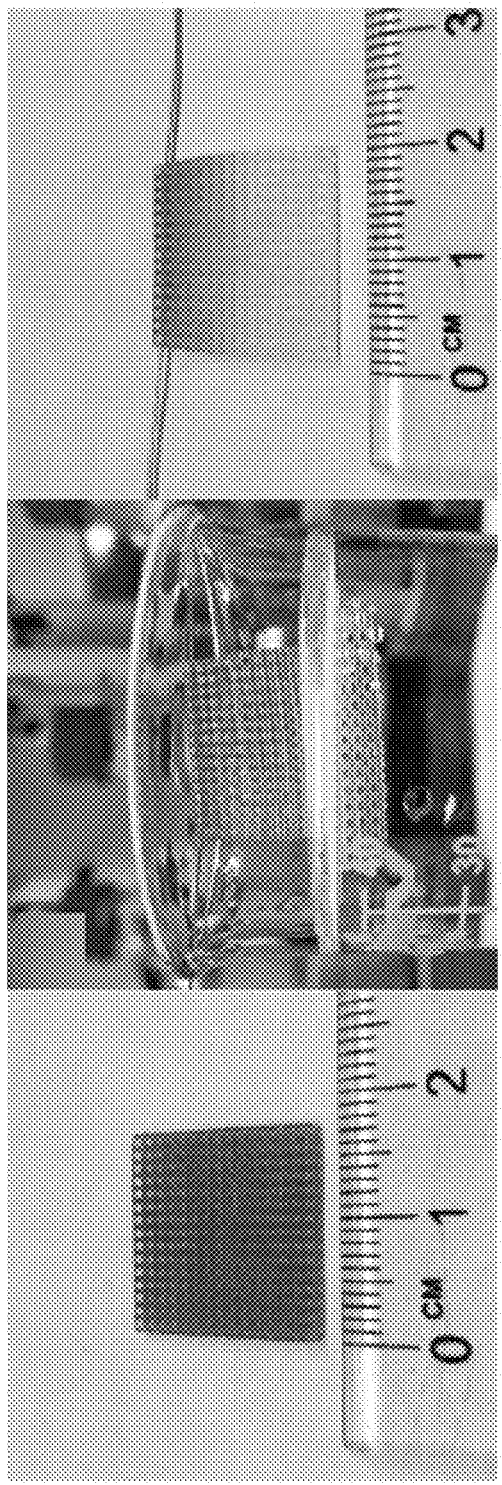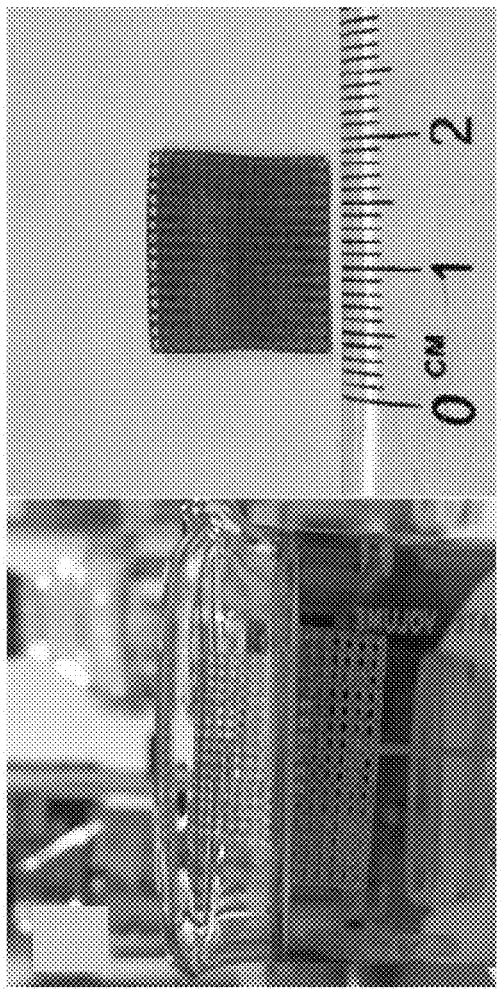

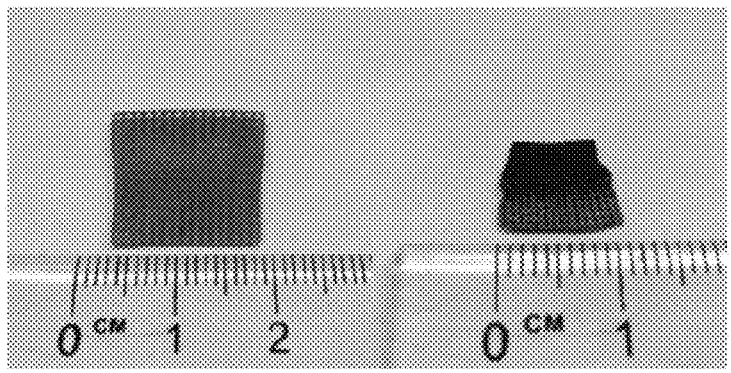
FIG. 18A   FIG. 18B
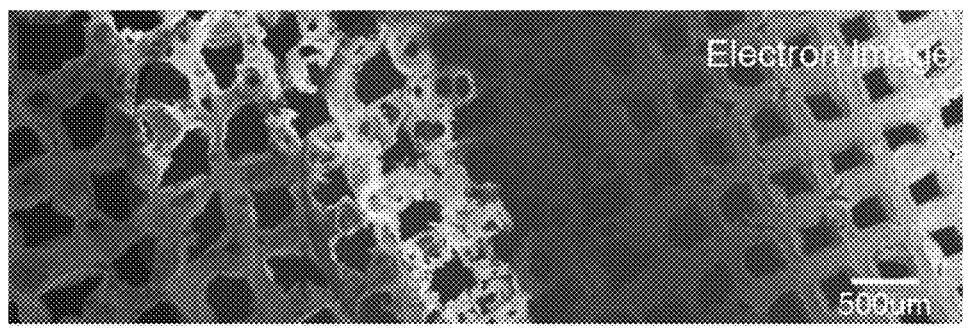
FIG. 19A
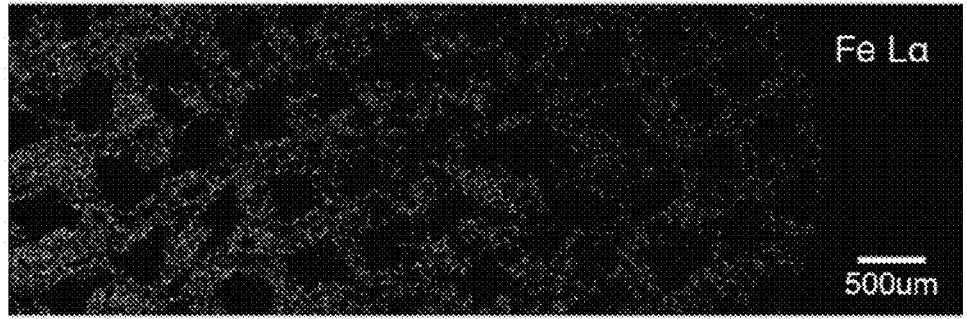
FIG. 19B
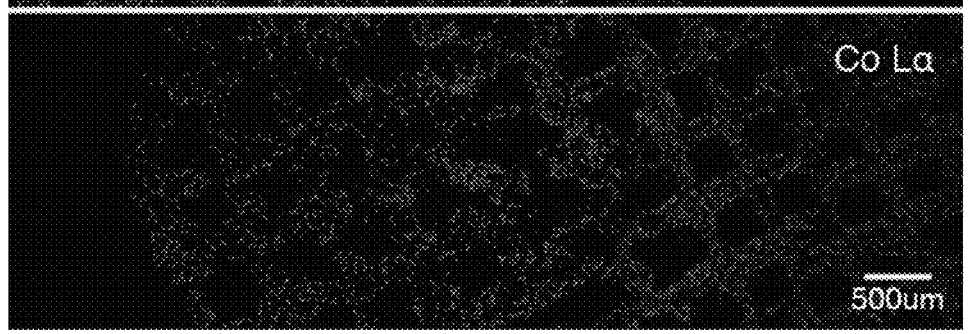
FIG. 19C

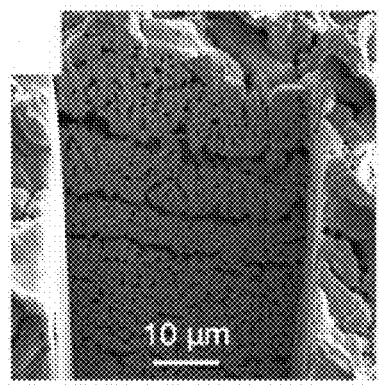
FIG. 23G
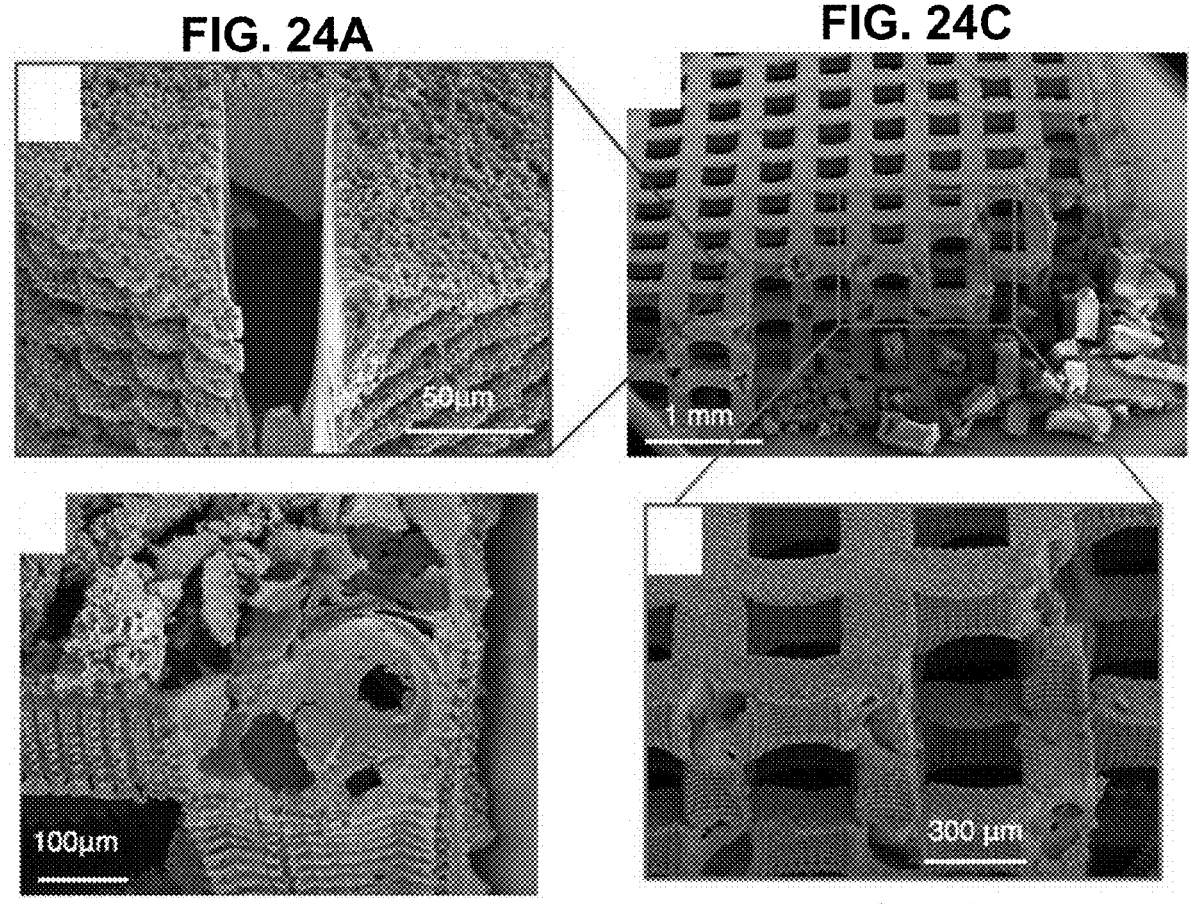
FIG. 24A
FIG. 24B
FIG. 24C
FIG. 24D

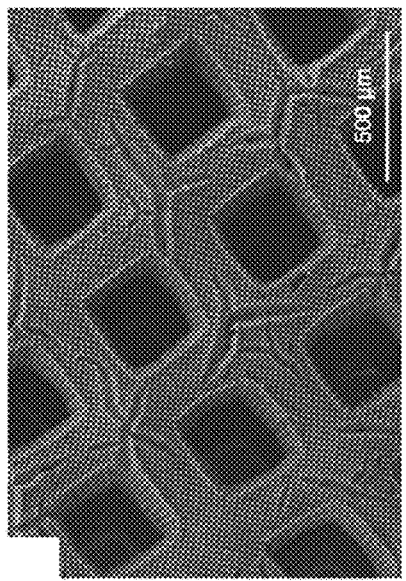
FIG. 25A
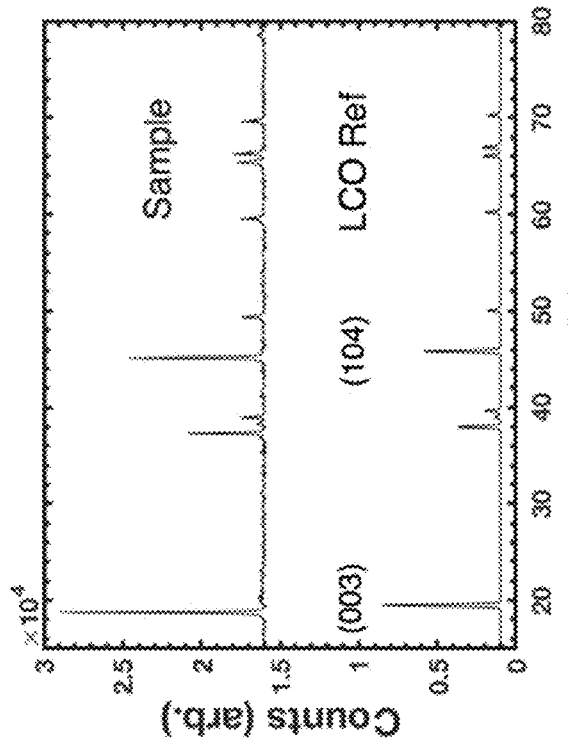
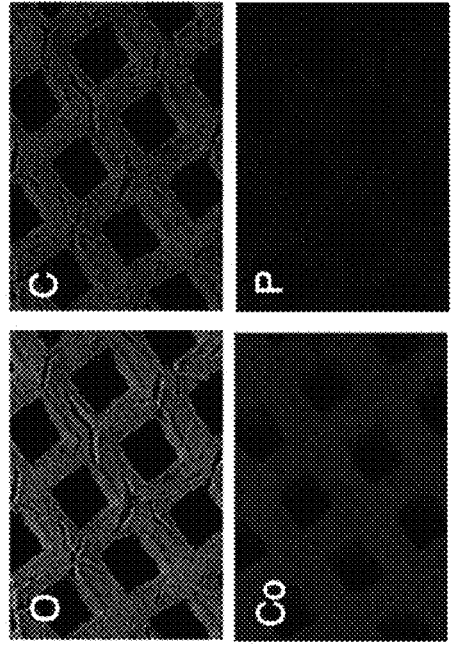
FIG. 25B
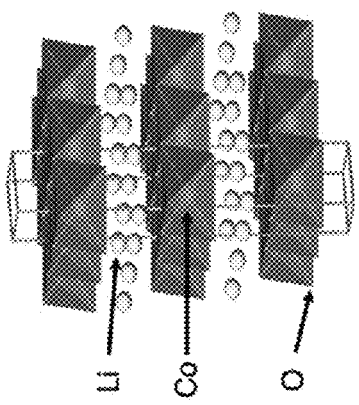
FIG. 25C

Case

Spring

Spacer

Lithium foil

Separator

PP washer

LCO lattice

Spacer w/ carbon adhesive

Case

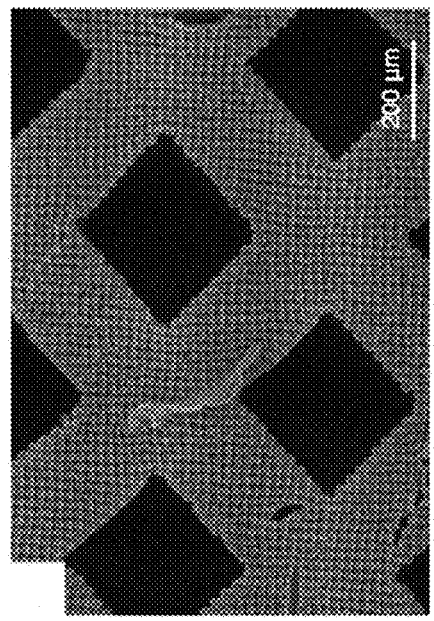
FIG. 31A
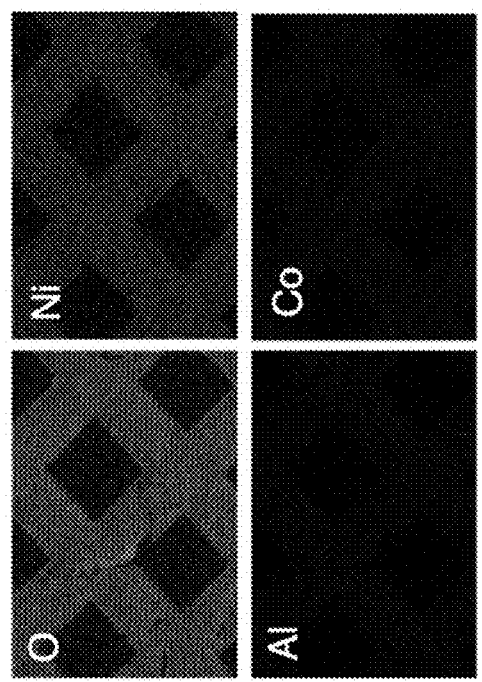
FIG. 31B
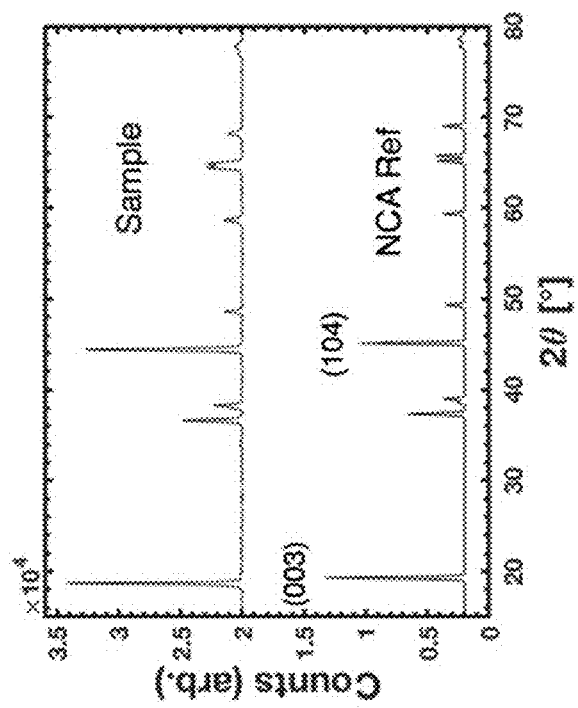
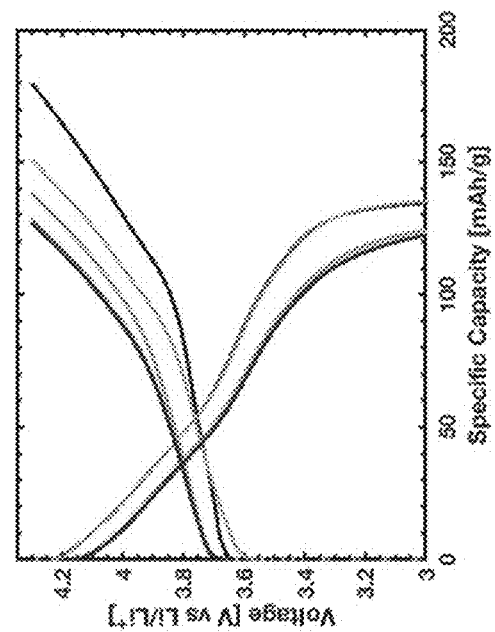
FIG. 31C

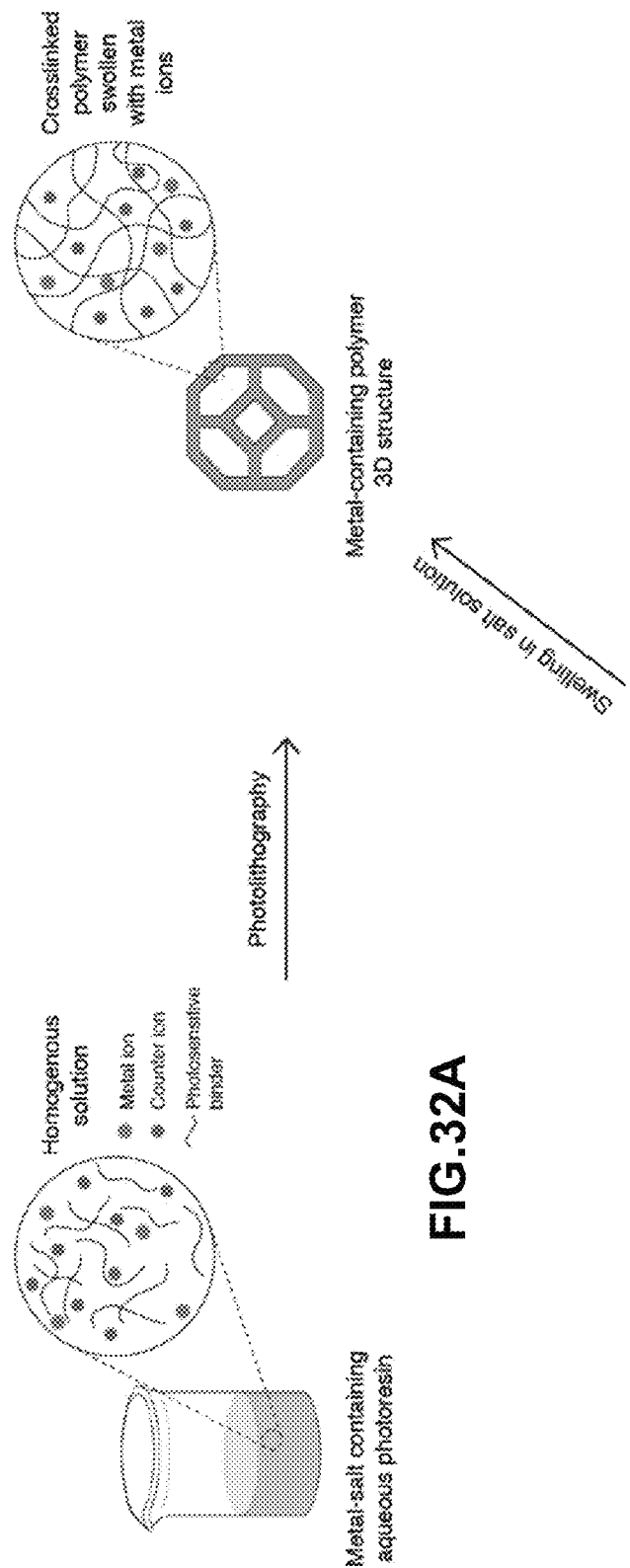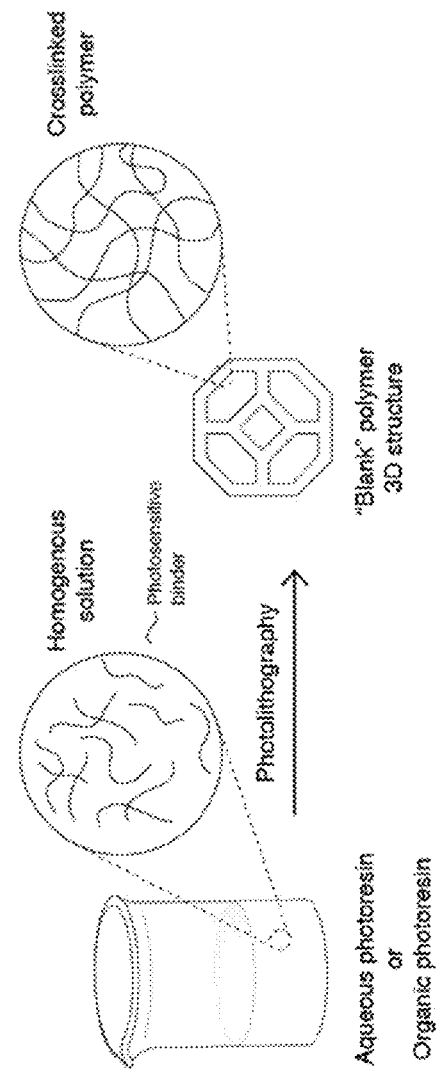
FIG.32A
FIG.32B

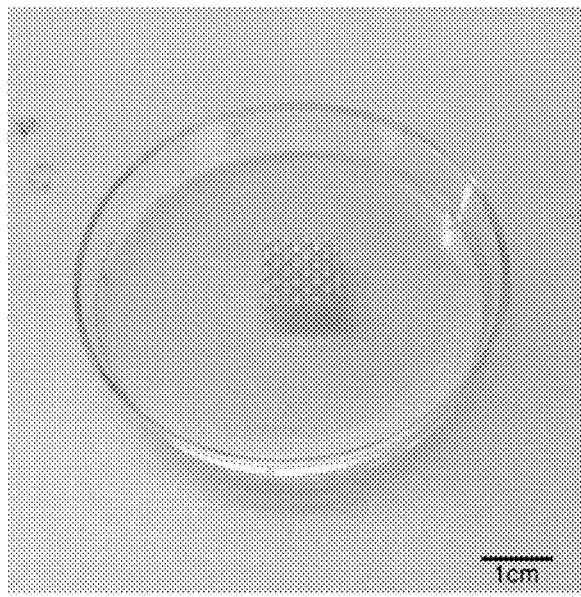
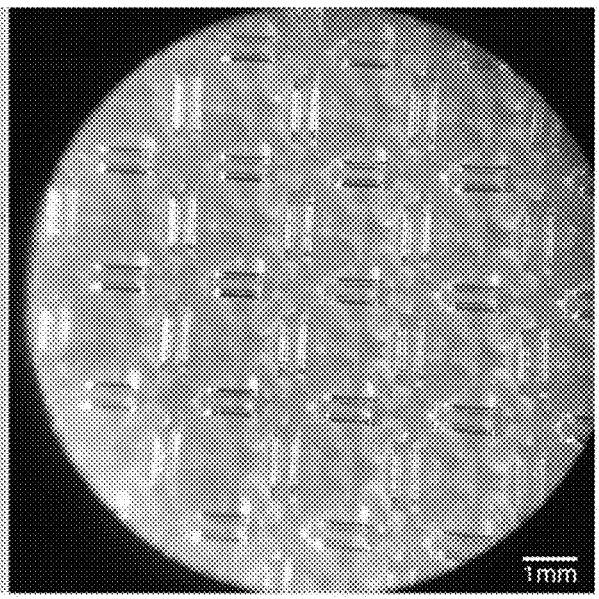
FIG. 34A    FIG. 34B
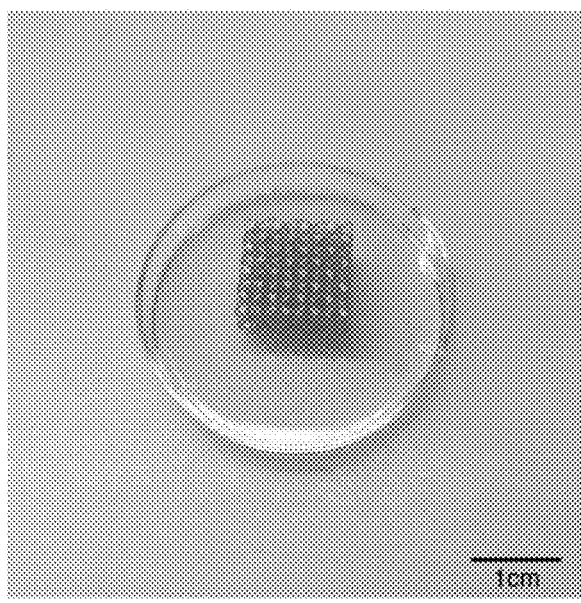
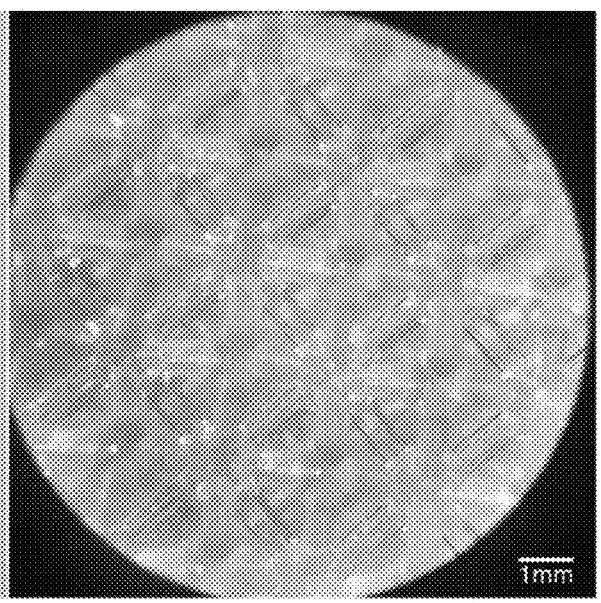
FIG. 35A    FIG. 35B

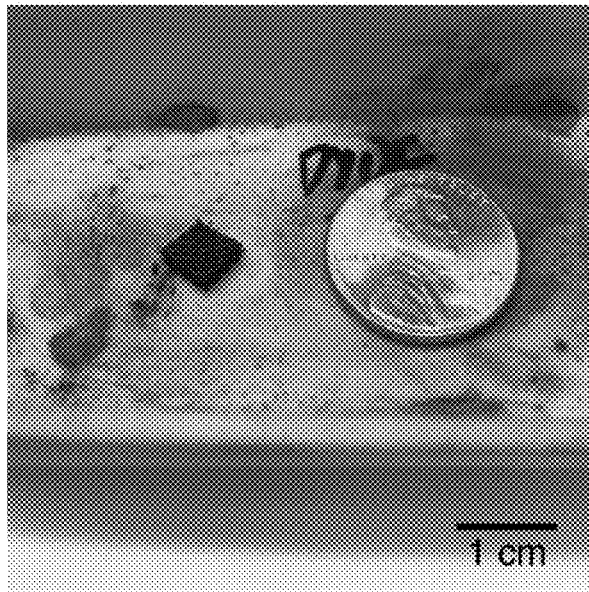 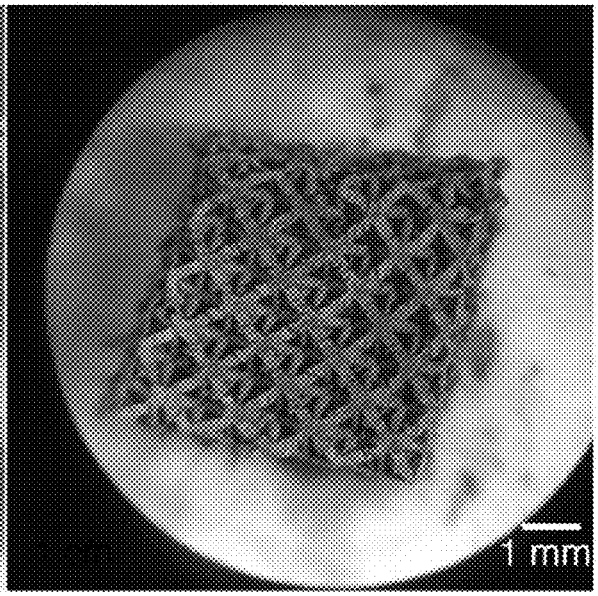
FIG. 36A          FIG. 36B
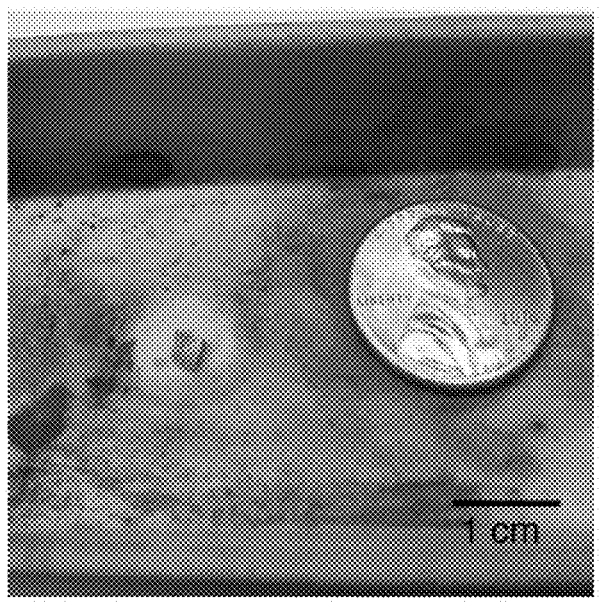 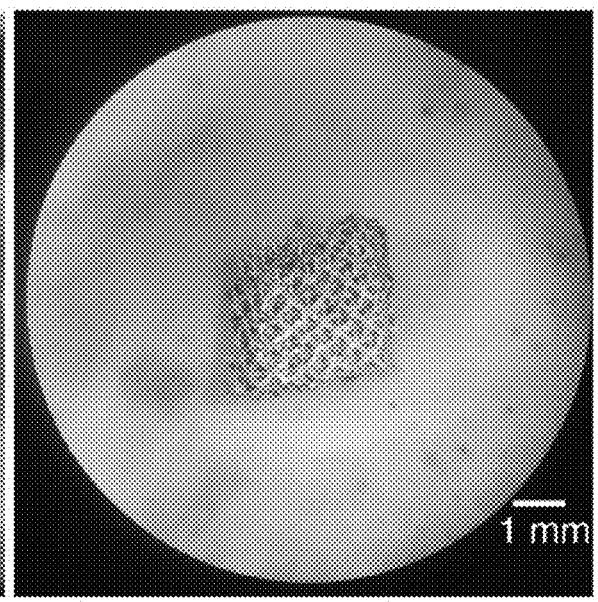
FIG. 37A          FIG. 37B

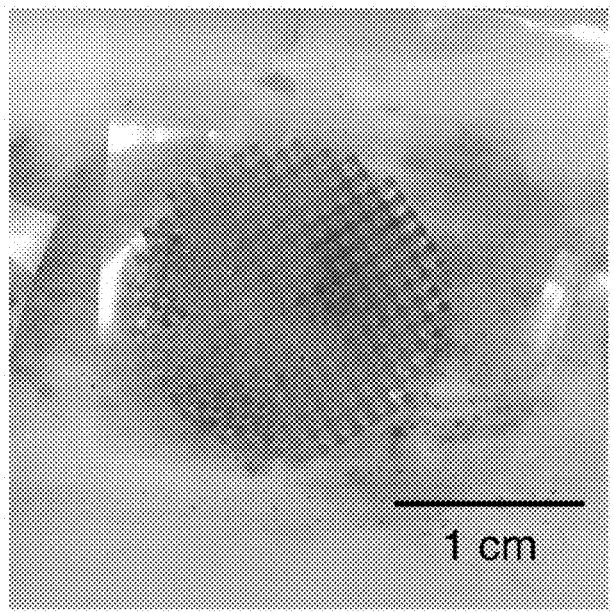
FIG. 38
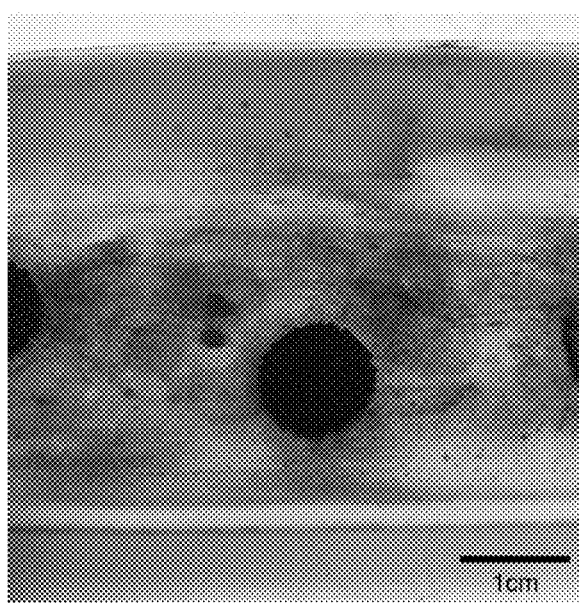 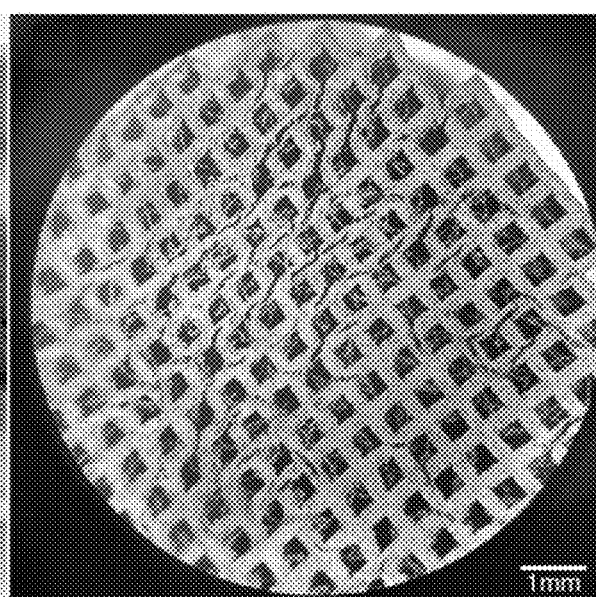
FIG. 39A          FIG. 39B

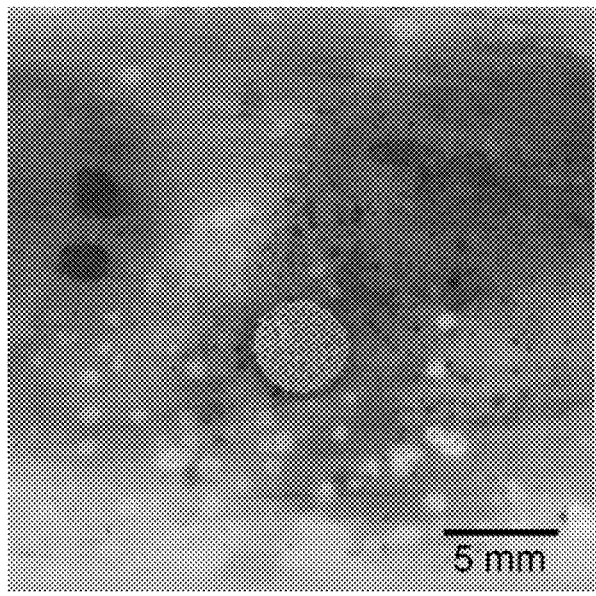 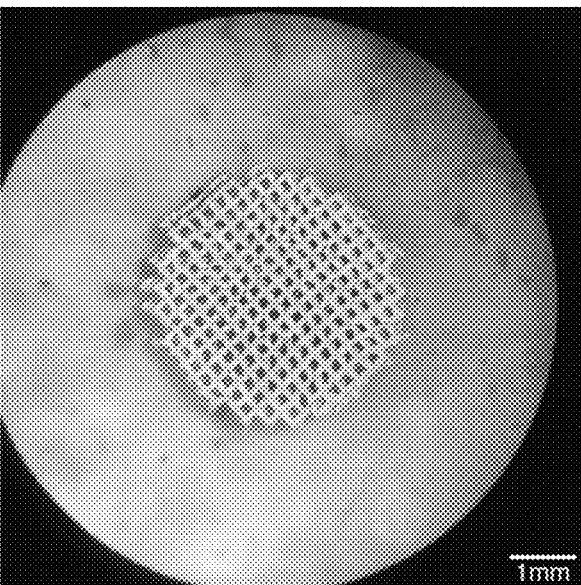
FIG. 40A  FIG. 40B
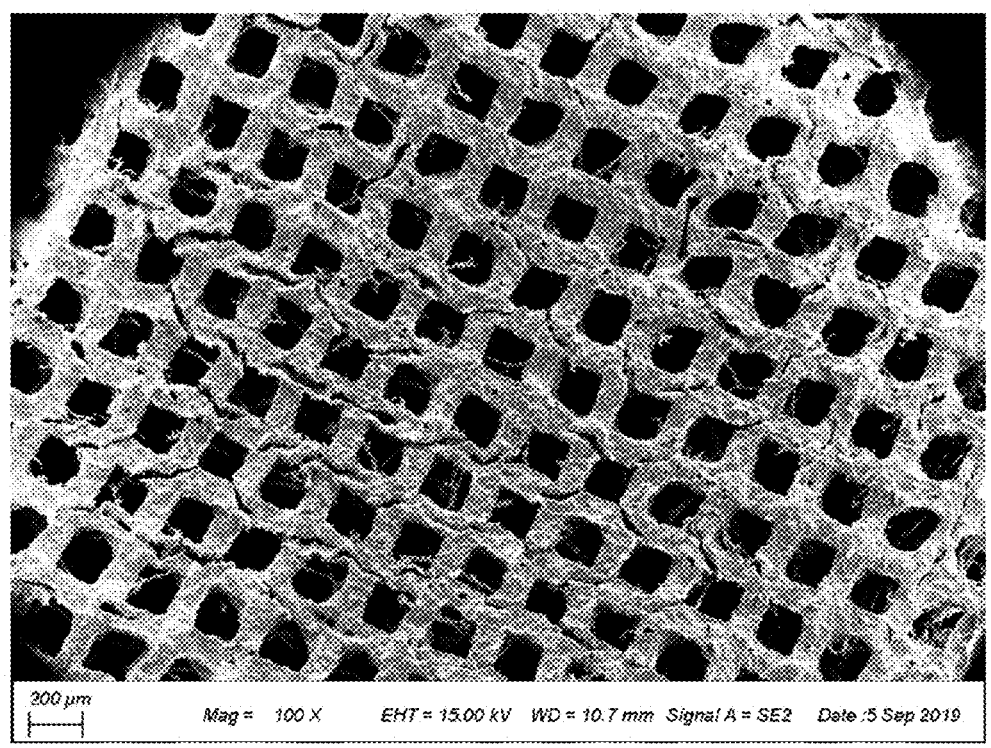
FIG. 41

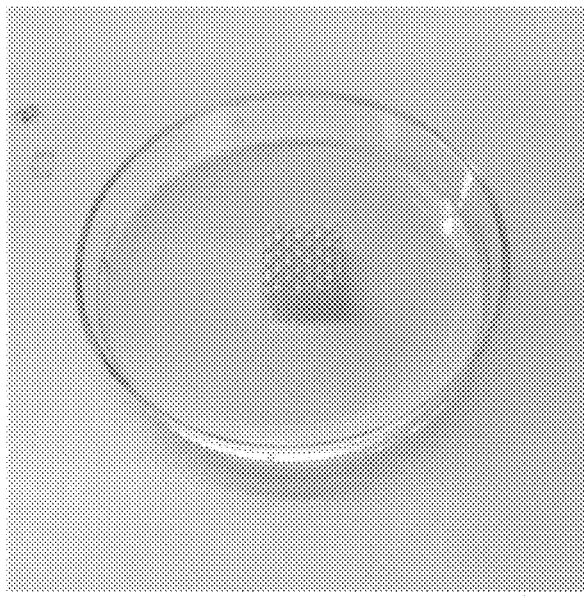 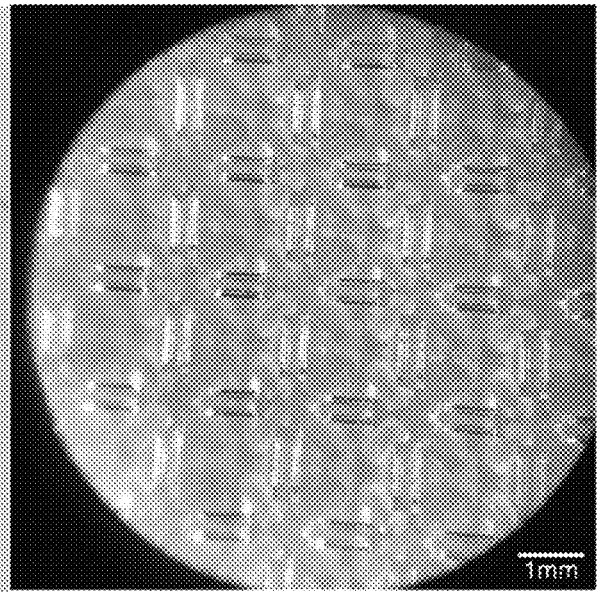
FIG. 47A          FIG. 47B
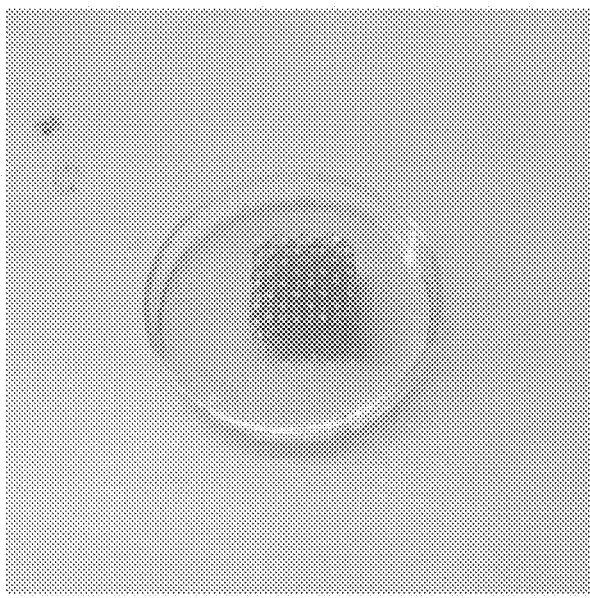 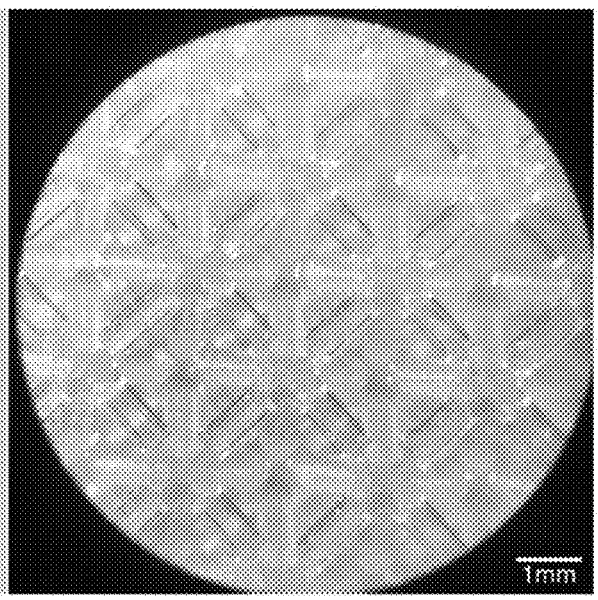
FIG. 48A          FIG. 48B

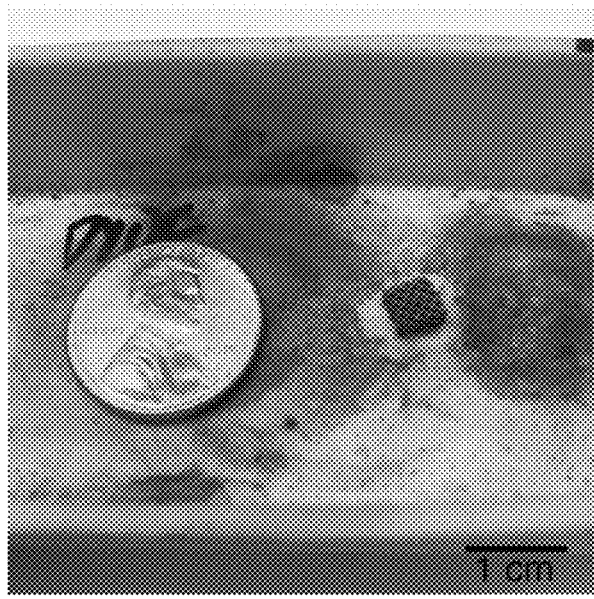 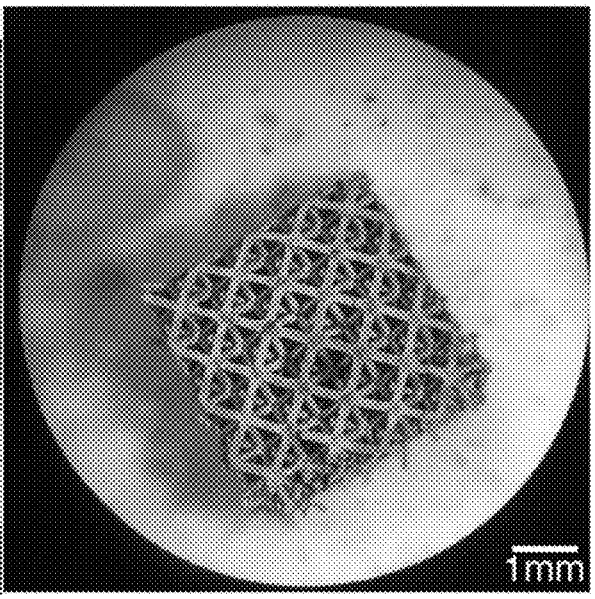
FIG. 49A  FIG. 49B
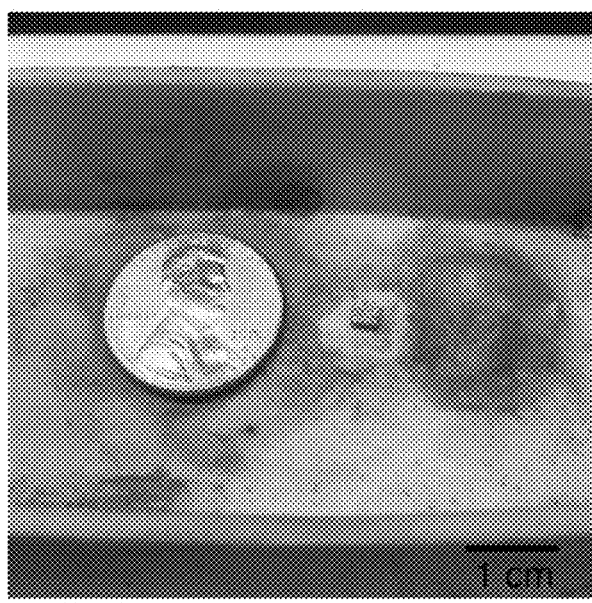 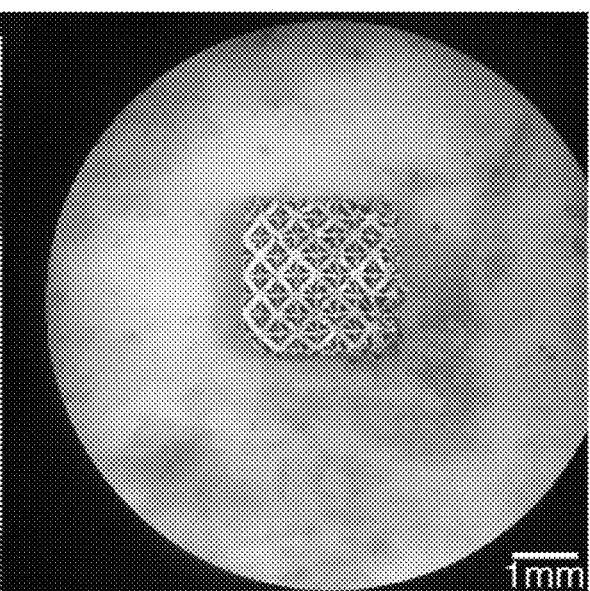
FIG. 50A  FIG. 50B

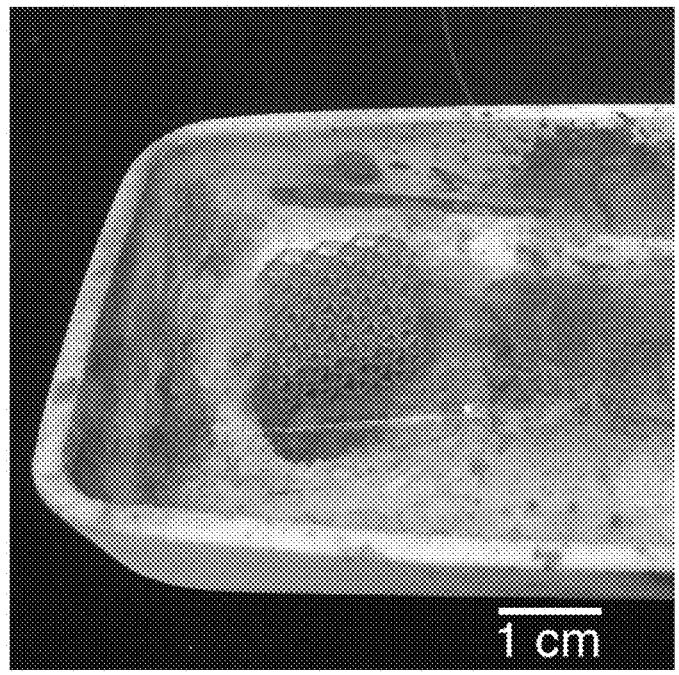
FIG. 56
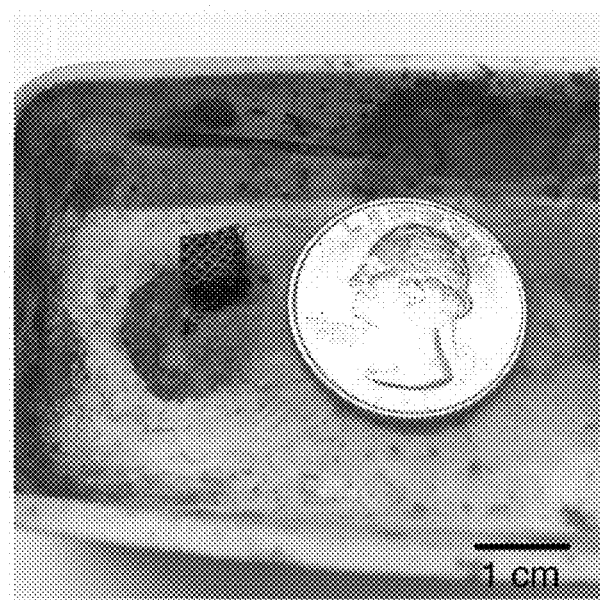 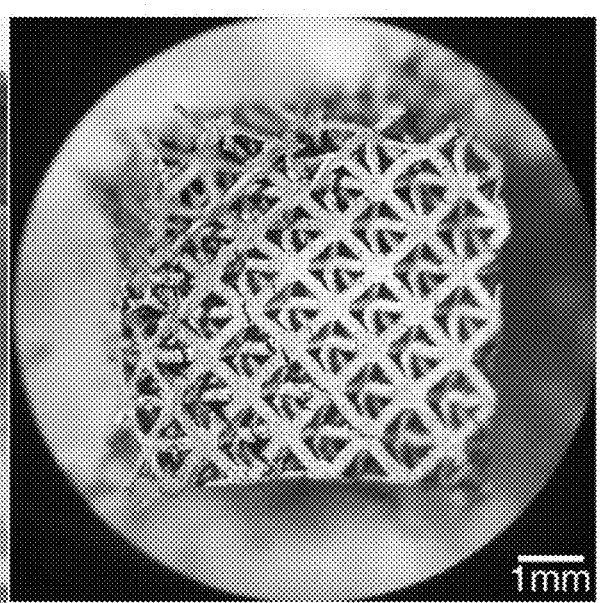
FIG. 57A  FIG. 57B

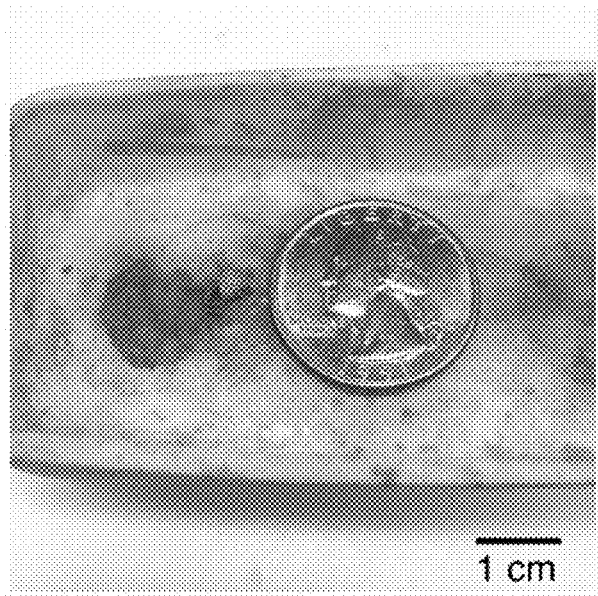 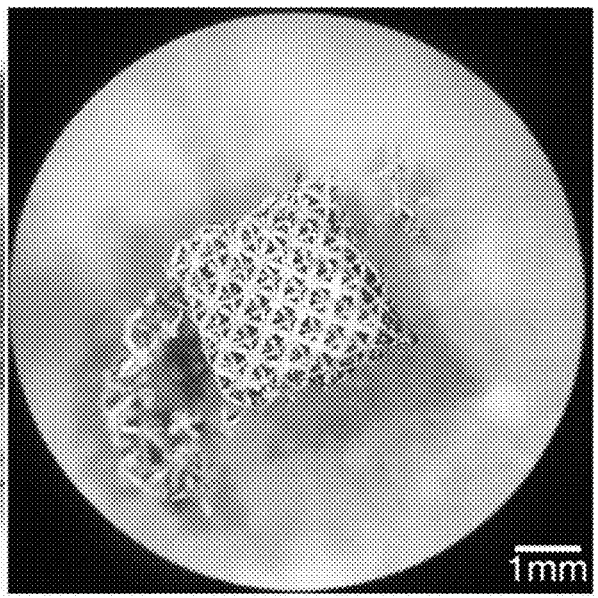
FIG. 58A  FIG. 58B
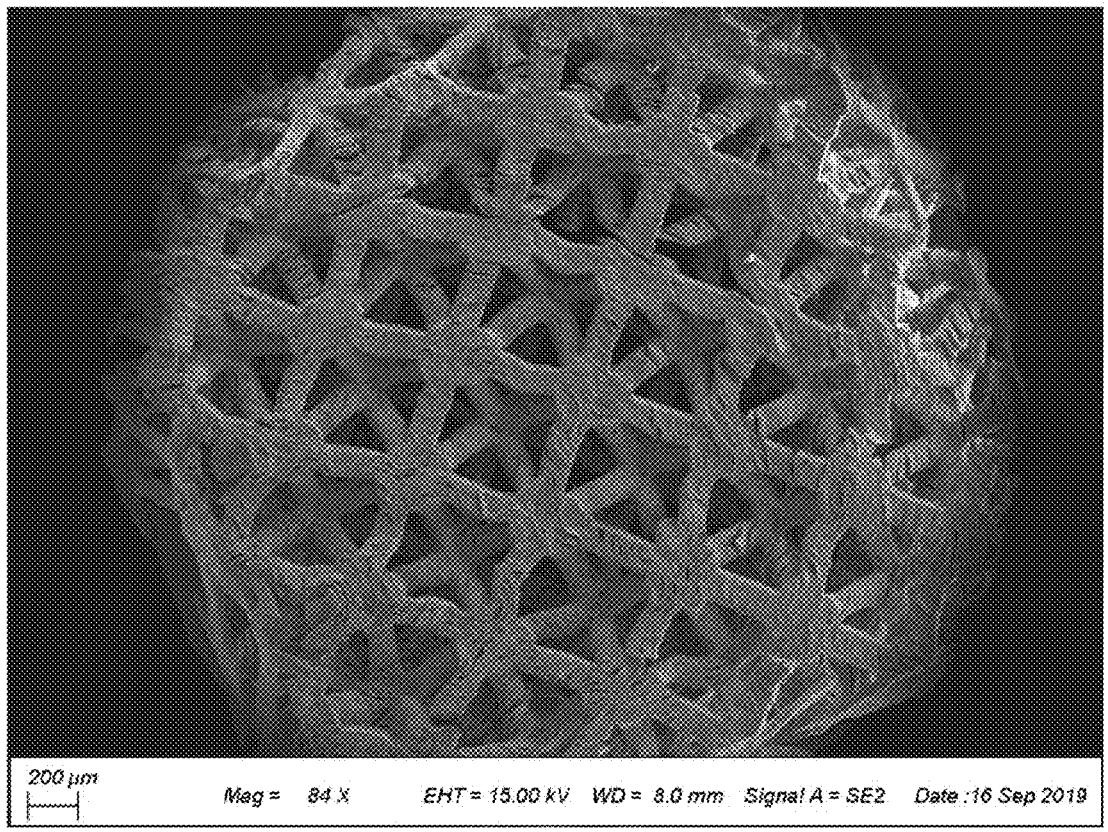
FIG. 59

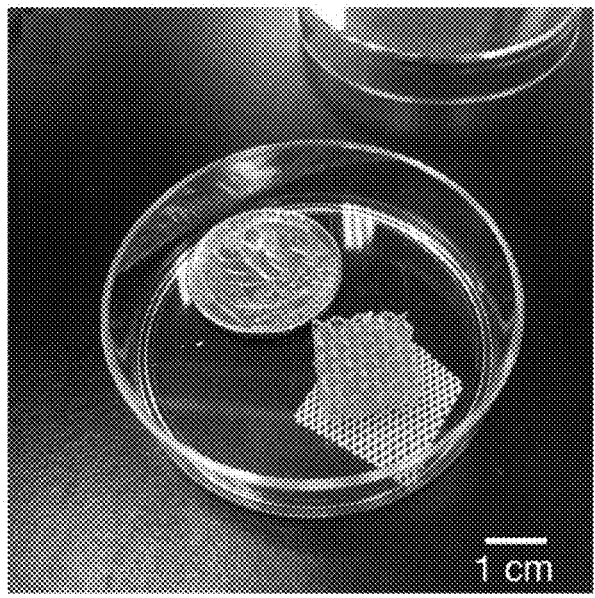
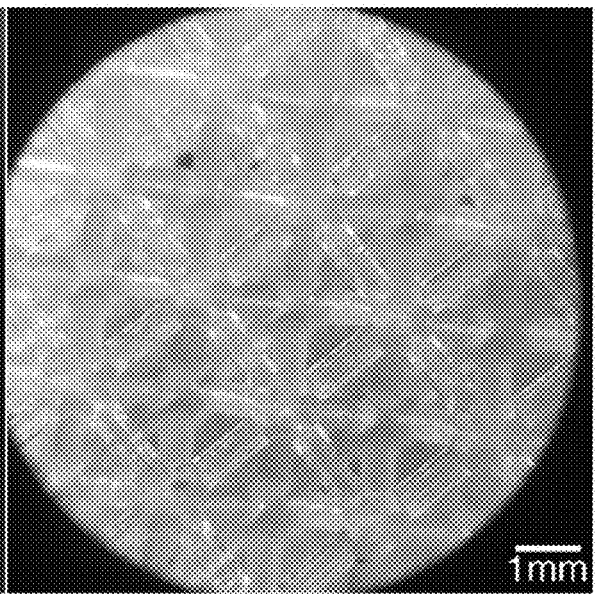
FIG. 72A  FIG. 72B
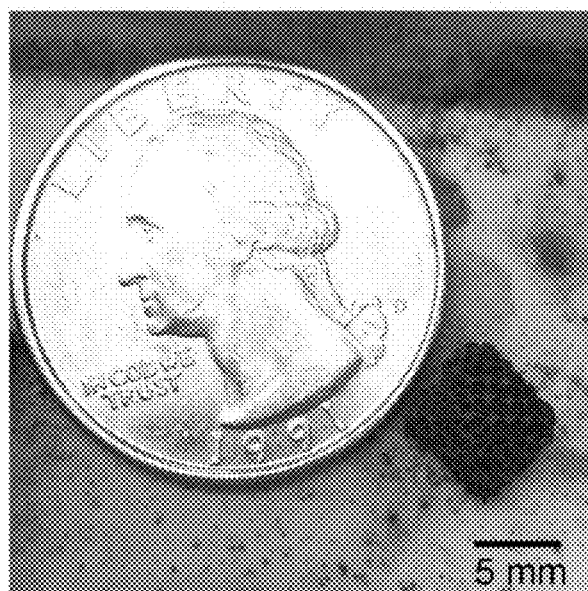
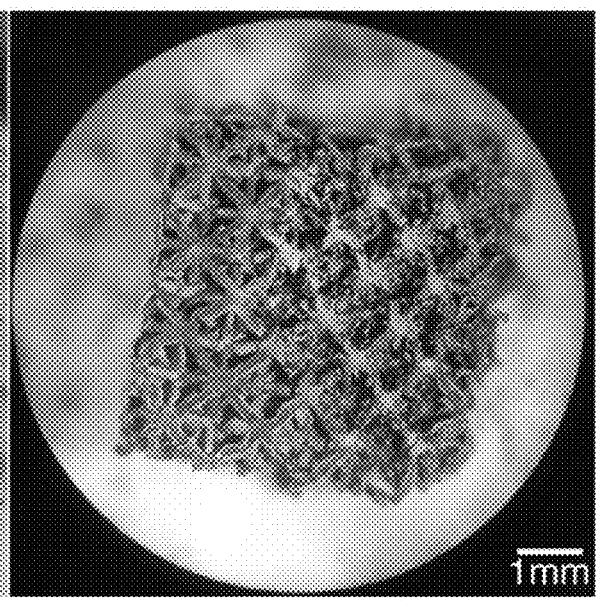
FIG. 73A  FIG. 73B

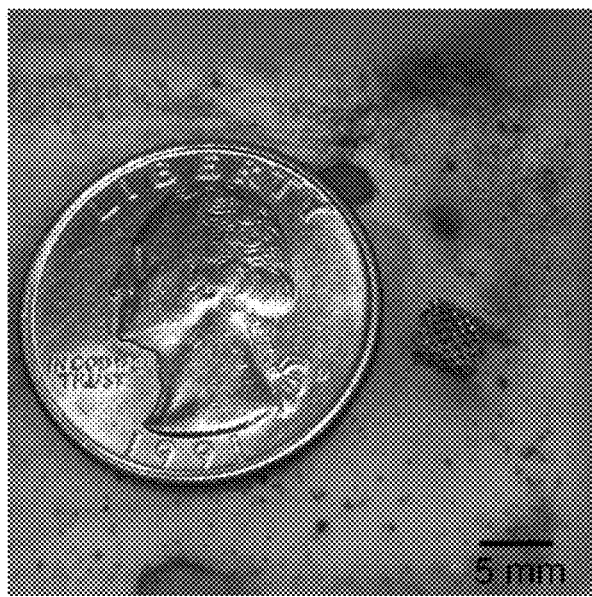 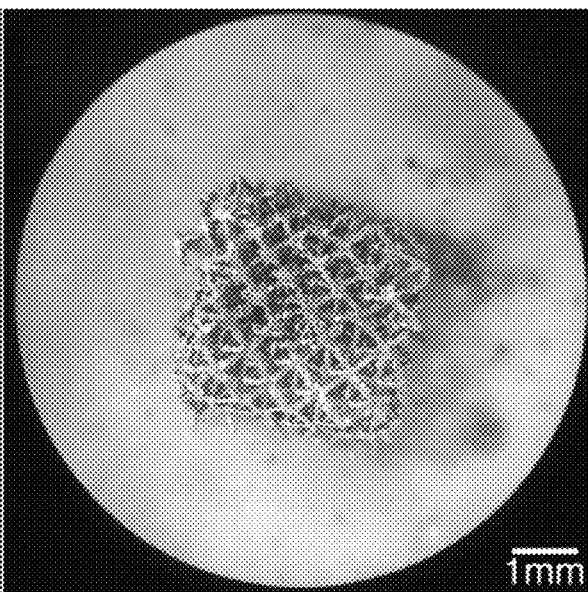
FIG. 74A  FIG. 74B
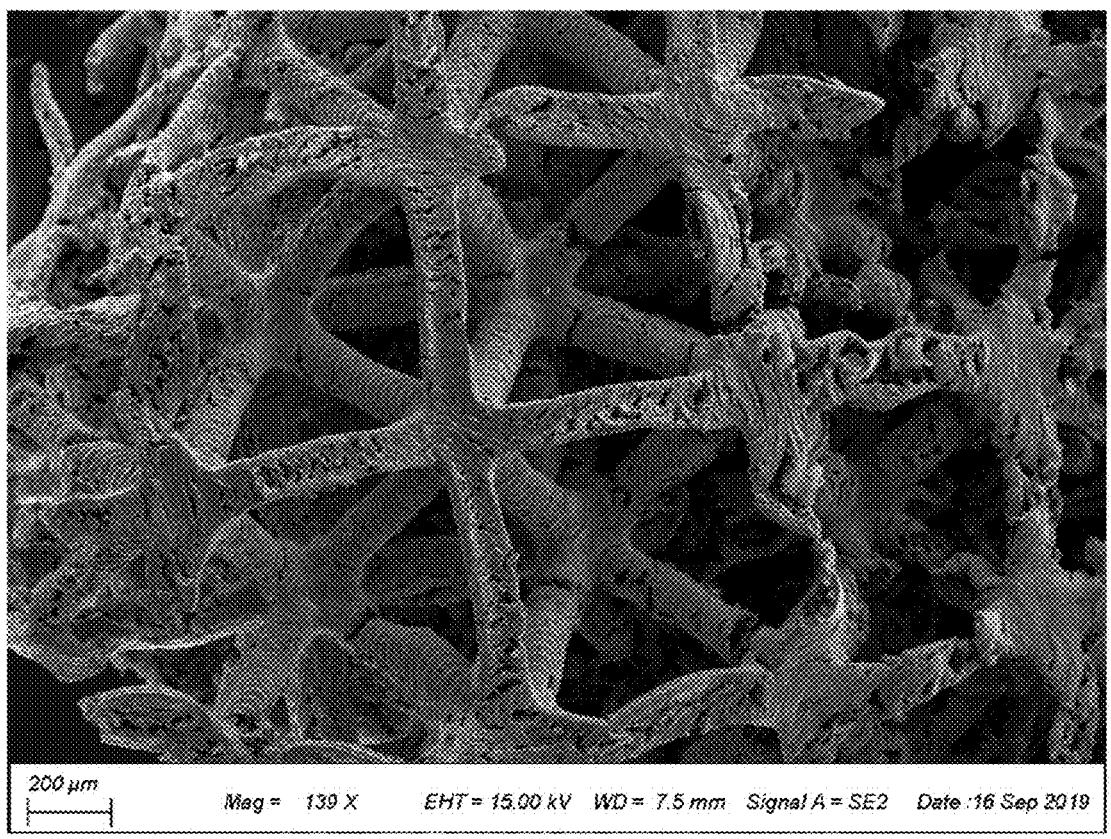
FIG. 75

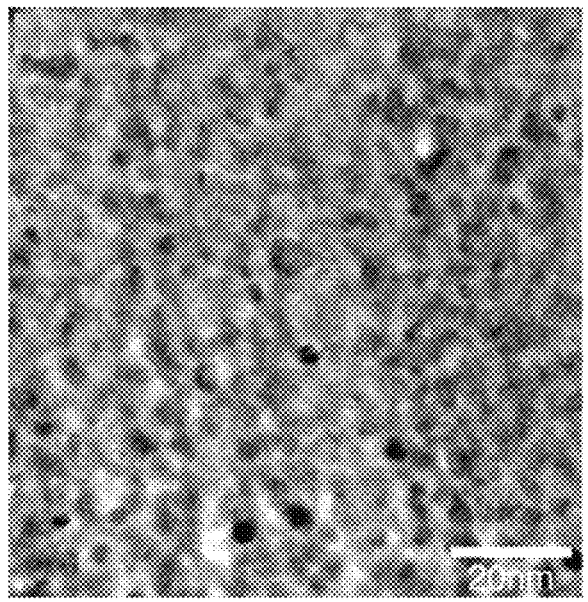 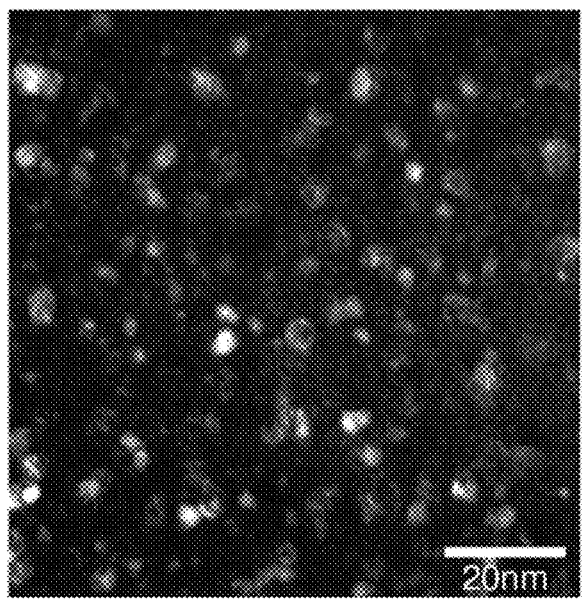
FIG. 81D          FIG. 81E
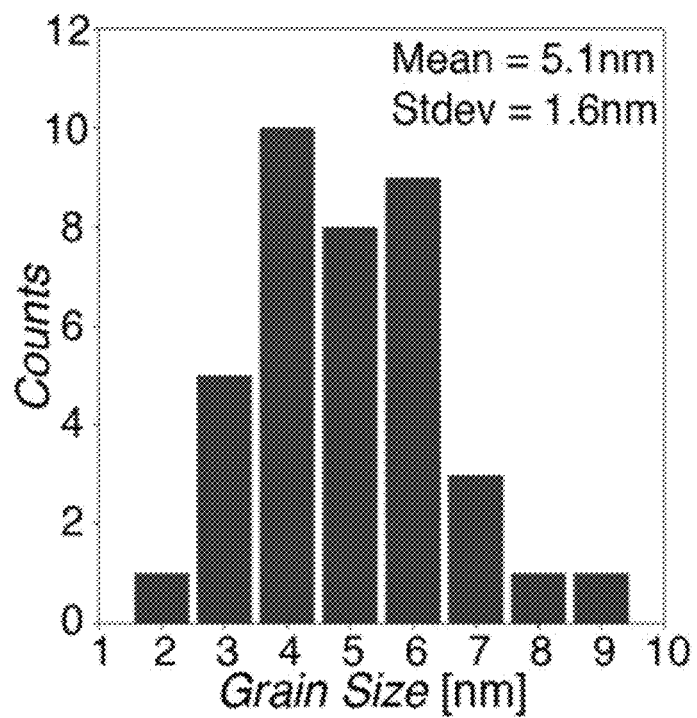
FIG. 81F

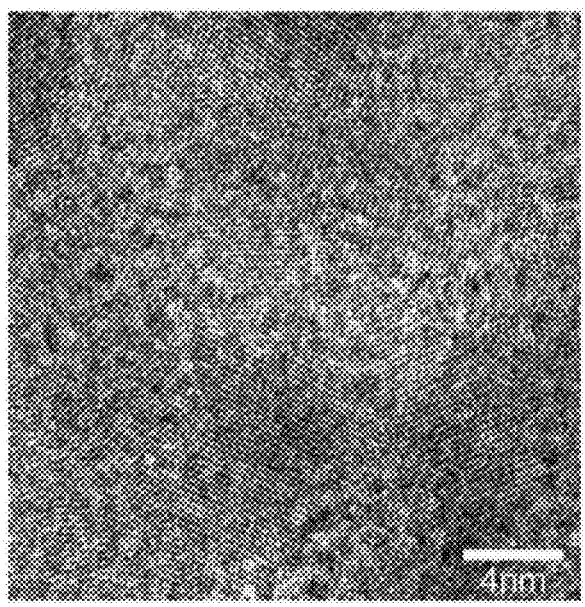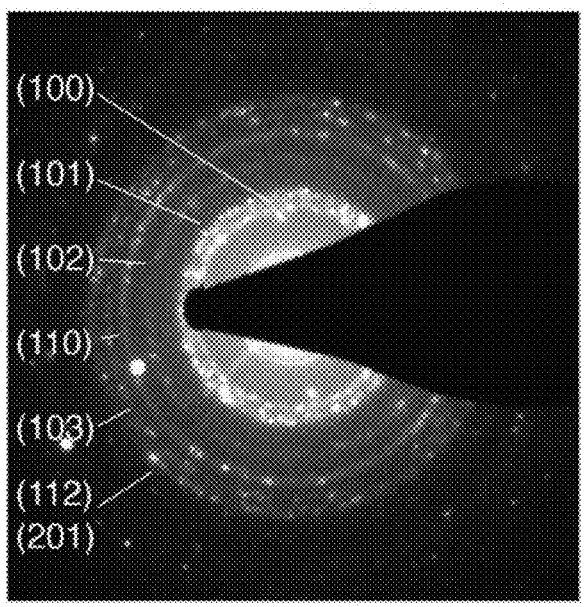
FIG. 81G  FIG. 81H

3D PRINTING OF METAL CONTAINING STRUCTURES

CROSS-REFERENCE TO RELATED APPLICATIONS

This application claims the benefit of priority to U.S. Provisional Patent Applications No. 62/734,884 filed Sep. 21, 2018, and No. 62/734,888, filed Sep. 21, 2018, which are hereby incorporated by reference in their entirety.

STATEMENT REGARDING FEDERALLY SPONSORED RESEARCH OR DEVELOPMENT

This invention was made with government support under Grant No. CA194533 awarded by the National Institute of Health and under DE-AR0000884/S-143484 awarded by the Department of Energy. The government has certain rights in the invention.

BACKGROUND OF INVENTION

Technical ceramics are one of the most important classes of materials being used in the world today. These engineered ceramics exhibit all kinds of unique mechanical, electrical, thermal and even biochemical properties, and have found application in virtually every scientific and engineering field. However, one key challenge that is still being faced in industry is in the shaping and production of these advanced ceramics. Manufacturing processes that work for metals and polymers, such as casting or machining cannot be applied to ceramics due to their high melting points and hardness. To circumvent this, alternative processes like pressing, molding and casting have been developed specifically for ceramics. Unfortunately, these processes still have their limitations. For example, while pressing of ceramic powders is relatively simple and inexpensive, only simply shaped parts can be achieved. On the other hand, techniques like molding or casting all require the use of expensive molds, making them inappropriate in areas where rapid prototyping is desired.

In recent years, 3D printing of ceramics has become a significant area of interest as it has the potential to remove the geometrical limitations associated with the current state of the art of ceramic processing. Conventional techniques for additive manufacturing of ceramic materials suffer from man issues and challenges, however. Issues include requiring slurries with high loading of ceramic particles, which results in high viscosity slurry that are difficult to print and difficult to keep homogeneously distributed. Furthermore, solid ceramic particles increase the refractive index of the resin and scatter the incident light, reducing both the cure depth and the dimensional accuracy of the print. Some other conventional approaches to printing ceramic materials are limited to Si-based ceramics.

The printing of metals also poses a few challenges, with the state of the art limited to direct metal laser sintering, selective laser melting, directed energy deposition, electron beam additive manufacturing, slurry printing with metal particles (similar to the ceramic slurries above), and aerosol jet printing. These techniques often require expensive high-energy lasers and/or specialized set-ups for fabrication.

As will be evident from the foregoing, there exists a need in the art for versatile additive manufacture processes making a wide range of materials, such as metals and ceramics. Provided herein are method and materials that address these and other needs in the art.

SUMMARY OF THE INVENTION

Provided herein are versatile methods for making metal-containing materials. These methods can include additive manufacture processes of these metal-containing materials, such as ceramic materials and metals. As noted above, additive manufacturing processes have generally been limited to producing polymer materials, while conventional approaches for manufacture of ceramic and/or metal materials are limited in obtainable geometries and/or compositions. A wide range of applications require or can benefit from metallic or ceramic materials with customized sizes and geometries. For example, materials made by methods disclosed herein can be useful for thermal management, such as in applications requiring metallic nano- or micro-scale features, for energy generation, such as for battery electrodes where customizable composition, porosity, and geometry can translate to increased performance, and for medical devices, such as biologically inert, non-decomposing, bio-scaffold or prostheses.

In an aspect, a method for making a metal-containing material comprises steps of: forming a metal-containing hydrogel from an aqueous precursor mixture using a photopolymerization; wherein the aqueous precursor mixture comprises water, one or more aqueous photosensitive binders, and one or more aqueous metal salts; and thermally treating the metal-containing hydrogel to form the metal-containing material; wherein the metal-containing hydrogel is exposed to a thermal-treatment atmosphere during the step of thermally treating; wherein a composition of the metal-containing material is at least partially (directly or indirectly) determined by a composition of the thermal-treatment atmosphere during the thermally treating step.

In an aspect, a method for making a metal-containing material, the method comprising steps of: swelling a blank hydrogel or a blank organogel using an aqueous metal salt mixture to form a metal-containing hydrogel; wherein the aqueous metal salt mixture comprising water and one or more metal salts; and thermally treating the metal-containing hydrogel to form the metal-containing material. Optionally, the method for making a metal-containing material comprises a step of forming the blank hydrogel from an aqueous blank mixture using a photopolymerization; wherein the aqueous blank mixture comprises water and one or more aqueous photosensitive binders; wherein the step of swelling is a step of swelling the blank hydrogel. Optionally, the method for making a metal-containing material comprises a step of forming the blank organogel from a non-aqueous blank mixture using a photopolymerization; wherein the nonaqueous blank mixture comprises a water-miscible non-water solvent and one or more photosensitive binders; wherein the step of swelling is a step of swelling the blank organogel.

Optionally, in any method for making a metal-containing material, the step of swelling is repeated a plurality of times, each repetition of the swelling comprises using the aqueous metal salt mixture having the one or more metal salts or using a different aqueous metal salt mixture having a different one or more metal salts. Optionally, in any method for making a metal-containing material, the metal-containing hydrogel is exposed to a thermal-treatment atmosphere during the step of thermally treating; and wherein a composition of the metal-containing material is at least partially (directly or indirectly) determined by a composition of the thermal-treatment atmosphere during the thermally treating step. Optionally, in any method for making a metal-containing material, a concentration of each of the one or more metal salts in the aqueous metal salt mixture is selected based on a desired composition of the metal-containing material and on a diffusion rate of each of one or more metal ions of the one or more metal salts. Optionally, in any method for making a metal-containing material, the method comprises a step of changing the diffusion rate the one or more metal salts in the metal-containing hydrogel using one or more of magnetic energy, electrical energy, optical energy, and thermal energy.

In an aspect, a method for making a metal-containing material comprises steps of: providing a first metal-containing hydrogel having a first portion and a second portion; wherein the first metal-containing hydrogel comprises one or more first metal ions in the first portion and in the second portion; leaching at least a fraction of the one or more first metal ions from a secondary portion of the first metal-containing hydrogel; wherein the secondary portion has a lower concentration of the one or more first metal ions than the rest ("primary portion") of the first metal-containing hydrogel; swelling at least the secondary portion of the first metal-containing hydrogel using an aqueous metal salt mixture to form a second metal-containing hydrogel; wherein the aqueous metal salt mixture comprises water and one or more second aqueous metal salts; wherein the one or more second metal salts comprise one or more second metal ions, the second metal ions being different from the first metal ions; and wherein the second metal-containing hydrogel has a spatially-varying composition comprising the primary portion with the one or more first metal ions and the secondary portion with the one or more second metal ions; and thermally treating the second metal-containing hydrogel to form the metal-containing material. Optionally, in any method for making a metal-containing material, the method comprises a step of forming the first metal-containing hydrogel from an aqueous precursor mixture using a photopolymerization; wherein the aqueous precursor mixture comprises water, one or more aqueous photosensitive binders, and one or more first aqueous metal salts; and wherein the one or more first aqueous metal salts comprise the one or more first metal ions.

Optionally, in any method for making a metal-containing material, the leaching, the swelling, or both the leaching and the swelling steps can be repeated, optionally using same or different mixtures and/or salts with each iteration.

Optionally, in any method for making a metal-containing material, the metal-containing material has a spatially-varying composition comprising a primary composition having the first metal ions and a secondary composition having the second metal ions. Optionally, in any method for making a metal-containing material, the metal-containing material has a primary portion having the primary composition and a secondary portion having the secondary composition. Optionally, in any method for making a metal-containing material, the metal-containing material comprises a transition region between the primary portion and the secondary portion; and wherein the transition region is characterized by a gradient composition between the primary composition and the secondary composition. Preferably, in any method for making a metal-containing material, the transition region, if present, has a length less than or equal to 1 cm between the primary portion and the secondary portion. Optionally, in any method for making a metal-containing material, the transition region, if present, has a length less than or equal to 1 mm between the primary portion and the secondary portion. Optionally, in any method for making a metal-containing material, the spatially-varying composition of the metal-containing material corresponds to spatially-varying magnetic characteristics, spatially-varying electrical characteristics, spatially-varying mechanical characteristics, spatially-varying thermal characteristics, or any combination of these. Optionally, in any method for making a metal-containing material, the method further comprises selecting desired spatially-varying characteristics selected from the group consisting of a desired spatially-varying composition, desired spatially-varying magnetic characteristics, desired spatially-varying electrical characteristics, desired spatially-varying thermal characteristics, desired spatially-varying mechanical characteristics, and any combination of these; and the method further comprising selecting the one or more first metal salts and the one or more second metal salts based on the desired spatially-varying characteristics. Optionally, in any method for making a metal-containing material, a concentration of the one or more first metal ions in the secondary portion of the second metal-containing hydrogel is less than or equal to 10% of a concentration of the one or more first metal ions in the primary portion of the second metal-containing hydrogel. Optionally, in any method for making a metal-containing material, the second metal-containing hydrogel is exposed to a thermal-treatment atmosphere during the step of thermally treating; and wherein a composition of the metal-containing material is at least partially (directly or indirectly) determined by a composition of the thermal-treatment atmosphere during the thermally treating step. Optionally, in any method for making a metal-containing material, the primary composition and the secondary composition, if present, are at least partially (directly or indirectly) determined by a composition of the thermal-treatment atmosphere.

Optionally, in any method for making a metal-containing material, at least 0.5 mol. %, preferably at least 10 mol. %, more preferably at least 20 mol. %, of the composition of the metal-containing material is (directly or indirectly) determined by a composition of the thermal-treatment atmosphere during the thermally treating step. Optionally, in any method for making a metal-containing material, the at least 0.5 mol. %, preferably at least 10 mol. %, more preferably at least 20 mol. %, of the composition of the metal-containing material is (directly or indirectly) determined by a chemical interaction of the metal-containing hydrogel and the thermal-treatment atmosphere during the thermally treating step. Optionally, in any method for making a metal-containing material, at least 0.5 wt. %, preferably at least 10 wt. %, more preferably at least 20 wt. %, of the composition of the metal-containing material is (directly or indirectly) determined by a composition of the thermal-treatment atmosphere during the thermally treating step. Optionally, in any method for making a metal-containing material, the at least 0.5 wt. %, preferably at least 10 wt. %, more preferably at least 20 wt. %, of the composition of the metal-containing material is (directly or indirectly) determined by a chemical interaction of the metal-containing hydrogel and the thermal-treatment atmosphere during the thermally treating step. As an illustrative example, a metal-containing hydrogel comprising Al ions is thermally treated (e.g. calcined) using an oxidizing thermal-treatment atmosphere such that the resulting metal-containing material is $Al_2O_3$; wherein the metal-containing material became a metal oxide ($Al_2O_3$) due to a chemical interaction (oxidation) with the oxidizing thermal-treatment atmosphere during the thermally treating step; and wherein, assuming no other source of 0-atoms besides the thermal-treatment atmosphere in this illustrative example, 60 mol. % of the metal-containing material ($Al_2O_3$), corresponding to the oxygen content in $Al_2O_3$, is (directly) determined by the interaction with the thermal-treatment atmosphere during the thermally treating step. In some embodiments, a composition of the metal-containing material is at least partially determined by anions (e.g., nitrates) of the metal salt present in the metal-containing hydrogel during the step of thermally treating. In some embodiments, a composition of the metal-containing material is at least partially determined by the thermal-treatment atmosphere and at least partially determined by the anions (e.g., nitrates) of the metal salt present in the metal-containing hydrogel during the step of thermally treating. In some embodiments, anions of metal salt(s) of the aqueous precursor mixture and/or of the aqueous metal salt mixture are selected to at least partially determine a composition of the metal-containing material. For example, a chemical interaction (e.g., oxidation or reduction) of anions, which are present in a metal-containing hydrogel (e.g., anions associated with the metal salt(s) taken up by the metal-containing hydrogel during a swelling step), with the metal-containing hydrogel or with the forming metal-containing material during the step of thermally treating can contribute atoms (e.g., oxygen atoms) to the composition of the resulting metal-containing material during the step of thermally treating. For example, a decomposition of anions (e.g., nitrates) present in a metal-containing hydrogel (e.g., anions associated with the metal salt(s) taken up by the metal-containing hydrogel during a swelling step) can contribute atoms (e.g., oxygen atoms) to the composition of the resulting metal-containing material during the step of thermally treating. For example, oxygen atoms from nitrate anions can become oxygen atoms of a resulting metal oxide metal-containing material during the step of thermally treating the metal-containing hydrogel. For example, decomposition of anions refers a chemical decomposition of the anions as a result of thermal energy (e.g., thermolysis; e.g., decomposition due to high temperature during the step of thermally treating). For example, anions of metal salts, such as metal salt(s) of the aqueous metal salt mixture or of the aqueous precursor mixture, can be oxidizers or reducers, such that said anions at least partially determine a composition of the resulting metal-containing material via oxidation or reduction, respectively, by the anions. Optionally, in any method for making a metal-containing material, the thermal-treatment atmosphere during the thermal treating step is selected from the group consisting of a reducing atmosphere, an oxidizing atmosphere, and an inert atmosphere. Optionally, in any method for making a metal-containing material, the thermal-treatment atmosphere during the thermally treating step is a reducing atmosphere and at least a portion of the metal-containing structure is metallic due to chemical interaction of the metal-containing hydrogel with the reducing thermal-treatment atmosphere during the thermally treating step. Optionally, in any method for making a metal-containing material, the thermal-treatment atmosphere during the thermally treating step is an oxidizing atmosphere and at least a portion of the metal-containing material is a metal oxide ceramic due to chemical interaction of the metal-containing hydrogel with the oxidizing thermal-treatment atmosphere during the thermally treating step. Optionally, in any method for making a metal-containing material, the thermal-treatment atmosphere during the thermally treating step is an inert atmosphere and at least a portion of the metal-containing material is a metal carbide due to the inert thermal-treatment atmosphere, during the thermally treating step, being an inert atmosphere. For example, a composition of at least a portion of the metal-containing material is indirectly determined by the thermal-treatment being an inert atmosphere. For example, a composition of at least a portion of the metal-containing material is indirectly determined by the thermal-treatment being an inert atmosphere via the lack of a chemical interaction between the metal-containing hydrogel or metal-containing material and the thermal atmosphere, because the inert atmosphere is not an oxidizing or a reducing atmosphere. Any method for making a metal-containing material disclosed herein can include a step of selecting a composition of the thermal-treatment atmosphere. In the optional step of selecting a composition of the thermal-treatment atmosphere, the thermal-treatment atmosphere is selected based on a desired composition of the metal-containing material wherein the selected thermal-treatment atmosphere at least partially determines the composition of the metal-containing material.

Optionally, in any method for making a metal-containing material, a composition of the reducing atmosphere comprises $H_2$, CO, $NH_3$, $NO_2$, forming gas (e.g., 95% $N_2$ and 5% $H_2$), or any combination of these. Optionally, in any method for making a metal-containing material, a composition of the reducing atmosphere comprises a vacuum. Optionally in some embodiments, a vacuum can be a reducing atmosphere, such as wherein the hydrogel can undergo carbothermal reduction from the carbon left behind by decomposition of polymer at high thermal treatment temperatures. Optionally, in any method for making a metal-containing material, a composition of the oxidizing atmosphere comprises $O_2$, air, and any combination of these. Optionally, in any method for making a metal-containing material, a composition of the inert atmosphere comprises nitrogen, argon, a vacuum, and any combination of these. Low vacuum may be useful for making carbon-containing metal-containing materials (e.g., metal carbides). As used herein, vacuum can refer to a regimes of vacuum such as, but not limited to, low vacuum (e.g., 760 to 25 Torr), medium vacuum (e.g., 25 Torr to 1 mTorr), high vacuum (1 mTorr to 1 nanoTorr) vacuum, and ultra high vacuum (1 nanoTorr to 1 picoTorr). Optionally, in any method for making a metal-containing material, the step of thermally treating comprises using a temperature of at least 100° C., preferably at least 130° C., more preferably at least 150° C. Optionally, in any method for making a metal-containing material, the step of thermally treating comprises using a temperature of at least 400° C. Optionally, in any method for making a metal-containing material, the step of thermally treating comprises a thermal treatment duration of at least 10 hours, preferably at least 24 hours, more preferably at least 48 hours, and further more preferably at least 72 hours.

Optionally, in any method for making a metal-containing material, at least a portion of a composition of the photoinitiator(s), of the UV-blocker(s), or both, is incorporated into the metal-containing material during the thermally-treating step(s). For example, the resulting metal-containing material can include phosphorous due to the composition of a photoinitiator present in a precursor or a blank dispersion during formation of a hydrogel or organogel. In some embodiments, this can provide a beneficial route for introducing certain compositional constituents to the resulting metal-containing material. Optionally, in any method for making a metal-containing material, the aqueous metal salt mixture comprises additives, wherein the additives contribute to a composition of the metal-containing material during the thermally treating step.

Optionally, in any method for making a metal-containing material, the step of thermally treating comprises a plurality of steps of thermally treating. Optionally, in any method for making a metal-containing material, the plurality of thermally treating steps comprises a first thermally treating step and a second thermally treating step, wherein: the first thermally treating step comprises using a first thermal-treatment atmosphere during the first step of thermally treating; the second thermally treating step comprises using a second thermal-treatment atmosphere during the second step of thermally treating; and a composition of the first thermal-treatment atmosphere is different from a composition of the second thermal-treatment atmosphere. Optionally, in any method for making a metal-containing material, the first thermally treating step comprises thermally treating the metal-containing hydrogel to form an intermediate metal-containing material; and wherein the second thermally treating step comprises thermally treating the intermediate metal-containing material to form the metal-containing material. Optionally, in any method for making a metal-containing material, the first thermal-treatment atmosphere comprises an oxidizing atmosphere and a composition of the intermediate metal-containing material comprises a metal oxide (e.g., a metal oxide ceramic); and wherein the second thermal-treatment atmosphere comprises a reducing atmosphere and a composition of the metal-containing material comprises a metal or metal alloy. Optionally, in any method for making a metal-containing material, a first portion of the metal-containing material has a composition corresponding to a chemical interaction with the first thermal-treatment atmosphere during the first thermally treating step; and wherein a second portion of the metal-containing material has a composition corresponding to a chemical interaction with the second thermal-treatment atmosphere during the second thermally treating step.

Optionally, in any method for making a metal-containing material, the aqueous precursor mixture substantially or essentially does not comprise metal-containing particles. Optionally, in any method for making a metal-containing material, the aqueous precursor mixture does not comprise metal-containing particles. Optionally, metal-containing particles, if present, are present at most at trace or impurity level in the aqueous precursor mixture. Optionally, metal-containing particles, if present, are present at concentration of less than 0.05 wt. %, preferably less than 0.01 wt. %, more preferably less than 0.005 wt. %, and further more preferably less than 0.001 wt. %, in the aqueous precursor mixture. Optionally, in any method for making a metal-containing material, the aqueous precursor mixture substantially or essentially does not comprise metal-containing particles having a diameter of at least 1 nm. Optionally, in any method for making a metal-containing material, the aqueous precursor mixture does not comprise metal-containing particles having a diameter of at least 1 nm. Optionally, metal-containing particles (having a diameter of at least 1 nm), if present, are present at most at trace or impurity level in the aqueous precursor mixture. Optionally, metal-containing particles (having a diameter of at least 1 nm), if present, are present at concentration of less than 0.05 wt. %, preferably less than 0.01 wt. %, more preferably less than 0.005 wt. %, and further more preferably less than 0.001 wt. %, in the aqueous precursor mixture. Optionally, in any method for making a metal-containing material, the aqueous metal salt mixture substantially or essentially does not comprise metal-containing particles. Optionally, in any method for making a metal-containing material, the aqueous metal salt mixture does not comprise metal-containing particles. Optionally, metal-containing particles, if present, are present at most at trace or impurity level in the aqueous metal salt mixture. Optionally, metal-containing particles, if present, are present at concentration of less than 0.05 wt. %, preferably less than 0.01 wt. %, more preferably less than 0.005 wt. %, and further more preferably less than 0.001 wt. %, in the aqueous metal salt Optionally, in any method for making a metal-containing material, the aqueous metal salt mixture substantially or essentially does not comprise metal-containing particles. Optionally, in any method for making a metal-containing material, the aqueous metal salt mixture substantially or essentially does not comprise metal-containing particles having a diameter of at least 1 nm. Optionally, in any method for making a metal-containing material, the aqueous metal salt mixture does not comprise metal-containing particles having a diameter of at least 1 nm. Optionally, metal-containing particles (having a diameter of at least 1 nm), if present, are present at most at trace or impurity level in the aqueous metal salt mixture. Optionally, metal-containing particles (having a diameter of at least 1 nm), if present, are present at concentration of less than 0.05 wt. %, preferably less than 0.01 wt. %, more preferably less than 0.005 wt. %, and further more preferably less than 0.001 wt. %, in the aqueous metal salt mixture.

Optionally, in any method for making a metal-containing material, the aqueous precursor mixture further comprises one or more photoinitiators, one or more UV-blockers, or any combination of these. Optionally, in any method for making a metal-containing material, the aqueous blank mixture further comprises one or more photoinitiators, one or more UV-blockers, or any combination of these. Optionally, in any method for making a metal-containing material, the nonaqueous blank mixture further comprises one or more photoinitiators, one or more UV-blockers, or any combination of these.

Optionally, in any method for making a metal-containing material, the aqueous precursor mixture comprises one metal salt. Optionally, in any method for making a metal-containing material, the aqueous metal salt mixture comprises one metal salt. Optionally, in any method for making a metal-containing material, the aqueous precursor mixture comprises at least two different metal salts, each characterized by different metal ions. Optionally, in any method for making a metal-containing material, the aqueous metal salt mixture comprises at least two different metal salts, each characterized by different metal ions. Optionally, in any method for making a metal-containing material, each of the one or more metal salts is a nitrate, an acetate, a chloride, sulfate, bicarbonate, oxynitrate, hydroxide, bromide, fluoride, iodide, chlorate, cyanide, cyanate, thiocyanate, phosphate, dichromate, perchlorate, benzoate, chromate, or any combination of these. Optionally, in any method for making a metal-containing material, each of the one or more metal salts is selected from those provided in "Solubility Table" accessed at https://en.wikipedia.org/wiki/Solubility_table (last accessed, Sep. 18, 2019), which is incorporated herein by reference. Optionally, in any method for making a metal-containing material, the one or more metal ions are selected from the group consisting of Fe, Zn, Li, Co, Al, Ni, Y, Mo, La, In, Sn, and any combination of these. Optionally, in any method for making a metal-containing material, each of the one or more metal ions is selected from metals provided in in "Solubility Table" accessed at https://en.wikipedia.org/wiki/Solubility_table (last accessed, Sep. 18, 2019). Optionally, in any method for making a metal-containing material, the method further comprises a step of selecting relative concentrations of the at least two different aqueous metal salts in the aqueous precursor mixture based on a desired composition of the metal-containing material; wherein the metal-containing material comprises metal ions of the at least two different aqueous metal salts. Optionally, in any method for making a metal-containing material, the method further comprises a step of selecting relative concentrations of the at least two different aqueous metal salts in the aqueous metal salt mixture based on a desired composition of the metal-containing material; wherein the metal-containing material comprises metal ions of the at least two different aqueous metal salts. The term "relative concentrations" as used herein can refer to a ratio of concentrations or of amounts of metal salts in a mixture (e.g., 1:1; e.g., 1:1:1).

Optionally, in any method for making a metal-containing material, the metal-containing material has a composition characterized as a binary material. Optionally, in any method for making a metal-containing material, the metal-containing material has a composition comprising at least two metal ions. Optionally, in any method for making a metal-containing material, the metal-containing material has a composition characterized as a ternary or higher order material. Optionally, in any method for making a metal-containing material, the metal-containing material has a composition characterized as a metal oxide, a metal alloy, or a metal carbide comprising at least two metal ions. Optionally, in any method for making a metal-containing material, the metal-containing material has a spatially-varying metal ion composition. Optionally, in any method for making a metal-containing material, the metal-containing material has a spatially-varying anion (e.g., oxide, nitride, carbide, etc.) composition. Optionally, in any method for making a metal-containing material, the spatially varying composition corresponds to a core-shell configuration. Optionally, in any method for making a metal-containing material, the metal-containing material is a metal or metal alloy. Optionally, in any method for making a metal-containing material, the metal containing material is a ceramic. Optionally, in any method for making a metal-containing material, the metal containing material is a carbide.

Optionally, in any method for making a metal-containing material, anions (e.g., nitrate, nitrite, acetate, hydroxide, chloride, etc.) of the one or more metal salts at least partially determine a microstructure of the metal-containing material; and wherein anions of the one or more metal salts are selected based on a desired microstructure of the metal-containing material. For example, use of metal salts with acetate anions can provide for much denser structures as compared to use of metal salts with nitrate anions which provide for a more porous microstructure. Use of different anions of the metal salts can also determine resulting surface area of the material. Optionally, in any method for making a metal-containing material, anions (e.g., nitrate, nitrite, acetate, hydroxide, chloride, etc.) of the one or more metal salts at least partially determine a microstructure of the metal-containing material, and the method comprises a step of selecting anions of the one or more metal salts based on a desired microstructure of the metal-containing material Optionally, in any method for making a metal-containing material, the metal-containing material has structure characterized as a lattice. Optionally, in any method for making a metal-containing material, the metal-containing material has structure characterized as architected, having a three-dimensional geometry, and being macroscopically monolithic. Preferably, but not necessarily, the material has a nano- or micro-architected three-dimensional geometry. Optionally, in any method for making a metal-containing material, a microstructure of the metal-containing material has grain sizes equal to or within 20% of a size of one or more features of the structure.

Optionally, in any method for making a metal-containing material, the step of forming the hydrogel comprises patterning or printing the hydrogel. Optionally, in any method for making a metal-containing material, the photopolymerization is an additive manufacturing process.

Optionally, in any method for making a metal-containing material, the method further comprises using the metal-containing structure in an electrode, as a biological scaffold, in a mechanical damping device, in a heat exchanger, as a catalyst, as a solid electrolyte, as a superconductor, as a thermal insulator, as an electrical insulator, as dielectrics, and/or as a sensors.

Optionally, in any method for making a metal-containing material, the method further comprises a step of selecting relative concentrations of the at least two different aqueous metal salts in the aqueous precursor mixture based on a desired composition of the metal-containing material; wherein the metal-containing material comprises metal ions of the at least two different aqueous metal salts. Optionally, in any method for making a metal-containing material, the method further comprises a step of selecting relative concentrations of the at least two different aqueous metal salts in the aqueous metal salt mixture based on a desired composition of the metal-containing material; wherein the metal-containing material comprises metal ions of the at least two different aqueous metal salts.

Optionally, in any method for making a metal-containing material, anions of the one or more metal salts at least partially determine a composition of the metal-containing material during thermally treating; and wherein the method comprises a step of selecting anions of the one or more metal salts based on a desired composition of the metal-containing material.

Optionally, in any method for making a metal-containing material, the step of thermally treating comprises pyrolyzing, calcinating, sintering, high temperature annealing, or a combination of these.

Optionally, in any method for making a metal-containing material, the material has a nano- or micro-architected three-dimensional geometry. Optionally, in any method for making a metal-containing material, the material has a structure characterized by a plurality of features independently having at least one physical dimension less than or equal to 50 μm. Optionally, in any method for making a metal-containing material, the material has a structure characterized by a plurality of features independently having at least one physical dimension selected from the range of 10 nm to 300 μm, optionally 50 nm to 100 μm. Optionally, in any method for making a metal-containing material, the material has a structure characterized by a plurality of features, wherein at least a portion of said features independently have one or more average cross sectional physical dimensions selected over the range of 50 nm to 200 μm.

In an aspect, an electrode comprises a metal-containing material characterized as an architected, having a three-dimensional geometry, and macroscopically monolithic lattice having a composition characterized as a metal oxide, a metal or metal alloy, a metal carbide, or a combination of these. Preferably, the electrode has a nano- or micro-architected three-dimensional geometry. Optionally, the electrode is a battery electrode.

Also disclosed herein are electrodes, such as battery electrodes, having the metal-containing material made by any combination of embodiments of methods for making a metal-containing material disclosed herein. Also disclosed herein are methods for making a metal-containing material including any one or any combination of embodiments of methods for making a metal-containing material disclosed herein.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 6. TEM diffraction pattern obtained from a beam of a tetrakaidecahedron unit cell prepared using this technique. The indexed rings correspond to that of zinc oxide.

FIGS. 7A-7B. Compression of the pre-calcined zinc nitrate polymeric structure. The red dashed line is a guide to the eye as to the degree of compression. FIGS. 7D-7E. Compression of a zinc oxide structure prepared using the technique described here. The red dashed line is a guide to the eye as to the degree of compression.

FIG. 15A. "Blank" template printed using projection micro-stereolithography. FIG. 15B. Template now swollen with iron nitrate mixture after immersion in 100 mg/mL mixture of iron nitrate overnight. FIG. 15C. Calcined structure. FIGS. 15D-15F. EDS map of the calcined cubic lattice. Iron and oxygen can be clearly seen in the generated map, indicating that the material is likely to be an iron oxide.

FIG. 16A. Lithium cobalt hydrogel structure printed from the lithium cobalt aqueous photoresin. FIG. 16B. The hydrogel is partially soaked in water to leach away the lithium cobalt salts from part of the structure. FIG. 16C. The "semi-blank" template after leaching. Half the structure is colorless, indicating a lack of metal salts. The other half still retains the red-purple color from the initial printed hydrogel.

FIG. 17A. To swell in the iron nitrate salt into the structure, the "semi-blank" template was immersed into a 100 mg/mL mixture of iron nitrate for 2 hours. FIG. 17B. The "semi-blank" template after swelling. The previously colorless part of the structure turned brown-orange, indicating the successful swelling of the iron nitrate salt into the structure.

FIG. 18A. Swollen hydrogel cubic lattice structure. Half lithium cobalt containing, the other half iron containing. FIG. 18B. Cubic lattice after the calcination process. The thermally treated structure is about 40% of its original size. The black color is typical of lithium cobalt oxide, and the red-brown color is typical of iron oxide. The different parts of the structure shrank by different amounts.

FIG. 19A. Composite electron image of the interface between both materials taken by combining 4 different images together. The iron rich portion is to the left of the image and the cobalt rich portion is to the right. FIG. 19B. Iron elemental map obtained from the 4 different electron images. A gradient in iron can be seen, from iron-rich on the left to iron-deficient on the right. FIG. 19C. Cobalt elemental map obtained from the 4 different electron images. A gradient in cobalt can be seen, from cobalt-deficient on the left to cobalt-rich on the right.

FIG. 24A. FIB cross section of an internal node illustrating a >100 μm pore. FIG. 24B. Spherical pores are seen in broken nodes of very cracked lattices. FIG. 24C. LCO lattice with a damaged edge. FIG. 24D. Zoomed-in image of the nodes of the damaged edge demonstrating node failure.

FIG. 25A. XRD spectrum from a pulverized LCO lattice and reference spectrum taken from Reference [177]. FIG. 25B. Crystal structure of LCO adapted from Reference [178]. $Co^{3+}$ ions lie in the center of $O^{2-}$ octahedra and the gray box outlines a unit cell. FIG. 25C. SEM image of the lattice with elemental maps from EDS illustrating the four elements with the highest atomic concentrations.

FIG. 28A. Voltage profile during charge at C/40 for 1 cycle and C/20 for cycles 2-5. FIG. 28B. Specific capacity and Coulombic efficiency during the first 50 cycles at various currents. FIG. 28C. Specific capacity and Coulombic efficiency over 231 cycles. FIG. 28D. Voltage profile at various cycles at C/10. Cycle 7 is the first C/10 cycle and cycle 32 is the sixth C/10 cycle; all subsequent cycling were at C/10.

FIG. 31A. XRD spectrum from a pulverized NCA lattice and reference spectrum taken from Reference [192]. FIG. 31B. SEM image of the NCA lattice with elemental maps from EDS illustrating the four non-Li elements of NCA. FIG. 31C. Voltage profile during charge at C/40 for 2 cycles and C/20 for cycles 3-5.

FIG. 32A. The metal-salt containing aqueous photoresin is first prepared by dissolving metal salts and water-soluble photosensitive reagents in water. A 3D printed metal-containing polymer is then printed using photolithography. FIG. 32B. A "blank" photoresin is prepared by mixing a hydrophilic binder in either water or a water-miscible organic solvent. A "blank" polymer 3D structure is then printed using photolithography. Metal ions are then introduced into the polymer structure by soaking the hydrophilic polymer in an aqueous solution containing dissolved metal salts.

FIG. 34A. 3D Octet lattice printed from the organic "blank" photoresin using a projection-microstereolithography printer. FIG. 34B. Image of the same octet lattice, as imaged using a stereomicroscope.

FIG. 35A. 3D Octet "blank" hydrogel lattice after swelling in a copper (II) nitrate solution for 6 hours at room temperature. FIG. 35B. Image of the same octet lattice, as imaged using a stereomicroscope. Scale bar to be determined.

FIG. 36A. Copper nitrate swollen 3D Octet lattice after calcination. FIG. 36B. Image of the same octet lattice, as imaged using a stereomicroscope.

FIG. 37A. Copper lattices after reduction. FIG. 37B. Image of the same octet lattice, as imaged using a stereomicroscope.

FIG. 38. 3D square "blank" hydrogel lattice (prepared by leaching a salt-in resin) after swelling in a copper (II) nitrate solution for 6 hours at room temperature.

FIG. 39A. Copper oxide lattices after calcination of structures swollen with copper nitrate. FIG. 39B. Image of the same copper oxide square lattice, as imaged using a stereomicroscope.

FIG. 40A. Copper lattices after reduction. FIG. 40B. Image of the same copper square lattice, as imaged using a stereomicroscope.

FIG. 41. SEM image of the copper lattice made as described in Example 13.

FIG. 47A. 3D Octet lattice printed from the organic "blank" photoresin using a projection-microstereolithography printer. FIG. 47B. Image of the same octet lattice, as imaged using a stereomicroscope.

FIG. 48A. 3D Octet "blank" hydrogel lattice after swelling in a nickel (II) nitrate hexahydrate solution for 2 hours at room temperature. FIG. 48B. Image of the same octet lattice, as imaged using a stereomicroscope.

FIG. 49A. Nickel nitrate swollen 3D Octet lattice after calcination. FIG. 49B. Image of the same octet lattice, as imaged using a stereomicroscope.

FIG. 50A. Nickel lattices after reduction. FIG. 50B. Image of the same octet lattice, as imaged using a stereomicroscope.

FIG. 56. 3D octet "blank" hydrogel lattice after swelling in a cobalt (II) nitrate hexahydrate solution for 2 hours at 50° C.

FIG. 57A. Cobalt oxide lattices after calcination of structures swollen with cobalt nitrate. FIG. 57B. Image of the same cobalt oxide octet lattice, as imaged using a stereomicroscope.

FIG. 58A. Cobalt lattices after reduction. FIG. 58B. Image of the same cobalt octet lattice, as imaged using a stereomicroscope.

FIG. 59. SEM image of the cobalt lattice made as described in Example 15.

FIG. 72A-72B. FIG. 72A: photograph of 3D octet "blank" gel lattice after swelling in a 1:1 volume ratio of 2.5M copper (II) nitrate hemipentahydrate solution and 2.5M nickel nitrate hexahydrate solution for 2 hours, at 50° C. FIG. 72B: stereomicroscope image of the lattice in FIG. 72A.

FIG. 73A. Metal oxide lattices after calcination of structures swollen with copper and nickel nitrates. FIG. 73B. Image of the same metal oxide octet lattice, as imaged using a stereomicroscope.

FIG. 74A. Metal lattices after reduction. FIG. 74B. Image of the same metal octet lattice, as imaged using a stereomicroscope.

FIG. 75. SEM image of the metal lattice made as described in Example 17.

FIGS. 81A-81H. Characterization of AM-produced ZnO. (FIG. 81A) XRD spectra of polymers with zinc precursor after calcination, (FIG. 81B) EDS chemical composition maps of a unit cell after calcination, where atomic ratio of Zn/O is ~0.92 based on the EDS spectrum in FIG. 81C; (FIG. 81D) Bright field, (FIG. 81E) dark field, and (FIG. 81G) high-resolution TEM images and (FIG. 81H) electron diffraction pattern from a calcined 3D ZnO structure. All reveal nanocrystalline microstructure. (FIG. 81F) Histogram of grain sizes from DF TEM images reveals 5.1+/−1.6 nm grain size (N=40).

STATEMENTS REGARDING CHEMICAL COMPOUNDS AND NOMENCLATURE

Figure 1:
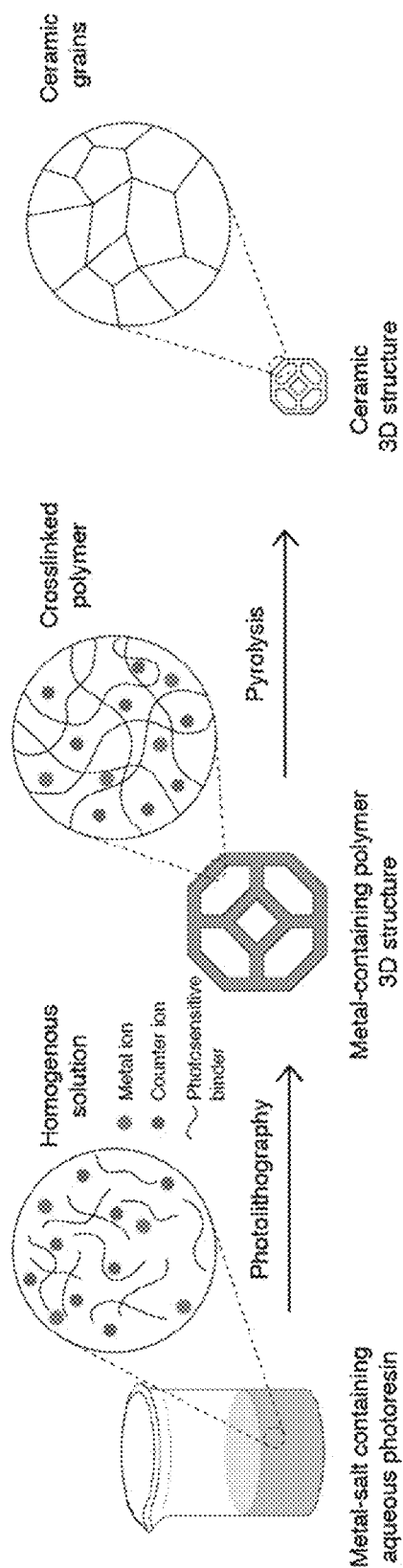
FIG. 1. The metal-salt containing aqueous photoresin is first prepared by dissolving metal salts and water-soluble photosensitive reagents in water. A 3D printed metal-containing polymer is then printed using photolithography. On calcination of the printed structure, the binder is burned out and a ceramic part is left behind. The net shape of the printed part is retained throughout the whole process.

In general, the terms and phrases used herein have their art-recognized meaning, which can be found by reference to standard texts, journal references and contexts known to those skilled in the art. The following definitions are provided to clarify their specific use in the context of the invention.

The term "metal-containing species" refers to a chemical species (e.g., atom, salt, ion, compound, molecule, material) whose chemical formula includes at least one metal element. For example, a material, object, chemical species, compound, molecule, mixture, solution, or dispersion that is characterized or referred to as "metal-containing" is a material, object, chemical species, compound, molecule, mixture, solution, or dispersion, respectively, that comprises at least one metal and/or metal-containing species. The term "metal-containing material" refers to a material that includes at least one metal and/or metal-containing species. The term "metal-containing hydrogel" refers to a hydrogel that includes at least one metal and/or metal-containing species. The term "metal-containing particles" refers to particles that comprise at least one metal and/or metal-containing species (e.g., metal oxide or metal nanoparticles). A metal-containing material may include one or more metal atoms and/or metal ions involved in ionic, covalent, metallic, and/or coordination bonding of the material.

A metal salt is an exemplary metal-containing species. Exemplary metal salts include, but are not limited to, metal nitrates and their hydrates and metal acetates and their hydrates. Exemplary metal salts include, but are not limited to, zinc nitrate, zinc nitrate hexahydrate, zinc chloride, zinc acetate, iron nitrate, iron nitrate nonahydrate, lithium nitrate, cobalt acetate, cobalt nitrate, cobalt nitrate hexahydrate, aluminum nonahydrate, barium acetate, yttrium nitrate, and any combinations of these.

The term "metal element" refers to a metal element of the periodic table of elements. Preferably, as used herein, the term "metal" includes elements that are metalloids. Metalloids elements include B, Si, Ge, As, Sb, and Te. Optionally, metalloid elements include B, Si, Ge, As, Sb, Te, Po, At, and Se.

The term "metal alloy" refers to an alloy of two or more metals. For example, a metal alloy may be characterized as a solid solution of two or more metal elements (e.g., the metal elements being in the form of atoms or ions in the solid solution), a mixture of metallic phases, or an intermetallic compound. A metal alloy can be characterized as comprising metallic bonding. In certain embodiments, a metal, rather than a metal alloy, refers to a metallic material whose chemical formula has one metal element (i.e., its compositions has substantially or essentially one metal element).

The term "ceramic" refers to a solid material comprising an compound of metal, non-metal, or metalloid atoms substantially or essentially held in ionic or ionic and covalent bonds. For example, a ceramic material can be characterized as having cations (e.g., metal ions, which can be metalloid ions) and anions (e.g., oxygen ions, nitrogen ions, carbide ions) substantially or essentially held together in ionic or ionic and covalent bonds. Any metal-containing material that is made by any method for making a metal-containing material disclosed herein can be a ceramic (i.e., a metal-containing ceramic). Exemplary ceramic materials include, but are not limited to, barium titanate, bismuth strontium calcium copper oxide, boron oxide, boron nitride, ferrite, lead zirconate titanate magnesium diboride, silicon carbide, silicon nitride, sialon (silicon aluminum oxynitride), aluminum oxide, copper oxide, cobalt oxide, zinc oxide, steatite, titanium carbide, titanium oxide, uranium oxide, yitrium barium copper oxide, zirconium dioxide, and any combinations of these.

The term "hydrogel" refers to a material comprising a network of one or more polymers, preferably one or more hydrophilic polymers, and comprising water. Preferably, but not necessarily, a hydrogel comprises a water content selected from the range of 1 wt. % to 90 wt. %, more preferably, but not necessarily, selected from the range of 10 wt. % to 90 wt. %. Optionally, a hydrogel further comprises one or more co-solvent, in addition to water, where the co-solvent can be a water-miscible non-water solvent. The co-solvent(s), if present in a hydrogel, is present in an amount (e.g., wt. %) less than a corresponding amount (e.g., wt. %) of water in the same hydrogel. As used herein, the term "organogel" refers to a material comprising a network of one or more polymers, preferably one or more hydrophilic polymers, and comprising a water-miscible non-water solvent. Preferably, but not necessarily, an organogel comprises a water-miscible non-water solvent content selected from the range of 1 wt. % to 90 wt. %, more preferably selected from the range of 10 wt. % to 90 wt. % Optionally, an organogel further comprises water, in addition to the water-miscible non-water solvent, where the water, if present in the organogel, is present in an amount (e.g., wt. %) less than a corresponding amount (e.g., wt. %) of the water-miscible non-water solvent in the same organogel. Hydrogels are further characterized and described in Ahmed ("Hydrogel: Preparation, characterization, and applications: A review", Journal of Advanced Research, vol. 6, issue 2, pgs. 105-121, published Jul. 18, 2013), which is incorporated herein by reference to the extent not inconsistent herewith. Organogels are further characterized and described in Murdan ("Organogels in drug delivery", Expert Opinion on Drug Delivery, vol. 2, issue 3, pages 489-505, published May 10, 2005), which is incorporated herein by reference to the extent not inconsistent herewith.

The term "photosensitive binder" refers to a cross-linkable material or chemical species (e.g., compound or molecule) that can be induced to cross-link with another photosensitive binder via electromagnetic radiation, such as light, such as visible light or ultra-violet light. Exemplary photosensitive binders include, but are not limited to, monomers, macromolecules, and polymers. Photosensitive binders include but are not limited to poly(ethylene glycol) macromolecules with acrylate functional groups.

The term "aqueous" refers to a material or chemical species dispersed in or dissolved in (solvated by) water. For example, an aqueous chemical species is a chemical species dispersed or dissolved in water. For example, an aqueous metal salt is a metal salt dissolved in water. An aqueous photosensitive binder is a photosensitive binder that is dispersed or dissolved in water. In reference to a mixture (e.g., a dispersion or a solution), the term "aqueous" (e.g., aqueous solution, aqueous dispersion, aqueous mixture) refers to a mixture (e.g., a dispersion or a solution) that includes water as a solvent with material(s) or chemical species dissolved or dispersed therein. The term "nonaqueous" refers to a material or chemical species that is not dissolve or dispersed in water. The terms non-aqueous and nonaqueous can be used interchangeably herein and are intended to be equivalent. In reference to a mixture (e.g., a dispersion or a solution), the term "nonaqueous" (e.g., nonaqueous solution, nonaqueous dispersion, nonaqueous mixture) refers to a mixture having a non-water solvent with at least one material and/or chemical species dissolved or dispersed in the non-water solvent. The term "water-miscible" refers to a chemical species (e.g., a non-water solvent, a photosensitive binder) that is miscible in water.

The term "non-water" in reference to a solvent refers to a solvent other than water. Exemplary non-water water-miscible solvents include, but are not limited to, dimethyl sulfoxide (DMSO), N,N-dimethylformamide (DMF), isopropanol, methanol, glycerol, ethanol, and any combinations of these.

The term "mixture" refers to a liquid mixture comprising one or more liquid solvents (e.g., water and/or a non-water water-miscible solvent) and one or more chemical species dissolved and/or dispersed in the one or more solvents. Solutions, dispersions, and suspensions are exemplary mixtures. For example, a mixture can be a solution, a dispersion, or a suspension. A mixture can be a homogeneous or a heterogeneous mixture. Preferably, but not necessarily, a mixture is a homogeneous mixture, wherein the one or more dissolved and/or dispersed chemical species are homogeneously, or uniformly, dissolved and/or dispersed in the one or more solvents of the homogeneous mixture. Chemical species dispersed and/or dissolved in a mixture can include, but are not limited to, ions (e.g., ions of salt(s)), photosensitive binders, polymers, colloidal particles (such as colloidal nanoparticles), UV-blockers, photoinitiators, and combinations of these. As used herein, solutions and colloids are exemplary dispersions. A solution refers to a homogenous liquid mixture in which one or more chemical species, such as salts (or ions thereof) and/or molecules are dissolved (solvated by the one or more solvents). Preferably, but not necessarily, a solution does not comprise nanoparticles (e.g., metal-containing nanoparticles; e.g., metal nanoparticles) dispersed therein. Optionally, a solution can have only trace or impurity levels of metal-containing nanoparticles dispersed therein. Preferably, a homogeneous mixture, such as a homogeneous dispersion, is microscopically homogeneous. Preferably, individual particles of a mixture (e.g., a dispersion) are not distinctly visible to the naked. Preferably, individual particles of a mixture (e.g., a dispersion) are less than 100 µm in size, preferably less than 60 µm is size, more preferably less than 50 µm in size, further more preferably less than 10 µm in size, further more preferably less than 1 µm in size, and optionally less than 100 nm in size. For example, particles in a mixture (e.g., a dispersion) can be solid objects (e.g., polymer particles; e.g., metal or ceramic nanoparticles) or liquid objects (e.g., micelles; e.g., particles of a liquid immiscible in the continuous liquid phase, such as in the case of an emulsion). Preferably, a dispersion is not a suspension having sedimented or sedimenting particles is not a dispersion. Preferably, a dispersion is not a suspension having sedimented or sedimenting particles that are greater than 10 µm, or greater than 50 µm, in size.

The term "blank" in reference to a hydrogel (e.g., blank hydrogel) or an organogel (e.g., blank organogel) refers to a hydrogel or organogel, respectively, that is capable of and does take up (e.g., swell-in; e.g., via diffusion, absorption, and/or adsorption) metal-containing species, such as metal salts or metal ions, during a method for making a metal-containing material, such as any method for making a metal-containing material disclosed herein, such as during a step of swelling of any method for making a metal-containing material disclosed herein. Preferably, but not necessarily, each of any blank hydrogel and any blank organogel has less than or equal to 0.5 wt. % of a metal and metal-containing chemical species (e.g., metal salts, metal ions, metal-containing nanoparticles). Preferably, but not necessarily, each of any blank hydrogel and any blank organogel has less than or equal to 0.6 wt. %, preferably less than or equal to less than 0.5 wt. %, more preferably less than or equal to 0.4 wt. %, optionally less than or equal to 0.3 wt. %, optionally less than or equal to 0.2 wt. %, optionally less than or equal to 0.1 wt. %, less than or equal to 0.05 wt. %, and optionally less than or equal to 0.01 wt. %, of a metal and metal-containing chemical species (e.g., metal salts, metal ions, metal-containing nanoparticles). Preferably, each of any blank hydrogel and any blank organogel can be independently characterized as being free of metal and metal-containing species other than photoinitiator(s) and UV-blocker(s). Generally, a "blank" mixture refers to a mixture that is free of metal and metal-containing species other than photoinitiator(s) and UV-blocker(s). Optionally, a blank mixture can have trace or impurity amounts of metal(s) or metal-containing species. A "blank aqueous mixture" refers to a mixture capable of and used to form a blank hydrogel, such as via a photopolymerization process performed on the blank aqueous mixture. A "blank nonaqueous mixture" refers to a mixture capable of and used to form a blank organogel, such as via a photopolymerization process performed on the blank nonaqueous mixture. A "blank mixture", such as "blank solution," used during a leaching step, such as a leaching step according to any method for making a metal-containing material disclosed herein, wherein the metal-containing hydrogel leaches metal-containing species into the blank mixture, refers to a mixture capable of and used to accept metal-containing species from a (leaching) metal-containing hydrogel (thereby facilitating leaching of the metal-containing hydrogel. Preferably, a blank mixture, such as a blank aqueous mixture or a blank nonaqueous mixture, has less than or equal to 0.5 wt. % of a metal and metal-containing chemical species (e.g., metal salts, metal ions, metal-containing nanoparticles). Optionally, a blank mixture has less than or equal to 0.6 wt. %, optionally less than or equal to 0.5 wt. %, optionally less than or equal to 0.4 wt. %, optionally less than or equal to 0.3 wt. %, optionally less than or equal to 0.2 wt. %, optionally less than or equal to less than 0.1 wt. %, optionally less than or equal to 0.05 wt. %, and optionally less than or equal to 0.01 wt. %, of a metal and metal-containing chemical species. Optionally, a blank mixture has less than or equal to 500 mM, optionally less than or equal to 300 mM, optionally less than or equal to 100 mM, optionally less than or equal to 50 mM, optionally less than or equal to 20 mM, optionally less than or equal to 10 mM, optionally less than or equal to less than 5 mM, optionally less than or equal to 1 mM, and optionally less than or equal to 0.1 mM, of a metal and metal-containing chemical species.

The term "wt. %" refers to a weight percent by weight. The term "mol. %" refers to molar percent or percent by moles.

As used herein, a resin refers to a mixture that comprises binders, such as monomers, macromolecules, and/or polymers. As used herein, a photoresin is a resin comprising one or more photosensitive binders. An aqueous precursor mixture comprising one or more aqueous photosensitive binders is an example of a photoresin. An aqueous blank mixture comprising one or more aqueous photosensitive binders is an example of a photoresin. A nonaqueous blank mixture comprising one or more nonaqueous photosensitive binders is an example of a photoresin.

As used herein, the term "polymer" refers to a molecule composed of repeating structural units connected by covalent chemical bonds often characterized by a substantial number of repeating units (e.g., equal to or greater than 3 repeating units, optionally, in some embodiments equal to or greater than 10 repeating units, in some embodiments greater or equal to 30 repeating units) and a high molecular weight (e.g. greater than or equal to 10,000 Da, in some embodiments greater than or equal to 50,000 Da or greater than or equal to 100,000 Da). Polymers are commonly the polymerization product of one or more monomer precursors. The term polymer includes homopolymers, or polymers consisting essentially of a single repeating monomer subunit. The term polymer also includes copolymers which are formed when two or more different types of monomers are linked in the same polymer. Copolymers may comprise two or more monomer subunits, and include random, block, brush, brush block, alternating, segmented, grafted, tapered and other architectures. Useful polymers include organic polymers or inorganic polymers that may be in amorphous, semi-amorphous, crystalline or semi-crystalline states. Polymer side chains capable of cross linking polymers (e.g., physical cross linking) may be useful for some applications.

The term "photopolymerization" refers a process that uses electromagnetic radiation, such as light, such as visible light, infrared light, and/or ultra-violet light, to initiate and propagate a polymerization or cross-linking reaction between or among cross-linkable materials or chemical species. Photolithography is a non-limiting example of a photopolymerization process.

The term "additive manufacture process" refers to a process for forming a material, a structure, or feature via deposition, or otherwise building up, of a material. The terms "additive manufacture process" and "additive manufacturing process" may be used interchangeably. An additive manufacture process can involve layer-by-layer and/or continuous or volume deposition of a material to form a three-dimensional structure or element. The deposited material may include, but is not limited to, inorganic materials, hybrid organic-inorganic materials, polymers, metals, or combinations of these. Exemplary additive manufacture processes include, but are not limited to, 3D printing, stereolithography (SLA), continuous liquid interface production, fused deposit modeling (FDM), 2-photon lithography, digital light processing (DLP), continuous liquid interface production, micro-stereolithographic (μ-SLA), interference lithography, holographic lithography, stimulated emission depletion (STED) lithography, vat photopolymerization, material extrusion, material jetting, and powder bed fusion. In some embodiments, an additive manufacture process does not require a subtractive manufacture to form the structure or element. Examples of subtractive manufacture processes include, but are not limited to, milling, machining, electron discharge machining, carving, shaping, grinding, drilling, and etching. In an embodiment, an additive manufacture process involves or is aided by computer-aided design (CAD).

As used herein, the term "thermal treatment" or "thermally treating" refers to a thermal/heat treatment such as, but not limited to, calcination, pyrolysis, sintering, high-temperature annealing, and any combinations of these. During thermal treatment, a material being thermally treated, such as a metal-containing hydrogel, is exposed to heat and an atmosphere, referred to as a "thermal-treatment atmosphere". The thermal-treatment atmosphere refers to chemical species, or lack thereof, in the gas/vapor space to which the thermally treated material (e.g., a hydrogel) is exposed during the thermal treatment. For example, the thermal-treatment atmosphere can include one or more gaseous or vapor chemical species. For example, the thermal-treatment atmosphere can be characterized as a vacuum (i.e., the lack of gaseous or vapor chemical species; i.e., having none or a low concentration of gaseous or vapor chemical species). For example, a thermal-treatment atmosphere can be a reactive atmosphere, such that at least one gaseous or vapor chemical species of the thermal-treatment atmosphere chemically interacts with the material being thermally treated during the thermal treatment. For example, a thermal-treatment atmosphere can be a reducing atmosphere, such that a chemical interaction of the thermal-treatment atmosphere (or at least one gaseous or vapor chemical species thereof) during thermal treatment with the material being thermally treated chemically reduces the material. For example, a thermal-treatment atmosphere can be an oxidizing atmosphere, such that a chemical interaction of the thermal-treatment atmosphere (or at least one gaseous or vapor chemical species thereof) with the material being thermally treated during thermal treatment chemically oxidizes said material. For example, a thermal-treatment atmosphere can be an inert atmosphere, such that no chemical interaction (or, substantially or essentially no chemical interaction) occurs between the gaseous or vapor species of the thermal-treatment atmosphere and the material being thermally treated during thermal treatment. For example, a composition of at least a portion of the metal-containing material is indirectly determined by the thermal-treatment being an inert atmosphere. For example, a composition of at least a portion of the metal-containing material is indirectly determined by the thermal-treatment being an inert atmosphere via the lack of a chemical interaction between the metal-containing hydrogel or metal-containing material and the thermal atmosphere, because the inert atmosphere is not an oxidizing or a reducing atmosphere. As used herein, oxidation or oxidizing of a material or species refers to an increase in an oxidation state of said material or species (e.g., loss of electrons with respect to the material or species before its undergoing oxidation). Oxidation can include incorporation of oxygen atoms, via chemical reaction, in the oxidized material or species. As used herein, reduction or reducing of a material or species refers to a decrease in an oxidation state of said material or species (e.g., gain of electrons with respect to the material or species before its undergoing reduction).

The term "swelling" refers to a first material, such as a hydrogel or an organogel, taking up at least one other material and/or chemical species (e.g., metal ion(s)) such that said at least one other material and/or chemical species becomes a part of the composition of said first material. Preferably, but not necessarily, swelling refers to the taking up of at least one metal and/or metal-containing species (e.g., metal salt; e.g., metal ions). Swelling, or the "taking up," can occur by absorption, adsorption, and/or diffusion, for example, of said at least one other material and/or chemical species into said first material. The term "leaching" refers to a first material, such as a hydrogel or an organogel, releasing or losing at least one other material and/or chemical species (e.g., metal ion(s)) such that said first material's composition has less of said at least one other material and/or chemical species due to the leaching thereof. Leaching can occur by absorption, adsorption, and/or diffusion, for example, of said at least one other material and/or chemical species out of said first material. Preferably, but not necessarily, leaching refers to the release/loss of at least one metal and/or metal-containing species (e.g., metal salt; e.g., metal ions). Preferably, the swelling is a process involving a liquid mixture wherein the first material (e.g., a hydrogel or an organogel) is exposed to a liquid mixture (e.g., an aqueous metal salt mixture), in which the at least one other material and/or chemical species (preferably, at least one metal and/or metal-containing species) is dispersed or dissolved, such that the at least one other material and/or chemical species (preferably, at least one metal and/or metal-containing species) is taken up from said liquid mixture (e.g., an aqueous metal salt mixture) into the first material (e.g., a hydrogel or an organogel). Optionally, the taken-up at least one other material and/or chemical species remains dispersed or dissolved in a solvent in the first material. For example, a hydrogel or an organogel may take up a mixture of water and at least one aqueous metal salt, where at least a portion of the taken-up at least one metal salt remains dissolved in the mixture. Preferably, the leaching is a process involving a liquid wherein the first material (e.g., a metal-containing hydrogel) is exposed to a liquid solvent, which is optionally a blank mixture, into which the at least one other material and/or chemical species (preferably, at least one metal and/or metal-containing species) is released from the first material (e.g., a metal-containing hydrogel). Optionally, the released at least one other material and/or chemical species becomes dispersed or dissolved in said liquid solvent during the leaching.

The term "macroscopically monolithic" refers to a material, system, structure, geometry, or other element that is a unitary interconnected and continuous element. In an embodiment, a macroscopically monolithic element is formed or composed of a material without joints or seams. In an embodiment, the term "interconnected" refers to a system, structure, geometry, or other element of which every first portion or first feature is either (i) directly connected to a second portion or second feature of the system, structure, geometry, or other element, or (ii) indirectly connected to a second portion or second feature of the system, structure, geometry, or other element via a third portion or third feature of the system, structure, geometry, or other element. In an embodiment, no portion or feature of an interconnected system, structure, geometry, or other element is fully isolated from the rest of the system, structure, geometry, or other element. In an embodiment, the term "continuous" refers to a system, structure, geometry, or other element of which every first portion or first feature is directly or indirectly bonded to, fused with, or otherwise belongs to the same uninterrupted phase with respect to a second portion or second feature of system, structure, geometry, or other element. In an embodiment, two features which are connected merely by superficial contact (e.g., touching) but are otherwise isolated with respect to each other, are not continuous. In an embodiment, two distinct features, such as fibers or particles, which are merely touching or are woven together may be interconnected but are not continuous with respect to each other. In an embodiment, a structure or geometry consisting of a plurality of features, such as fibers or particles, each of which is merely touching or woven together with another feature, such as a fiber or particle, may be an interconnected structure or geometry but is not a continuous structure or geometry. The term macroscopically monolithic does not and is not intended to describe a size of the material or element. An element can be microscopic or nanoscopic and be characterized as having a macroscopically monolithic structure as described here.

The term "deterministic" refers a system, structure, geometry, or other element characterized by at least one feature and/or at least one property (e.g., spatial variation of composition, magnetism, electrical conductivity, and/or thermal conductivity, etc.) that is known and/or controlled to be within 20%, preferably within 10%, more preferably within 5%, more preferably within 1%, or more preferably within 0.1% of a determined or desired value. In an embodiment, a deterministic geometry is characterized one or more features each independently having at least one physical dimension which, prior to or during formation of said structure, is pre-determined to be within 20%, preferably within 10%, more preferably within 5%, more preferably within 1%, or more preferably within 0.1% of a determined or desired value. For example, a deterministic architected three-dimensional geometry of a structure comprises a plurality of features, such as trusses, having one or more physical dimensions (e.g., width, thickness, diameter, length) the values of which are within 20%, preferably within 10%, more preferably within 5%, more preferably within 1%, or still more preferably within 0.1% of the value(s) of the one or more physical dimensions designed, such as via a CAD technique, or determined prior to formation of the structure. Stochastic geometries or structures, such as random or natural foams, are not deterministic.

The term "architected" refers to a system, structure, geometry, or feature having features that are designed and formed according to the design. In an embodiment, an architected structure is deterministic or formed according to deterministic process(es). In an embodiment, substantially all features, and physical dimensions thereof, are designed, or pre-determined, and formed according to the design such that the substantially all features, and physical dimensions thereof, are substantially equivalent to those of the design. Preferably, as used herein, an architected metal-containing material is a nano- or micro-architected material (having a nano- or micro-architected structure).

The term "three dimensional geometry" refers to a geometry characterized by a three-dimensional geometric configuration. In an embodiment, a structure has a three dimensional geometry when a three-coordinate system of physical space is required to fully describe the physical dimensions of a unit cell of the structure. A three dimensional geometry may be nano-architected and/or micro-architected. In an embodiment, a structure characterized by a nano-architected three dimensional geometry is a structure characterized one or more features having at least one physical size dimension (e.g., length, width, diameter, or height) the value of which is in the range of approximately 1 nm to less than 1 μm. The one or more "features" include, but are not limited to, beams, struts, ties, trusses, sheets, shells, and nodes. In an embodiment, a structure characterized by a nano-architected three dimensional geometry is a structure characterized by a unit cell having whose at least one physical size dimension (e.g., length, width, or height) the value of which is in the range of approximately 1 nm to less than 1 μm. In an embodiment, a structure characterized by a micro-architected three dimensional geometry is a structure characterized one or more features having at least one physical size dimension (e.g., length, width, or height) the value of which is in the range of approximately 1 μm to 1000 μm. In an embodiment, a structure characterized by a micro-architected three dimensional geometry is a structure characterized by a unit cell having at least one physical size dimension (e.g., length, width, or height) the value of which is in the range of approximately 1 μm to 1000 μm.

As used herein, a "feature" of a system or material, such as a metal-containing material according to an embodiment, structure, or geometry, such as a three-dimensional geometry according to an embodiment, refers to an element such as, but not limited to, a beam, a strut, a tie, a truss, a sheet, a shell, a sphere, an ellipse, a node, or a combination of these. In an embodiment, a fillet, a bevel, a chamfer, or similar attribute is a portion of a feature but is not a feature itself. For example, a fillet, or rounding of an interior or exterior corner, is a portion of one or more features but is not a "feature", as used herein, itself. For example, a fillet between a first truss and a second truss is a portion of the first truss, of the second truss, or a portion of each of the first and second trusses, but the fillet is not itself a "feature", as used herein, of the three-dimensional geometry or structure. A "longitudinal feature" refers to an element whose length (or, size along its longitudinal axis) is at least 50% greater than each of its other characteristic size dimensions (i.e., width, height, thickness, or diameter). Exemplary longitudinal feature may include, but are not limited to, beams, struts, ties, and trusses. In an embodiment, a surface feature is a feature that may be better characterized as a flat and/or curved planar feature than a longitudinal feature. In an embodiment, a surface feature corresponds to a feature that may be approximated or characterized as a mathematical two-dimensional manifold, having a uniform or non-uniform thickness. In an embodiment, a surface feature corresponds to a feature that may be approximated or characterized as a mathematical two-dimensional manifold, having a uniform or non-uniform thickness, and is an open surface. Exemplary surface features include, but are not limited to, sheets and shells.

The term "cross-sectional physical dimension" refers to a physical dimension of a feature measured in a transverse or cross-sectional axis. In an embodiment, the transverse axis is perpendicular to a longitudinal axis of the feature. In an embodiment, a cross-sectional physical dimension corresponds to a width or a diameter of a feature such as a beam, strut, or tie. In an embodiment, a longitudinal physical dimension is a dimension of a feature along the longitudinal axis of the feature, wherein the longitudinal axis is perpendicular to a cross-sectional axis. Optionally, the longitudinal physical dimension is measured between two nodes. Optionally, the longitudinal physical dimensions is measured between physical ends of a structure.

The term "unit cell" refers to the smallest arrangement, configuration, or geometry of a plurality of features such that an entire structure, or three-dimensional geometry thereof, characterized by said unit cell can be formed by repetition of said unit cell. For example, repetition of the unit cell in three dimensions may form a three-dimensional structure. The entire structure may be a three-dimensional structure, such as a three-dimensional porous structure.

The term "average," when used in reference to a material or structure property, refers to a calculated arithmetic mean of at least two, or preferably at least three, identical measurements or calculations of said property. For example, an average density of a structure is the arithmetic mean of at least two measurements performed identically, of the density of said structure.

The term "density" refers to volumetric mass density. Density is represented in units of mass-per-volume (e.g., $g/cm^3$). When referring to a material, the term density corresponds to the volumetric mass density of the material. When referring to a structure, the term density corresponds to the volumetric mass density of the structure, which is a function of the geometric configuration (geometry) of the structure as well as a function of the material(s) of which the structure is formed, such that an increase in porosity of said structure corresponds to a decrease in density of said structure. The density of a structure, such as a structure having a three-dimensional geometry according to an embodiment of the invention, may be measured according a method conventionally known, or not yet known, in the art. For example, the density of a structure may be determined by determining mass, height, and diameter for a disk-shape sample, and then calculating the determined mass divided by volume for the sample, with assuming the sample is substantially a complete circle.

The term "relative density" refers to a volume fraction of solid material in a composite material system, structure, or feature. In an embodiment, a relative density corresponds to a ratio of density of a structure to density solid material (or the combination of materials), of which the structure is composed. Relative density may be represented as a fraction (the ratio of densities) or as a percentage (the ratio of densities×100%). In an embodiment, relative density of a structure, or a three-dimensional geometry thereof, before pyrolysis is substantially the same to that after pyrolysis.

The term "specific strength" refers to a ratio of strength to density of a material, system, structure, or feature where strength refers to force per unit area at the point of failure of the material, element, or structure. Specific strength may also be referred to as strength-to-weight ratio. In an embodiment, "strength" refers to compressive strength. In an embodiment, "strength" refers to tensile strength. In an embodiment, compressive strength is the maximum stress a material can sustain under crush loading. In an embodiment, compressive strength of a material, structure, or element that fails by shattering fracture can be defined within fairly narrow limits as an independent property. In an embodiment, the compressive strength of a material, structure, or element that does not shatter in compression is the amount of stress required to distort the material an arbitrary amount. In an embodiment, compressive strength of a material, structure, system, feature, or element that does not shatter in compression can be calculated as the stress at a 0.2% strain offset from the linear portion in a stress-strain curve. In an embodiment, compressive strength is calculated by dividing the maximum load, on the material, structure, or element, by the original cross-sectional area of the material, structure, or element being examined.

The term "stiffness" refers to an extent to which a material, structure, system, or feature resists deformation in response to an applied force. Stiffness corresponds to a ratio of force applied to a material, structure, or element versus the displacement produced by the applied force along the same degree of freedom (e.g., same axis or direction) exhibited by the material, structure, or element. The term "specific stiffness" refers to a ratio of stiffness to density of the material, element, or structure. In an embodiment, the stiffness of a material, structure, or element is the Young's modulus of the material, structure, or element.

The term "node" may refer to a junction or intersection of a plurality of features, such as beams or struts. A structure may have a three-dimensional geometry that is a node-free geometry.

The term "core," when referring to a feature of a structure having a three-dimensional geometry, according to an embodiment, refers to an inner volume of the feature up to and excluding the external surface of the feature. In an embodiment, the core of a feature corresponds to the feature's internal volume excluding that of any coatings, particularly coatings introduced after a pyrolysis process, present thereon.

The term "pre-polymer" or "prepolymer" refers to a monomer or mixture comprising one or more monomers where the monomer(s) have been reacted to an intermediate molecular mass state. The prepolymer is capable of undergoing further polymerization to a fully cured higher molecular weight state. In some embodiments, the terms prepolymer and monomer may be used interchangeably.

The term "substantially" refers to a property that is within 10%, within 5%, within 1%, or is equivalent to a reference property. The term "substantially equal", "substantially equivalent", or "substantially unchanged", when used in conjunction with a reference value describing a property or condition, refers to a value that is within 10%, optionally within 5%, optionally within 1%, optionally within 0.1%, or optionally is equivalent to the provided reference value. For example, a ratio is substantially equal to 1 if it the value of the ratio is within 10%, optionally within 5%, optionally within 1%, or optionally equal to 1. The term "substantially greater", when used in conjunction with a reference value describing a property or condition, refers to a value that is at least 2%, optionally at least 5%, or optionally at least 10% greater than the provided reference value. The term "substantially less", when used in conjunction with a reference value describing a property or condition, refers to a value that is at least 2%, optionally at least 5%, or optionally at least 10% less than the provided reference value.

The term "electrochemical cell" refers to devices and/or device components that convert chemical energy into electrical energy or electrical energy into chemical energy. Electrochemical cells have two or more electrodes (e.g., positive and negative electrodes) and one or more electrolytes. For example, an electrolyte may be a fluid electrolyte or a solid electrolyte. Reactions occurring at the electrode, such as sorption and desorption of a chemical species or such as an oxidation or reduction reaction, contribute to charge transfer processes in the electrochemical cell. Electrochemical cells include, but are not limited to, primary (non-rechargeable) batteries and secondary (rechargeable) batteries. In certain embodiments, the term electrochemical cell includes metal hydride batteries, metal-air batteries, fuel cells, supercapacitors, capacitors, flow batteries, solid-state batteries, and catalysis or electrocatalytic cells (e.g., those utilizing an alkaline aqueous electrolyte).

The term "electrode" refers to an electrical conductor where ions and electrons are exchanged with the aid of an electrolyte and an outer circuit. The term "negative electrode" refers to the electrode that is conventionally referred to as the anode during discharging of the electrochemical cell. During charging of the electrochemical cell, the negative electrode is one that is conventionally referred to as the cathode. The negative electrode may comprise a porous structure. An exemplary negative electrode includes, but is not limited to, a carbon allotrope such as graphite, graphitic carbon, or glassy carbon. The term "positive electrode" refers to the electrode that is conventionally referred to as the cathode during discharging of the electrochemical cell. During charging of the electrochemical cell, the positive electrode is one that is conventionally referred to as the anode. An exemplary positive electrode includes, but is not limited to, lithium cobalt oxide.

"Active material" refers to the material in an electrode that takes part in electrochemical reactions which store and/or deliver energy in an electrochemical cell.

The term "porous" refers to a material, element, or structure that has porosity. The term "porosity" refers to the amount of a material or structure, such as a three-dimensional structure of an electrode, corresponding to an absence of said material or structure, such as absence corresponding to pores, such as apertures, channels, voids, etc. Porosity may be expressed as the percentage of the volume of a material, structure or device component, such as an electrode or a three-dimensional structure of an electrode, which corresponds to pores, such as apertures, channels, voids, etc., relative to the total volume occupied by the material, structure or device component. In an embodiment, an electrode comprises a porous structure having a three-dimensional geometry, wherein the porous structure is characterized by a porosity selected from the range of 20% to 95%, preferably for some applications a porosity selected from the range of 50% to 95%, and optionally for some applications 60% to 95%. In some embodiments, porosity of a material, such as a carbon allotrope material, refers to porosity of within an individual feature, or portion thereof, that is formed of said material. For example, porosity of a carbon allotrope material of a structure may refer to porosity of a feature, such as a beam or strut, that is formed of said carbon allotrope material. Pores of a porous material may be characterized by an average diameter selected from the range of 1 nm to 1000 nm. In an embodiment, the average diameter of the pores of a material is less than the cross-sectional diameter of a feature formed of the material.

Greer, et al. (U.S. application Ser. No. 16/151,186, filed Oct. 3, 2018) and Portela, et al. (U.S. application Ser. No. 16/206,163, filed Nov. 30, 2018) are incorporated herein by reference in their entirety, to the extent not inconsistent herewith. Greer, et al., and Portela, et al., include additional descriptions of photopolymerization techniques, additive manufacturing, and structural or geometrical features, for example.

In an embodiment, a composition or compound of the invention, such as an alloy or precursor to an alloy, is isolated or substantially purified. In an embodiment, an isolated or purified compound is at least partially isolated or substantially purified as would be understood in the art. In an embodiment, a substantially purified composition, compound or formulation of the invention has a chemical purity of 95%, optionally for some applications 99%, optionally for some applications 99.9%, optionally for some applications 99.99%, and optionally for some applications 99.999% pure.

DETAILED DESCRIPTION OF THE INVENTION

In the following description, numerous specific details of the devices, device components and methods of the present invention are set forth in order to provide a thorough explanation of the precise nature of the invention. It will be apparent, however, to those of skill in the art that the invention can be practiced without these specific details.

Technical ceramics are one of the most important classes of materials being used in the world today. These engineered ceramics exhibit all kinds of unique mechanical, electrical, thermal and even biochemical properties[1-4], and have found application in virtually every scientific and engineering field. However, one key challenge that is still being faced in industry is in the shaping and production of these advanced ceramics. Manufacturing processes that work for metals and polymers, such as casting or machining cannot be applied to ceramics due to their high melting points and hardness[5]. To circumvent this, alternative processes like pressing, molding and casting have been developed specifically for ceramics. Unfortunately, these processes still have their limitations. For example, while pressing of ceramic powders is relatively simple and inexpensive, only simply shaped parts can be achieved. On the other hand, techniques like molding or casting all require the use of expensive molds, making them inappropriate in areas where rapid prototyping is desired[6].

In recent years, 3D printing of ceramics has become a significant area of interest as it has the potential to remove the geometrical limitations associated with the current state of the art of ceramic processing. Currently, there exist many techniques for additive manufacturing of ceramic materials. They can be broadly categorized into direct or indirect processes[7]. In direct processes, the 3D printed parts are fabricated in a single process where the geometric shape and the material properties are achieved at the same time. Examples of these processes are selective laser melting and selective laser sintering, where thermal energy selectively fuses regions of a powder bed of ceramics particles into the desired shape. In indirect processes, the part is fabricated in a multistep process where the first step shapes the part, and a subsequent one consolidates the part into the actual ceramic material. Typical examples of this are binder jetting and stereolithography, where ceramic powders/precursors are shaped via the use of a binder material, which is then removed during a second heat treatment[8].

Although indirect processes require more processing stages and are thus more time consuming, they have started to gain popularity due to the versatility of materials that can be made and the low cost of equipment compared to that of direct processes[8,9]. In particular, processes involving photolithography have emerged as one of the most promising ones due to the high resolution and small feature sizes achievable[10]. These photolithography systems typically consist of photosensitive slurries, where fine powders of the desired ceramic of choice are dispersed in a photosensitive organic binder. By selectively exposing certain parts of the slurry to radiation of the appropriate wavelength, the binder can be cured into a desired shape, trapping the ceramic powder within as well. A subsequent high temperature treatment then burns off the organic binder and sinters together the remaining ceramic powders into a dense ceramic part[11-14]. The advantages of these systems are that it's simple and versatile—as long as the desired ceramic can be obtained in powder form and can be dispersed in a photosensitive binder, the slurry can be obtained and the part 3D printed. However, for a part to survive the high temperature process, the slurry has to have a high loading of ceramic particles, somewhere between the ranges of 45-70 volume percent, which results in a host of other issues. At such high loadings, the viscosity of the slurry increases significantly, making it difficult to print[15,16]. Homogenous dispersion of the ceramic powder also becomes challenging at such high viscosities[17]. Furthermore, the solid ceramic particles increase the refractive index of the resin and scatter the incident light, reducing both the cure depth and the dimensional accuracy of the print[18,19].

To circumvent these problems, an alternative technique centered on the use of preceramic polymers was developed recently[20], where an inorganic polymer photoresist is used in the printing process. These inorganic polymers often have heteroatoms in their backbone such as Si and B, amongst others, which can then be converted on pyrolysis into one of many Si-based ceramics[21-23]. In this case, the inorganic polymer is both the binder and ceramic precursor at the same time. While this method avoids the use of slurries, and addresses the problem of loading and homogeneity, these preceramic polymers are often not commercially available and need to be synthesized[24-26]. Furthermore, aside from the work by Vyatskikh et al[24], almost all of the preceramic polymers being used result in Si-based ceramics, limiting the type of ceramics that can be made.

There thus exists a need to develop new techniques that combines the best of both systems, the ease and versatility of using ceramic powders with the homogeneity and low viscosities afforded by the preceramic polymers.

The invention can be further understood by the following non-limiting examples.

Example 1: 3D Printing of Metal Containing Structures Via a Metal Salt-Containing Aqueous Photoresin This example presents a method of manufacturing metal-containing materials via a two-step process: a) fabrication of a metal-containing hydrogel material via photolithography of a metal-salt containing aqueous photoresin and b) thermal treatment (e.g., pyrolysis or calcination) of the aforementioned preceramic hydrogel material.

Demonstrated here are simple inexpensive method to fabricate 3D printed metal-containing structures via a multistep process where first, a metal-containing hydrogel part is printed via photolithography from an aqueous photoresin, followed by thermal treatment (e.g., pyrolysis) of the aforementioned metal-containing hydrogel. The aqueous photoresin (or, aqueous precursor mixture) is a homogenous mixture of dissolved metal salts, water and water-soluble binders, photoinitiators and UV blockers. Advantageous of this process include that any water-soluble metal salt can be used, resulting in a wide variety of ceramics that can be produced using this methodology. These aqueous resins are homogenous and have low viscosities since the dissolution of the metal salts does not increase the viscosity of the water substantially.

The present disclosure includes a general approach for fabricating 3D printed metal-containing parts via a two-step process where, first, a part is fabricated via stereolithography from a metal-salt containing aqueous photoresin and then second, thermal treatment (e.g., pyrolysis) of the aforementioned part. This is described schematically in FIG. 1.

In terms of the preparation of the metal-salt containing photoresin, a number of different reagents can be used. Suitable water-soluble photosensitive binders of the present invention include but are not limited to poly(ethylene glycol) macromolecules with acrylate functional groups. Water-soluble photoinitiators that can be used include, but are not limited to ethyl(2,4,6-trimethylbenzoyl)-phenylphosphinate, Irgacure 2959, 7-diethylamino-3-theonoyl coumarin and lithium phenyl-2,4,6-trimethylbenzoylphosphinate. Similarly, suitable water-soluble UV blockers include, but are not limited to disodium 4,4'-bis(2-sulfostyryl)biphenyl. Since water is the primary solvent here, any water-soluble metal salt can be used, including but are not limited to metal nitrates and their hydrates and metal acetates and their hydrates. A metal salt is an ionic compound with a metal cation and a counter anion. Examples include but are not limited to: zinc nitrate, zinc nitrate hexahydrate, zinc chloride, zinc acetate, iron nitrate, iron nitrate nonahydrate, lithium nitrate, cobalt acetate, cobalt nitrate, cobalt nitrate hexahydrate and aluminum nonahydrate.

To fabricate the 3D printed part, any photolithography technique can be used. Suitable photopolymerization methods include but are not limited to: two-photon lithography, stereolithography, micro-stereolithography and projection micro-stereolithography.

The thermal treatment process is important to the fabrication process. If the 3D printed part (hydrogel) is thermally treated in an oxidizing atmosphere, then the final structure can be made of a metal oxide. On the other hand, if the hydrogel is thermally treated in an inert atmosphere, then metal carbides can be formed. And, if the hydrogel is thermally treated in a reducing atmosphere, then metal parts can be made.

Example 2: Zinc Oxide Structures Fabricated Via a Two-Stage Process of Two-Photon Lithography Followed by Thermal Treatment (e.g., Calcination)

1) Preparation of Metal-Salt Containing Aqueous Photoresin (an Aqueous Precursor Mixture)

To make zinc oxide, zinc ions need to be present in the aqueous precursor mixture. Thus, zinc nitrate was chosen as the metal salt of choice to be dissolved in the aqueous precursor mixture. 5 g of zinc nitrate hexahydrate is first dissolved in 1 mL of water. To this mixture, 2.67 mL of poly(ethylene glycol) diacrylate ($M_n$=575 g/mol) (PEGda) is added. A clear homogenous mixture is obtained. In a separate vial, 5.4 mg of 7-diethylamino-3-theonyl coumarin (DETC) is added to 400 μL of dimethyl sulfoxide to produce a yellow mixture. 50 μL of the DETC mixture is then added to 500 μL of the zinc/PEGda mixture to obtain an orange mixture. This is represented schematically in FIGS. 2A-2B.

2) Two-Photon Lithography of the Zinc Nitrate PEGda Aqueous Precursor Mixture

Figure 2A:
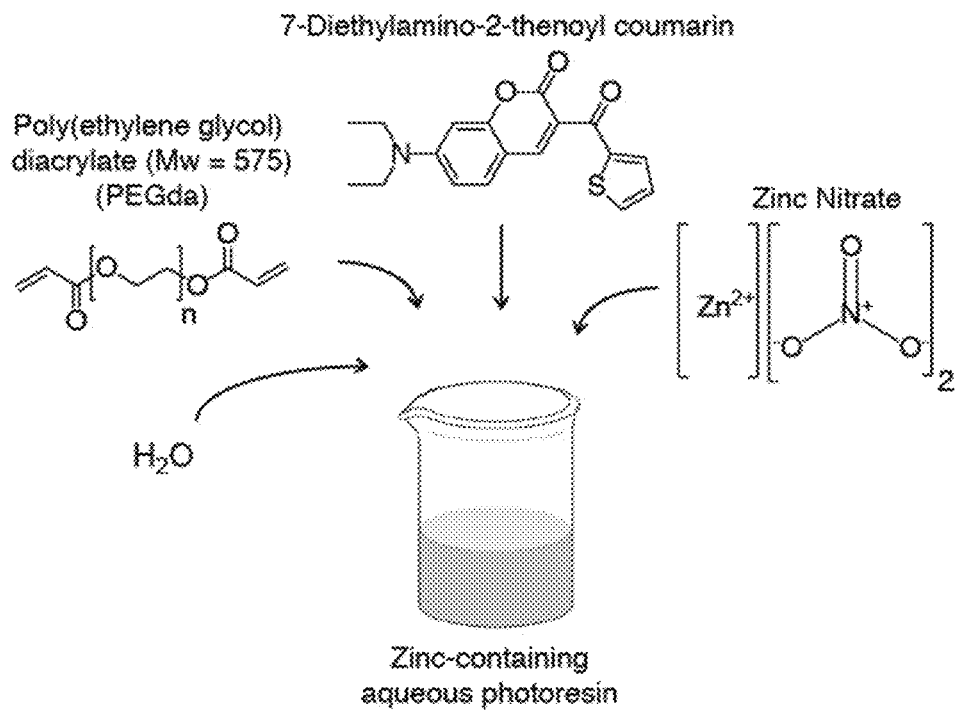
FIG. 2A. Preparation of the zinc nitrate PEGda aqueous resin.
Figure 2B:
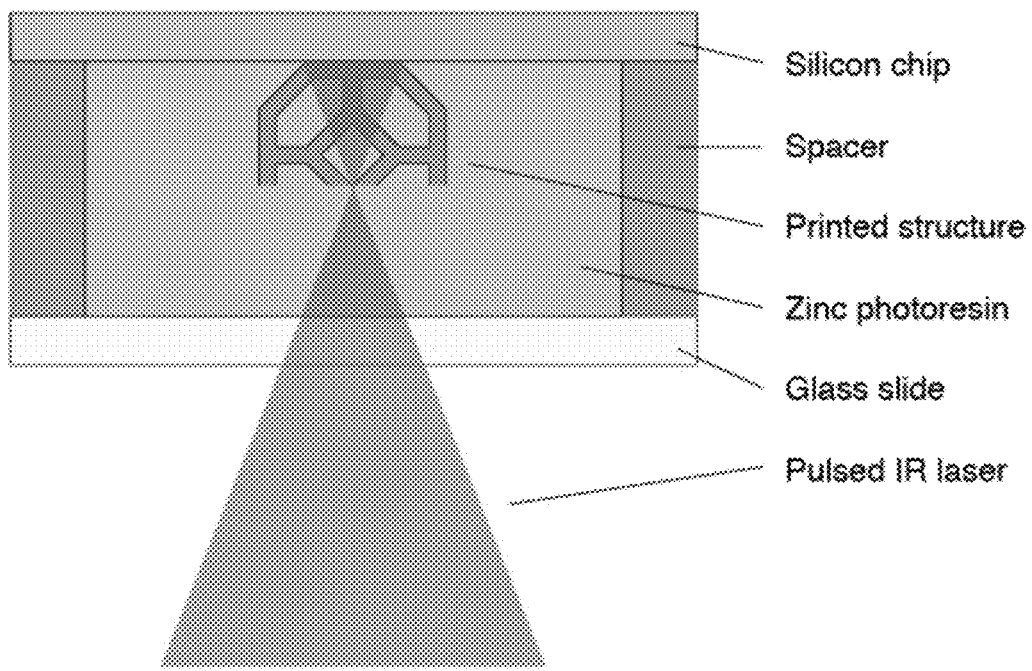
FIG. 2B. Schematic of the two-photon lithography process.
Figures 3A, 3B, 3C, 3D, 3E, 3F:
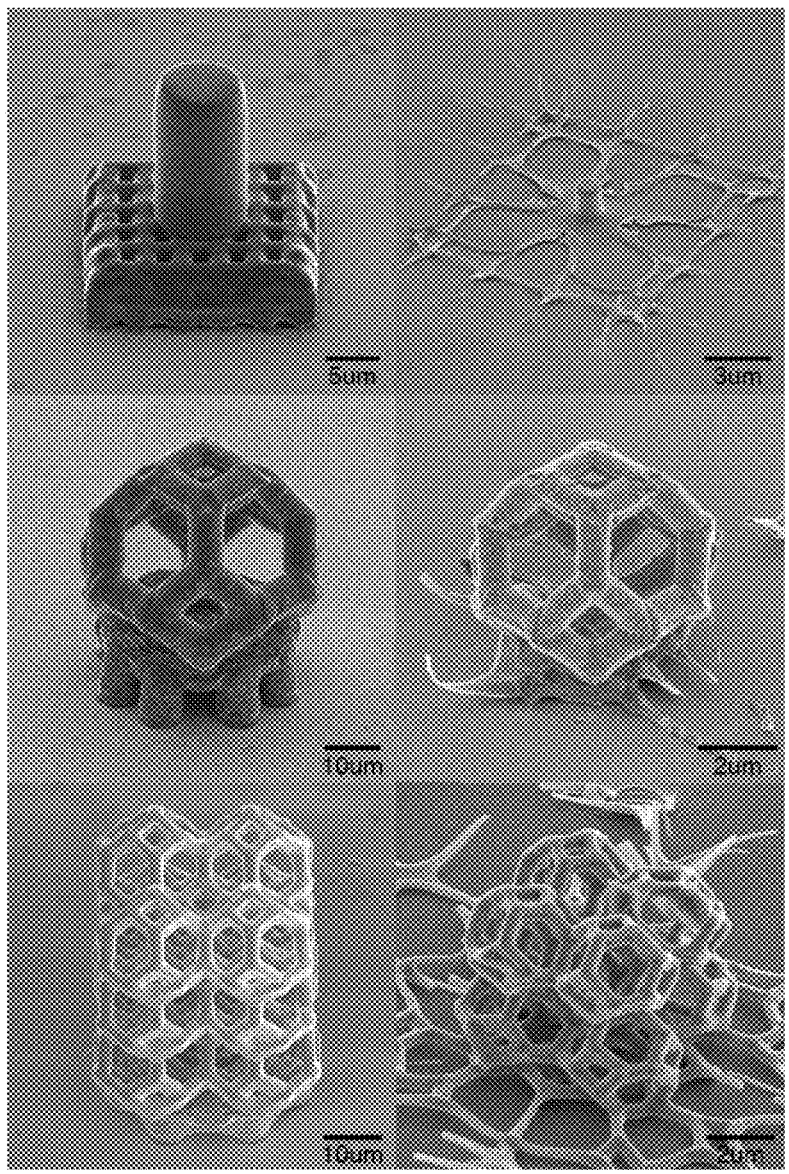
FIG. 3A. Pillar supported on a cubic lattice before calcination.
FIG. 3B. Same pillar depicted in FIG. 3A after the calcination process.
FIG. 3C. Tetrakaidecahedron unit cell on a support structure prior to calcination FIG. 3D. Tetrakaidecahedron unit cell post-calcination.
FIG. 3E. Tetrakaidecahedron lattice on a support structure before calcination.
FIG. 3F. Tetrakaidecahedron lattice after calcination.

Two-photon lithography was then used to fabricate 3D structures from the using the prepared zinc nitrate PEGda aqueous precursor mixture. This is depicted in FIGS. 2A-2B.

3) Calcination Process

The fabricated structures were then subjected to the following thermal treatment: a slow ramp of 0.5° C./min to 500° C. in air, followed by slow cooling to room temperature at a rate of 1° C./min in air. The structures before and after the thermal treatment process are shown in FIGS. 3A-3F. As seen, the net shapes of the structures are retained. The use of support structures is also critical to the thermal treatment process as evidenced by its use in all the structures shown in FIGS. 3A-3F.

4) Characterization

Figure 4:
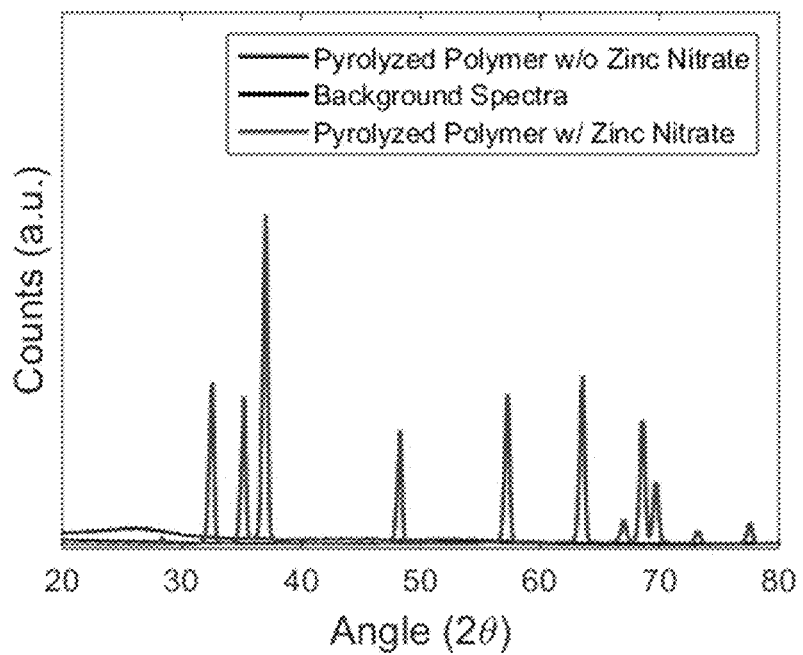
FIG. 4. XRD of samples made by calcining polymers made with the zinc nitrate aqueous resin and a control resin without the zinc nitrate. It is clear that the polymer containing the zinc nitrate resulted in a crystalline material post-calcination with peaks corresponding to that of zinc oxide, as indicated by the labeled peaks. The polymer without the zinc nitrate resulted in an amorphous spectra after calcination.

To determine the identity of the calcined material, a variety of characterization techniques were used. X-ray diffraction (XRD) was first used to determine the phase of the material. To prepare a large enough sample for XRD, the zinc nitrate PEGda aqueous resin was casted onto a mold and then exposed to UV light, resulting in the curing and formation of a large sample. As a control, another sample was made using a resin where the zinc nitrate was omitted. The samples were then treated with the same high temperature treatment described above. FIG. 4 shows the XRD pattern obtained from both calcined samples. It is clear from the spectra that calcination of the zinc nitrate containing polymer resulted in the formation of zinc oxide, as indicated by the labeled peaks.

Figure 5:
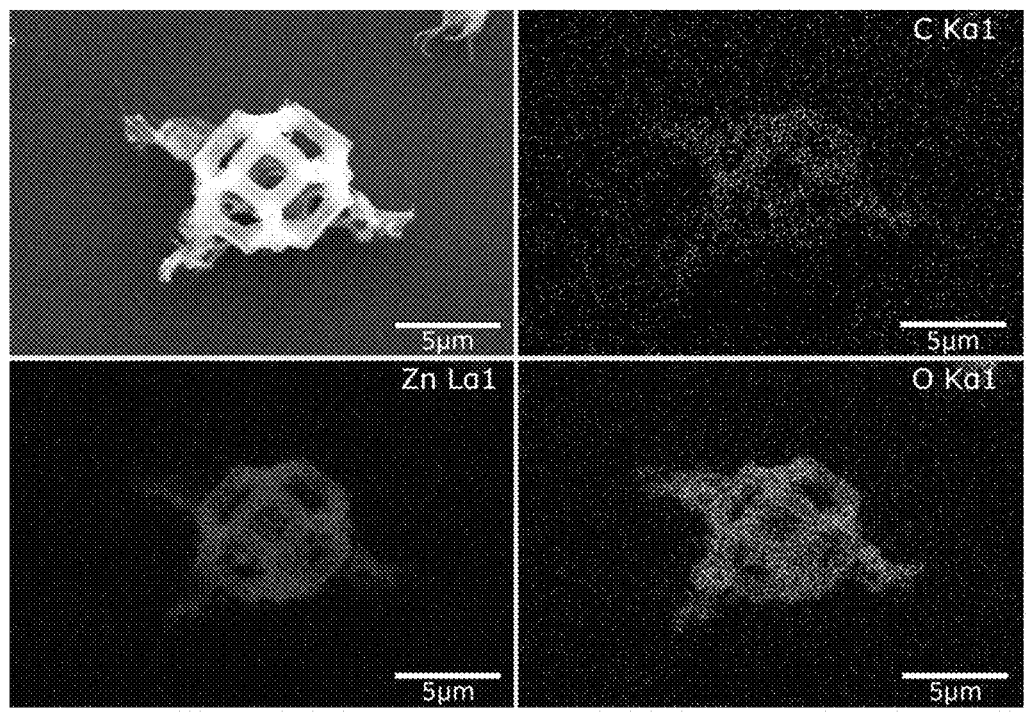
FIG. 5. EDS map of a fabricated tetrakaidecahedron unit cell. Zinc, oxygen and carbon can be clearly seen in the generated map, further corroborating the fact that the structure is zinc oxide.
Figure 7C:
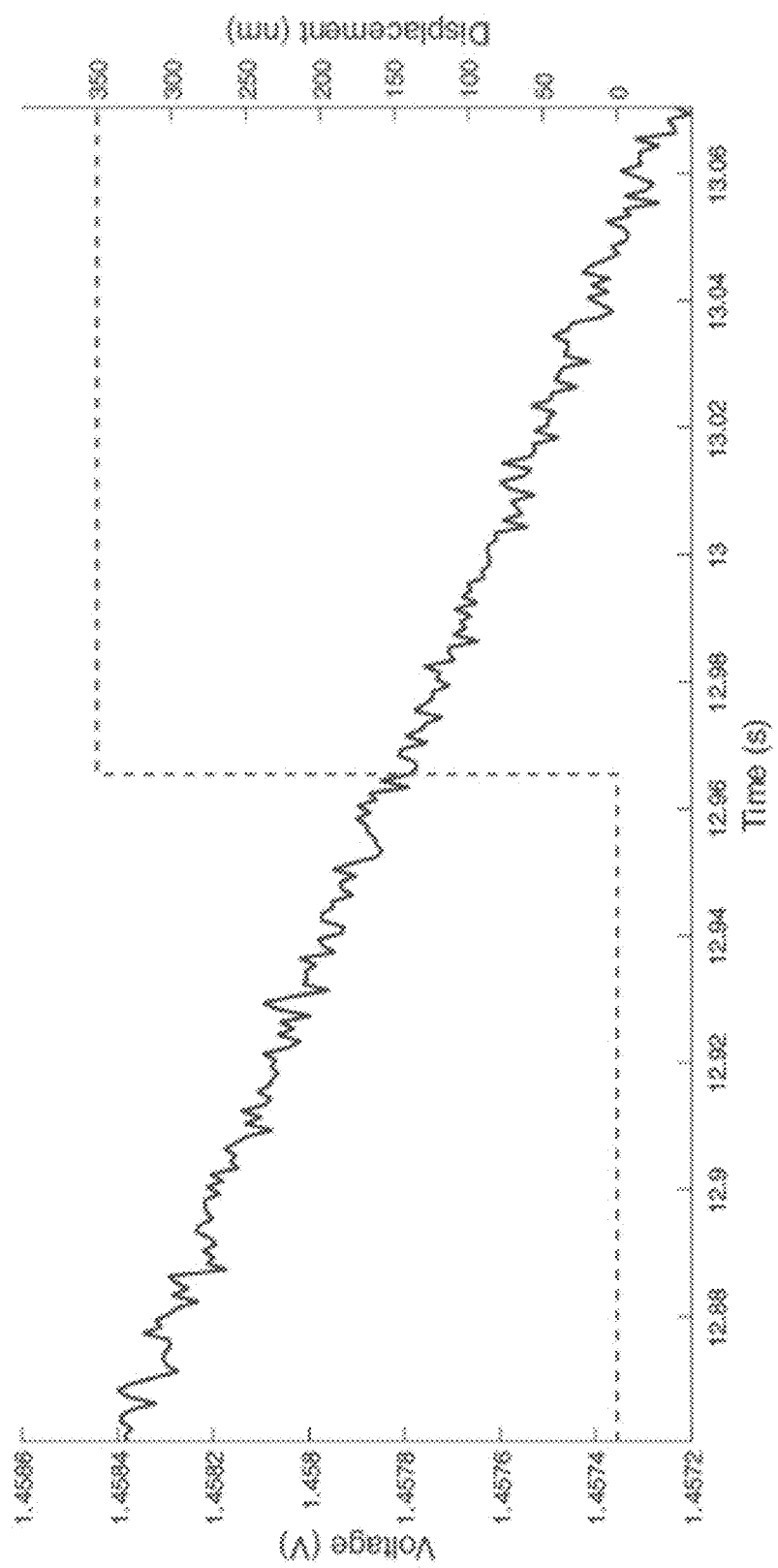
FIG. 7C. No voltage change over a compression of 200 nm.
Figure 7F:
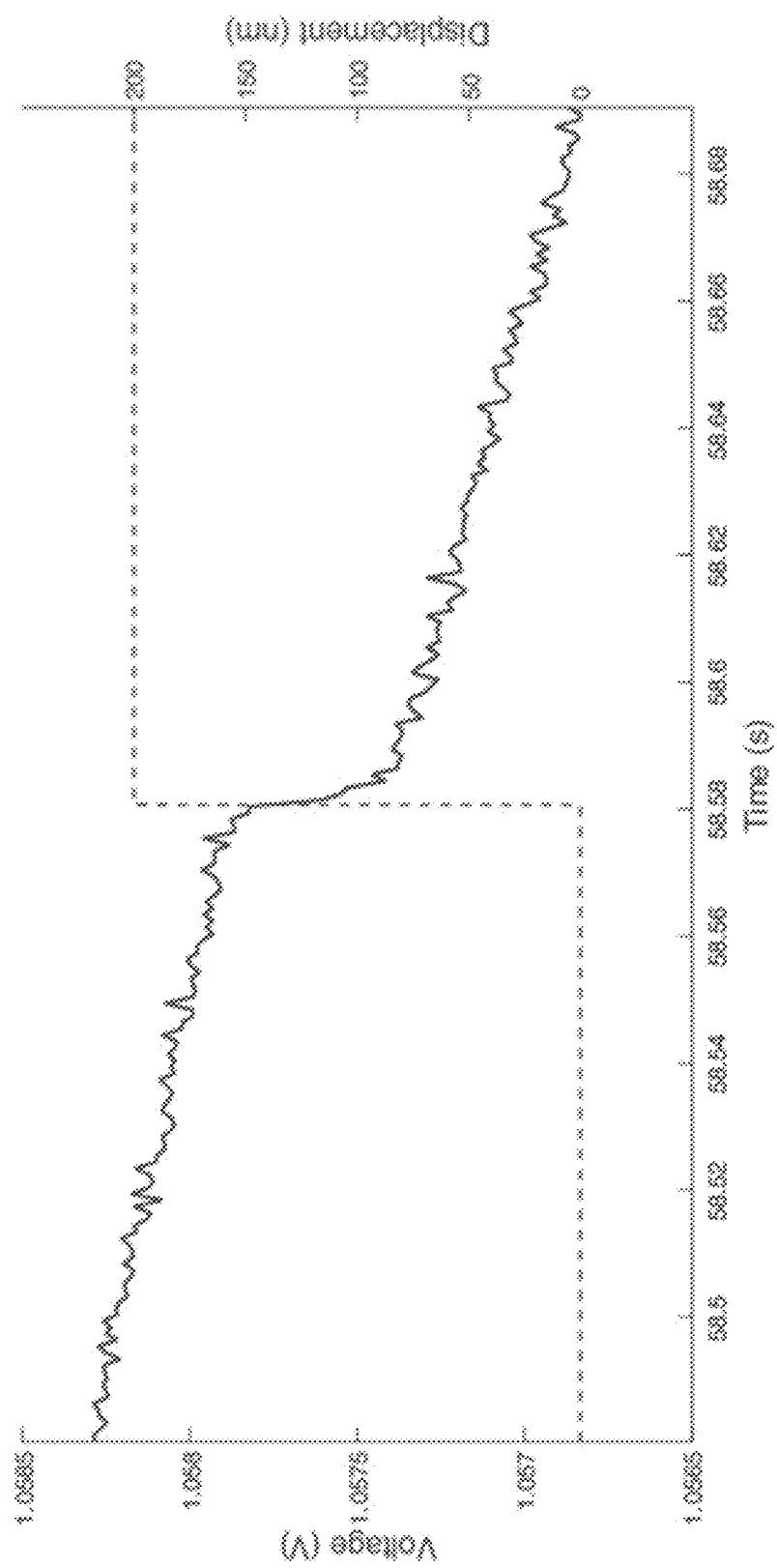
FIG. 7F. A sudden change of voltage on compression of 200 nm, indicated a piezoelectric response.

Energy-dispersive X-ray spectroscopy (EDS) was also conducted on calcined samples fabricated via two-photon lithography. The elemental map of one of the tetrakaidecahedron unit cells is shown in FIG. 5. From the map, it can be seen that zinc, oxygen and carbon are present throughout the structure. With the data obtained from XRD, it is thus likely that the sample is primarily zinc oxide with either some zinc carbide or some amount of organic that did not fully oxidize away.

Transmission electron microscopy (TEM) was also conducted on one of the tetrakaidecahedron samples to determine the final material of the structure. FIG. 6 shows the diffraction pattern obtained from the TEM. As seen, rings are observed, indicating the crystalline nature of the material. The indexed rings correspond to that expected of zinc oxide, confirming that calcination of structures printed from the zinc nitrate PEGda aqueous precursor mixture resulted in a monolithic zinc oxide structure.

As proof of their piezoelectric behavior, the 3D printed zinc oxide structures were subjected to a compressive load and then their voltage measured. As a control, zinc nitrate containing polymeric structures were used. The voltage responses of both the zinc oxide structure and the pre-calcined structure is shown in FIGS. 7A-7F.

This example highlights the following:

1) Preparation of a metal-salt containing aqueous precursor mixture. In this example, zinc nitrate is used.

2) Polymerization of the metal-salt containing aqueous precursor mixture via photolithography. In this example, two-photon lithography is used.

3) Thermal treatment of the metal-salt containing structure in air to give the corresponding metal oxide. In this case, zinc oxide is obtained from the zinc nitrate structure.

4) Multiple characterization techniques point to the fact that the calcined structures are indeed zinc oxide.

5) The zinc oxide structures exhibit piezoelectric behavior.

It is important to note the following:

1) Any photopolymerization method can be used to 3D print with the zinc nitrate containing aqueous precursor mixture.

2) The approach is general for all metal salts, as long as the metal salt can be dissolved in water.

Example 3: Lithium Cobalt Oxide Structures Fabricated Via a Two-Step Process of Projection Micro-Stereolithography Followed by Calcination 1) Preparation of Metal-Salt Containing Aqueous Precursor Mixture To make lithium cobalt oxide, it is not only necessary to have lithium and cobalt ions, it is also important that they are present in equal amounts. Thus, lithium nitrate and cobalt nitrate hexahydrate are chosen as the metals salts of choice for this example and added such that the ratio of Li to Co ions was 1:1. 20 mL of a 5M cobalt nitrate hexahydrate mixture was added to 20 mL of a 5M lithium nitrate mixture. To that, 60 mL of poly(ethylene glycol) diacrylate ($M_n$=575 g/mol) was added and then stirred. The resulting mixture was a deep purple color. In a separate vial, 343.5 mg of lithium phenyl-2,4,6-trimethylbenzoylphosphinate and 328.7 mg of disodium 4,4'-bis(2-sulfostyryl)biphenyl was added to 9 mL of water, resulting in a yellow mixture. Both mixtures re then added together to give the lithium cobalt aqueous precursor mixture.

2) Fabrication of 3D Structure Via Projection Micro-Stereolithography

The lithium cobalt aqueous photoresin was then used in an Autodesk Ember printer to fabricate 3D structures. In this example, cubic lattices measuring approximately 2 cm in diameter and about 1.5 cm tall were made.

3) Calcination Process

Figure 8:
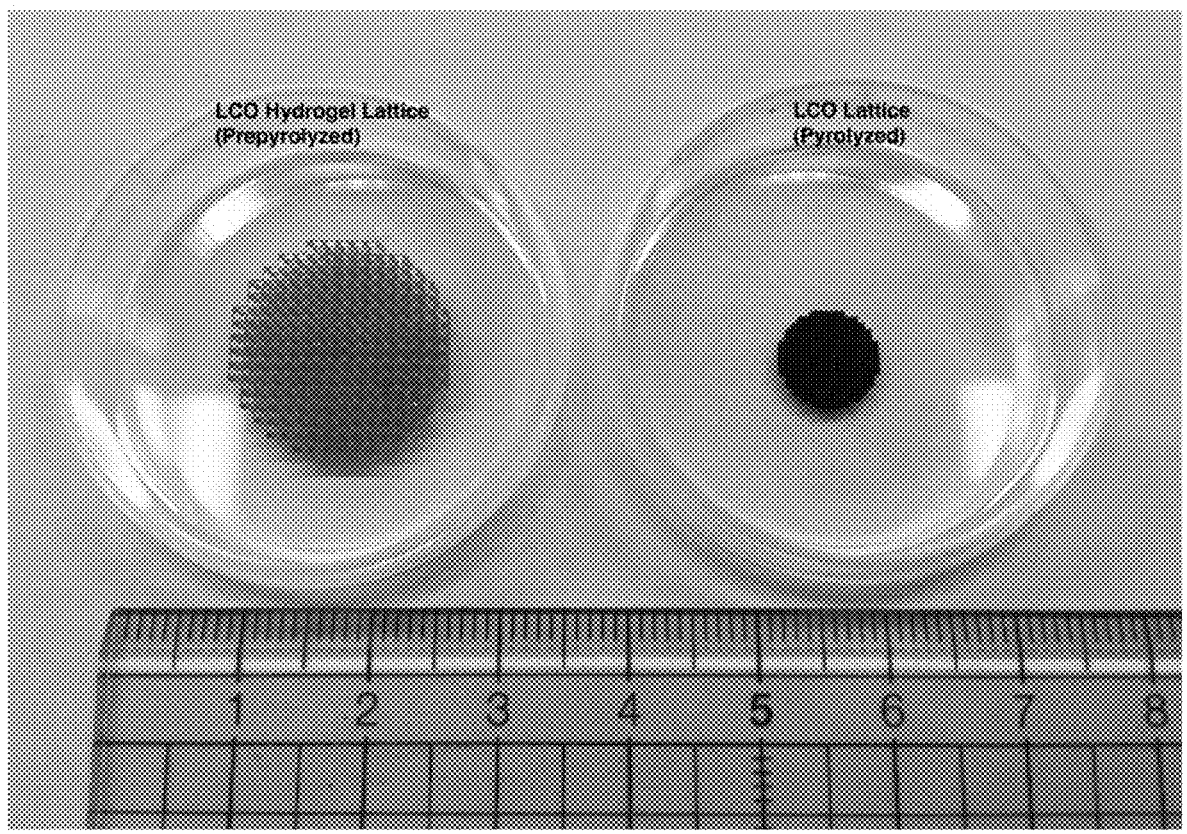
FIG. 8. Left—Cubic lattice printed from the lithium cobalt aqueous photoresin. Right—Cubic lattice after the calcination process. The calcined structure is about 40% of its original size. The structure still maintains its net shape.
Figure 9:
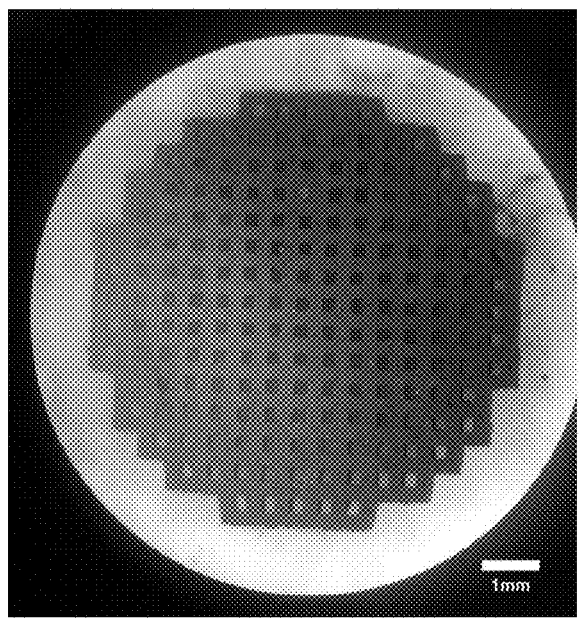
FIG. 9. Calcined structure. The cubic lattice is still retained and the structure is approximately 40% of its original size. The black color is also typical of that of lithium cobalt oxide.

The fabricated structures were then subjected to the following thermal treatment: a slow ramp of 1° C./min to 700° C. in air, followed by slow cooling to room temperature at a rate of 2° C./min in air. The structures before and after the calcination process are shown in FIG. 8 and FIG. 9.

4) Characterization

Figure 10:
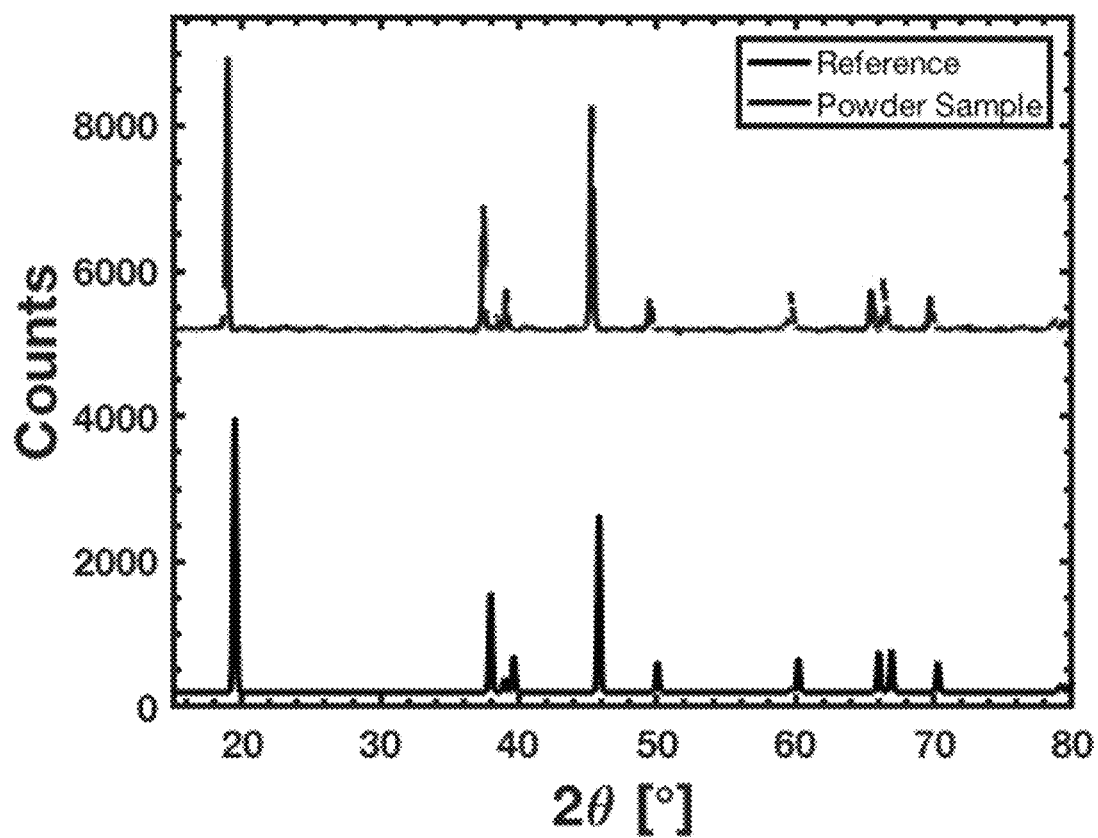
FIG. 10. Top—XRD spectra from that of the crushed calcined sample. Bottom—Reference spectra of lithium cobalt oxide[27]. It is clear that the experimentally determined peaks are aligned with that of the reference spectra, indicating that the material is indeed lithium cobalt oxide.

To determine the identity of the calcined material, a variety of characterization techniques were used. X-ray diffraction (XRD) was first used to determine the phase of the material. The calcined structure was crushed into a powder and then subjected to XRD. FIG. 10 shows the XRD spectra from the crushed calcined sample and a reference spectrum of lithium cobalt oxide obtained from a previous study on lithium cobalt oxide[27].

Figure 11:
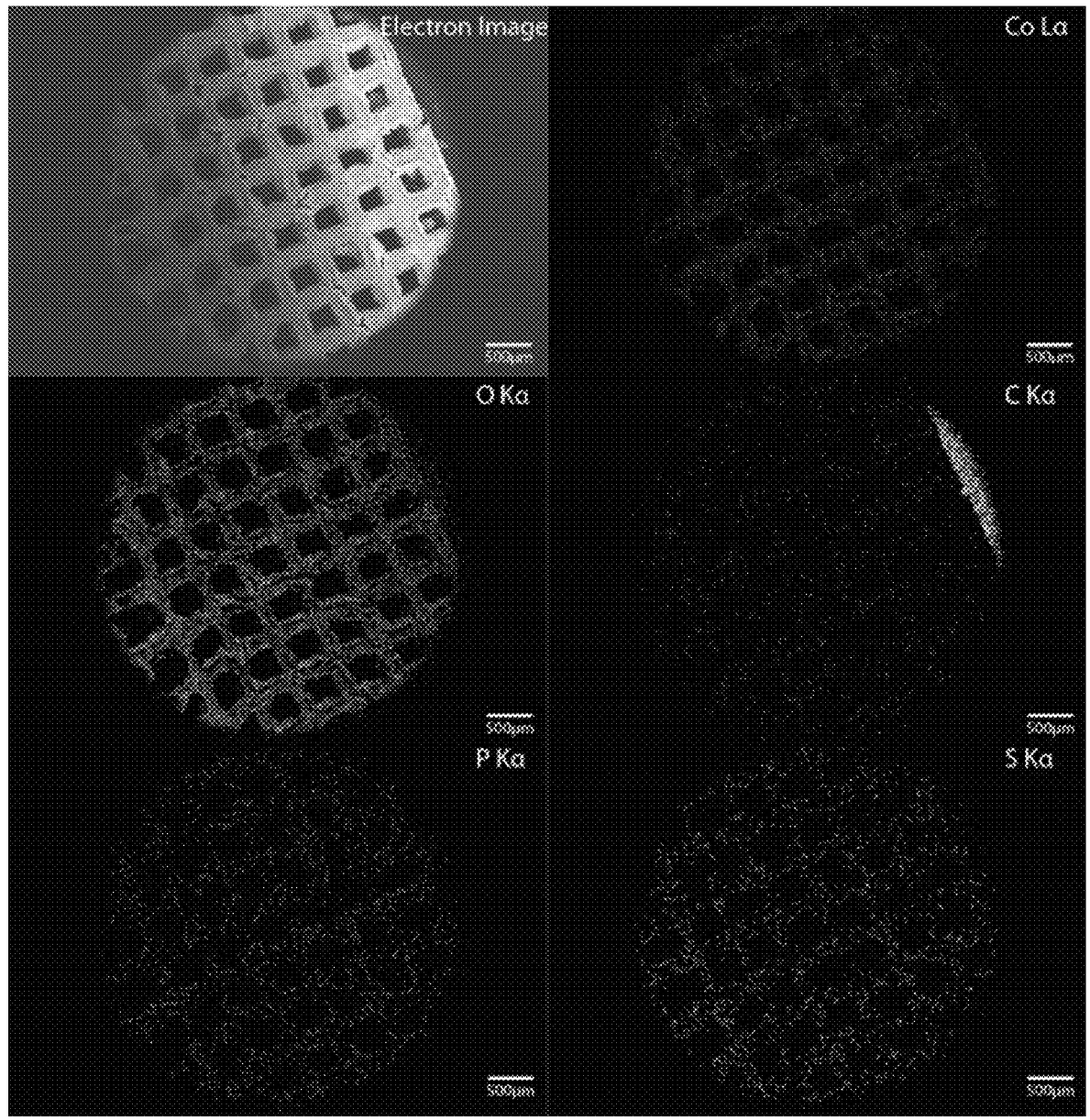
FIG. 11. EDS map of the calcined structure. Cobalt and oxygen can clearly be seen, further corroborating the fact that the structures are indeed lithium cobalt oxide. The carbon detected is likely from the organic binder that did not undergo complete oxidation. Phosphorous and sulfur are from the photoinitiator and UV blocker respectively.

Energy-dispersive X-ray spectroscopy (EDS) was also conducted on the calcined samples fabricated via projection micro-stereolithography. The elemental map of the cubic lattice is shown in FIG. 11. As would be expected based on the XRD data, both cobalt and oxygen are present in large quantities and can clearly be seen in the EDS map. Some amount of carbon can also be detected. The presence of phosphorus and sulfur can be attributed to the lithium phenyl-2,4,6-trimethylbenzoylphosphinate photoinitiator and the disodium 4,4'-bis(2-sulfostyryl)biphenyl UV blocker respectively. Both the XRD and EDS data point to the fact that the calcined cubic lattices are indeed made of lithium cobalt oxide.

Figure 12:
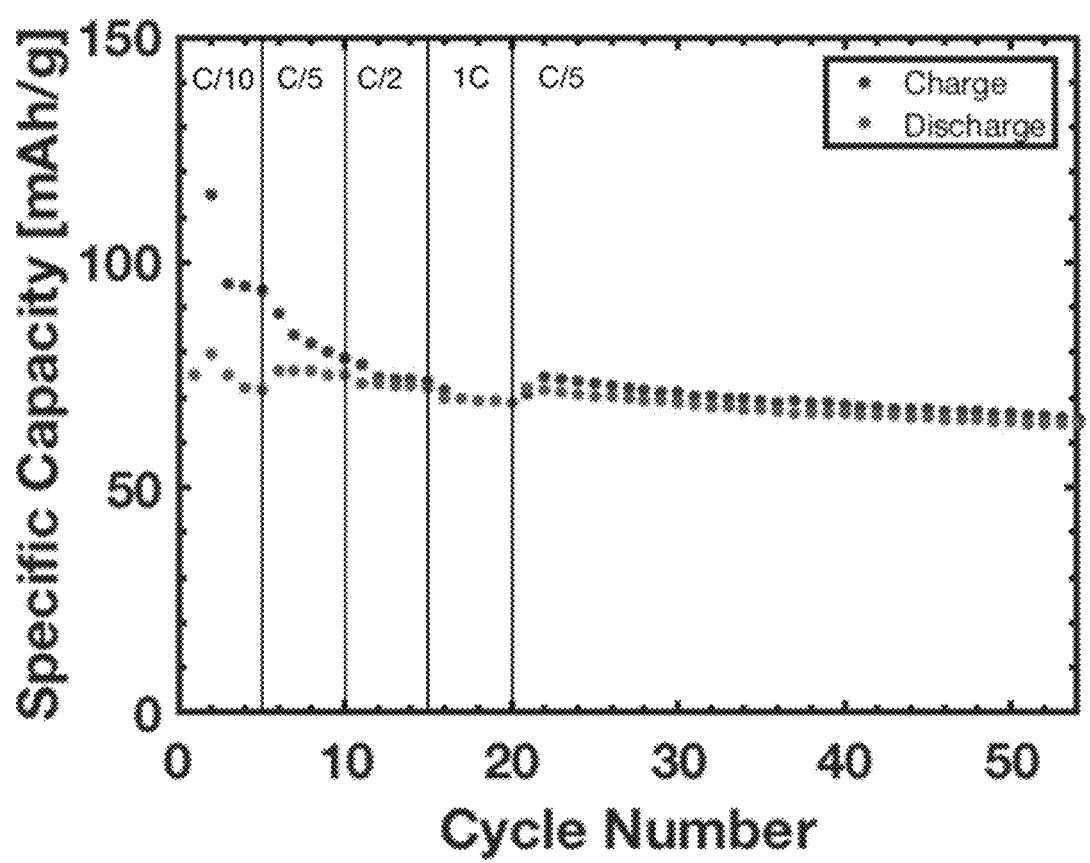
FIG. 12. Electrochemical cycling of a slurry electrode fabricated from a pulverized $LiCoO_2$ lattice. The slurry contained 80% $LiCoO_2$, 10% C black, and 10% PVDF binder.

To test for the electrochemical activity of the material, a lithium cobalt oxide cubic lattice was crushed and then made into a slurry electrode containing 80 wt % lithium cobalt oxide, 10% carbon black, and 10% of a polyvinylidene fluoride binder. The electrode had a specific capacity of 115 mAh/g at C/10 on the second charge and was stable over 50 cycles with a specific capacity of 65 mAh/g at C/5, as seen in the cycling data shown in FIG. 12. The first charge was omitted in the figure due to a very large anomalous capacity, possibly due to side reactions from an incompletely dry slurry. The relatively low specific capacity is likely due to some delamination of the electrode from inhomogeneities in the slurry-making process.

This example highlights the following:

1) Preparation of a metal-salt containing aqueous precursor mixture. In this example, lithium nitrate and cobalt nitrate is used.

2) Polymerization of the metal-salt containing aqueous precursor mixture via photolithography. In this example, projection micro-stereolithography is used.

3) Calcination of the metal-salt containing structure in air to give the corresponding metal oxide. In this case, lithium cobalt oxide is obtained from the lithium nitrate and cobalt nitrate structure.

4) Multiple characterization techniques point to the fact that the calcined structures are indeed lithium cobalt oxide.

5) The lithium cobalt structures are electrochemically active.

It is important to note the following:

1) Any photopolymerization method can be used to 3D print with the lithium cobalt containing aqueous precursor mixture.

2) The approach is general for all metal salts, as long as the metal salt can be dissolved in water.

REFERENCES CORRESPONDING TO EXAMPLES 1-3

1. Somiya, S., *Advanced technical ceramics*. 2012: Elsevier.
2. Basu, B. and K. Balani, *Advanced structural ceramics*. 2011: John Wiley & Sons.
3. Kokubo, T., *Bioceramics and their clinical applications*. 2008: Elsevier.
4. Richerson, D. W., *Modern ceramic engineering: properties, processing, and use in design*. 2005: CRC press.
5. Rahaman, M. N., *Ceramic processing and sintering*. 2003: CRC press.
6. Bauer, W., H.-J. Ritzhaupt-Kleissl, and J. Hausselt, *Slip casting of ceramic microcomponents*. Microsystem technologies, 1998. 4(3): p. 125-127.
7. Zocca, A., et al., *Additive manufacturing of ceramics: issues, potentialities, and opportunities*. Journal of the American Ceramic Society, 2015. 98(7): p. 1983-2001.
8. Deckers, J., J. Vleugels, and J.-P. Kruth, *Additive manufacturing of ceramics: a review*. Journal of Ceramic Science and Technology, 2014. 5(4): p. 245-260.
9. Kruth, J.-P., et al., *Consolidation phenomena in laser and powder-bed based layered manufacturing*. CIRP annals, 2007. 56(2): p. 730-759.
10. Pham, T. A., et al., *Three-dimensional SiCN ceramic microstructures via nano-stereolithography of inorganic polymer photoresists*. Advanced Functional Materials, 2006. 16(9): p. 1235-1241.
11. Mitteramskogler, G., et al., *Light curing strategies for lithography-based additive manufacturing of customized ceramics*. Additive Manufacturing, 2014. 1: p. 110-118.
12. Hinczewski, C., S. Corbel, and T. Chartier, *Ceramic suspensions suitable for stereolithography*. Journal of the European Ceramic Society, 1998. 18(6): p. 583-590.
13. Schwentenwein, M. and J. Homa, *Additive manufacturing of dense alumina ceramics*. International Journal of Applied Ceramic Technology, 2015. 12(1): p. 1-7.
14. Gmeiner, R., et al., *Stereolithographic ceramic manufacturing of high strength bioactive glass*. International Journal of Applied Ceramic Technology, 2015. 12(1): p. 38-45.
15. Song, X., et al., *Ceramic fabrication using mask-image-projection-based stereolithography integrated with tape-casting*. Journal of Manufacturing Processes, 2015. 20: p. 456-464.
16. Griffith, M. L. and J. W. Halloran, *Freeform fabrication of ceramics via stereolithography*. Journal of the American Ceramic Society, 1996. 79(10): p. 2601-2608.
17. Doreau, F., C. Chaput, and T. Chartier, *Stereolithography for manufacturing ceramic parts*. Advanced Engineering Materials, 2000. 2(8): p. 493-496.
18. Hagedorn, Y., *Laser additive manufacturing of ceramic components: Materials, processes, and mechanisms*, in *Laser Additive Manufacturing*. 2017, Elsevier. p. 163-180.
19. Chartier, T., et al., *Stereolithography of structural complex ceramic parts*. Journal of materials science, 2002. 37(15): p. 3141-3147.
20. Eckel, Z. C., et al., *Additive manufacturing of polymer-derived ceramics*. Science, 2016. 351(6268): p. 58-62.

21. Zanchetta, E., et al., *Stereolithography of SiOC ceramic microcomponents.* Advanced Materials, 2016. 28(2): p. 370-376.
22. Li, S., et al., *The fabrication of SiBCN ceramic components from preceramic polymers by digital light processing (DLP) 3D printing technology.* Journal of the European Ceramic Society, 2018. 38(14): p. 4597-4603.
23. Jana, P., et al., *Polymer-derived SiCN cellular structures from replica of 3D printed lattices.* Journal of the American Ceramic Society, 2018. 101(7): p. 2732-2738.
24. Vyatskikh, A., et al., *Additive manufacturing of polymer-derived titania for one-step solar water purification.* Materials Today Communications, 2018. 15: p. 288-293.
25. Pham, T. A., et al., *Inorganic polymer photoresist for direct ceramic patterning by photolithography.* Chemical Communications, 2007(39): p. 4021-4023.
26. Colombo, P., et al., *Polymer-derived ceramics: 40 years of research and innovation in advanced ceramics.* Journal of the American Ceramic Society, 2010. 93(7): p. 1805-1837.
27. Akimoto, J., Y. Gotoh, and Y. Oosawa, *Synthesis and structure refinement of LiCoO2Single crystals,* 1998, Elsevier.

Example 4: 3D Printing of Metal-Containing Materials Via the Swelling in of Metal Salts into a Printed Hydrogel This disclosure includes a method of manufacturing metal-containing materials via the swelling in of metal-salts into a structure. This process can be broken down into three general steps: a) fabrication of a hydrogel material via photolithography of an aqueous precursor mixture, b) swelling in a metal salt via immersion in a aqueous metal salt mixture and c) thermal treatment of the aforementioned preceramic hydrogel material.

Swell-in: In this multistep process, a blank hydrogel part is first printed via photolithography from an aqueous blank mixture to form a "blank" hydrogel template. This "blank" hydrogel is then immersed into a salt mixture, which swells it with the new salt. The final step of the process is the thermal treatment of the swollen preceramic hydrogel. This process allows for the possibility of a) making structures of a single ceramic, b) making structures out of multiple ceramics by preferentially only swelling certain parts of the structure.

Example 5: Leach and Swell-In

Figure 13:
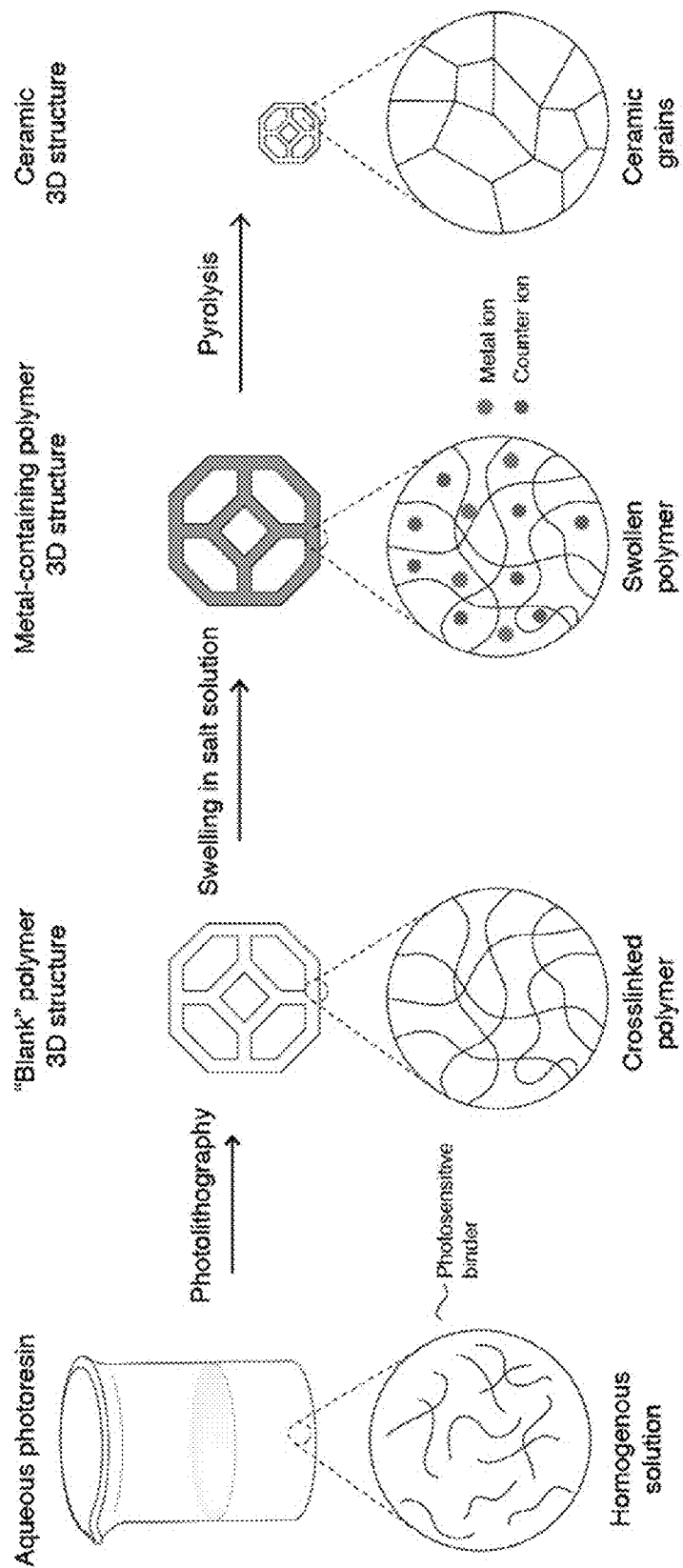
FIG. 13. Swell in method—The aqueous photoresin is first prepared by dissolving water-soluble photosensitive reagents in water. A 3D printed hydrogel template is then printed using photolithography to form the "blank" structure. The "blank" template is then soaked in an aqueous salt mixture to swell it with salts. The swollen hydrogel structure is then thermally treated in a thermal-treatment atmosphere. Depending on the thermal treatment conditions, such as the thermal-treatment atmosphere composition, different metal-based materials can be formed. The net shape of the printed part is retained throughout the whole process.

Leach and swell-in: In this multistep process, a metal-salt containing hydrogel part is first printed via photolithography from a metal-salt containing aqueous photoresin. The hydrogel is then partially immersed in water to leach out the metal salt to form a "semi-blank" having a secondary portion from which metal ions are leached and an un-leached primary portion (secondary portion has lower concentration of metal ions than primary portion). The "semi-blank" hydrogel template is then immersed into an aqueous metal salt mixture, swelling it with the new metal salt. The final step of the process is the thermal treatment (e.g., calcination) of the swollen preceramic hydrogel. This process allows for the possibility of a) making structures of a single ceramic, b) making structures out of multiple ceramics by preferentially only leaching and then swelling certain parts of the structure Example 6: Embodiments of Swell-In Methods Swell-in: In the "swell-in" method, a blank hydrogel is first fabricated via stereolithography from an aqueous blank mixture and then second, the incorporation of a metal salt into the blank hydrogel (which may also be referred to as a hydrogel template), followed by thermal treatment of the swollen hydrogel to give the desired material. This is described schematically in FIG. 13.

In terms of the preparation of the initial aqueous blank mixture, a number of different reagents can be used. Suitable water-soluble photosensitive binders of the present invention include but are not limited to poly(ethylene glycol) macromolecules with acrylate functional groups. Water-soluble photoinitiators that can be used include, but are not limited to ethyl(2,4,6-trimethylbenzoyl)-phenylphosphinate, Irgacure 2959, 7-diethylamino-3-theonoyl coumarin and lithium phenyl-2,4,6-trimethylbenzoylphosphinate. Similarly, suitable water-soluble UV blockers include, but are not limited to disodium 4,4'-bis(2-sulfostyryl)biphenyl.

To fabricate the 3D printed part, any photolithography technique can be used. Suitable photopolymerization methods include but are not limited to: two-photon lithography, stereolithography, micro-stereolithography and projection micro-stereolithography.

During the swelling process, any water-soluble metal salt or combination of water-soluble metal salts can be used. A metal salt is an ionic compound with a metal cation and a counter anion. Examples include but are not limited to: zinc nitrate, zinc nitrate hexahydrate, zinc chloride, zinc acetate, iron nitrate, iron nitrate nonahydrate, lithium nitrate, cobalt acetate, cobalt nitrate, cobalt nitrate hexahydrate and aluminum nonahydrate.

The thermal treatment process is important to the fabrication process. If the 3D printed hydrogel is thermally treated in an oxidizing atmosphere, then the final structure can be made of a metal oxide. On the other hand, if the hydrogel is thermally treated in an inert atmosphere, then metal carbides can be formed. And, if the part is thermally treated in a reducing atmosphere, then metal parts can be made.

If a single water-soluble metal salt is used during the swelling process, then the resulting material of the thermally treated structure will be primarily of a single phase. The use of a combination of salts is not trivial, with the potential for multiple different phases to be formed. It is important to consider the diffusion rates of the different ions into the hydrogel during the swelling process, and how the non-stoichiometry will affect the final material formed.

Example 7: Embodiments of Leach and Swell-In Methods

Figure 14:
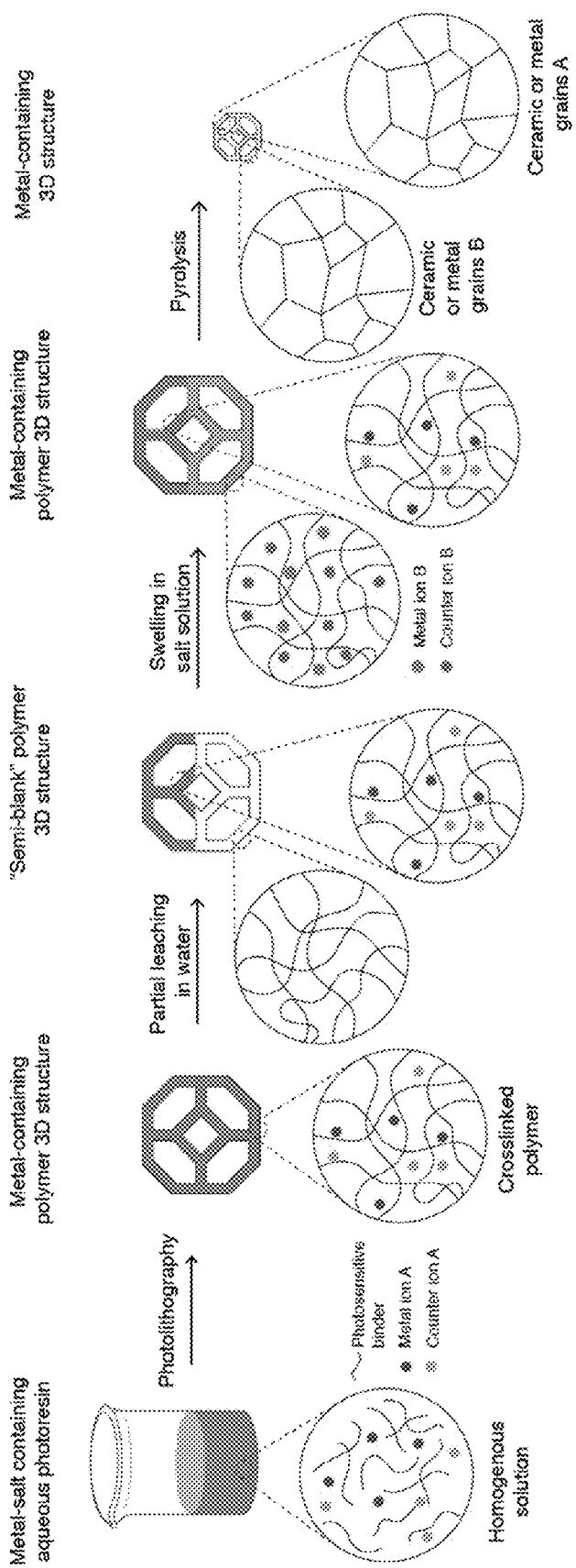
FIG. 14. Leach and swell-in method—The metal-salt containing aqueous photoresin is first prepared by dissolving water-soluble photosensitive reagents and the desired metal salts in water. A 3D printed hydrogel is then printed using photolithography. Areas of the structure where the different metal is desired are then leached selectively, to form the "semi-blank" template. The "semi-blank" template is then soaked in another aqueous salt mixture to swell it with salts. The swollen hydrogel structure is then thermally treated using a thermal-treatment atmosphere. Depending on the thermal treatment conditions, such as composition of the thermal-treatment atmosphere, different metal-containing materials can be formed. The net shape of the printed part is retained throughout the whole process.

Leach and swell-in: In the "leach and swell-in" method, a metal-containing hydrogel part is first printed via photolithography from a metal-salt containing aqueous precursor mixture. Parts of the hydrogel are then immersed in water (or a blank mixture) to leach out the metal salt to form a "semi-blank" structure, having an un-leached primary portion and a secondary portion from which metal ions are leached (secondary portion has lower concentration of metal ions than primary portion). The "semi-blank" template is then immersed into a salt solution (an aqueous metal salt mixture), swelling it with the new salt. Thermal treatment of the swollen hydrogel then gives the desired materials. This is depicted schematically in FIG. 14. This process allows for the possibility of making structures out of multiple materials by preferentially only leaching and then swelling certain parts of the structure. If all the salts are leached out form the structure and then swollen with the new salt, then this method becomes the same as the "swell-in" method described above.

In terms of the preparation of the initial metal-salt containing aqueous precursor mixture, a number of different reagents can be used. Suitable water-soluble photosensitive binders of the present invention include but are not limited to poly(ethylene glycol) macromolecules with acrylate functional groups. Water-soluble photoinitiators that can be used include, but are not limited to ethyl(2,4,6-trimethylbenzoyl)-phenylphosphinate, Irgacure 2959, 7-diethylamino-3-theonoyl coumarin and lithium phenyl-2,4,6-trimethylbenzoylphosphinate. Similarly, suitable water-soluble UV blockers include, but are not limited to disodium 4,4'-bis(2-sulfostyryl)biphenyl. Since water is the primary solvent here, any water-soluble metal salt can be used, including but are not limited to metal nitrates and their hydrates and metal acetates and their hydrates. A metal salt is an ionic compound with a metal cation and a counter anion. Examples include but are not limited to: zinc nitrate, zinc nitrate hexahydrate, zinc chloride, zinc acetate, iron nitrate, iron nitrate nonahydrate, lithium nitrate, cobalt acetate, cobalt nitrate, cobalt nitrate hexahydrate and aluminum nonahydrate.

To fabricate the 3D printed part, any photolithography technique can be used. Suitable photopolymerization methods include but are not limited to: two-photon lithography, stereolithography, micro-stereolithography and projection micro-stereolithography.

During the swelling process, any water-soluble salt or combination of water-soluble salts can be used.

The thermal treatment process is important to the fabrication process. If the 3D printed hydrogel is thermally treated in an oxidizing atmosphere, then the final structure can be made of a metal oxide. On the other hand, if the hydrogel is thermally treated in an inert atmosphere, then metal carbides can be formed. And, if the hydrogel is thermally treated in a reducing atmosphere, then metal materials can be made.

Since the stoichiometry of ions in the initial aqueous photoresin can be controlled, it is possible to create single-phase ternary compounds using this method. However, similar to the "swell-in" method, the swelling of the new salt into the "blank" portion of the structure still carries the considerations as described above.

Example 8: Iron Oxide Structures Fabricated Via the "Swell-In" Method

1) Preparation of Aqueous Blank Mixture 60 mL of poly(ethylene glycol) diacrylate ($M_n$=575 g/mol) was added to 40 ml of water and then stirred. In a separate vial, 343.5 mg of lithium phenyl-2,4,6-trimethylbenzoylphosphinate and 328.7 mg of disodium 4,4'-bis(2-sulfostyryl)biphenyl was added to 9 mL of water, resulting in a yellow solution. Both solutions were then added together to give the aqueous blank mixture.

2) Fabrication of 3D Structure Via Projection Micro-Stereolithography

The aqueous blank mixture was then used in an Autodesk Ember printer to fabricate the "blank" 3D templates. In this example, cubic lattices measuring approximately 2 cm in diameter and about 0.3 cm tall were made.

3) Swelling in Process

The iron nitrate mixture was prepared by dissolving 1 g of iron(II) nitrate nonahydrate in 10 mL of water, giving a concentration of 100 mg/mL. The "blank" 3D templates were then soaked in the iron nitrate mixture overnight. The colorless "blank" structure turned brown-orange after the soaking process. This is shown in FIGS. 15A-15F.

4) Calcination Process

The swollen structures were then subjected to the following thermal treatment: a slow ramp of 1° C./min to 700° C. in air, followed by slow cooling to room temperature at a rate of 2° C./min in air. The samples before and after calcination are shown in FIGS. 15A-15F.

5) Characterization

Energy-dispersive X-ray spectroscopy (EDS) was conducted on the calcined samples to determine the make-up of the material. The elemental map of the cubic lattice is shown in FIGS. 15A-15F. From the map, it can be seen that iron and oxygen are present throughout the structure, indicating that the material is a form of iron oxide.

This example highlights the following:

1) Preparation of an aqueous blank mixture.

2) Polymerization of the aqueous blank mixture via photolithography to form the "blank" template. In this example, projection micro-lithography was used.

3) Swelling of the "blank" hydrogel in a metal-salt mixture. In this example, the "blank" hydrogel was swollen in an iron nitrate mixture.

4) Thermal treatment of the metal-salt containing structure in air to give the corresponding metal oxide. In this case, iron oxide was obtained from the swollen structure.

5) EDS shows the presence of iron and oxygen in the structure.

It is important to note the following:

1) Any photopolymerization method can be used to 3D print with the aqueous photoresin.

2) The "blank" hydrogel can be swollen in any aqueous metal salt mixture.

Example 9: Lithium Cobalt Oxide+Iron Oxide Structures Fabricated Via the "Leach and Swell In" Method 1) Preparation of Metal-Salt Containing Aqueous Precursor Mixture To make lithium cobalt oxide, it is not only necessary to have lithium and cobalt ions, it is also important that they are present in equal amounts. Thus, lithium nitrate and cobalt nitrate hexahydrate were chosen as the metals salts of choice and added such that the ratio of Li to Co ions was 1:1. 20 mL of a 5M cobalt nitrate hexahydrate mixture was added to 20 mL of a 5M lithium nitrate mixture. To that, 60 mL of poly(ethylene glycol) diacrylate ($M_n$=575 g/mol) was added and then stirred. The resulting mixture was a deep purple color. In a separate vial, 343.5 mg of lithium phenyl-2,4,6-trimethylbenzoylphosphinate and 328.7 mg of disodium 4,4'-bis(2-sulfostyryl)biphenyl was added to 9 mL of water, resulting in a yellow solution. Both mixtures were then added together to give the lithium cobalt aqueous precursor mixture.

2) Fabrication of 3D Structure Via Projection Micro-Stereolithography

The lithium cobalt aqueous precursor mixture was then used in an Autodesk Ember printer to fabricate 3D structures. In this example, cubic lattices measuring approximately 2 cm in length and width and about 0.2 cm tall were made.

3) Leaching Process

The lithium cobalt hydrogel is then partially submerged in a beaker of water for 2 hours to leach out the lithium cobalt salts. The "semi-blank" template is left behind. This is seen in FIGS. 16A-16C.

4) "Swell-In" Process

A iron nitrate mixture was prepared by dissolving 1 g of iron(II) nitrate nonahydrate in 10 mL of water, giving a concentration of 100 mg/mL. The "semi-blank" 3D template was then soaked in the iron nitrate mixture for 2 hours. The colorless part of the "semi-blank" template turned brown-orange after the soaking process. This is shown in FIGS. 17A-17B.

5) Calcination Process

The swollen structures were then subjected to the following thermal treatment: a slow ramp of 1° C./min to 700° C. in air, followed by slow cooling to room temperature at a rate of 2° C./min in air. The structures before and after the calcination process are shown in FIGS. 18A-18B.

6) Characterization

To determine the identity of the calcined material, energy-dispersive X-ray spectroscopy (EDS) was conducted on different parts of the calcined samples to determine the elements across the structure. The composite elemental map of the cubic lattice is shown in FIGS. 19A-19C. The oxygen map was omitted.

From FIGS. 19A-19C, it can be seen that a gradient in both iron and cobalt can be seen across the interface. Far from the interface, only iron or cobalt can be detected, indicating the successful spatial localization of either of the elements in their respective materials. A sharp interface was not observed due to the diffusion of ions both during the leaching and swelling processes.

This example highlights the following:

1) Preparation of the initial metal-salt containing aqueous precursor mixture. In this case, a lithium cobalt aqueous precursor mixture was used.

2) Polymerization of the metal-salt containing photoresin via photolithography. In this example, projection micro-stereolithography was used.

3) Formation of the "semi-blank" template by partial immersion of the structure in water.

4) Swelling of the "blank" part of the gel structure by immersion of that part of the structure into an aqueous metal salt mixture. In this example, iron nitrate solution was used.

5) Thermal treatment of the metal-salt containing hydrogel in air to give the corresponding metal oxides. In this case, both lithium cobalt oxide and iron oxide was formed.

6) EDS shows the distribution of iron and cobalt across the interface. Far from the interface, only either iron or cobalt could be detected. This indicates the successful formation of the respective oxide on either side of the interface.

It is important to note the following:

1) Any photopolymerization method can be used to 3D print with the initial metal-salt containing aqueous photoresin.

2) The approach is general for all metal salts, as long as the metal salt can be dissolved in water.

REFERENCES CORRESPONDING TO EXAMPLES 4-9

1. Somiya, S., *Advanced technical ceramics*. 2012: Elsevier.
2. Basu, B. and K. Balani, *Advanced structural ceramics*. 2011: John Wiley & Sons.
3. Kokubo, T., *Bioceramics and their clinical applications*. 2008: Elsevier.
4. Richerson, D. W., *Modern ceramic engineering: properties, processing, and use in design*. 2005: CRC press.
5. Rahaman, M. N., *Ceramic processing and sintering*. 2003: CRC press.
6. Bauer, W., H.-J. Ritzhaupt-Kleissl, and J. Hausselt, *Slip casting of ceramic microcomponents*. Microsystem technologies, 1998. 4(3): p. 125-127.
7. Zocca, A., et al., *Additive manufacturing of ceramics: issues, potentialities, and opportunities*. Journal of the American Ceramic Society, 2015. 98(7): p. 1983-2001.
8. Deckers, J., J. Vleugels, and J.-P. Kruth, *Additive manufacturing of ceramics: a review*. Journal of Ceramic Science and Technology, 2014. 5(4): p. 245-260.
9. Kruth, J.-P., et al., *Consolidation phenomena in laser and powder-bed based layered manufacturing*. CIRP annals, 2007. 56(2): p. 730-759.
10. Pham, T. A., et al., *Three-dimensional SiCN ceramic microstructures via nano-stereolithography of inorganic polymer photoresists*. Advanced Functional Materials, 2006. 16(9): p. 1235-1241.
11. Mitteramskogler, G., et al., *Light curing strategies for lithography-based additive manufacturing of customized ceramics*. Additive Manufacturing, 2014. 1: p. 110-118.
12. Hinczewski, C., S. Corbel, and T. Chartier, *Ceramic suspensions suitable for stereolithography*. Journal of the European Ceramic Society, 1998. 18(6): p. 583-590.
13. Schwentenwein, M. and J. Homa, *Additive manufacturing of dense alumina ceramics*. International Journal of Applied Ceramic Technology, 2015. 12(1): p. 1-7.
14. Gmeiner, R., et al., *Stereolithographic ceramic manufacturing of high strength bioactive glass*. International Journal of Applied Ceramic Technology, 2015. 12(1): p. 38-45.
15. Song, X., et al., *Ceramic fabrication using mask-image-projection-based stereolithography integrated with tape-casting*. Journal of Manufacturing Processes, 2015. 20: p. 456-464.
16. Griffith, M. L. and J. W. Halloran, *Freeform fabrication of ceramics via stereolithography*. Journal of the American Ceramic Society, 1996. 79(10): p. 2601-2608.
17. Doreau, F., C. Chaput, and T. Chartier, *Stereolithography for manufacturing ceramic parts*. Advanced Engineering Materials, 2000. 2(8): p. 493-496.
18. Hagedorn, Y., *Laser additive manufacturing of ceramic components: Materials, processes, and mechanisms*, in *Laser Additive Manufacturing*. 2017, Elsevier. p. 163-180.
19. Chartier, T., et al., *Stereolithography of structural complex ceramic parts*. Journal of materials science, 2002. 37(15): p. 3141-3147.
20. Eckel, Z. C., et al., *Additive manufacturing of polymer-derived ceramics*. Science, 2016. 351(6268): p. 58-62.
21. Zanchetta, E., et al., *Stereolithography of SiOC ceramic microcomponents*. Advanced Materials, 2016. 28(2): p. 370-376.
22. Li, S., et al., *The fabrication of SiBCN ceramic components from preceramic polymers by digital light processing (DLP) 3D printing technology*. Journal of the European Ceramic Society, 2018. 38(14): p. 4597-4603.
23. Jana, P., et al., *Polymer-derived SiCN cellular structures from replica of 3D printed lattices*. Journal of the American Ceramic Society, 2018. 101(7): p. 2732-2738.
24. Vyatskikh, A., et al., *Additive manufacturing of polymer-derived titania for one-step solar water purification*. Materials Today Communications, 2018. 15: p. 288-293.

25. Pham, T. A., et al., *Inorganic polymer photoresist for direct ceramic patterning by photolithography*. Chemical Communications, 2007(39): p. 4021-4023.
26. Colombo, P., et al., *Polymer-derived ceramics: 40 years of research and innovation in advanced ceramics*. Journal of the American Ceramic Society, 2010. 93(7): p. 1805-1837.

Example 10: 3D Architected Li-Ion Cathodes

Using a Li metal anode can improve energy density, but changes to the battery architecture itself can also improve performance, especially to take advantage of the favorable properties of Li solid-state cells. This Example describes fabrication and characterization of efficient 3D architected LIB cathodes using a methods for making metal-containing materials, optionally including additive manufacturing process.

Three-Dimensional Batteries

The traditional planar design of lithium-ion batteries (LIBs) presents a fundamental trade-off between energy and power density. To increase the energy of a battery without changing materials, more active material must be added. However, as the active material layer becomes thicker, the transport length of Li ions and electrons through the electrode increases as the thickness increases, reducing capacity at higher rates and reducing power [129, 130]. The energy density is usually dependent on the active material mass loading, defined as mass per areal footprint (mg/cm$^2$). Mass loading is particularly important for Li anode solid-state batteries and microbatteries, which require thin solid electrolytes (SEs) due to the electrolytes' relatively low ionic conductivity as well as thin layers of Li and the cathode to maximize the overall energy density [2, 41, 129-132]. In conventional LIBs, comprised of liquid electrolytes and electrodes formed of powders of an active material, conductive additive, and binder ("slurry electrodes"), thin cells can be wound around a central post in the "jelly-roll" design to increase energy density without increasing film thickness [133]. However, SEs, which are commonly brittle ceramics, and monolithic electrodes, such as sputtered ceramic cathodes, would likely fracture in this configuration [130, 131].

One promising approach to realize both high energy and power densities in solid-state batteries is to change the two-dimensional (2D) planar design into a three-dimensional (3D) architecture. By intelligently utilizing the height of the electrode, the mass loading can be increased while maintaining short Li ion and electron transport lengths [129, 130]. 3D electrodes are commonly measured by their areal capacity (mAh/cm$^2$), which can be improved by increasing the mass loading using the height of the electrode [130]. "3D batteries" commonly refer to any type of electrode design that utilizes an architected or porous design used to increase mass loading with shorter transport lengths [130]. However, many 3D electrode designs are "pseudo-3D", i.e. their cross sections do not change with at least one spatial dimension. A common 3D battery electrode design is to use 1D structures like posts or nanowires [134, 135]. The 1D structures are often created by depositing active material into a template [134, 136-138], depositing the active material on a scaffold [139, 140], or directly growing the individual structures [141, 142]. These structures can increase the mechanical stability of the thin active material [141] and increase the areal capacity over a thin film [139], but they require high aspect ratios to greatly decrease Li ion diffusion paths, which limits their heights as the structures often fail or agglomerate when they are too tall [41]. 2D patterned electrodes can achieve similar increases in areal capacity, but have similar issues with height [143-145]. While many pseudo-3D and 3D electrodes can perform well in a liquid electrolyte by simply replacing a planar electrode, different electrode configurations must be utilized to exploit the advantages of 3D batteries with a full solid-state cell (anode, electrolyte, and cathode) [130]. One of the most common electrode configurations is to use interdigitated electrodes, which decreases the diffusion path between electrodes [146-148]. Interpenetration beyond planar interdigitation is difficult to achieve with only a few known examples [149, 150].

An ideal 3D electrode would include a large connectivity, controllable and ideal pore size, and be comprised of an ordered structure to optimize the material loading and pore size. A single active material thickness and pore size is usually required to optimize the energy and power density of a cell, and a stochastic material will contain deviations of the optimum thickness and/or pore size [41, 151]. An ordered, periodic structure reduces defects that could short circuit the cell or increase the ion diffusion path [135, 152] and would be stronger than a stochastic foam at the same densities [153]. True 3D electrodes are less common and can be fabricated by depositing onto a 3D current collector/scaffold (often carbon or metal foam) [154-156], or by directly forming the active material using a heat treatment [149, 157, 158].

Additive manufacturing, commonly referred to as 3D printing, provides a promising route to create 3D electrodes with tunable geometries and dimensions. Currently, the majority of 3D printed LIB electrodes are created by adding powders of active materials to a slurry or ink [148, 159-162] or polymer [163]. These methods add inactive ingredients into the electrodes, thereby reducing energy density, and are often limited in geometry. Inks sometimes cannot be printed over free space and must be supported by a printed layer underneath [164]. To our knowledge, there is only one existing study that developed a 3D printed electrode comprised of just the active material, in that case a Ag microlattice electrode fabricated using Aerosol Jet 3D printing [158]. One of the largest challenges for 3D printing LIB electrodes is the difficulty in printing non-polymeric materials that are commonly used in LIBs [165]. Recently, we have developed a new additive manufacturing technique called photopolymer complex synthesis to 3D print oxides [166].

Utilizing this method, 3D architected transition metal oxide LIB cathodes were fabricated. This technique incorporates metal salts with desired cations into a photoresin that can be 3D printed into hydrogel structures using digital light processing (DLP). The cubic lattices were manufactured and calcined in air to produce structures 7.5-8 mm wide and ~1.3 mm tall. The primary material studied was LiCoO$_2$ (LCO) because of its well understood electrochemical properties and its common use as a LIB cathode material. The largest challenge for 3D solid-state batteries is the conformal deposition of solid electrolytes on 3D structures [130, 131], normally performed using atomic layer deposition (ALD) [167, 168] or polymer electrodeposition [169, 170].

A conventional liquid electrolyte was is described in this Example to investigate the electrochemical performance of the lattices, though a solid electrolyte can be used with three-dimensional metal-containing materials made as described herein. The lattices have a porous microstructure formed of ~230 nm diameter crystallites and have reasonable gravimetric discharge capacities of 122 mAh/g and areal capacities up to ~8 mAh/cm$^2$ with a capacity retention of 82% over 100 cycles.

Fabrication of 3D Architected LCO Electrodes

Figure 20B:
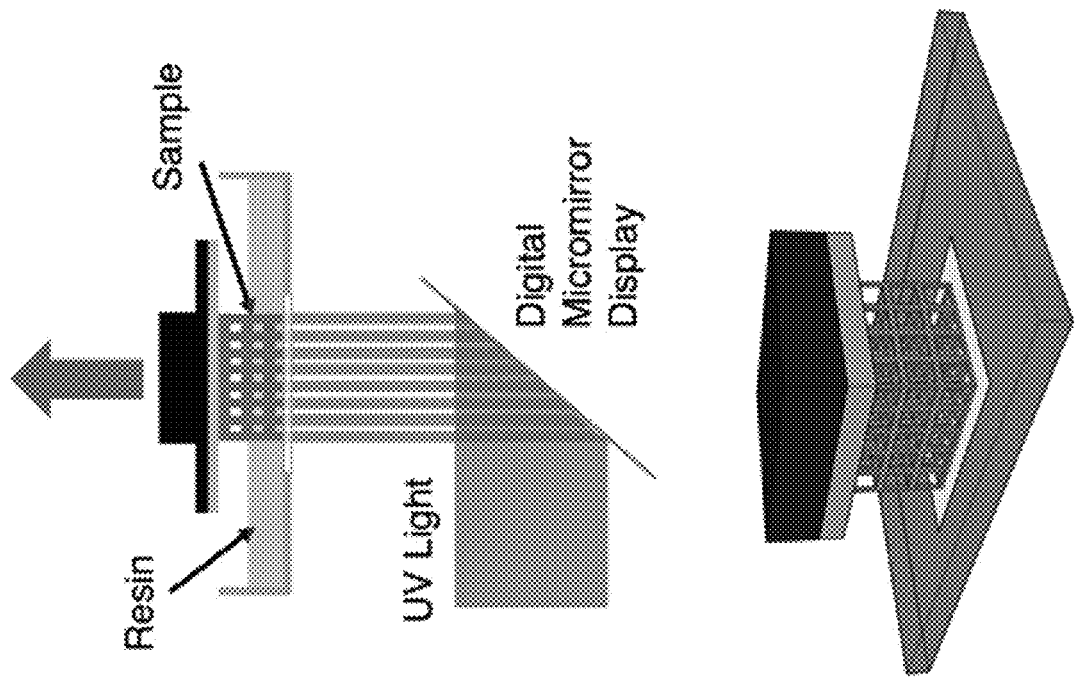
FIG. 20B. Schematics of the DLP printing process.
Figure 20A:
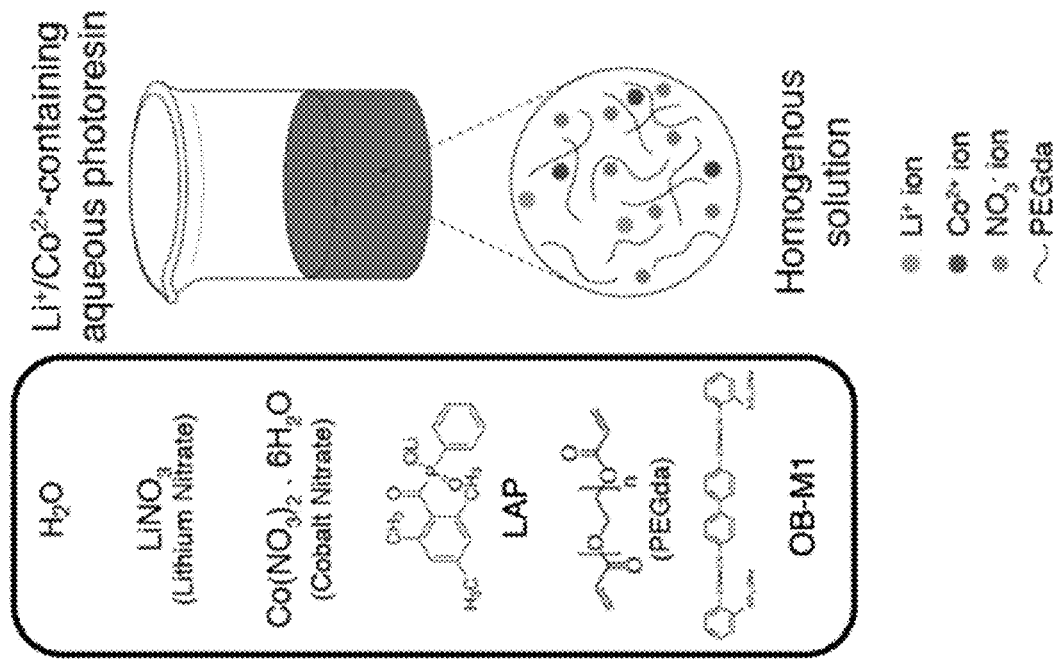
FIG. 20A. The ingredients of the $Li^+$ and $Co^{2+}$ containing resin. The magenta color originates from the Co salt.

To fabricate the 3D electrodes, a custom aqueous photopolymer resin with the necessary metal cations was formulated. The aqueous resin contains $LiNO_3$ and $Co(NO_3)$ $.6H_2O$ aqueous salt mixtures mixed with poly(ethylene glycol) diacrylate (PEGDa, Mw=575 g/mol) and a lithium phenyl-2,4,6 trimethylbenzoylphosphinate (LAP) photoinitiator and Benetex OB-M1 UV blocker with a salt loading of 230 mg/mL resin (FIG. 20A). The resin was poured into the tray of the DLP 3D printer (Autodesk Ember) and cubic lattices were printed. DLP printing utilizes a digital micromirror display to project a 2D pattern of UV light into the photoresin that polymerizes at the pixels in the pattern, as illustrated in FIG. 20B. The structure is then moved slightly higher and the subsequent layers are printed similarly in a layer-by-layer fashion [164]. Because of the relatively low volume fraction of polymerizable material and the need for a highly cross-linked, insoluble material, a relatively large dose of UV light is needed to print this resin. Consequently, a UV blocker is necessary to reduce the amount of UV light that is absorbed beyond the plane of focus to cause unwanted polymerization.

Figure 21:
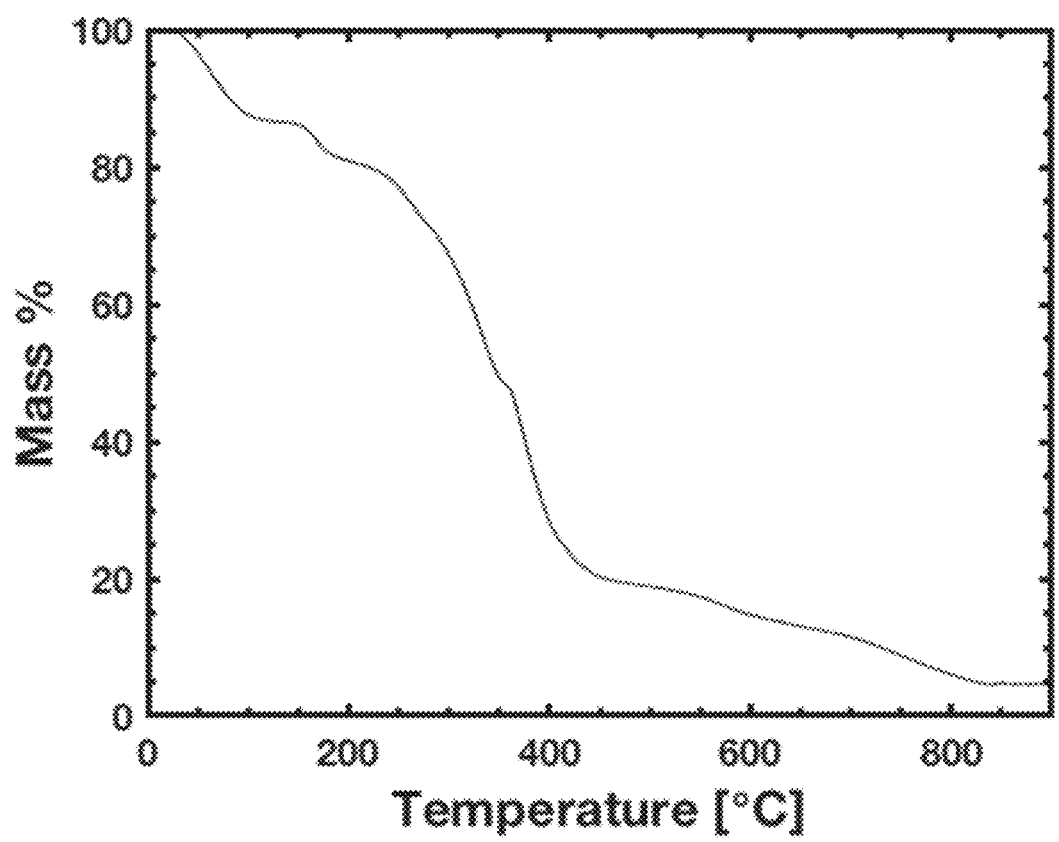
FIG. 21. Thermogravimetric analysis (TGA) of the $Li^+$ and $Co^{2+}$ containing resin under $N_2$ flow. Most of the mass decrease happens between 235 and 450° C.

Thermogravimetric analysis (TGA) was performed (PerkinElmer STA 6000) from 30 to 900° C. at a heating rate of 5° C./min under $N_2$ with a flow rate of 20 mL $min_{-1}$ to evaluate at which temperatures the resin changes mass. The TGA data, shown in FIG. 21, revealed that between 30 and 110° C., a 14% mass loss was seen, likely from the evaporation of water. Around 235° C., a large, somewhat gradual decrease of 59% in mass occurred until 450° C. In this range, the combustion of the nitrate salts and PEGda has occurred in addition to the thermal decomposition of organic material. The mass then decreases more gradually by 15% until 850° C. An important caveat is that this was done under $N_2$ gas instead of air (like the calcination process) because the TGA under air was not available. We would expect the mass change during calcination to be more similar to that in Reference [166] (TGA performed in air), where the combustion happens ~130° C. with a sharp decrease in mass and most of the mass loss is completed around 400° C. However, that resin had a salt loading of 760 mg/mL, much larger than the LCO resin, so the mass loss will likely be somewhat slower for this work. Based on this information, we chose our burn profile to minimize the thermal ramp rate in the temperature range with the largest mass loss (100-500° C.) while increasing the ramp rate over other temperatures to minimize the overall time of the calcination. The samples were calcined in a furnace (MTI OTF-1500X) in air at ~22 torr at 1° C./min to 100° C., 0.25° C./min to 500° C., 2° C./min to 700° C., a 3 hour hold at 700° C., then cooled down to room temperature at 2° C./min. 700° C. was chosen as the maximum temperature because it has been shown to optimize the rate capabilities of LCO [171]. This process has some similarities with solution combustion synthesis, where a metal salt with an oxidizing anion and fuel are mixed in a solvent and heated, producing metal oxide nanoparticles of compounds involving the metal cation due to the heat and gas produced by the combustion reaction [172]. Our process's combination of solution combustion synthesis with photolithography and polymer complex solution has been termed "photopolymer complex synthesis" [166].

Figure 22A:
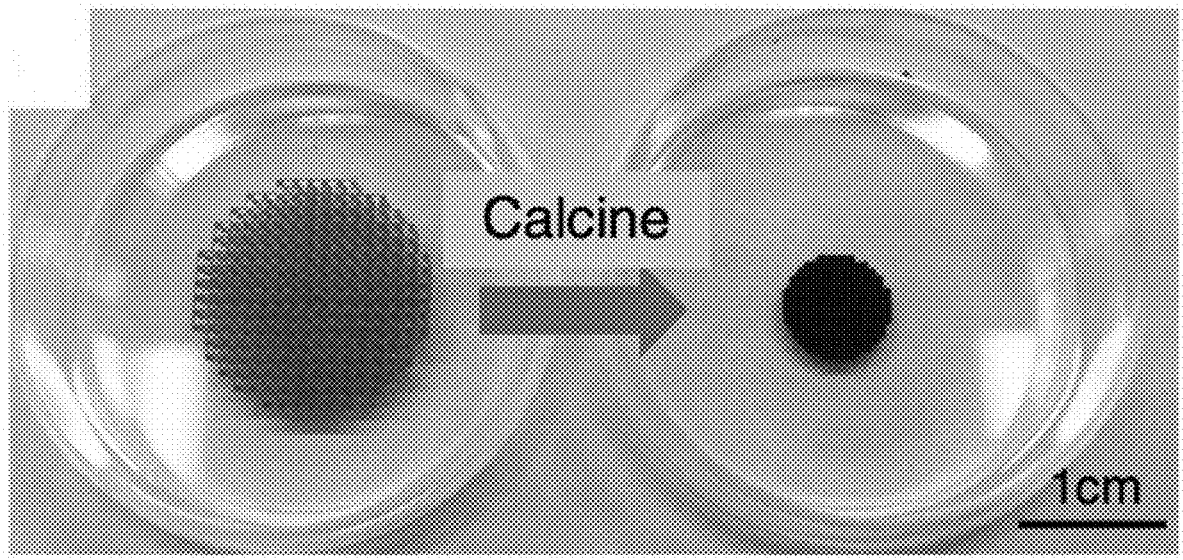
FIG. 22A. Image of the lattices before and after calcination.
Figure 22B:
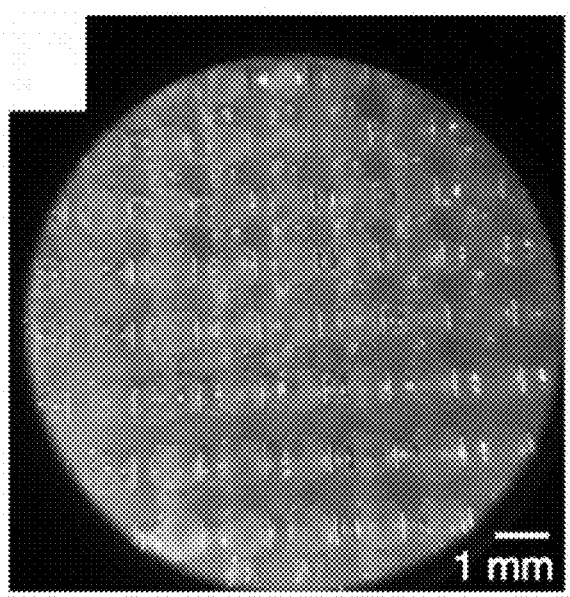
FIG. 22B. Beams of the as-printed lattice and (FIG. 22C) calcined lattice at the same magnification.
Figure 22C:
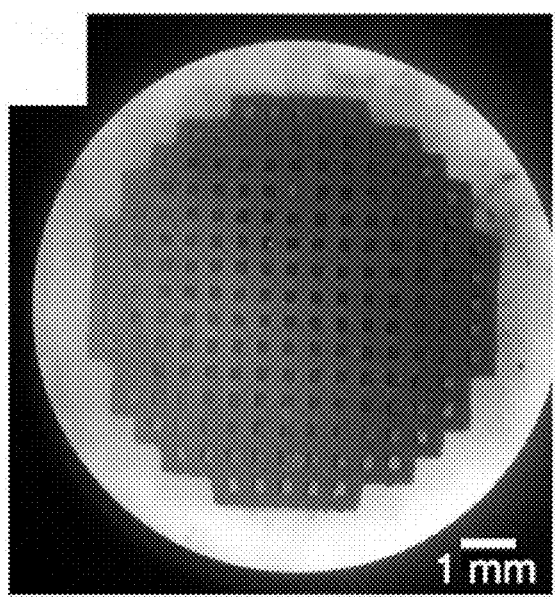

Free-standing lattices were printed with cubic unit cells and beam diameters of ~870 µm and ~240 µm, respectively. The overall shape was roughly cylindrical with 15-20 unit cells in width and 3 unit cells in height producing overall dimensions of 15-16 mm wide and ~2 mm tall (FIGS. 22A-22B). The water content in the printed structures gradually evaporated, so the size of the structures fluctuated due to the time between printing and calcination. Features could be seen on the surface in an ordered pattern with a spacing of ~48 µm. The ordered pattern on the surface of the lattices likely arises from the pixels from the projector. The relative density of the structure, the volume of material in the unit cell divided by the length of the unit cell cubed, is 43%.

Figure 23A:
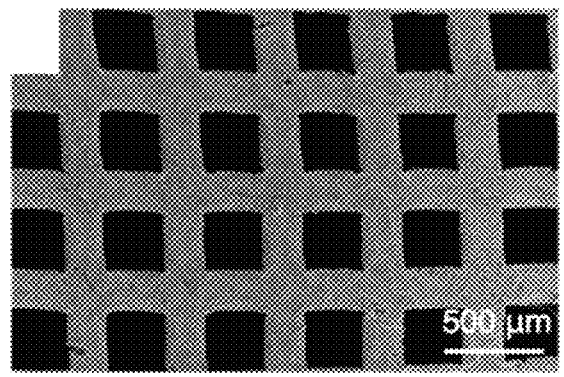
FIG. 23A. Low magnification image of pristine beams of a calcined LCO lattice.
Figure 23B:
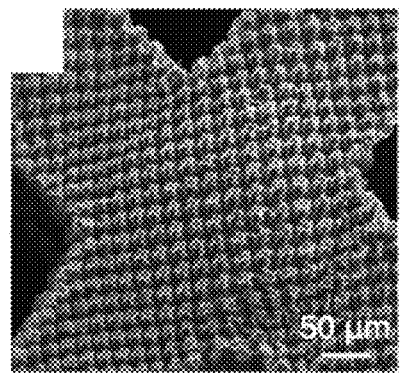
FIG. 23B. The pattern of pixels on a node.
Figure 23C:
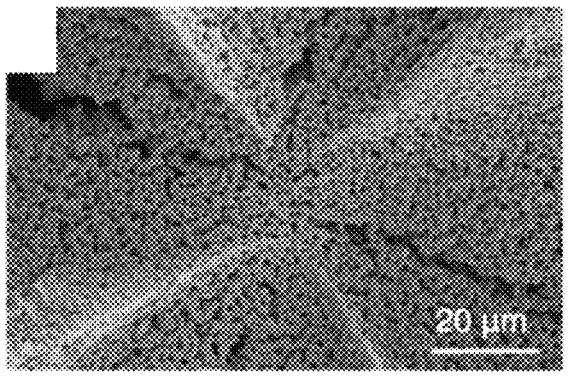
FIG. 23C. A node crack on a heavily-cracked lattice.
Figure 23D:
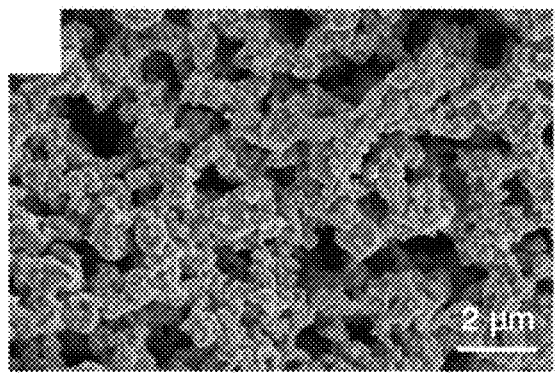
FIG. 23D. A high magnification image of the particle microstructure in the node crack.
Figure 23E:
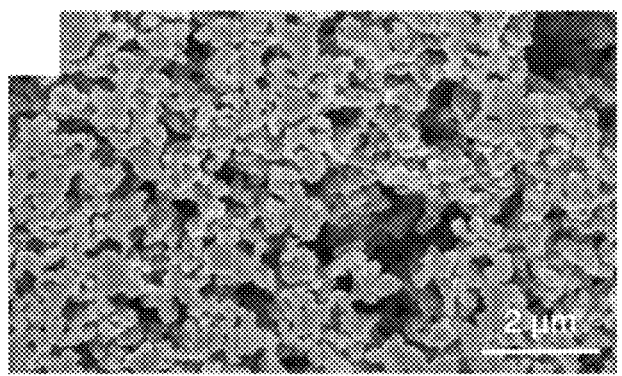
FIG. 23E. FIB cross section image of the particles microstructure in the interior of an intact node.

Post calcination, the lattices turned black with unit cell and beam diameters of ~410 µm and ~140 µm, respectively (FIG. 23A) with a mass loading (mass/area) of 50-60 $mg/cm^2$. The overall dimensions were 7.5-8 mm wide and ~1.3 mm tall and the ordered pattern on the surface of the beams, with a spacing of 23 µm, became more evident (FIG. 23B). FIGS. 23D-23E show the microstructure formed of crystallites with sizes of 230±76 nm with a microscale porosity of ~36% determined by image analysis. The lattices contained some cracks on the surface, mostly located at the nodes (FIG. 23C). These cracks were more common if the thermal ramp rate of the calcination process was relatively high (1° C./min); ramp rates of 0.5° C./min and below produced few surface cracks at the nodes.

Figure 23F:
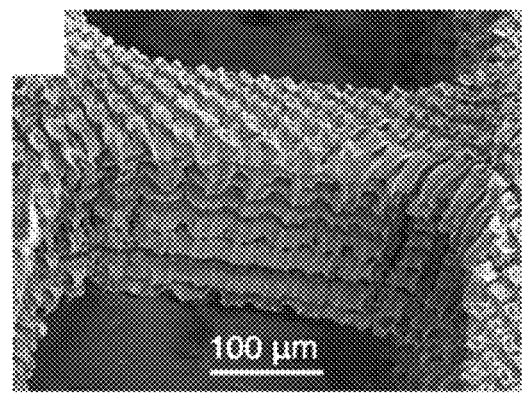
FIG. 23F. The side of a beam revealing the layers of the print, which can also be seen in the FIB cross section (FIG. 23G).

The layers of the printing process were also visible on the sides of the beams, seen in FIG. 23F. FIB cross sections of the beams showed a similar porosity as the surface, sometimes with small ~2 µm spacing between the print layers (FIG. 23G). In some materials, at the nodes, the cross sections revealed large pores of at least 123 µm tall×34 µm wide, illustrated in FIG. 24A. In some materials, nodes of damaged lattices that contained more surface cracks showed large spherical pores between 33 and 146 µm in diameter (FIG. 24B).

The cubic unit cell was chosen as an illustrative example for its simplicity and because some other printing methods, such as inkjet printing, struggle to print overhanging features over free space, which DLP printing easily performs [164]. During the calcination process, water is driven off and the nitrate salts combust the organic molecules in the resin around 130° C. During this combustion and the heat treatment, the cations in the salt oxidize to become oxide nanoparticles [172], which gives rise to the lattice porosity. Theoretical linear shrinkage was calculated as 77% following the method in Reference [166]. Briefly, all the Li and Co in the resin are assumed to fully transform into LCO during calcination and the radius shrinkage of a sphere of resin to a sphere of monolithic LCO is calculated. The calcination decreased the mass of the lattice to an average of 5.44% of the original mass. The measured structural linear shrinkage after heating is 52.7%, so volumetrically it shrinks 89.4% assuming isotropic shrinkage, while the decrease in mass is 94.6%. The pixel pattern on the lattices also shrinks by 52%. The shrinkage in height of about 35% is less than that of the other linear dimensions. This may be due to the difficulty measuring the height of the LCO lattices because of their lack of mechanical robustness and any warping after calcination would increase the apparent height of the lattices. The discrepancy in the leftover material (10.6% of original volume and 5.44% of the original mass) can be explained by the porosity: the mass shrinkage is 51% of the volume shrinkage, somewhat larger than the measured porosity of 36%. However, this porosity is the microscale porosity of the crystallites; it does not take into account the many large pores in the nodes or any other large pores in the lattice, so it is underestimated. The "true" porosity is thus likely close to 51%. To compare the shrinkage to the theoretical shrinkage, the measured linear shrinkage should be multiplied by the porosity, which gives 79.6%, similar to the theoretical linear shrinkage of 77%. The discrepancy may be due to the impurities in the material and non-linearities in shrinkage. The full porosity of the lattices, including both the prescribed structural relative density and porosity, is ~80%.

Cracks and pores, if present, located on the nodes likely result from the $\sqrt{2}$ times longer distance that gas needs to escape in the node vs. a beam. A slower thermal ramp rate should allow more time for the gas to escape during calcination and produce fewer cracks, especially at the nodes. Our observations are consistent with this explanation, as a 0.2° C./min ramp rate produces many fewer cracks than a 1° C./min ramp rate.

The porous, particle-like microstructure seen in these lattices is distinct from the monothilic morphology of lattices with submicron features printed using a similar photoresin and calcination process [166]. That work fabricated structures using two-photon lithography, where a laser is rastered in a photoresin that polymerizes at the laser voxel when the polymer locally absorbs two photons, which allows for a much higher resolution (~1 µm as printed) and smaller throughput (1000 µm³/hr as printed). Because DLP printing produces feature sizes much larger than the grain size and gas has larger distance to escape compared to two-photon lithography, the structures in this work are porous instead of monolithic. In addition, the lower mass loading of salts in our work produce more shrinkage, which also leads to a more porous structure.

The mechanical robustness of the lattices is related to their morphology, which can be tuned by varying parameters of the methods of making the metal-containing materials. In some cases, the porous structure can contain many crystallites that are connected at only a few points, similar to poorly consolidated granular material, which have low strength when poorly connected [173]. The contribution of the nodes plays an important role in the deformation of lattice architectures [174]. Internal pores at the nodes can significantly weaken the lattice as there is less material there to support any applied stress, resulting in failure controlled by beam failure at the nodes (see FIGS. 24C-24D). The strength of brittle materials is largely governed by the flaw size and population inherent in the material due to its processing, with the stress to propagate a crack proportional to 1/pa, where a is the flaw length [175]. The large pores and defects in the lattices can contribute to their low toughness by greatly decreasing the stress necessary to propagate cracks to fracture the structure. The surface cracks from faster thermal ramp rates provide large flaw sizes to further decrease toughness, consistent with our observations that the low thermal ramp rate lattices better resist failure.

Materials Characterization of LCO Structures

Samples were pulverized into a fine powder between glass slides in order to perform powder x-ray diffraction (XRD) on a PANalytical X'Pert Pro x-ray powder diffractometer at 45 kV and 40 mA with a Cu $k_\alpha$ source. FIG. 25A shows the XRD spectrum of the lattices with peaks consistent with the α-NaFeO$_2$ layered structure of LCO (FIG. 25B). The (003)/(104) peak ratio is 1.52; ratios greater than one signal that the cations in the structure are well ordered, improving cycle life [176]. A small peak shift of 0.7° compared to the reference sample [177] was consistent between all samples, even a commercial LCO powder (Sigma Adrich), and so was likely an instrument artifact.

The chemical composition of the lattices was investigated by energy-dispersive x-ray spectroscopy (EDS), performed on a Zeiss 1550VP FESEM with an Oxford X-Max SDD EDS detector at 10 kV (FIG. 25C). EDS spectra of the lattice exhibited mostly Co and O with the composition shown in Table 1. Unfortunately, Li cannot be seen in EDS without specialized equipment due to its low scattering cross-section and absorption of the produced x-rays by the detector window [179]. The ratio of O to Co was 1.9, similar to the ratio in stoichiometric LiCoO$_2$. The impurities in the structure were, in descending order of atomic percentage (at %), C, P, S, Na, and S. The combined at % of impurities was 6.6 at %, assuming an equivalent atomic percentage of Li and Co. The impurities arise from incompletely combusted organic material (C), the photoinitiator (P), the counter ion of the UV blocker (Na), and the UV blocker (S). The elemental maps were generally uniform, even at the pixel level (~20 µm), with a few spots containing excess S around 2 at %. It is possible that S and P reacted with oxygen and another cation to form sulfates or phosphates. These were not detected in XRD; Co fluoresces under Cu $k_\alpha$ radiation which produces a strong background that can obscure any trace impurities [180]. The amount of material that is likely LCO is therefore ~93 at %/~95 wt %. Quantitative elemental data from EDS is somewhat inaccurate, especially for lighter elements, so the exact compositions may vary by a few at %.

TABLE 1

Atomic percentages taken from EDS spectra. The first at % column is the data from the instrument and the second at % column assumes the same at % for Li and Co and recalculates the overall composition.

|    | At % | At % w/Li |
|----|------|-----------|
| O  | 59.5 | 45.1      |
| Co | 31.8 | 24.1      |
| Li | —    | 24.1      |
| C  | 5.1  | 3.9       |
| P  | 2.7  | 2.0       |
| Na | 0.5  | 0.4       |
| S  | 0.4  | 0.3       |

To further confirm the lattices were indeed comprised of electrochemically active LCO, cyclic voltammetry (CV) was performed on slurry electrodes fabricated from lattices pulverized by crushing between glass slides. In a CV experiment, the voltage is swept from the OCV up to an upper voltage, where it is swept back down to a lower voltage. The cycles can then be repeated. Cyclic voltammograms reveal at which voltages electrochemical reactions take place by measuring a peak in current at these voltages.

To fabricate the slurry electrodes, the powder from the crushed LCO structure was first mixed in vortex mixer in a polyethylene vial with isopropyl alcohol and zirconia ball-mill balls for 2 hours. The resulting mixture was poured into a glass dish and dried at 60° C. for 2 hours then at 100° C. in vacuum for 18 hours. The electrode slurry was comprised of 80 wt % of this active material, 10 wt % conductive additive (super C65 carbon black), and 10 wt % binder polyvinylidene fluoride (PVDF) in N-methyl-2-pyrrolidone (NMP). The slurry was mixed in a polyethylene vial with zirconia ball-mill balls for 5 hours. It was then cast onto Al foil with various thickness using a film applicator blade and dried for 12 hours at 50° C. 11.1 mm diameter electrode discs were punched out of the foil and the electrodes were dried for 18 hours at 100° C. under vacuum. Samples were tested in CR2032 coin cells that were assembled in an argon-filled glovebox. 30 µL of 1MLiPF$_6$ in 1:1 ethylene carbonate:diethyl carbonate electrolyte (EC:DEC, BASF Selectilyte LP 40) was used as the electrolyte. Li foil was used as the counter electrode (Sigma Aldrich, purity: 99.9%) with a 25 µm thick polypropylene (PP) separator. CV was performed using a BioLogic BCS-805 battery cycler scanning between 3 V and 4.2 V at a scan rate of 0.005 mV/s, slow enough to approach equilibrium.

Figure 26A:
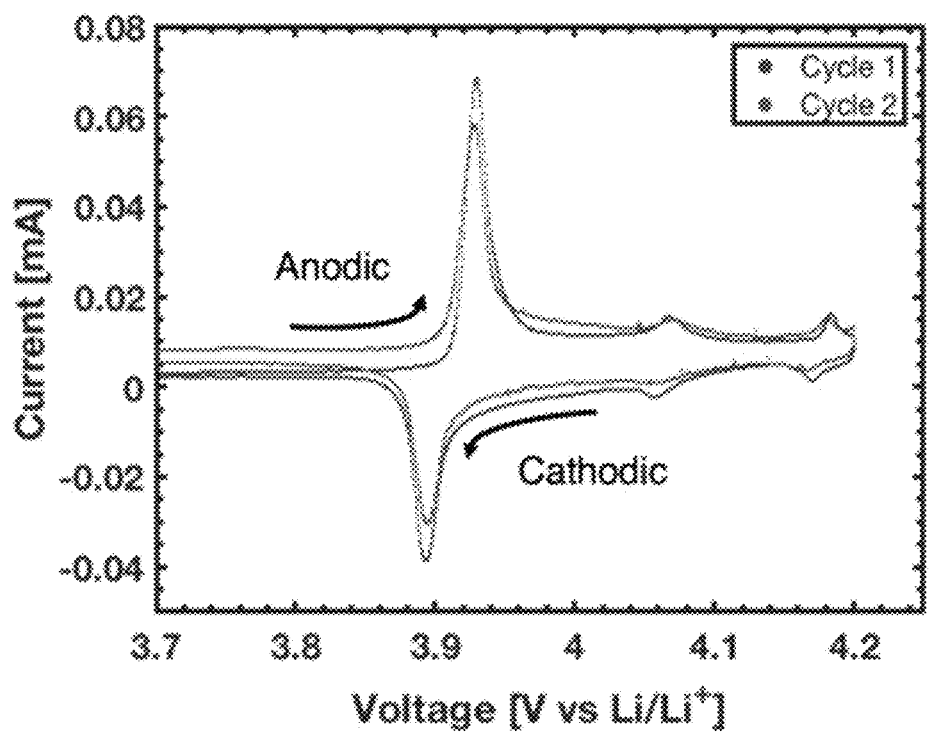
FIG. 26A. 2 cycles of a CV scan at 0.005 mV/s between 3 and 4.2 V. The 3 major LCO peaks fall between ~3.9 and 4.2 V.

FIG. 26A illustrates the primary peaks in the CV scan. During the first cycle, the anodic scan exhibited a large peak at 3.929 V with two smaller peaks at 4.068 and 4.184. The reverse cathodic scan showed corresponding peaks at 3.893 V, 4.056 V, 4.170 V. During the second cycle, the peaks shifted slightly to 3.928 V, 4.071 V, and 4.181 V in the anodic scan and 3.894 V, 4.053 V, and 4.107 V in the cathodic scan. The peaks in the CVs performed on slurry electrodes from LCO lattices are virtually identical to the peaks observed in literature [181, 182]. The redox couple at 3.929/3.893 V corresponds to a first order phase transition between two hexagonal phases, while the peaks at 4.068/4.056 V and 4.184/4.170 V correspond to an order/disorder transition of Li ions with a distortion to a monoclinic phase [181, 183, 184].

Figure 26B:
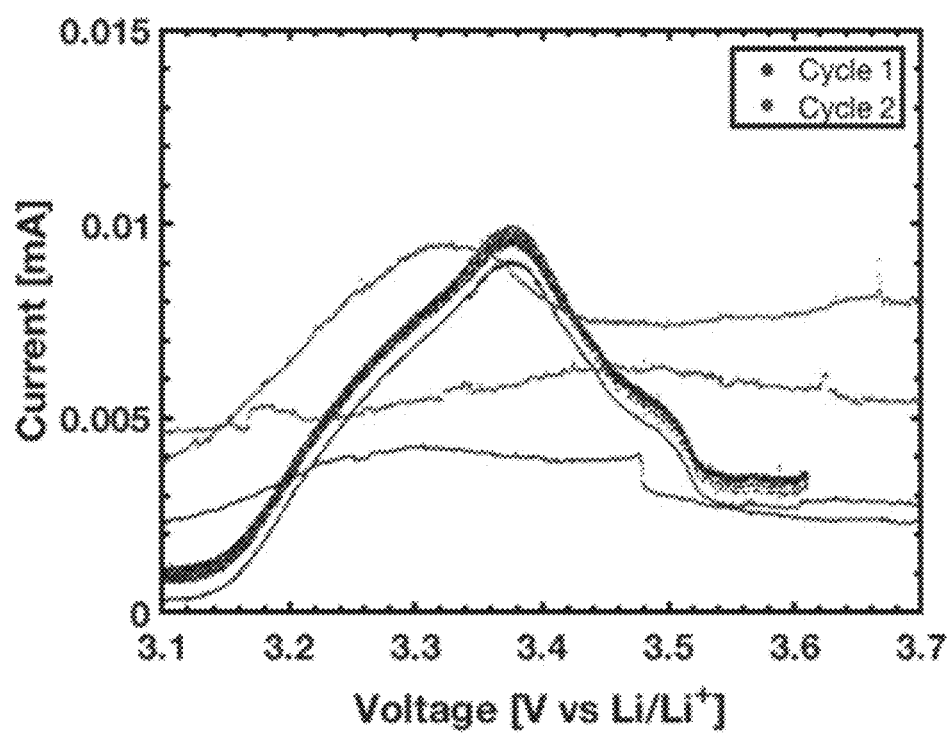
FIG. 26B. Lower voltage peak of the CV scan ~3.4 V. The denser data points below 3.6 V on the anodic scan of the first cycle are due to a different data acquisition rate. The rate was changed around 3.6 V to reduce the overall number of data points.

The peaks in the second cycle were only 11 mV different on average compared to the first cycle, illustrating the reversibility of Li ion intercalation and deintercalation in the fabricated LCO. On the first cycle, there was a broad low voltage peak at 3.38 V that did not have a corresponding cathodic peak (second cycle: 3.35 V), seen in FIG. 26B. The difference in current between the anodic and cathodic scans at this peak for the first cycle was 7.66 µA and decreased on the second cycle to 4.96 µA. This peak is likely due to some impurity in the LCO material or in some other part of the cell, such as the electrolyte, because LCO is not electrochemically active in this range [181]. The current decay between cycles is indicative of the irreversibility of this peak and the small currents suggest that the peak is due to a low concentration impurity.

Electrochemical Performance of 3D LCO Electrodes

To electrochemically probe the structures, they need to be electrically connected to the cathode current collector and infilled with the electrolyte. A conductive adhesive can connect the lattice to a current collector (stainless steel spacer) and taller-than-sample rings can be placed around the lattice so direct pressure is applied to the rings instead of the lattice (see FIG. 27A). PP rings were used because PP is a common LIB separator material and is stable under cycling conditions. The conductive adhesive cannot react with the electrolyte and needs to be stable under the chemical environment and large voltages applied to the cell. Carbon glue (Ted Pella) was first used to stick the lattice to the spacer, and the cell showed no capacity. Upon dissembling, the lattice was not attached to the spacer and the electrolyte was black, i.e. the electrolyte dissolved the carbon glue. This highlights the reactivity of the cell environment and the importance of a conductive adhesive that is stable during cycling.

Figure 27A:
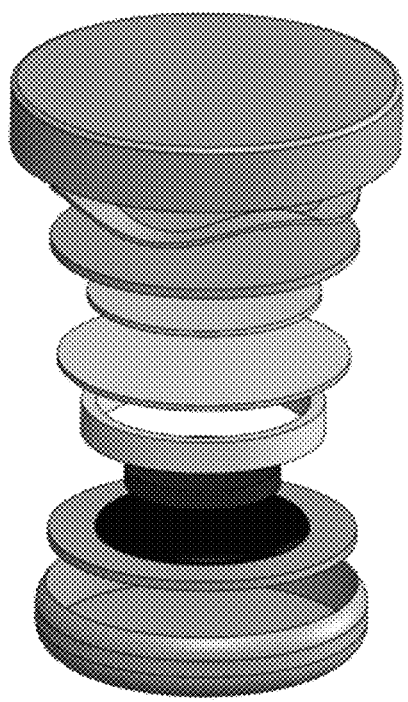
FIG. 27A. Schematic of the cell stack in the 2032 coin cells. Liquid electrolyte is applied into the cell before the separator is added.
Figure 27B:
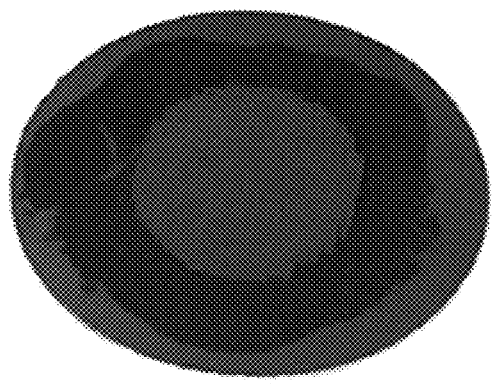
FIG. 27B. LCO lattice attached to a stainless spacer with the carbon adhesive.

Carbon black and PVDF are very commonly added to LIB electrodes as a conductive additive and binder, respectively, and are therefore stable under cycling conditions. A conductive adhesive was fabricated by mixing 75 wt % conductive super C65 carbon black and 25 wt % PVDF binder in NMP in a 1.28 mL:100 mg solvent:solid ingredients ratio. The mixture was mixed in a vortex mixer in a polyethylene vial with zirconia ball-mill balls for 24 hours. The mixture was drop-casted onto a 0.2 mm stainless steel spacer and thinned to ~0.5 mm thickness using a film applicator blade to minimize cracking. The LCO lattice was then carefully placed into the middle of the adhesive and the whole stack was dried at 35° C. for 4 hours (FIG. 27B). Cracks still occurred in the adhesive but the lattices were firmly attached and did not move when the spacer was flipped upside down and shaken with tweezers. PP rings with thickness of 1.6 mm and 0.18 mm with inner and outer diameters of 9.5 mm and 15.9 mm, respectively, were thinned using a rotary power tool to an inner diameter of ~11 mm to more easily fit around the lattices. The rings were placed around the LCO structure to support the stress of the coin cell spring. A 0.18 mm thick PP ring is added if necessary to increase height. FIG. 27A illustrates the cell stack from bottom to top: smaller coin cell case, spacer with lattice attached, a 1.6 mm thick PP ring, a PP separator, Li counter electrode, spacer, spring, and top case. Cells were assembled in an argon-filled glovebox and the electrolyte (1 M $LiPF_6$ in 1:1 EC:DEC) is inserted into the cell cavity until the cell case is full of electrolyte (~400 µL) after the PP rings are placed down. Some electrolyte spilled out the cell during crimping, so the actual amount of electrolyte in the cell is less than 400 µL. The available volume in the cell cavity for the electrolyte is approximately 150-200 µL. Control cells that contain PP rings and the carbon adhesive did not exhibit any capacity.

Figure 28A:
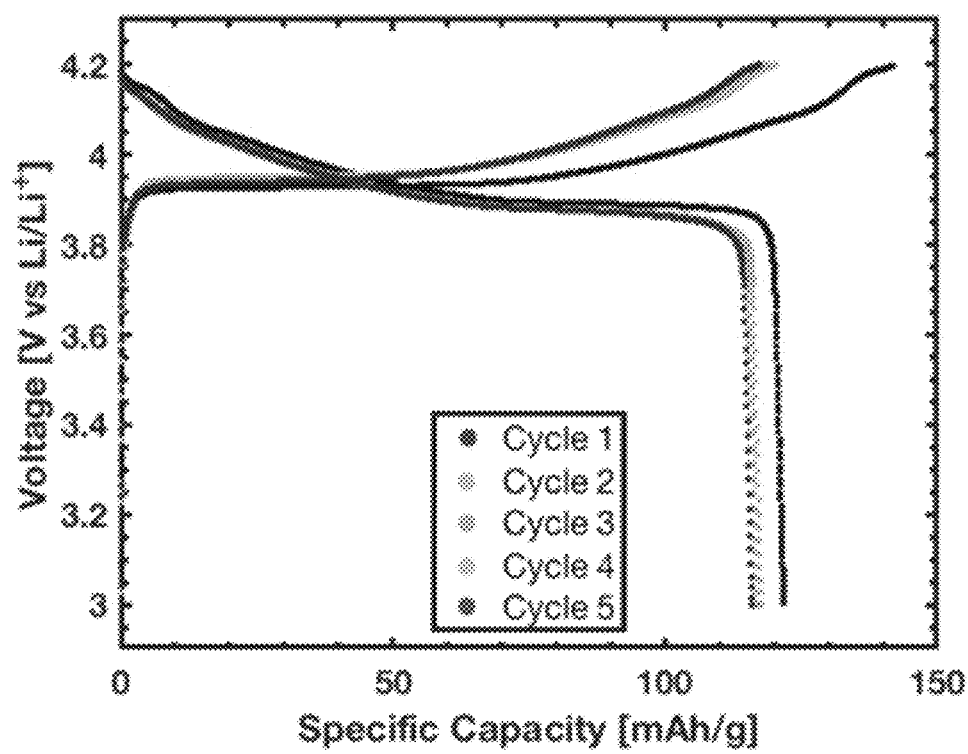
FIGS. 28A-28D. Electrochemical performance of the LCO lattice.

Coin cells were analyzed by either a BioLogic BCS-805 battery cycler or Neware BTS4000 cycler and were cycled galvanostatically between 3.0 and 4.2 V at C/40 for two cycles, slow enough to minimize polarization, then at increasing rates for 5 cycles each to 2C, then for up to 200 cycles at C/10. A rate of 1C corresponds to a discharge or charge in 1 hour based on the theoretical capacity of LCO (155 mAh/g), 2C corresponds to a 30 minute half-cycle, etc. The voltage profiles for LCO lattices seen in FIG. 28A show a plateau around 3.93 V on charge and 3.88 V on discharge and small plateaus ~4.15 V and 4.2 V on charge and discharge with a first cycle irreversibility of 20 mAh/g at C/40. This voltage profile is similar to that of LCO reported in the literature, with a plateau ~3.9 V and small plateaus ~4.1 and 4.2 V around 10 mAh/g of charge or discharge [182]. These plateaus correspond to the peaks in the CV, which arise from a first order phase transition and order/disorder transition, respectively [183]. The combination of CV, voltage profiles, XRD, and EDS all provide confidence that the 3D architected electrodes are comprised of electrochemically active LCO, essentially identical to that commonly used in LIB cathodes.

Figure 28B:
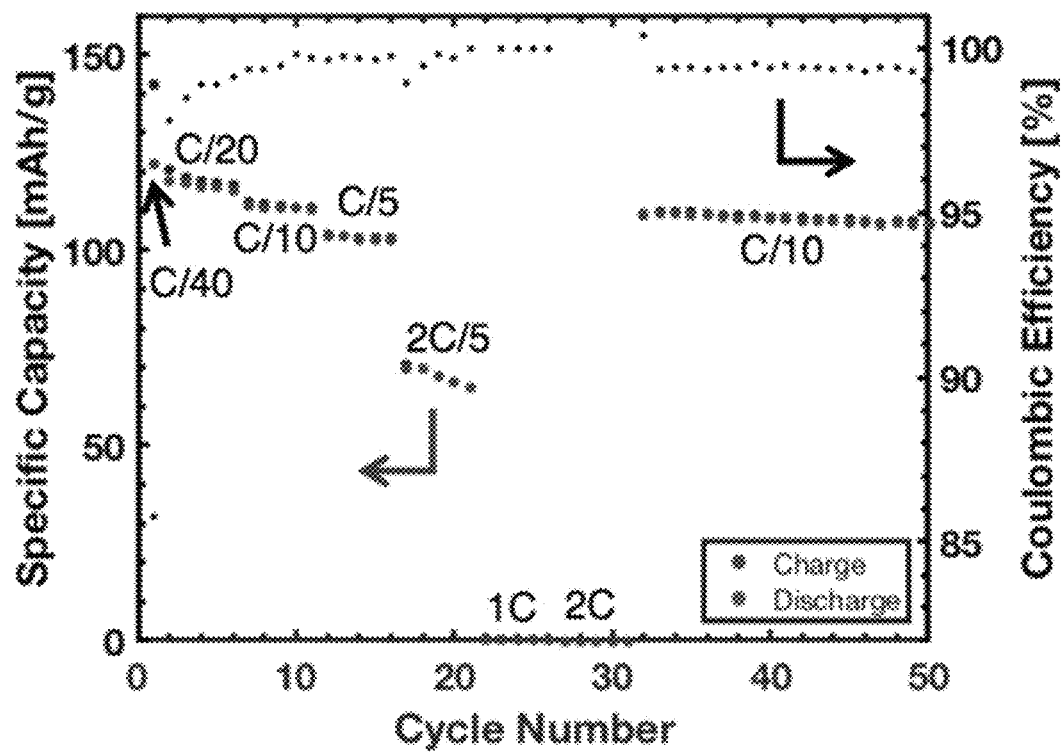
Figure 28C:
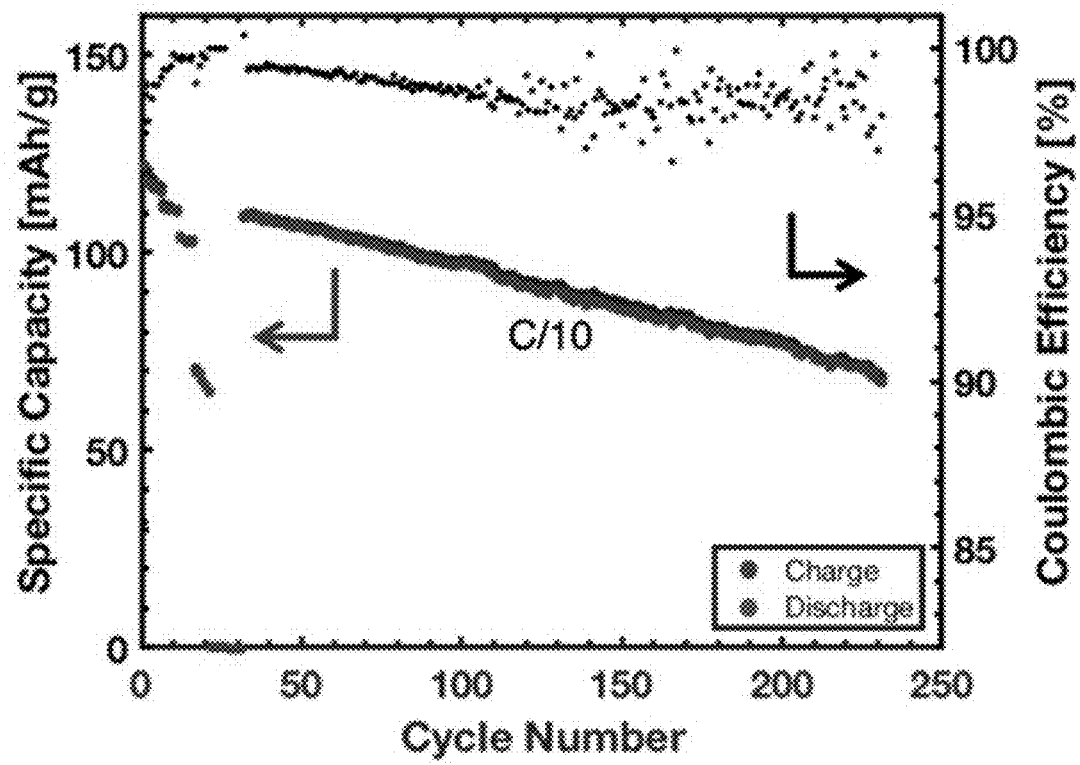

The first specific discharge capacity at C/40 was 122 mAh/g, and the first discharge capacities at C/20, C/10, C/5, and 2C/5 are 96.6%, 91.4%, 85.0%, and 57.2% of the first discharge capacity at C/40, respectively (FIG. 28B). The lattices did not show capacity at rates of 1C or 2C. Two samples cycled at 2C/3 showed a capacity of 21.9% compared to C/40. The average Coulombic efficiency (CE), the ratio between the discharge and charge capacities, for the first 88 cycles at C/10 (110 overall cycles) was 99.0% with a standard deviation of 0.373. Interestingly, during the subsequent cycles, the variance in CE increased, with an average of 98.4% and standard deviation of 0.608. Small sections of the structure losing and regaining electrical contact during the later cycles could explain the variance increase. FIG. 28C illustrates the extended cycling, with a linear capacity decay of 0.18% per cycle over 231 cycles. The first specific discharge capacity at C/40 of 122 mAh/g is lower than the theoretical capacity of 155 mAh/g for $LiCoO_2$ ! $Li_{0.5}CoO_2$, although it is very similar to LCO particles fabricated by conventional combustion synthesis [186, 187].

Factors that can influence capacity of the cell include impurity content, mechanical failure (e.g., breakage) of the metal-containing lattice, and loss of electrical communication in the cell, such as during fabrication, such as if some parts of the lattice are covered by the C adhesive, incomplete electrolyte infiltration, and the Ohmic drop across the electrode. If there is no conductive additive and the electrode is relatively tall, the electrical resistance from LCO (a semiconductor in the lithiated state [188]) contributes to a large Ohmic drop. The addition of a large (~30 wt %) amount of conductive additive has been shown to increase gravimetric capacity [171]; this amount of inactive materials can decrease the absolute capacity, however.

Figure 28D:
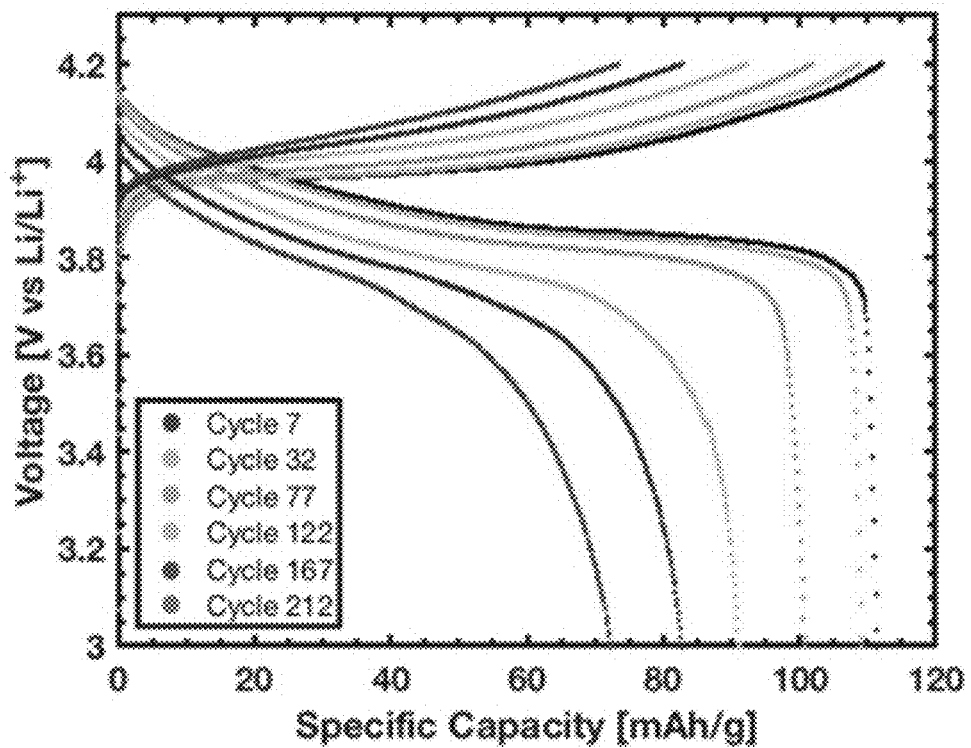

The polarization, defined as the difference in voltage between charge and discharge at 10% state of charge, gradually increased during extended cycling at C/10, with a polarization of 0.14 V for cycle 7 (first C/10 cycle), 0.15 V for cycle 32, 0.19 V for cycle 77, 0.41 V for cycle 122, 0.51 for cycle 167, and 0.62 V for cycle 212 (FIG. 28D). Cycle 32 is the sixth C/10 cycles and all subsequent cycles were at C/10. Polarization increasing during cycling is typical for LIB electrodes and is normally attributed to disconnection of active material and a gradually thickening SEI layer [189]. These degradation mechanisms may be somewhat exacerbated in the LCO structures due to their lack of mechanical stability and larger surface area.

Figure 29A:
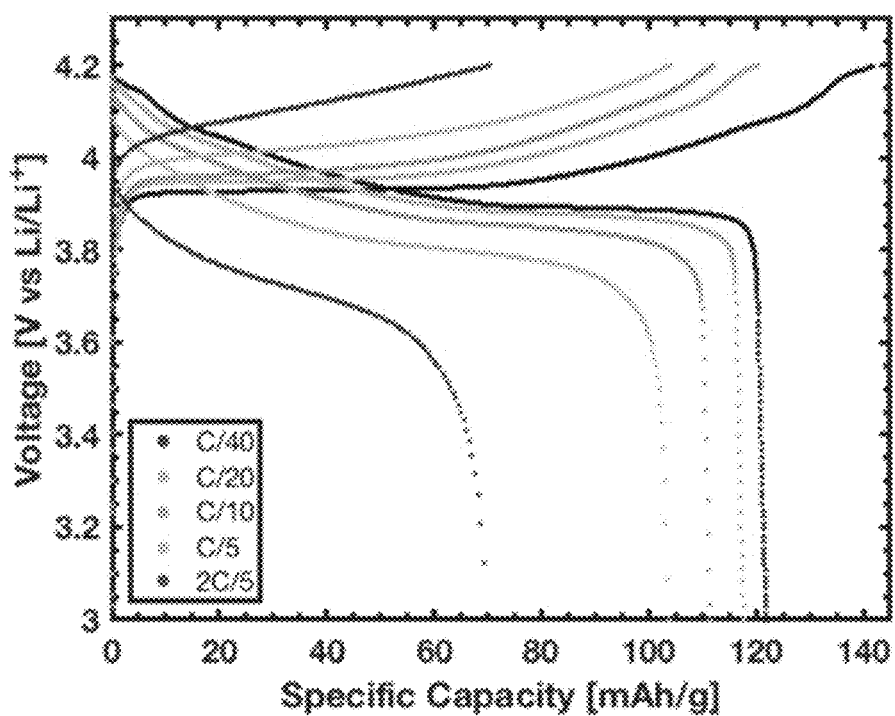
FIG. 29A. Voltage profile of the first cycle at various currents.

The polarization also increased for increasing current, with values of 0.046 V for C/40, 0.090 V for C/20, 0.14 V for C/10, 0.29 V for C/5, and 0.52 V for 2C/5. The voltage curves for the first cycle at each current are shown in FIG. 29A. Polarization almost always increases with current, as the Ohmic drop, activation polarization, and concentration polarization increase with current [16]. The lack of conductive additive and large electrode height will increase the Ohmic drop, reducing the capacity at larger currents. If the polarization, which is linear with current, is extrapolated to 1C, the polarization would be 1.3 V, greater than the experimental voltage range, resulting in no measured capacity.

Figure 29B:
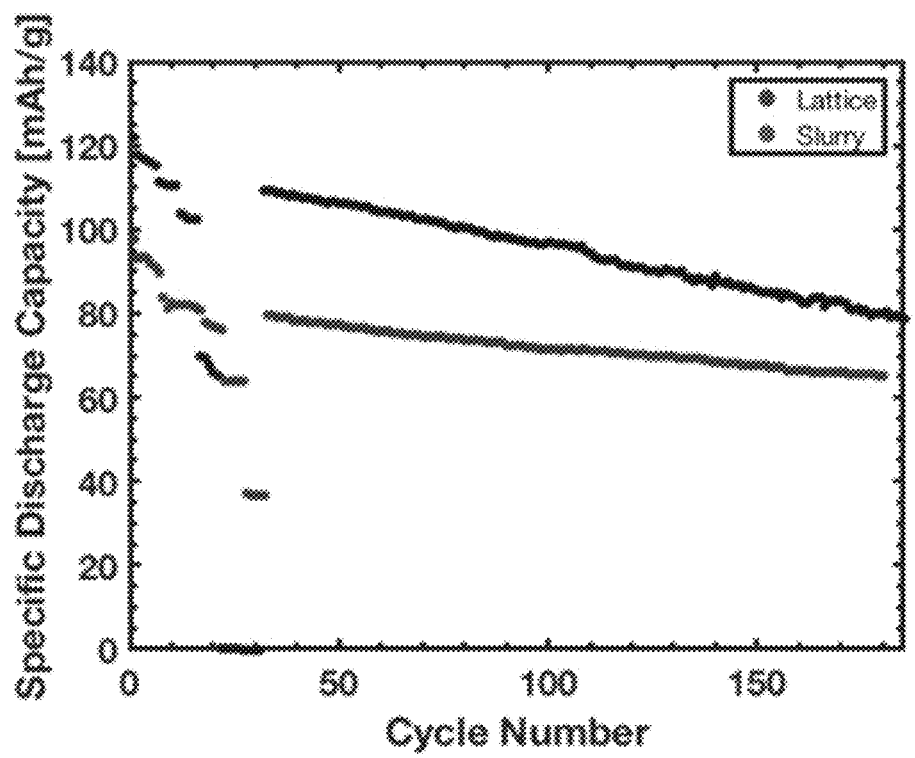
FIG. 29B. Specific discharge capacity of a LCO lattice vs. a slurry electrode fabricated from pulverized LCO lattices.
Figure 29C:
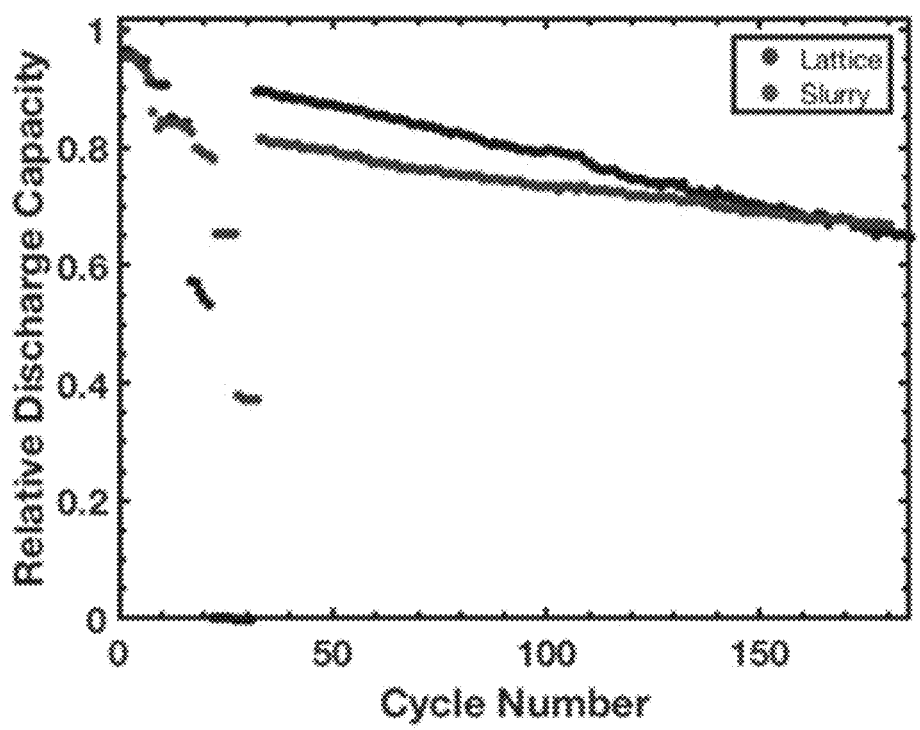
FIG. 29C. Discharge capacity of a LCO lattice vs. a slurry electrode fabricated from pulverized LCO lattices relative to the first discharge capacity.

Slurry electrode fabricated from pulverized lattices exhibited lower gravimetric capacities around 97 mAh/g at C/40. The capacities at C/20, C/10, C/5, 2C/5, 1C, and 2C are 95.8%, 86.0%, 84.1%, 79.9%, 65.2%, and 37.9% of the first discharge capacity, respectively (FIG. 29B). The areal capacity of the lattice was 35× larger than the areal capacity of the slurry electrodes, largely driven by the 28× increase in mass loading provided by the relatively tall structure. Because of the thinness of the slurry (~25 μm thick), the transport length for Li ions during cycling is greatly reduced, allowing for much higher relative capacity at 2C/5, 1C, and 2C compared to the lattice. In addition, the 10 wt % of C conductive additive improves the high rate performance of the slurry electrodes. The decay rate was also roughly linear and smaller than that of the lattices, at 0.12% per cycle (FIG. 28C). The larger decay rate and worse high current performance of the 3D LCO structures is again likely due to the lack of conductive additive and structural features that can disconnect during cycling. The lower specific capacity for the slurry is surprising, as it should be similar to that of the lattice. Likely, the slurry-making procedure resulted in the lower specific capacity, possibly due to film delamination; the slurry electrodes exhibited lower gravimetric capacity compared to the lattice electrodes over all 9 samples. Nevertheless, this comparison allows us to decouple the electrochemical properties of the 3D structure vs. the material; the poor performance of the 3D electrodes at higher rates is due to the structure and height, while the low current capacity of the architected electrodes is limited by the inherent material.

Figure 30A:
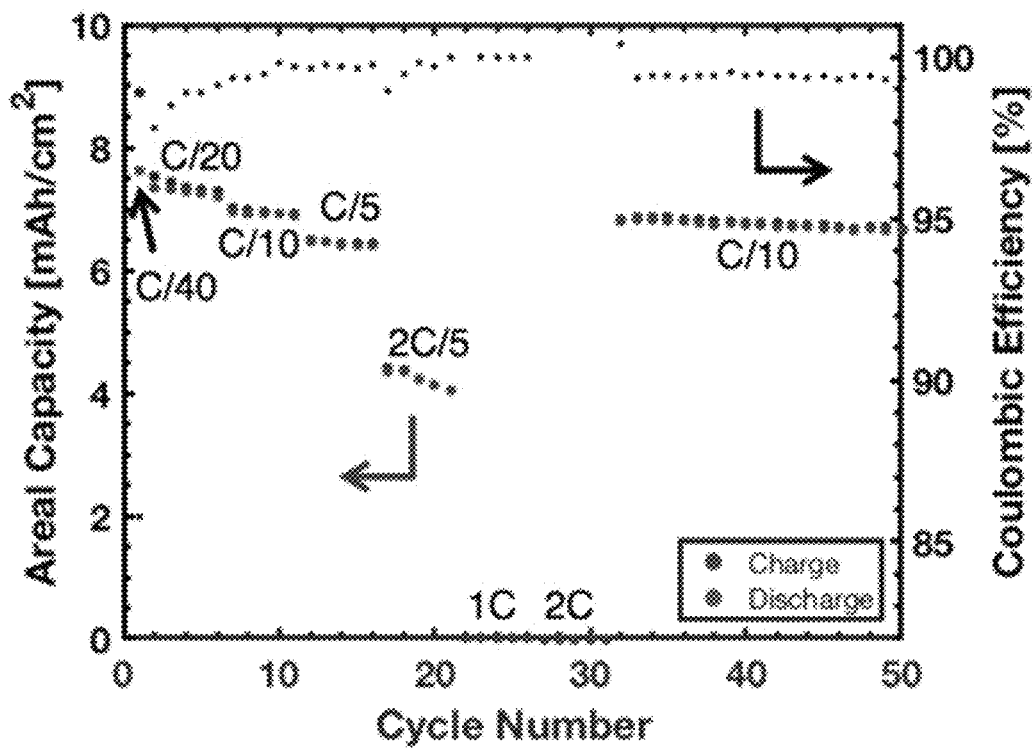
FIG. 30A. Areal capacity and Coulombic efficiency of a LCO lattice during the first 50 cycles of cycling at various currents.
Figure 30B:
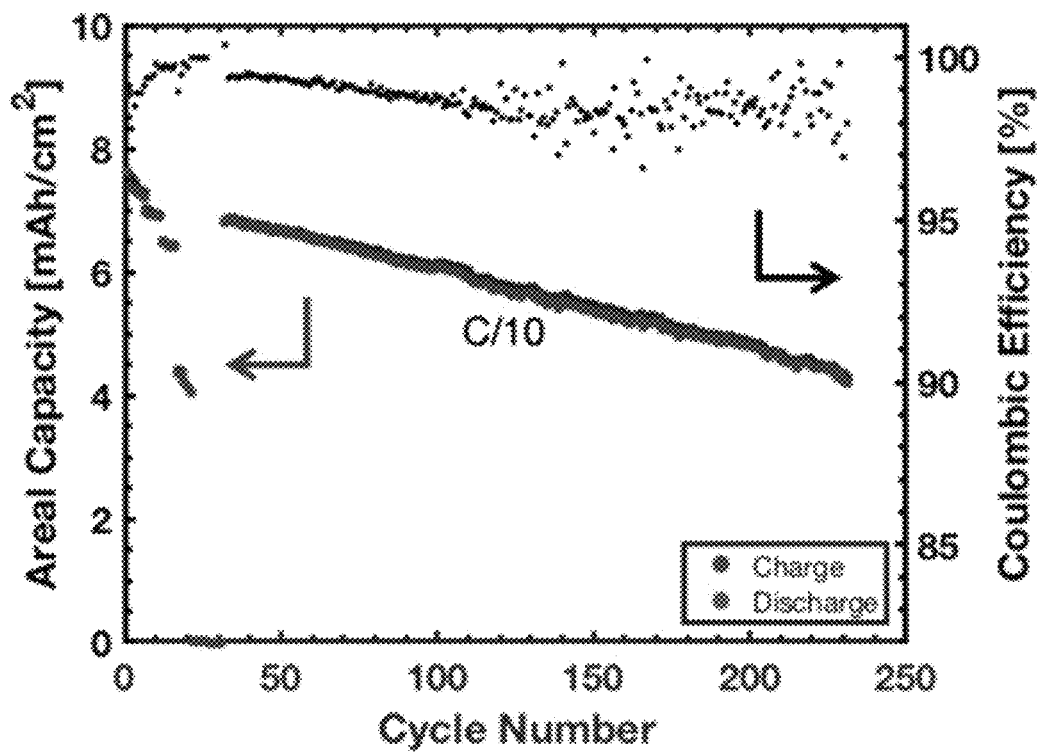
FIG. 30B. Areal capacity and Coulombic efficiency of a LCO lattice over 231 cycles.

The first areal discharge capacity of the lattices at C/40 is 7.6 mAh/cm$^2$, ~2 times larger than conventional slurry electrodes. The areal capacity during cycling is shown in FIGS. 30A-30B. The improvement in areal capacity is due to the large increase in height made feasible by the additive manufacturing process. It is difficult to create electrodes with these heights using other methods, often requiring densely sintered electrodes [188] or ink based 3D printing [159]. Areal capacities over 10 mAh/cm$^2$ have been demonstrated using various deposition methods. For example, Wei et al. 3D printed 1 mm $Li_4Ti_5O_{12}$ and $LiFePO_4$ electrodes using an ink-based printing process and measured ~13 mAh/cm$^2$ for a full cell at low current densities (0.2 mA/cm$^2$) [159]. Using LCO electrodeposited onto a carbon foam, Zhang et al. achieved ~20 mAh/cm$^2$ at C/5 [154]. Lu et al. fabricated ~1 mm thick LCO electrodes by infilling a wood template and infilling the resulting structure again to reach 22.7 mAh/cm$^2$ [190]. The 3D printed LCO lattices in this work did not reach the large areal capacities of these other works due to their mass loading limitations from the overall porosity of the structure ~80%. However, the lattices still provided a ~2 increase in areal capacity over traditional planar electrodes and provide other advantages, such as the ability to print arbitrary structures that are binder and scaffold-free. DLP printing is also inherently a faster and more scalable technology compared to many other 3D printing technologies [164]. The time to print scales almost exclusively with height because each layer prints simultaneously, so the printing of structures that are much larger in the x-y directions or many smaller structures of the same height happens in virtually the same time as one coin cell-sized structure.

There are multiple routes that are contemplated to improve and optimize the electrochemical performance of printed LCO structures. Other unit cell geometries, such as an octet, could increase mass loading with the same beam diameter and provide more stiffness and strength. The burn profile can be optimized to reduce porosity and defects by reducing the thermal ramp rate and burning at the maximum temperature for longer times. A second infill step could be used to greatly increase mass loading, similar to Li et al. [190]. The chemistry in the resin can also be tuned; salts that are less oxidizing than nitrates, such as acetates, could reduce the violence of combustion and therefore increase mechanical robustness and mass loading. The concentration of salts could be optimized to control the resolution and porosity of the structure. Reduction in pixel size in the micrometer display of DLP printers could also improve resolution. If the calcination profile is optimized to increase mechanical stability and carbon content, then the electrochemical performance may also be enhanced by reducing polarization.

The metal cations in the photoresin and their concentrations can be tuned to produce oxide 3D structures of various LIB-relevant materials. This chapter was focused on fabricating and characterizing LCO lattices, but some resins were made with salts in the correct stoichiometric ratios to produce another common LIB cathode, $LiNi_{0.8}Co_{0.15}Al_{0.5}O_2$ (NCA). Using a very similar procedure as discussed in this chapter, NCA lattices were fabricated with similar dimensions to LCO lattices. FIG. 31A shows the XRD spectrum from pulverized NCA lattices that reveals peaks from the lattices that match with the α-NaFeO$_2$ layered structure of NCA with a (003):(104) peak ratio of 1.12. EDS reveals that the lattices are comprised of mostly O and Ni in addition to Co and Al (FIG. 31B), with impurities of C, P, S, and Na. The molar ratio of Ni/Co and Ni/Al was 5.4 and 13.6, respectively, similar to the ideal ratio of 5.3 and 16 for NCA. The deviation in the Ni/Al ratio is likely due to the inaccuracies of EDS for light elements and small at %. However, the measured ratio of Ni/O is 0.63, much higher than the ideal ratio of 0.4. The reason for this is currently unclear, but the composition may be corroborated with other techniques, such as x-ray photoelectron spectroscopy and mass spectroscopy. The voltage profile of the NCA lattices, measured by cycling at C/40 and C/20 between 3 and 4.3 V, is shown in FIG. 31C, which reveals a sloping voltage with a sharp drop ~3.4 V on discharge and a first discharge specific capacity of 135 mAh/g. This profile is similar to the characteristic voltage profile of NCA, while the specific capacity of NCA can reach 200 mAh/g [191]. The lower capacity is likely due to similar reasons as the lower capacity from the LCO lattices, in addition to deviations from the ideal stoichiometry. The capability of photopolymer complex synthesis to fabricate efficient LIB electrodes out of more complicated oxides, such as NCA, is still currently under investigation.

In summary of this Example: Free-standing architected 3D LCO electrodes were fabricated at coin cell dimensions using a novel photopolymer system with DLP 3D printing. Metal salts in the photopolymer resin were oxidized during calcination to create an architected oxide structure. The lattices were printed with ~120 μm beam diameters with overall (structural and microscale) porosities ~80%. XRD, EDS, and CV all provide complimentary evidence that the lattices were indeed comprised of LCO, with ~5 wt % of impurities. The LCO lattices exhibited gravimetric capacities of 122 mAh/g and areal capacities up to ~8 mAh/cm$^2$ with a capacity retention of 82% over 100 cycles. This represents a reasonable gravimetric capacity and cycle life with an areal capacity ~2x higher than conventional electrodes. The large variable space of this fabrication process could be optimized to improve the electrochemical properties of printed structures and can be adapted to manufacture architected 3D electrodes out of many other LIB-relevant materials, such as NCA. 3D architected cathodes such as those discussed in this chapter may eventually be utilized in Li solid-state batteries with high energy and power densities.

REFERENCES CORRESPONDING TO EXAMPLE 10

[1] C. Curry, "Lithium-ion battery costs and market," Bloom. New Energy Finance, vol. 5, 2017.
[2] P. Albertus, S. Babinec, S. Litzelman, and A. Newman, "Status and challenges in enabling the lithium metal electrode for high-energy and low-cost rechargeable batteries," Nat. Energy, vol. 3, no. 1, p. 16, 2018.
[3] Z. P. Cano, D. Banham, S. Ye, A. Hintennach, J. Lu, M. Fowler, and Z. Chen, "Batteries and fuel cells for emerging electric vehicle markets," Nat. Energy, vol. 3, no. 4, p. 279, 2018.
[4] G. E. Blomgren, "The development and future of lithium ion batteries," J. Electrochem. Soc., vol. 164, no. 1, pp. A5019-A5025, 2017.
[5] B. Scrosati, "History of lithium batteries," J. Solid State Electrochem., vol. 15, no. 7-8, pp. 1623-1630, 2011.
[6] M. S. Whittingham, "Chemistry of intercalation compounds: Metal guests in chalcogenide hosts," Prog. Solid State Chem., vol. 12, no. 1, pp. 41-99, 1978.
[7] K. Mizushima, P. C. Jones, P. J. Wiseman, and J. B. Goodenough, "LixCoO2 (0<x<−1): A new cathode material for batteries of high energy density," Mater. Res. Bull., vol. 15, no. 6, pp. 783-789, 1980.
[8] R. Yazami and P. Touzain, "A reversible graphite-lithium negative electrode for electrochemical generators," J. Power Sources, vol. 9, no. 3, pp. 365-371, 1983.
[9] A. Yoshino, K. Sanechika, and T. Nakajima, "Secondary battery," May 1987.
[10] S. Flandrois and B. Simon, "Carbon materials for lithium-ion rechargeable batteries," Carbon, vol. 37, no. 2, pp. 165-180, 1999.
[11] N. Nitta, F. Wu, J. T. Lee, and G. Yushin, "Li-ion battery materials: Present and future," Mater. Today, vol. 18, no. 5, pp. 252-264, 2015.
[12] K. Xu, "Electrolytes and interphases in Li-ion batteries and beyond," Chem. Rev., vol. 114, no. 23, pp. 11503-11618, 2014.
[13] M. F. Lagadec, R. Zahn, and V. Wood, "Characterization and performance evaluation of lithium-ion battery separators," Nat. Energy, p. 1, 2018.
[14] J. B. Goodenough and K.-S. Park, "The Li-ion rechargeable battery: A perspective," J. Am. Chem. Soc., vol. 135, no. 4, pp. 1167-1176, 2013.
[15] X. H. Liu, L. Zhong, L. Q. Zhang, A. Kushima, S. X. Mao, J. Li, Z. Z. Ye, J. P. Sullivan, and J. Y. Huang, "Lithium fiber growth on the anode in a nanowire lithium ion battery during charging," Appl. Phys. Lett., vol. 98, no. 18, p. 183107, 2011.
[16] T. B. Reddy, Linden's Handbook of Batteries, vol. 4. McGraw-hill New York, 2011.
[17] J. Lee, A. Urban, X. Li, D. Su, G. Hautier, and G. Ceder, "Unlocking the potential of cation-disordered oxides for rechargeable lithium batteries," Science, vol. 343, no. 6170, pp. 519-522, 2014.
[18] M. M. Thackeray, S.-H. Kang, C. S. Johnson, J. T. Vaughey, R. Benedek, and S. A. Hackney, "Li 2 MnO 3-stabilized LiMO 2 (M=Mn, Ni, Co) electrodes for lithium-ion batteries," J. Mater. Chem., vol. 17, no. 30, pp. 3112-3125, 2007.
[19] H. Li, J. Pang, Y. Yin, W. Zhuang, H. Wang, C. Zhai, and S. Lu, "Application of a nonflammable electrolyte containing Pp13TFSI ionic liquid for lithium ion batteries using the high capacity cathode material Li [Li 0.2 Mn 0.54 Ni 0.13 Co 0.13] O 2," RSC Adv., vol. 3, no. 33, pp. 13907-13914, 2013.
[20] A. Abouimrane, I. Belharouak, and K. Amine, "Sulfone-based electrolytes for high-voltage Li-ion batteries," Electrochem. Commun., vol. 11, no. 5, pp. 1073-1076, 2009.
[21] H. Wu and Y. Cui, "Designing nanostructured Si anodes for high energy lithium ion batteries," Nano Today, vol. 7, no. 5, pp. 414-429, 2012.
[22] "Sila Nanotechnologies." https://silanano.com/.
[23] "Nexeon I Building better batteries I Transformative silicon-based anode technology." https://www.nexeon.co.uk/.
[24] W. Xu, J. Wang, F. Ding, X. Chen, E. Nasybulin, Y. Zhang, and J.-G. Zhang, "Lithium metal anodes for rechargeable batteries," Energy Environ. Sci., vol. 7, no. 2, pp. 513-537, 2014.
[25] D. Lin, Y. Liu, and Y. Cui, "Reviving the lithium metal anode for high-energy batteries," Nat. Nanotechnol., vol. 12, no. 3, p. 194, 2017.
[26] Z. Li, J. Huang, B. Y. Liaw, V. Metzler, and J. Zhang, "A review of lithium deposition in lithium-ion and lithium metal secondary batteries," J. Power Sources, vol. 254, pp. 168-182, 2014.
[27] F. Orsini, A. Du Pasquier, B. Beaudoin, J. M. Tarascon, M. Trentin, N. Langenhuizen, E. De Beer, and P. Notten, "In situ scanning electron microscopy (SEM) observation of interfaces within plastic lithium batteries," J. Power Sources, vol. 76, no. 1, pp. 19-29, 1998.

[28] M. D. Tikekar, S. Choudhury, Z. Tu, and L. A. Archer, "Design principles for electrolytes and interfaces for stable lithium-metal batteries," Nat. Energy, vol. 1, no. 9, p. 16114, 2016.

[29] Y. Lu, Z. Tu, and L. A. Archer, "Stable lithium electrodeposition in liquid and nanoporous solid electrolytes," Nat. Mater., vol. 13, no. 10, p. 961, 2014.

[30] A. Zhamu, G. Chen, C. Liu, D. Neff, Q. Fang, Z. Yu, W. Xiong, Y. Wang, X. Wang, and B. Z. Jang, "Reviving rechargeable lithium metal batteries: Enabling next-generation high-energy and high-power cells," Energy Env. Sci, vol. 5, no. 2, pp. 5701-5707, 2012.

[31] F. Ding, W. Xu, G. L. Graff, J. Zhang, M. L. Sushko, X. Chen, Y. Shao, M. H. Engelhard, Z. Nie, and J. Xiao, "Dendrite-free lithium deposition via self-healing electrostatic shield mechanism," J. Am. Chem. Soc., vol. 135, no. 11, pp. 4450-4456, 2013.

[32] H. Yang, E. O. Fey, B. D. Trimm, N. Dimitrov, and M. S. Whittingham, "Effects of Pulse Plating on lithium electrodeposition, morphology and cycling efficiency," J. Power Sources, vol. 272, pp. 900-908, December 2014.

[33] C. Monroe and J. Newman, "The impact of elastic deformation on deposition kinetics at lithium/polymer interfaces," J. Electrochem. Soc., vol. 152, no. 2, pp. A396-A404, 2005.

[34] A. Ferrese and J. Newman, "Mechanical deformation of a lithium-metal anode due to a very stiff separator," J. Electrochem. Soc., vol. 161, no. 9, pp. A1350-A1359, 2014.

[35] A. Manthiram, X. Yu, and S. Wang, "Lithium battery chemistries enabled by solid-state electrolytes," Nat. Rev. Mater., vol. 2, no. 4, p. 16103, 2017.

[36] F. Han, A. S. Westover, J. Yue, X. Fan, F. Wang, M. Chi, D. N. Leonard, N. J. Dudney, H. Wang, and C. Wang, "High electronic conductivity as the origin of lithium dendrite formation within solid electrolytes," Nat. Energy, vol. 4, no. 3, p. 187, 2019.

[37] L. Porz, T. Swamy, B. W. Sheldon, D. Rettenwander, T. Frömling, H. L. Thaman, S. Berendts, R. Uecker, W. C. Carter, and Y.-M. Chiang, "Mechanism of lithium metal penetration through inorganic solid electrolytes," Adv. Energy Mater., vol. 7, no. 20, p. 1701003, 2017.

[38] J. A. Lewis, F. J. Q. Cortes, M. G. Boebinger, J. Tippens, N. Kondekar, X. Liu, M. Chi, and M. T. McDowell, "Interphase morphology between a solid-state electrolyte and lithium controls cell failure," ACS Energy Lett., vol. 4, no. 2, pp. 591-599, 2019.

[39] J. Wolfenstine, H. Jo, Y.-H. Cho, I. N. David, P. Askeland, E. D. Case, H. Kim, H. Choe, and J. Sakamoto, "A preliminary investigation of fracture toughness of Li7La3Zr2O12 and its comparison to other solid li-ionconductors," Mater. Lett., vol. 96, pp. 117-120, 2013.

[40] C. Xu, Z. Ahmad, A. Aryanfar, V. Viswanathan, and J. R. Greer, "Enhanced strength and temperature dependence of mechanical properties of Li at small scales and its implications for Li metal anodes," Proc. Natl. Acad. Sci., vol. 114, no. 1, pp. 57-61, 2017.

[41] R. Liu, J. Duay, and S. B. Lee, "Heterogeneous nanostructured electrode materials for electrochemical energy storage," Chem. Commun., vol. 47, no. 5, pp. 1384-1404, 2011.

[42] N. Hansen, "Hall-Petch relation and boundary strengthening," Scr. Mater., vol. 51, no. 8, pp. 801-806, 2004.

[43] J. R. Greer and J. T. M. De Hosson, "Plasticity in small-sized metallic systems: Intrinsic versus extrinsic size effect," Prog. Mater. Sci., vol. 56, no. 6, pp. 654-724, 2011.

[44] H. Bei, S. Shim, E. P. George, M. K. Miller, E. G. Herbert, and G. M. Pharr, "Compressive strengths of molybdenum alloy micro-pillars prepared using a new technique," Scr. Mater., vol. 57, no. 5, pp. 397-400, 2007.

[45] B. Yang, C. Motz, M. Rester, and G. Dehm, "Yield stress influenced by the ratio of wire diameter to grain size—a competition between the effects of specimen microstructure and dimension in micro-sized polycrystalline copper wires," Philos. Mag., vol. 92, no. 25-27, pp. 3243-3256, 2012.

[46] X. W. Gu, C. N. Loynachan, Z. Wu, Y.-W. Zhang, D. J. Srolovitz, and J. R. Greer, "Size-dependent deformation of nanocrystalline Pt nanopillars," Nano Lett., vol. 12, no. 12, pp. 6385-6392, 2012.

[47] Z. H. Aitken, D. Jang, C. R. Weinberger, and J. R. Greer, "Grain Boundary Sliding in Aluminum Nano-Bi-Crystals Deformed at Room Temperature," Small, vol. 10, no. 1, pp. 100-108, 2014.

[48] A. Kunz, S. Pathak, and J. R. Greer, "Size effects in Al nanopillars: Single crystalline vs. bicrystalline," Acta Mater., vol. 59, no. 11, pp. 4416-4424, 2011.

[49] M. D. Uchic, D. M. Dimiduk, J. N. Florando, and W. D. Nix, "Sample dimensions influence strength and crystal plasticity," Science, vol. 305, no. 5686, pp. 986-989, 2004.

[50] J. R. Greer, W. C. Oliver, and W. D. Nix, "Size dependence of mechanical properties of gold at the micron scale in the absence of strain gradients," Acta Mater., vol. 53, no. 6, pp. 1821-1830, 2005.

[51] A. T. Jennings, M. J. Burek, and J. R. Greer, "Microstructure versus size: Mechanical properties of electroplated single crystalline Cu nanopillars," Phys. Rev. Lett., vol. 104, no. 13, p. 135503, 2010.

[52] J.-Y. Kim, D. Jang, and J. R. Greer, "Tensile and compressive behavior of tungsten, molybdenum, tantalum and niobium at the nanoscale," Acta Mater., vol. 58, no. 7, pp. 2355-2363, 2010.

[53] S. Min Han, G. Feng, J. Young Jung, H. Joon Jung, J. R. Groves, W. D. Nix, and Y. Cui, "Critical-temperature/Peierls-stress dependent size effects in body centered cubic nanopillars," Appl. Phys. Lett., vol. 102, no. 4, p. 041910, 2013.

[54] A. S. Schneider, D. Kaufmann, B. G. Clark, C. P. Frick, P. A. Gruber, R. Mönig, O. Kraft, and E. Arzt, "Correlation between critical temperature and strength of small-scale bcc pillars," Phys. Rev. Lett., vol. 103, no. 10, p. 105501, 2009.

[55] J. R. Greer and W. D. Nix, "Nanoscale gold pillars strengthened through dislocation starvation," Phys. Rev. B, vol. 73, no. 24, p. 245410, 2006.

[56] S. Tariq, K. Ammigan, P. Hurh, R. Schultz, P. Liu, and J. Shang, "Li material testing-fermilab antiproton source lithium collection lens," in Proceedings of the 2003 Particle Accelerator Conference, vol. 3, pp. 1452-1454, IEEE, 2003.

[57] Z. Ahmad and V. Viswanathan, "Stability of electrodeposition at solid-solid interfaces and implications for metal anodes," Phys. Rev. Lett., vol. 119, no. 5, p. 056003, 2017.

[58] P. Wang, W. Qu, W.-L. Song, H. Chen, R. Chen, and D. Fang, "Electro-Chemo-Mechanical Issues at the Interfaces in Solid-State Lithium Metal Batteries," Adv. Funct. Mater., p. 1900950, 2019.

[59] F. P. McGrogan, T. Swamy, S. R. Bishop, E. Eggleton, L. Porz, X. Chen, Y.-M. Chiang, and K. J. Van Vliet, "Compliant Yet Brittle Mechanical Behavior of Li2S—

P2S5 Lithium-Ion-Conducting Solid Electrolyte," Adv. Energy Mater., vol. 7, no. 12, p. 1602011, 2017.

[60] M. J. Wang, R. Choudhury, and J. Sakamoto, "Characterizing the Li-Solid-Electrolyte Interface Dynamics as a Function of Stack Pressure and Current Density," Joule, 2019.

[61] Y. Ren, Y. Shen, Y. Lin, and C.-W. Nan, "Direct observation of lithium dendrites inside garnet-type lithium-ion solid electrolyte," Electrochem. Commun., vol. 57, pp. 27-30, 2015.

[62] E. J. Cheng, A. Sharafi, and J. Sakamoto, "Intergranular Li metal propagation through polycrystalline Li6.25Al0.25La3Zr2O12 ceramic electrolyte," Electrochimica Acta, vol. 223, pp. 85-91, 2017.

[63] J. Tippens, J. Miers, A. Afshar, J. Lewis, F. J. Q. Cortes, H. Qiao, T. S. Marchese, C. V. Di Leo, C. Saldana, and M. T. McDowell, "Visualizing Chemo-Mechanical Degradation of a Solid-State Battery Electrolyte," ACS Energy Lett., 2019.

[64] E. G. Herbert, S. A. Hackney, V. Thole, N. J. Dudney, and P. S. Phani, "Nanoindentation of high-purity vapor deposited lithium films: A mechanistic rationalization of diffusion-mediated flow," J. Mater. Res., vol. 33, no. 10, pp. 1347-1360, 2018.

[65] E. G. Herbert, S. A. Hackney, V. Thole, N. J. Dudney, and P. S. Phani, "Nanoindentation of high-purity vapor deposited lithium films: A mechanistic rationalization of the transition from diffusion to dislocation-mediated flow," J. Mater. Res., vol. 33, no. 10, pp. 1361-1368, 2018.

[66] A. Masias, N. Felten, R. Garcia-Mendez, J. Wolfenstine, and J. Sakamoto, "Elastic, plastic, and creep mechanical properties of lithium metal," J. Mater. Sci., vol. 54, no. 3, pp. 2585-2600, 2019.

[67] Y. Wang and Y.-T. Cheng, "A nanoindentation study of the viscoplastic behavior of pure lithium," Scr. Mater., vol. 130, pp. 191-195, 2017.

[68] S. Narayan and L. Anand, "A large deformation elastic-viscoplastic model for lithium," Extreme Mech. Lett., vol. 24, pp. 21-29, 2018.

[69] W. S. LePage, Y. Chen, E. Kazyak, K.-H. Chen, A. J. Sanchez, A. Poli, E. M. Arruda, M. D. Thouless, and N. P. Dasgupta, "Lithium Mechanics: Roles of Strain Rate and Temperature and Implications for Lithium Metal Batteries," J. Electrochem. Soc., vol. 166, no. 2, pp. A89-A97, 2019.

[70] D. Hull and H. M. Rosenberg, "The deformation of lithium, sodium and potassium at low temperatures: Tensile and resistivity experiments," Philos. Mag., vol. 4, no. 39, pp. 303-315, 1959.

[71] R. P. Schultz, "Lithium: Measurement of Young's Modulus and Yield Strength," tech. rep., Fermi National Accelerator Lab., Batavia, Ill. (US), 2002.

[72] M. Motoyama, M. Ejiri, and Y. Iriyama, "Modeling the nucleation and growth of Li at metal current collector/LiPON interfaces," J. Electrochem. Soc., vol. 162, no. 13, pp. A7067-A7071, 2015.

[73] E. G. Herbert, S. A. Hackney, N. J. Dudney, and P. S. Phani, "Nanoindentation of high-purity vapor deposited lithium films: The elastic modulus," J. Mater. Res., vol. 33, no. 10, pp. 1335-1346, 2018.

[74] P. Zhang, S. X. Li, and Z. F. Zhang, "General relationship between strength and hardness," Mater. Sci. Eng. A, vol. 529, pp. 62-73, 2011.

[75] J. B. Bates, N. J. Dudney, G. R. Gruzalski, R. A. Zuhr, A. Choudhury, C. F. Luck, and J. D. Robertson, "Fabrication and characterization of amorphous lithium electrolyte thin films and rechargeable thin-film batteries," J. Power Sources, vol. 43, no. 1-3, pp. 103-110, 1993.

[76] N. J. Dudney, "Solid-state thin-film rechargeable batteries," Mater. Sci. Eng. B, vol. 116, no. 3, pp. 245-249, 2005.

[77] J. B. Bates, N. J. Dudney, B. Neudecker, A. Ueda, and C. D. Evans, "Thinfilm lithium and lithium-ion batteries," Solid State Ion., vol. 135, no. 1-4, pp. 33-45, 2000.

[78] J. Li, C. Ma, M. Chi, C. Liang, and N. J. Dudney, "Solid electrolyte: The key for high-voltage lithium batteries," Adv. Energy Mater., vol. 5, no. 4, p. 1401408, 2015.

[79] B. J. Neudecker, N. J. Dudney, and J. B. Bates, ""Lithium-free" thin-film battery with in situ plated Li anode," J. Electrochem. Soc., vol. 147, no. 2, pp. 517-523, 2000.

[80] "Front Edge Technology, Inc—Home Page." http://frontedgetechnology.com/.

[81] V. Krasnov, K.-W. Nieh, and S.-J. Ting, "Method of manufacturing a thin film battery," July 2005.

[82] V. Krasnov, K.-W. Nieh, and J. Li, "Thin film battery and manufacturing method," January 2011.

[83] X. Qian, N. Gu, Z. Cheng, X. Yang, E. Wang, and S. Dong, "Methods to study the ionic conductivity of polymeric electrolytes using ac impedance spectroscopy," J. Solid State Electrochem., vol. 6, no. 1, pp. 8-15, 2001.

[84] C. Wang and J. Hong, "Ionic/electronic conducting characteristics of Lifepo4 cathode materials the determining factors for high rate performance," Electrochem. Solid-State Lett., vol. 10, no. 3, pp. A65-A69, 2007.

[85] "Chemical Analysis, Life Sciences, and Diagnostics I Agilent." https://www.agilent.com/.

[86] D. Kiener, C. Motz, M. Rester, M. Jenko, and G. Dehm, "FIB damage of Cu and possible consequences for miniaturized mechanical tests," Mater. Sci. Eng. A, vol. 459, no. 1-2, pp. 262-272, 2007.

[87] C. Multiphysics, V. 5.2 a. Www. Comsol. Com. COMSOL AB, Stockholm. Sweden, 2018.

[88] Y. Hamon, A. Douard, F. Sabary, C. Marcel, P. Vinatier, B. Pecquenard, and A. Levasseur, "Influence of sputtering conditions on ionic conductivity of LiPON thin films," Solid State Ion., vol. 177, no. 3-4, pp. 257-261, 2006.

[89] J. Schwenzel, V. Thangadurai, and W. Weppner, "Investigation of thin film all solid-state lithium ion battery materials," Ionics, vol. 9, no. 5-6, pp. 348-356, 2003.

[90] E. Dologlou, "Self-diffusion in solid lithium," Glass Phys. Chem., vol. 36, no. 5, pp. 570-574, 2010.

[91] J. Qian, W. A. Henderson, W. Xu, P. Bhattacharya, M. Engelhard, O. Borodin, and J.-G. Zhang, "High rate and stable cycling of lithium metal anode," Nat. Commun., vol. 6, p. 6362, 2015.

[92] Y. Li, Y. Li, A. Pei, K. Yan, Y. Sun, C.-L. Wu, L.-M. Joubert, R. Chin, A. L. Koh, and Y. Yu, "Atomic structure of sensitive battery materials and interfaces revealed by cryo-electron microscopy," Science, vol. 358, no. 6362, pp. 506-510, 2017.

[93] F. Wang, J. Graetz, M. S. Moreno, C. Ma, L. Wu, V. Volkov, and Y. Zhu, "Chemical distribution and bonding of lithium in intercalated graphite: Identification with optimized electron energy loss spectroscopy," Acs Nano, vol. 5, no. 2, pp. 1190-1197, 2011.

[94] D.-R. Lru and D. B. Williams, "The electron-energy-loss spectrum of lithium metal," Philos. Mag. B, vol. 53, no. 6, pp. L123-L128, 1986.

[95] B. L. Mehdi, J. Qian, E. Nasybulin, C. Park, D. A. Welch, R. Faller, H. Mehta, W. A. Henderson, W. Xu, and C. M. Wang, "Observation and quantification of nanoscale processes in lithium batteries by operando electrochemical (S) TEM," Nano Lett., vol. 15, no. 3, pp. 2168-2173, 2015.

[96] X. Wang, M. Zhang, J. Alvarado, S. Wang, M. Sina, B. Lu, J. Bouwer, W. Xu, J. Xiao, and J.-G. Zhang, "New insights on the structure of electrochemically deposited lithium metal and its solid electrolyte interphases via cryogenic TEM," Nano Lett., vol. 17, no. 12, pp. 7606-7612, 2017.

[97] Z. Wang, D. Santhanagopalan, W. Zhang, F. Wang, H. L. Xin, K. He, J. Li, N. Dudney, and Y. S. Meng, "In situ STEM-EELS observation of nanoscale interfacial phenomena in all-solid-state batteries," Nano Lett., vol. 16, no. 6, pp. 3760-3767, 2016.

[98] M. Hammad Fawey, V. S. K. Chakravadhanula, M. A. Reddy, C. Rongeat, T. Scherer, H. Hahn, M. Fichtner, and C. Kübel, "In situ TEM studies of micron-sized all-solid-state fluoride ion batteries: Preparation, prospects, and challenges," Microsc. Res. Tech., vol. 79, no. 7, pp. 615-624, 2016.

[99] "TEM Sample Holder Supports & Solutions: E-Chips I Protochips." https://www.protochips.com/products/e-chips/.

[100] M. J. Zachman, E. Asenath-Smith, L. A. Estroff, and L. F. Kourkoutis, "Site-specific preparation of intact solid-liquid interfaces by label-free in situ localization and cryo-focused ion beam lift-out," Microsc. Microanal., vol. 22, no. 6, pp. 1338-1349, 2016.

[101] M. M. Beg and M. Nielsen, "Temperature dependence of lattice dynamics of lithium 7," Phys. Rev. B, vol. 14, no. 10, p. 4266, 1976.

[102] L. Vitos, A. V. Ruban, H. L. Skriver, and J. Kollar, "The surface energy of metals," Surf. Sci., vol. 411, no. 1-2, pp. 186-202, 1998.

[103] S.-W. Lee, S. M. Han, and W. D. Nix, "Uniaxial compression of fcc Au nanopillars on an MgO substrate: The effects of prestraining and annealing," Acta Mater., vol. 57, no. 15, pp. 4404-4415, 2009.

[104] G. Lee, J.-Y. Kim, M. J. Burek, J. R. Greer, and T. Y. Tsui, "Plastic deformation of indium nanostructures," Mater. Sci. Eng. A, vol. 528, no. 19-20, pp. 6112-6120, 2011.

[105] M. J. Burek, A. S. Budiman, Z. Jahed, N. Tamura, M. Kunz, S. Jin, S. M. J. Han, G. Lee, C. Zamecnik, and T. Y. Tsui, "Fabrication, microstructure, and mechanical properties of tin nanostructures," Mater. Sci. Eng. A, vol. 528, no. 18, pp. 5822-5832, 2011.

[106] L.-W. Ji, S.-J. Young, T.-H. Fang, and C.-H. Liu, "Buckling characterization of vertical ZnO nanowires using nanoindentation," Appl. Phys. Lett., vol. 90, no. 3, p. 033109, 2007.

[107] N. Friedman, A. T. Jennings, G. Tsekenis, J.-Y. Kim, M. Tao, J. T. Uhl, J. R. Greer, and K. A. Dahmen, "Statistics of dislocation slip avalanches in nanosized single crystals show tuned critical behavior predicted by a simple mean field model," Phys. Rev. Lett., vol. 109, no. 9, p. 095507, 2012.

[108] X. Ni, H. Zhang, D. B. Liarte, L. W. McFaul, K. A. Dahmen, J. P. Sethna, and J. R. Greer, "Yield precursor dislocation avalanches in small crystals: The irreversibility transition," Phys. Rev. Lett., vol. 123, no. 3, p. 035501, 2019.

[109] I. N. Sneddon, "The relation between load and penetration in the axisymmetric Boussinesq problem for a punch of arbitrary profile," Int. J. Eng. Sci., vol. 3, no. 1, pp. 47-57, 1965.

[110] E. G. Herbert, W. E. Tenhaeff, N. J. Dudney, and G. M. Pharr, "Mechanical characterization of LiPON films using nanoindentation," Thin Solid Films, vol. 520, no. 1, pp. 413-418, 2011.

[111] T. Slotwinski and J. Trivisonno, "Temperature dependence of the elastic constants of single crystal lithium," J. Phys. Chem. Solids, vol. 30, no. 5, pp. 1276-1278, 1969.

[112] P. S. Phani, K. E. Johanns, G. Duscher, A. Gali, E. P. George, and G. M. Pharr, "Scanning transmission electron microscope observations of defects in as-grown and pre-strained Mo alloy fibers," Acta Mater., vol. 59, no. 5, pp. 2172-2179, 2011.

[113] K. E. Johanns, A. Sedlmayr, P. S. Phani, R. Mönig, O. Kraft, E. P. George, and G. M. Pharr, "In-situ tensile testing of single-crystal molybdenum-alloy fibers with various dislocation densities in a scanning electron microscope," J. Mater. Res., vol. 27, no. 3, pp. 508-520, 2012.

[114] H. Bei, S. Shim, G. M. Pharr, and E. P. George, "Effects of pre-strain on the compressive stress-strain response of Mo-alloy single-crystal micropillars," Acta Mater., vol. 56, no. 17, pp. 4762-4770, 2008.

[115] C. R. Krenn, D. Roundy, J. W. Morris Jr, and M. L. Cohen, "Ideal strengths of bcc metals," Mater. Sci. Eng. A, vol. 319, pp. 111-114, 2001.

[116] M. J. Burek and J. R. Greer, "Fabrication and microstructure control of nanoscale mechanical testing specimens via electron beam lithography and electroplating," Nano Lett., vol. 10, no. 1, pp. 69-76, 2009.

[117] Q. Xiao, L. Huang, and Y. Shi, "Suppression of shear banding in amorphous ZrCuAl nanopillars by irradiation," J. Appl. Phys., vol. 113, no. 8, p. 083514, 2013.

[118] D. J. Magagnosc, G. Kumar, J. Schroers, P. Felfer, J. M. Cairney, and D. S. Gianola, "Effect of ion irradiation on tensile ductility, strength and fictive temperature in metallic glass nanowires," Acta Mater., vol. 74, pp. 165-182, 2014.

[119] D. Z. Chen, X. W. Gu, Q. An, W. A. Goddard III, and J. R. Greer, "Ductility and work hardening in nano-sized metallic glasses," Appl. Phys. Lett., vol. 106, no. 6, p. 061903, 2015.

[120] J. Saint, M. Morcrette, D. Larcher, and J. M. Tarascon, "Exploring the Li—Ga room temperature phase diagram and the electrochemical performances of the LixGay alloys vs. Li," Solid State Ion., vol. 176, no. 1-2, pp. 189-197, 2005.

[121] A. T. Jennings, C. Gross, F. Greer, Z. H. Aitken, S.-W. Lee, C. R. Weinberger, and J. R. Greer, "Higher compressive strengths and the Bauschinger effect in conformally passivated copper nanopillars," Acta Mater., vol. 60, no. 8, pp. 3444-3455, 2012.

[122] T. Zhu, J. Li, A. Samanta, A. Leach, and K. Gall, "Temperature and strainrate dependence of surface dislocation nucleation," Phys. Rev. Lett., vol. 100, no. 2, p. 025502, 2008.

[123] A. T. Jennings, J. Li, and J. R. Greer, "Emergence of strain-rate sensitivity in Cu nanopillars: Transition from dislocation multiplication to dislocation nucleation," Acta Mater., vol. 59, no. 14, pp. 5627-5637, 2011.

[124] W. Cai and V. V. Bulatov, "Mobility laws in dislocation dynamics simulations," Mater. Sci. Eng. A, vol. 387, pp. 277-281, 2004.

[125] A. Ishizaka and T. Doi, "Systematic change in surface structures on Si (111) clean surfaces with temperature," Philos. Mag. Lett., vol. 65, no. 2, pp. 95-100, 1992.

[126] G. Richter, K. Hillerich, D. S. Gianola, R. Monig, O. Kraft, and C. A. Volkert, "Ultrahigh strength single crys-

[126] ...talline nanowhiskers grown by physical vapor deposition," Nano Lett., vol. 9, no. 8, pp. 3048-3052, 2009.

[127] A. Gangulee, "The structure of electroplated and vapor-deposited copper films," J. Appl. Phys., vol. 43, no. 3, pp. 867-873, 1972.

[128] M. Hommel and O. Kraft, "Deformation behavior of thin copper films on deformable substrates," Acta Mater., vol. 49, no. 19, pp. 3935-3947, 2001.

[129] S. Ferrari, M. Loveridge, S. D. Beattie, M. Jahn, R. J. Dashwood, and R. Bhagat, "Latest advances in the manufacturing of 3D rechargeable lithium microbatteries," J. Power Sources, vol. 286, pp. 25-46, 2015.

[130] M. Roberts, P. Johns, J. Owen, D. Brandell, K. Edstrom, G. El Enany, C. Guery, D. Golodnitsky, M. Lacey, and C. Lecoeur, "3D lithium ion batteries—from fundamentals to fabrication," J. Mater. Chem., vol. 21, no. 27, pp. 9876-9890, 2011.

[131] T. S. Arthur, D. J. Bates, N. Cirigliano, D. C. Johnson, P. Malati, J. M. Mosby, E. Perre, M. T. Rawls, A. L. Prieto, and B. Dunn, "Three-dimensional electrodes and battery architectures," Mrs Bull., vol. 36, no. 7, pp. 523-531, 2011.

[132] J. F. Oudenhoven, L. Baggetto, and P. H. Notten, "All-solid-state lithiumion microbatteries: A review of various three-dimensional concepts," Adv. Energy Mater., vol. 1, no. 1, pp. 10-33, 2011.

[133] T. Wierzbicki and E. Sahraei, "Homogenized mechanical properties for the jellyroll of cylindrical Lithium-ion cells," J. Power Sources, vol. 241, pp. 467-476, 2013.

[134] N. Cirigliano, G. Sun, D. Membreno, P. Malati, C. J. Kim, and B. Dunn, "3D Architectured Anodes for Lithium-Ion Microbatteries with Large Areal Capacity," Energy Technol., vol. 2, no. 4, pp. 362-369, 2014.

[135] S. R. Gowda, A. Leela Mohana Reddy, X. Zhan, H. R. Jafry, and P. M. Ajayan, "3D nanoporous nanowire current collectors for thin film microbatteries," Nano Lett., vol. 12, no. 3, pp. 1198-1202, 2012.

[136] F. Chamran, Y. Yeh, H.-S. Min, B. Dunn, and C.-J. Kim, "Fabrication of high-aspect-ratio electrode arrays for three-dimensional microbatteries," J. Microelectromechanical Syst., vol. 16, no. 4, pp. 844-852, 2007.

[137] C. R. Sides, N. Li, C. J. Patrissi, B. Scrosati, and C. R. Martin, "Nanoscale materials for lithium-ion batteries," Mrs Bull., vol. 27, no. 8, pp. 604-607, 2002.

[138] M. Nishizawa, K. Mukai, S. Kuwabata, C. R. Martin, and H. Yoneyama, "Template Synthesis of Polypyrrole-Coated Spinel $LiMn_2O_4$ Nanotubules and Their Properties as Cathode Active Materials for Lithium Batteries," J. Electrochem. Soc., vol. 144, no. 6, pp. 1923-1927, 1997.

[139] M. M. Shaijumon, E. Perre, B. Daffos, P.-L. Taberna, J.-M. Tarascon, and P. Simon, "Nanoarchitectured 3D cathodes for Li-Ion microbatteries," Adv. Mater., vol. 22, no. 44, pp. 4978-4981, 2010.

[140] E. Perre, P. L. Taberna, D. Mazouzi, P. Poizot, T. Gustafsson, K. Edström, and P. Simon, "Electrodeposited $Cu_2Sb$ as anode material for 3-dimensional Li-ion microbatteries," J. Mater. Res., vol. 25, no. 8, pp. 1485-1491, 2010.

[141] C. K. Chan, H. Peng, G. Liu, K. McIlwrath, X. F. Zhang, R. A. Huggins, and Y. Cui, "High-performance lithium battery anodes using silicon nanowires," Nat. Nanotechnol., vol. 3, no. 1, p. 31, 2008.

[142] J. Zhu, J. Jiang, Y. Feng, G. Meng, H. Ding, and X. Huang, "Three-Dimensional $Ni/SnO_x/C$ Hybrid Nanostructured Arrays for Lithium-Ion Microbattery Anodes with Enhanced Areal Capacity," ACS Appl. Mater. Interfaces, vol. 5, no. 7, pp. 2634-2640, 2013.

[143] A. Izumi, M. Sanada, K. Furuichi, K. Teraki, T. Matsuda, K. Hiramatsu, H. Munakata, and K. Kanamura, "Development of high capacity lithium-ion battery applying three-dimensionally patterned electrode," Electrochimica Acta, vol. 79, pp. 218-222, 2012.

[144] J. Li, M. C. Leu, R. Panat, and J. Park, "A hybrid three-dimensionally structured electrode for lithium-ion batteries via 3D printing," Mater. Des., vol. 119, pp. 417-424, 2017.

[145] K. Yoshima, H. Munakata, and K. Kanamura, "Fabrication of micro lithiumion battery with 3D anode and 3D cathode by using polymer wall," J. Power Sources, vol. 208, pp. 404-408, 2012.

[146] J. H. Pikul, H. G. Zhang, J. Cho, P. V. Braun, and W. P. King, "High-power lithium ion microbatteries from interdigitated three-dimensional bicontinuous nanoporous electrodes," Nat. Commun., vol. 4, p. 1732, 2013.

[147] K. Dokko, J.-i. Sugaya, H. Nakano, T. Yasukawa, T. Matsue, and K. Kanamura, "Sol-gel fabrication of lithium-ion microarray battery," Electrochem. Commun., vol. 9, no. 5, pp. 857-862, 2007.

[148] K. Sun, T.-S. Wei, B. Y. Ahn, J. Y. Seo, S. J. Dillon, and J. A. Lewis, "3D printing of interdigitated Li-Ion microbattery architectures," Adv. Mater., vol. 25, no. 33, pp. 4539-4543, 2013.

[149] J. G. Werner, G. G. Rodriguez-Calero, H. D. Abruña, and U. Wiesner, "Block copolymer derived 3-D interpenetrating multifunctional gyroidal nanohybrids for electrical energy storage," Energy Environ. Sci., vol. 11, no. 5, pp. 1261-1270, 2018.

[150] C. Liu, E. I. Gillette, X. Chen, A. J. Pearse, A. C. Kozen, M. A. Schroeder, K. E. Gregorczyk, S. B. Lee, and G. W. Rubloff, "An all-in-one nanopore battery array," Nat. Nanotechnol., vol. 9, no. 12, p. 1031, 2014.

[151] S. Chabi, C. Peng, D. Hu, and Y. Zhu, "Ideal three-dimensional electrode structures for electrochemical energy storage," Adv. Mater., vol. 26, no. 15, pp. 2440-2445, 2014.

[152] Y. Xu, M. Zhou, L. Wen, C. Wang, H. Zhao, Y. Mi, L. Liang, Q. Fu, M. Wu, and Y. Lei, "Highly ordered three-dimensional $Ni-TiO_2$ nanoarrays as sodium ion battery anodes," Chem. Mater., vol. 27, no. 12, pp. 4274-4280, 2015.

[153] H. N. Wadley, N. A. Fleck, and A. G. Evans, "Fabrication and structural performance of periodic cellular metal sandwich structures," Compos. Sci. Technol., vol. 63, no. 16, pp. 2331-2343, 2003.

[154] H. Zhang, H. Ning, J. Busbee, Z. Shen, C. Kiggins, Y. Hua, J. Eaves, J. Davis, T. Shi, and Y.-T. Shao, "Electroplating lithium transition metal oxides," Sci. Adv., vol. 3, no. 5, p. e1602427, 2017.

[155] P. Johns, M. Roberts, and J. Owen, "Conformal electrodeposition of manganese dioxide onto reticulated vitreous carbon for 3D microbattery applications," J. Mater. Chem., vol. 21, no. 27, pp. 10153-10159, 2011.

[156] G. F. Yang, J. S. Song, H. Y. Kim, and S. K. Joo, "Metal foam as positive electrode current collector for $LiFePO_4$-based Li-ion battery," Jpn. J. Appl. Phys., vol. 52, no. 10S, p. 10MB13, 2013.

[157] K. T. Lee, J. C. Lytle, N. S. Ergang, S. M. Oh, and A. Stein, "Synthesis and rate performance of monolithic macroporous carbon electrodes for lithiumion secondary batteries," Adv. Funct. Mater., vol. 15, no. 4, pp. 547-556, 2005.

[158] M. S. Saleh, J. Li, J. Park, and R. Panat, "3D printed hierarchically-porous microlattice electrode materials for exceptionally high specific capacity and areal capacity lithium ion batteries," Addit. Manuf., vol. 23, pp. 70-78, 2018.

[159] T.-S. Wei, B. Y. Ahn, J. Grotto, and J. A. Lewis, "3D printing of customized li-ion batteries with thick electrodes," Adv. Mater., vol. 30, no. 16, p. 1703027, 2018.

[160] C. W. Foster, M. P. Down, Y. Zhang, X. Ji, S. J. Rowley-Neale, G. C. Smith, P. J. Kelly, and C. E. Banks, "3D printed graphene based energy storage devices," Sci. Rep., vol. 7, p. 42233, 2017.

[161] K. Fu, Y. Wang, C. Yan, Y. Yao, Y. Chen, J. Dai, S. Lacey, Y. Wang, J. Wan, and T. Li, "Graphene oxide-based electrode inks for 3D-printed lithium-ion batteries," Adv. Mater., vol. 28, no. 13, pp. 2587-2594, 2016.

[162] J. Hu, Y. Jiang, S. Cui, Y. Duan, T. Liu, H. Guo, L. Lin, Y. Lin, J. Zheng, and K. Amine, "3D-printed cathodes of $LiMn_{1-x}Fe_xPO_4$ nanocrystals achieve both ultrahigh rate and high capacity for advanced lithium-ion battery," Adv. Energy Mater., vol. 6, no. 18, p. 1600856, 2016.

[163] C. Reyes, R. Somogyi, S. Niu, M. A. Cruz, F. Yang, M. J. Catenacci, C. P. Rhodes, and B. J. Wiley, "Three-dimensional printing of a complete lithium ion battery with fused filament fabrication," ACS Appl. Energy Mater., vol. 1, no. 10, pp. 5268-5279, 2018.

[164] Z. Chen, Z. Li, J. Li, C. Liu, C. Liu, Y. Li, P. Wang, H. Yi, C. Lao, and F. Yuelong, "3D printing of ceramics: A review," J. Eur. Ceram. Soc., 2018.

[165] A. Zocca, C. M. Gomes, A. Staude, E. Bernardo, J. GUnster, and P. Colombo, "SiOC ceramics with ordered porosity by 3D-printing of a preceramic polymer," J. Mater. Res., vol. 28, no. 17, pp. 2243-2252, 2013.

[166] D. W. Yee, M. L. Lifson, B. W. Edwards, and J. R. Greer, "Additive Manufacturing of 3D-Architected Multifunctional Metal Oxides," Adv. Mater., p. 1901345, 2019.

[167] A. C. Kozen, A. J. Pearse, C.-F. Lin, M. Noked, and G. W. Rubloff, "Atomic layer deposition of the solid electrolyte LiPON," Chem. Mater., vol. 27, no. 15, pp. 5324-5331, 2015.

[168] M. Nisula, Y. Shindo, H. Koga, and M. Karppinen, "Atomic layer deposition of lithium phosphorus oxynitride," Chem. Mater., vol. 27, no. 20, pp. 6987-6993, 2015.

[169] C. P. Rhodes, J. W. Long, M. S. Doescher, J. J. Fontanella, and D. R. Rolison, "Nanoscale polymer electrolytes: Ultrathin electrodeposited poly (phenylene oxide) with solid-state ionic conductivity," J. Phys. Chem. B, vol. 108, no. 35, pp. 13079-13087, 2004.

[170] S. R. Gowda, A. L. M. Reddy, M. M. Shaijumon, X. Zhan, L. Ci, and P. M. Ajayan, "Conformal coating of thin polymer electrolyte layer on nanostructured electrode materials for three-dimensional battery applications," Nano Lett., vol. 11, no. 1, pp. 101-106, 2010.

[171] M. Jo, Y.-S. Hong, J. Choo, and J. Cho, "Effect of $LiCoO_2$ cathode nanoparticle size on high rate performance for Li-ion batteries," J. Electrochem. Soc., vol. 156, no. 6, pp. A430-A434, 2009.

[172] A. Varma, A. S. Mukasyan, A. S. Rogachev, and K. V. Manukyan, "Solution combustion synthesis of nanoscale materials," Chem. Rev., vol. 116, no. 23, pp. 14493-14586, 2016.

[173] F. Saidi, Y. Bemabé and T. Reuschle, "The mechanical behaviour of synthetic, poorly consolidated granular rock under uniaxial compression," Tectonophysics, vol. 370, no. 1-4, pp. 105-120, 2003.

[174] C. M. Portela, J. R. Greer, and D. M. Kochmann, "Impact of node geometry on the effective stiffness of non-slender three-dimensional truss lattice architectures," Extreme Mech. Lett., vol. 22, pp. 138-148, 2018.

[175] B. Lawn, Fracture of Brittle Solids. Cambridge university press, 1993.

[176] J. Cho, C.-S. Kim, and S.-I. Yoo, "Improvement of structural stability of $LiCoO_2$ cathode during electrochemical cycling by sol-gel coating of $SnO_2$," Electrochem. Solid-State Lett., vol. 3, no. 8, pp. 362-365, 2000.

[177] J. Akimoto, Y. Gotoh, and Y. Oosawa, Synthesis and Structure Refinement of $LiCoO_2$ Single Crystals. Elsevier, 1998.

[178] M. S. Whittingham, "Lithium batteries and cathode materials," Chem. Rev., vol. 104, no. 10, pp. 4271-4302, 2004.

[179] S. Burgess, X. Li, and J. Holland, "High spatial resolution energy dispersive X-ray spectrometry in the SEM and the detection of light elements including lithium," Microsc. Anal., vol. 6, pp. S8-S13, 2013.

[180] S. A. Speakman, "Basics of X-ray powder diffraction," Mass.-USA 2011a Disponível Em Httpprism Mit EduxrayBasics 20 of 20 X-Ray 20 Powder 20Di raction Pdf, 2011.

[181] J. N. Reimers and J. R. Dahn, "Electrochemical and in situ X-ray diffraction studies of lithium intercalation in $Li_xCoO_2$," J. Electrochem. Soc., vol. 139, no. 8, pp. 2091-2097, 1992.

[182] H.-C. Shin and S.-I. Pyun, "Investigation of lithium transport through lithium cobalt dioxide thin film sputter-deposited by analysis of cyclic voltammogram," Electrochimica Acta, vol. 46, no. 16, pp. 2477-2485, 2001.

[183] J. Xie, N. Imanishi, A. Hirano, M. Matsumura, Y. Takeda, and O. Yamamoto, "Kinetics investigation of a preferential (104) plane oriented $LiCoO_2$ thin film prepared by RF magnetron sputtering," Solid State Ion., vol. 178, no. 19-20, pp. 1218-1224, 2007.

[184] G. G. Amatucci, J. M. Tarascon, and L. C. Klein, "$CoO_2$, the end member of the $Li_xCoO_2$ solid solution," J. Electrochem. Soc., vol. 143, no. 3, pp. 1114-1123, 1996.

[185] M. F. Lagadec, R. Zahn, and V. Wood, "Designing polyolefin separators to minimize the impact of local compressive stresses on lithium ion battery performance," J. Electrochem. Soc., vol. 165, no. 9, pp. A1829-A1836, 2018.

[186] S. Rodrigues, N. Munichandraiah, and A. K. Shukla, "Novel solution combustion synthesis of $LiCoO_2$ and its characterization as cathode material for lithium-ion cells," J. Power Sources, vol. 102, no. 1-2, pp. 322-325, 2001.

[187] P. Kalyani, N. Kalaiselvi, and N. Muniyandi, "A new solution combustion route to synthesize $LiCoO_2$ and $LiMn_2O_4$," J. Power Sources, vol. 111, no. 2, pp. 232-238, 2002.

[188] W. Lai, C. K. Erdonmez, T. F. Marinis, C. K. Bjune, N. J. Dudney, F. Xu, R. Wartena, and Y.-M. Chiang, "Ultrahigh-Energy-Density Microbatteries Enabled by New Electrode Architecture and Micropackaging Design," Adv. Mater., vol. 22, no. 20, pp. E139-E144, 2010.

[189] M. Dubarry, B. Y. Liaw, M.-S. Chen, S.-S. Chyan, K.-C. Han, W.-T. Sie, and S.-H. Wu, "Identifying battery aging mechanisms in large format Li ion cells," J. Power Sources, vol. 196, no. 7, pp. 3420-3425, 2011.

[190] L.-L. Lu, Y.-Y. Lu, Z.-J. Xiao, T.-W. Zhang, F. Zhou, T. Ma, Y. Ni, H.-B. Yao, S.-H. Yu, and Y. Cui, "Wood-Inspired High-Performance Ultrathick Bulk Battery Electrodes," Adv. Mater., vol. 30, no. 20, p. 1706745, 2018.

[191] I. Hwang, C. W. Lee, J. C. Kim, and S. Yoon, "Particle size effect of Ni-rich cathode materials on lithium ion battery performance," Mater. Res. Bull., vol. 47, no. 1, pp. 73-78, 2012.

[192] N. M. Trease, I. D. Seymour, M. D. Radin, H. Liu, H. Liu, S. Hy, N. Chernova, P. Parikh, A. Devaraj, and K. M. Wiaderek, "Identifying the Distribution of Al3+ in LiNi0.8Co0.15Al0.05O2," Chem. Mater., vol. 28, no. 22, pp. 8170-8180, 2016.

Example 11: 3D Printing of Metal Structures Via a Metal-Salt Containing Photopolymer Disclosed here are simple inexpensive methods to fabricate 3D printed metal structures via a multistep process where first; a metal-containing hydrogel part is created via one of the following procedures, for example: a) photolithography from an aqueous precursor mixture containing the relevant metal salts, b) the swelling in of metal salts into a blank hydrogel fabricated from an aqueous blank mixture using photolithography, and c) the swelling in of metal salts into a blank organogel fabricated from an organic photoresin (nonaqueous precursor mixture) using photolithography. In case a), the aqueous precursor mixture is a homogenous solution of dissolved metal salts, water, water-soluble binders/monomers, and photoactive molecules. In case b), the aqueous blank mixture is a homogenous solution of water, water-soluble binders/monomers, and photoactive molecules. In case c), the organic (nonaqueous) blank mixture is a homogenous solution of a water-miscible organic solvent, water-soluble binders/monomers, and photoactive molecules.

The metal-containing hydrogel part is then calcined in air to obtain the corresponding metal oxide, which is then reduced to its corresponding metal in a subsequent high-temperature treatment.

Advantages of this process include that any water-soluble metal salt can be used, resulting in a wide variety of metal oxides that can be produced, from simple binary oxides to more complex multi-element oxides. Under the appropriate reducing condition (temperature, thermal-treatment atmosphere, reagent), the metal oxides can then be reduced to metals. If complex oxides (ternary and above oxides) were the starting materials, then alloys can be produced.

The present disclosure includes a general approach for fabricating 3D printed metal parts via a multi-step process, where first, a metal-salt containing hydrogel is produced via stereolithography. This can be done in a variety of ways. In a "salt-in" approach, an aqueous photoresin containing dissolved metal salts, water, water-soluble binders/monomers, and photoactive molecules can be used to directly print the metal-salt containing hydrogel. This approach is described schematically in FIG. 32A. In terms of the preparation of the metal-salt containing photoresin, a number of different reagents can be used. Suitable water-soluble photosensitive binders of the present invention include but are not limited to poly(ethylene glycol) macromolecules with acrylate functional groups. Water-soluble photoinitiators that can be used include, but are not limited to ethyl(2,4,6-trimethylbenzoyl)-phenylphosphinate, Irgacure 2959, 7-diethylamino-3-theonoyl coumarin and lithium phenyl-2,4,6-trimethylbenzoylphosphinate. Similarly, suitable water-soluble UV blockers include, but are not limited to tatrazine, and disodium 4,4'-bis(2-sulfostyryl)biphenyl. Since water is the primary solvent here, any water-soluble metal salt can be used, including but are not limited to metal nitrates and their hydrates and metal acetates and their hydrates. A metal salt is an ionic compound with a metal cation and a counter anion. Examples include but are not limited to: zinc nitrate, zinc nitrate hexahydrate, zinc chloride, zinc acetate, iron nitrate, iron nitrate nonahydrate, lithium nitrate, cobalt acetate, cobalt nitrate, cobalt nitrate hexahydrate and aluminum nonahydrate.

In a "swell-in" approach, metal salts are swollen into a hydrophilic polymer, fabricated via stereolithography, as described schematically in FIG. 32B. This can be done using an aqueous photoresin or an organic photoresin that contains a water-miscible organic solvent.

If an aqueous photoresin is desired, a number of different reagents can be used. Suitable water-soluble hydrophilic binders of the present invention include but are not limited to poly(ethylene glycol) macromolecules with acrylate functional groups. Water-soluble photoinitiators that can be used include, but are not limited to ethyl(2,4,6-trimethylbenzoyl)-phenylphosphinate, Irgacure 2959, 7-diethylamino-3-theonoyl coumarin and lithium phenyl-2,4,6-trimethylbenzoylphosphinate. Similarly, suitable water-soluble UV blockers include, but are not limited to tatrazine, and disodium 4,4'-bis(2-sulfostyryl)biphenyl.

If an organic photoresin is desired, a number of different reagents can be used. Suitable water-miscible organic solvents include but are not limited to N,N-dimethylformamide, dimethyl sulfoxide, and isopropanol. Suitable hydrophilic binders include but are not limited to poly(ethylene glycol) macromolecules with acrylate functional groups. Photoinitiators that can be used include, but are not limited to ethyl(2,4,6-trimethylbenzoyl)-phenylphosphinate, Irgacure 2959, 7-diethylamino-3-theonoyl coumarin and lithium phenyl-2,4,6-trimethylbenzoylphosphinate. Similarly, suitable UV blockers include, but are not limited to tatrazine, and disodium 4,4'-bis(2-sulfostyryl)biphenyl. The organogel approach allows for a greater variety of photoactive molecules that can be used in the photoresin.

To fabricate the 3D printed part, any photolithography technique can be used. Suitable photopolymerization methods include but are not limited to: two-photon lithography, stereolithography, micro-stereolithography and projection micro-stereolithography.

Figure 33:
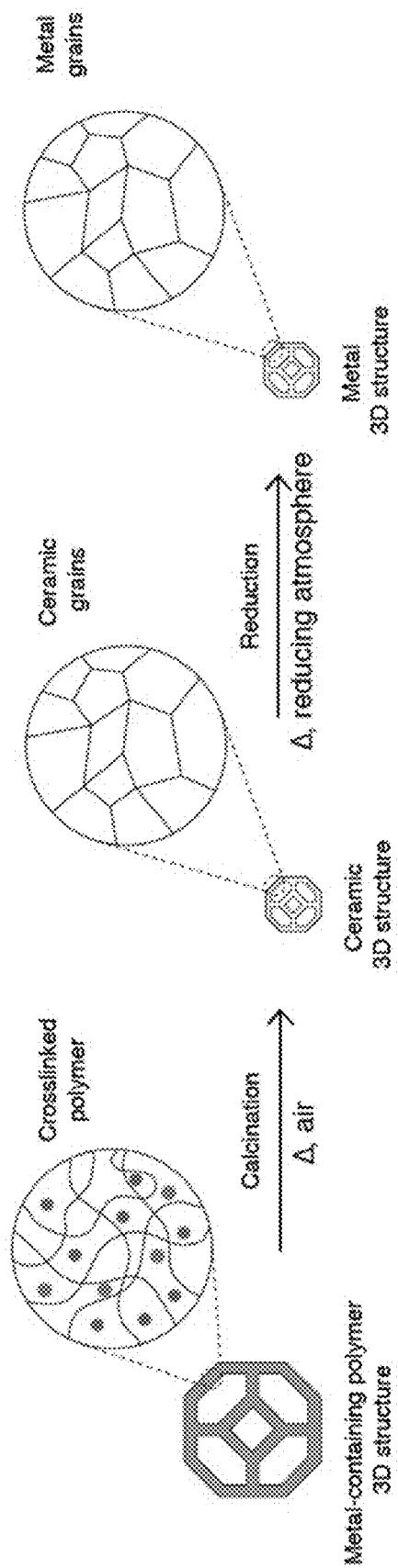
FIG. 33. The metal-salt containing polymer 3D structure is calcined in air at the appropriate temperature to form the corresponding metal oxide structure. The metal oxide is then reduced under the appropriate reduction conditions to form a metal 3D structure.

The 3D printed part is then calcined in air to produce the corresponding metal oxide, which is then subsequently reduced under the appropriate conditions to form the desired metal part. This is shown schematically in FIG. 33.

Example 12: Copper Structures Fabricated Via the Four-Stage Process of Projection-Microstereolithography, Swell-In, Calcination, and then Reduction 1) Preparation of Organic (Nonaqueous) "Blank" Photoresin (i.e., a Nonaqueous Blank Mixture)

To make the photoresin, 120 g of poly(ethylene glycol) diacrylate (Mw=700 g/mol) (PEGda) was first mixed with 270 mg of Mayzo OB-M1. In a separate vial, 37.5 mL of N,N-dimethylformamide was mixed with 270 mg of Mayzo OB-M1. To this vial, 540 mg of Lucrin TPO-L was added and mixed till a homogenous solution was formed. This was then added to the PEGda solution to give a clear photoresin.

2) Projection-Microstereolithography of the Organic "Blank" Photoresin (the Nonaqueous Blank Mixture)

Projection-microstereolithography was then used to fabricate 3D structures from the prepared "blank" photoresin. An octet structure printed from this resin is shown in FIGS. 34A-34B.

3) Swelling-In Process

The 3D octet was then swollen in a copper (II) nitrate solution (200 mg/mL) for 6 hours, at room temperature. The structure then turned blue, as shown in FIGS. 35A-35B.

4) Calcination of Copper-Containing 3D Structure

The copper-containing 3D structure was then calcined in flowing air, at a high throughput pressure of 20 Torr. In brief, the sample was placed on an alumina boat inside a quartz tube, and then evacuated with a vacuum until a pressure of 2 Torr was reached. Air was then allowed to flow in, with the vacuum running, until a steady pressure of 20 Torr was reached. The sample was then heated at a rate of 1° C./min until 100° C., followed by a ramp of 0.25° C./min to 500° C., and then a ramp of 2° C./min to 700° C. The sample was then held at 700° C. for 180 minutes, before cooling at a rate of 2° C./min to room temperature. The calcined structures are seen in FIGS. 36A-36B. The blue structure turned black, which is indicative of its conversion to copper oxide.

5) Reduction of Copper Oxide Structures

The copper oxide structures were then reduced in forming gas (95% $N_2$, 5% $H_2$) at high temperatures. The structure was placed on an alumina boat, inside a quartz tube, and then evacuated using a vacuum. When the pressure inside the tube was approximately 2 Torr, forming gas was slowly introduced into the tube until the tube was at atmospheric pressure. The sample was then heated using the following temperature profile: 3° C./min to 900° C., hold at 900° C. for 6 hours, followed by cooling at 3° C./min to room temperature. Forming gas was flowing through the tube at all times. The black copper oxide structure turned into a shiny bronze color, which is indicative of its conversion to copper. This can be seen in FIGS. 37A-37B.

Example 13: Copper Structures Fabricated Via the Five-Stage Process of Projection-Microstereolithography, Leach, Swell-In, Calcination, and then Reduction 1) Preparation of Lithium and Cobalt Nitrate Photoresin (LCO Resin)

To make the photoresin, 13.3 mL of 5M lithium nitrate solution was first mixed with 26.7 mL of 2.5M cobalt nitrate hexahydrate solution. To this salt solution, 60 mL of poly(ethylene glycol) diacrylate (Mw=575 g/mol) (PEGda) was added and mixed. In a separate vial, 343 mg of lithium phenyl-2,4,6-trimethylbenzoylphosphinate and 328 mg of Mayzo OB-M1 was mixed with 10 mL of deionized water to form a pale yellow solution. This was then added slowly to the metal nitrate/PEGda solution to give a deep purple photoresin.

2) Projection-Microstereolithography of the LCO Resin

Projection-microstereolithography was then used to fabricate 3D structures from the prepared LCO resin. A cubic lattice was printed in this example.

3) Leaching of Salts

The printed cubic lattice was placed in 30 mL of deionized water for 6 hours. The solution was decanted and 30 mL of deionized water added, and the sample left to soak for another 6 hours. The sample was a slight tinge of yellow after this, likely due to some yellowing during the print process.

4) Swell-in of Copper (II) Nitrate

The clear sample was then soaked in a copper (II) nitrate solution (100 mg/mL) for 6 hours, at room temperature. The structure then turned a blue-green color, as seen in FIG. 38.

5) Calcination of Copper Containing 3D Structure

The copper-containing 3D structure was then calcined in flowing air, at a high throughput pressure of 20 Torr. In brief, the sample was placed on an alumina boat inside a quartz tube, and then evacuated with a vacuum until a pressure of 2 Torr was reached. Air was then allowed to flow in, with the vacuum running, until a steady pressure of 20 Torr was reached. The sample was then heated at a rate of 1° C./min until 100° C., followed by a ramp of 0.25° C./min to 500° C., and then a ramp of 2° C./min to 700° C. The sample was then held at 700° C. for 180 minutes, before cooling at a rate of 2° C./min to room temperature. The calcined structures are seen in FIGS. 39A-39B. The blue structure turned black, which is indicative of its conversion to copper oxide.

6) Reduction of Copper Oxide Structures

The copper oxide structure was then reduced in forming gas (95% $N_2$, 5% $H_2$) at high temperatures. The structure was placed on an alumina boat, inside a quartz tube, and then evacuated using a vacuum. When the pressure inside the tube was approximately 2 Torr, forming gas was slowly introduced into the tube until the tube was at atmospheric pressure. The sample was then heated using the following temperature profile: 3° C./min to 900° C., hold at 900° C. for 6 hours, followed by cooling at 3° C./min to room temperature. Forming gas was flowing through the tube at all times. The black copper oxide structure turned into a shiny bronze color, which is indicative of its conversion to copper. This can be seen in FIGS. 40A-40B.

Figure 42:
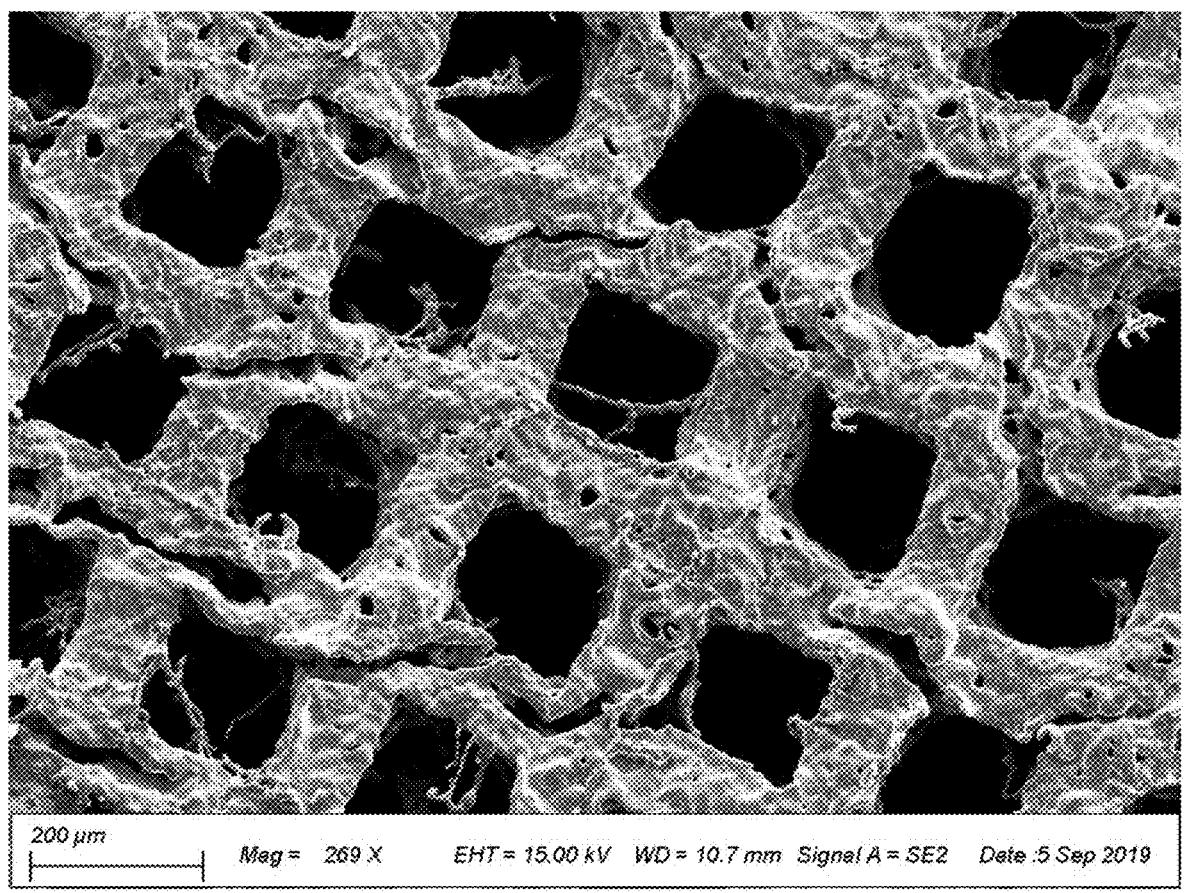
FIG. 42. SEM image of the copper lattice made as described in Example 13.
Figure 43:
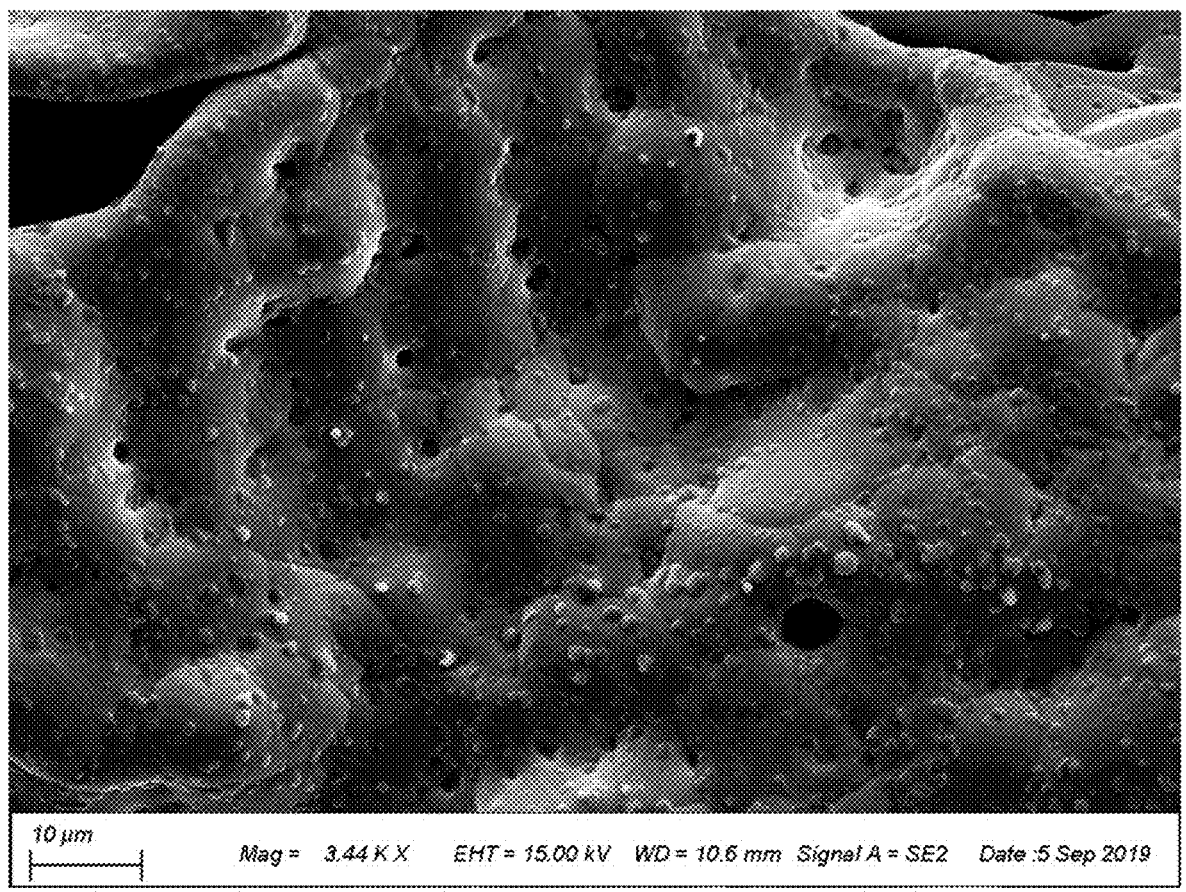
FIG. 43. SEM image of the microstructure of the copper lattice made as described in Example 13.

FIGS. 41, 42 and 43 show scanning electron microscope (SEM) images of the copper lattice described in FIGS. 40A-40B, with increasing magnification.

Figure 44:
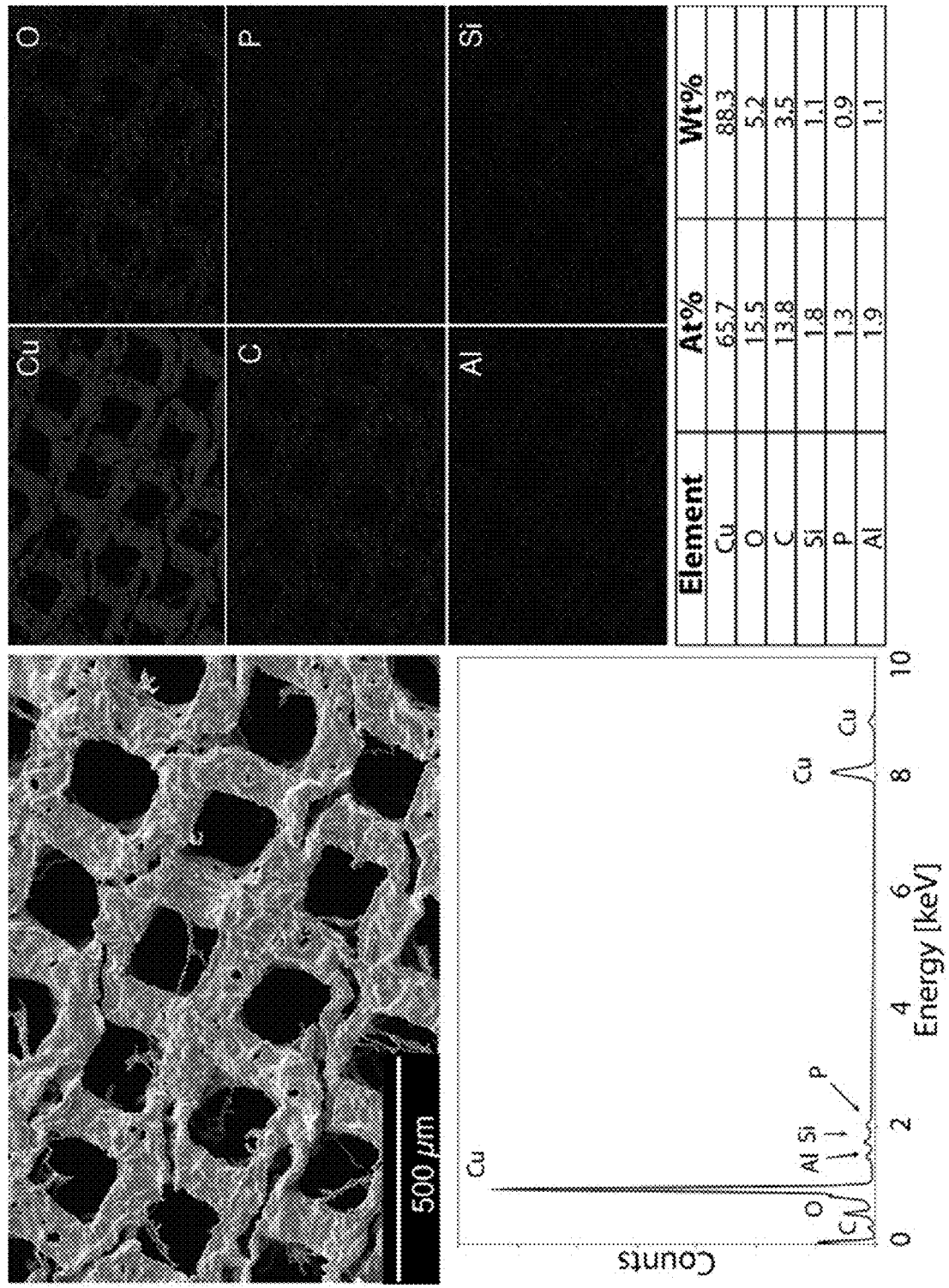
FIG. 44. Clockwise from top left—SEM image of the area being probed with EDS. Corresponding elemental maps, copper, oxygen, carbon, phosphorous, aluminum, and silicon were detected. Table of elements in both atomic and weight percentages. The EDS spectrum, with peaks indexed to the appropriate element.

FIG. 43 clearly shows microstructural features that are typically associated with metals, such as grains, and possibly annealing twins. To confirm the composition of the material, energy dispersive X-ray spectroscopy (EDS) was used to obtain elemental maps of the material, as shown in FIG. 44.

Figure 45:
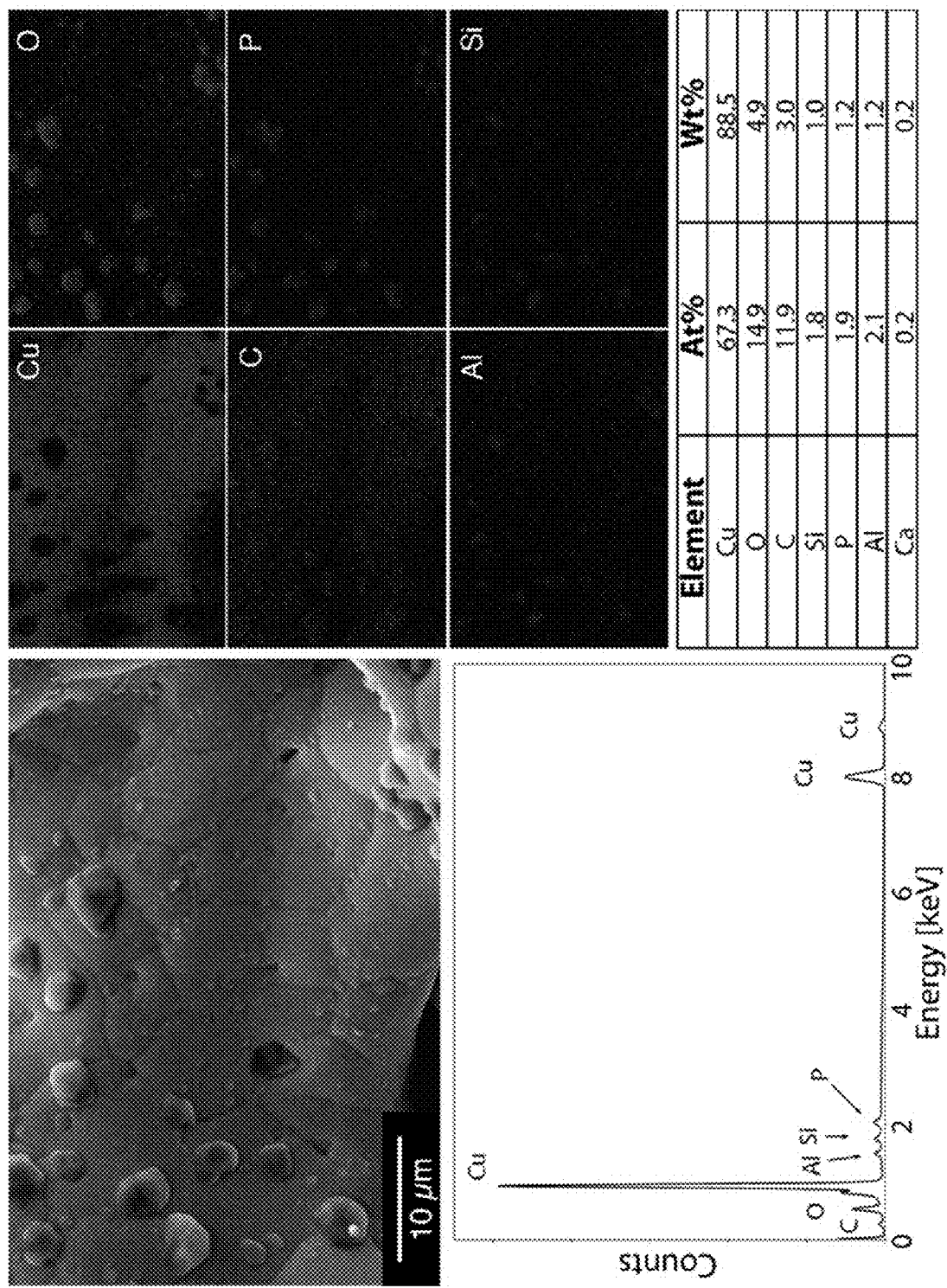
FIG. 45. Clockwise from top left—SEM image of the area being probed with EDS. Corresponding elemental maps, copper, oxygen, carbon, phosphorous, aluminum, and silicon were detected. Table of elements in both atomic and weight percentages. The EDS spectrum, with peaks indexed to the appropriate element.
Figure 46:
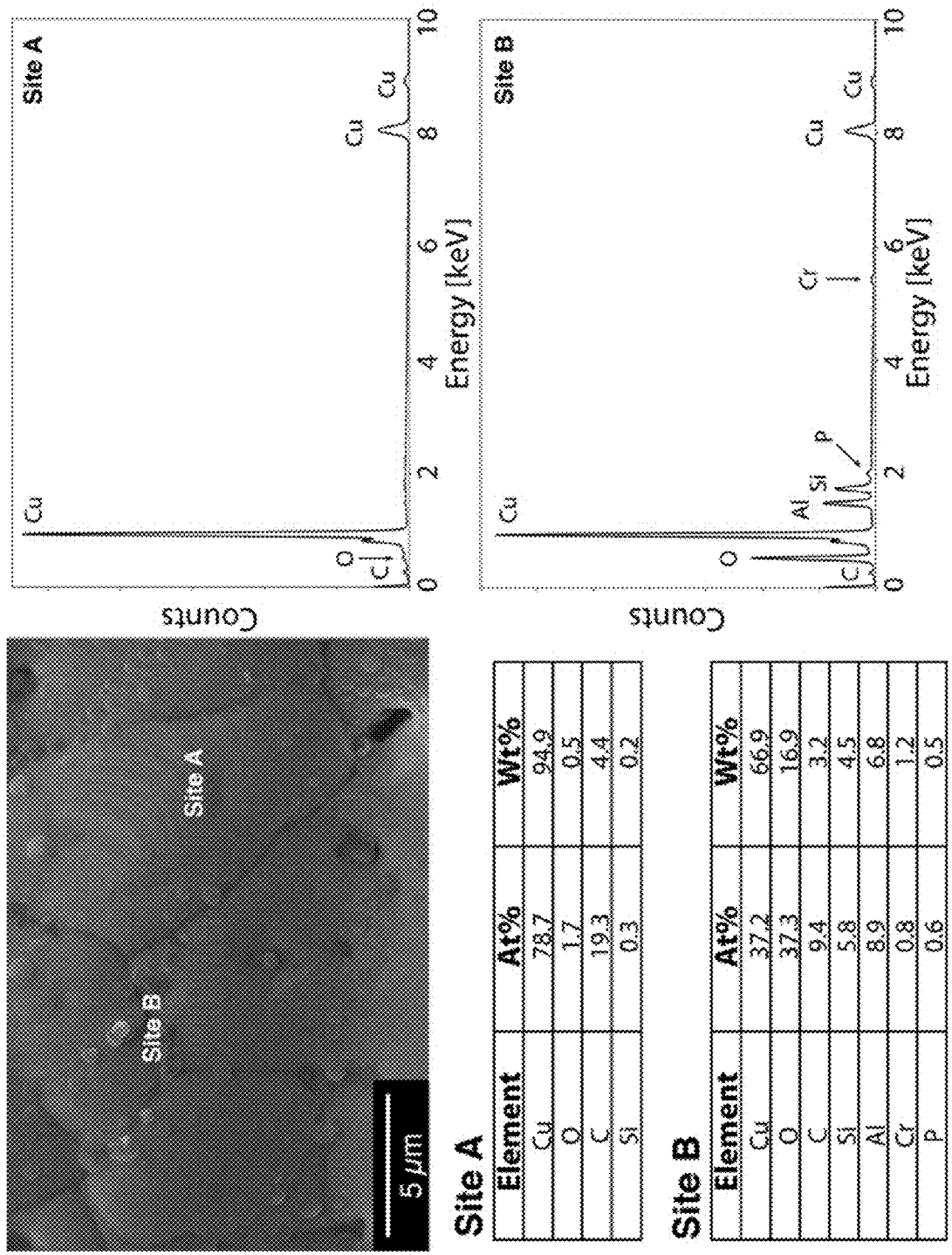
FIG. 46. Clockwise from top left—SEM image of the area being probed with EDS. EDS spectra of the copper-rich region, labeled as Site A. EDS spectra of the copper-deficient region, labeled as Site B. Table of elements in both atomic and weight percentages of the elements detected in Site A and Site B.

As seen, the majority element detected with copper, followed by oxygen. Closer inspection of the microstructure revealed that the copper was phase segregated from the other elements, as shown in FIG. 45. Spot analysis of the copper-rich and copper-deficient regions are shown in FIG. 46.

Example 14: Nickel Structures Fabricated Via the Four-Stage Process of Projection-Microstereolithography, Swell-In, Calcination, and then Reduction 1) Preparation of Organic "Blank" Photoresin (a Non-aqueous Blank Mixture)

To make the photoresin, 120 g of poly(ethylene glycol) diacrylate (Mw=700 g/mol) (PEGda) was first mixed with 270 mg of Mayzo OB-M1. In a separate vial, 37.5 mL of N,N-dimethylformamide was mixed with 270 mg of Mayzo OB-M1. To this vial, 540 mg of Lucrin TPO-L was added and mixed till a homogenous solution was formed. This was then added to the PEGda solution to give a clear photoresin.

2) Projection-Microstereolithography of the Organic "Blank" Photoresin (the Nonaqueous Blank Mixture)

Projection-microstereolithography was then used to fabricate 3D structures from the prepared "blank" photoresin. An octet structure printed from this resin is shown below in FIGS. 47A-47B.

3) Swelling-In Process

The 3D octet was then swollen in a nickel (II) nitrate hexahydrate solution (250 mg/mL) for 2 hours, at room temperature. The structure then turned green, as shown in FIGS. 48A-48B.

4) Calcination of Nickel-Containing 3D Structure

The nickel-containing 3D structure was then calcined in flowing air, at a high throughput pressure of 20 Torr. In brief, the sample was placed on an alumina boat inside a quartz tube, and then evacuated with a vacuum until a pressure of 2 Torr was reached. Air was then allowed to flow in, with the vacuum running, until a steady pressure of 20 Torr was reached. The sample was then heated at a rate of 3° C./min until 700° C., followed by hold at 700° C. for 180 minutes, before cooling at a rate of 3° C./min to room temperature. The calcined structures are seen in FIGS. 49A-49B. The green structure turned black, which is indicative that some degree of conversion to nickel oxide took place.

5) Reduction of Nickel Oxide Structures

The nickel oxide structures were then reduced in forming gas (95% $N_2$, 5% $H_2$) at high temperatures. The structure was placed on an alumina boat, inside a quartz tube, and then evacuated using a vacuum. When the pressure inside the tube was approximately 2 Torr, forming gas was slowly introduced into the tube until the tube was at atmospheric pressure. The sample was then heated using the following temperature profile: 3° C./min to 900° C., hold at 900° C. for 6 hours, followed by cooling at 3° C./min to room temperature. Forming gas was flowing through the tube at all times. The black nickel oxide structure turned into a shiny silver color, which is indicative of its conversion to nickel. This can be seen in FIGS. 50A-50B.

Figure 51:
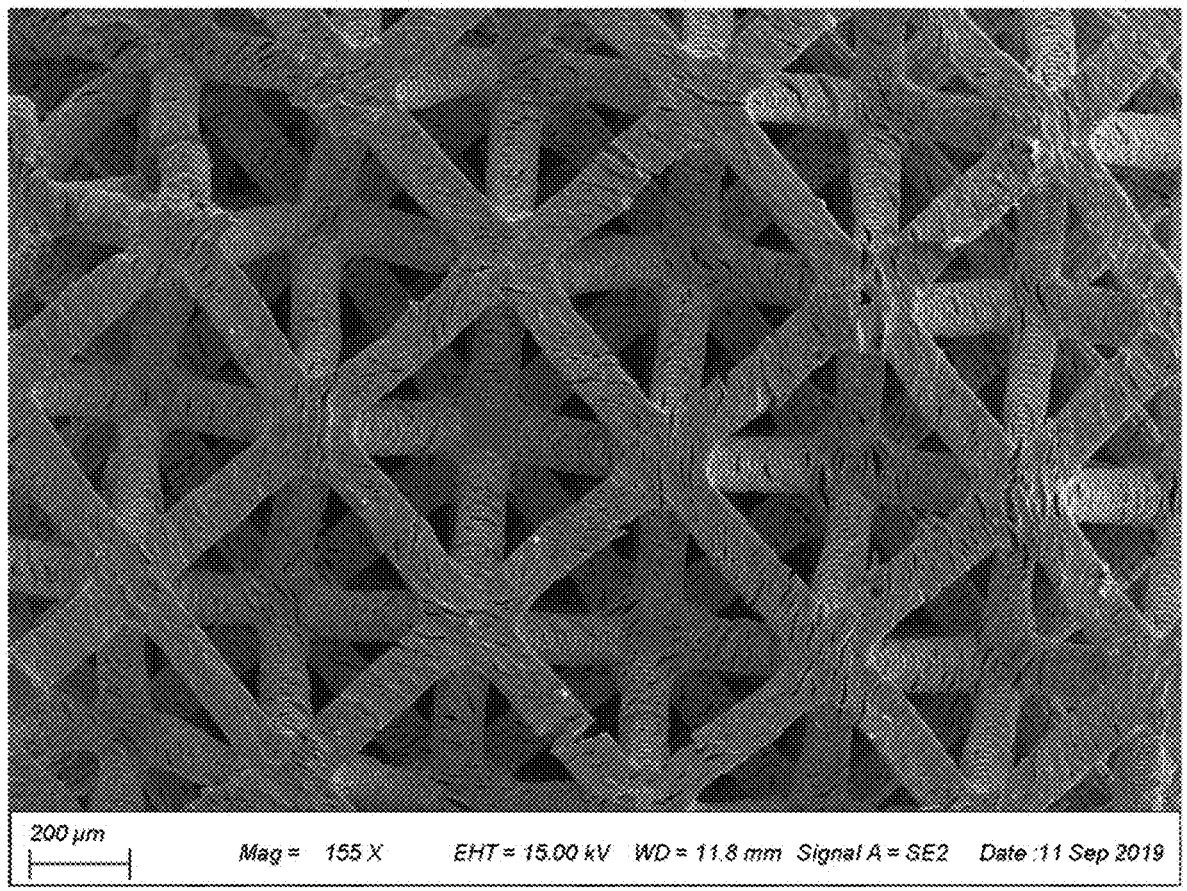
FIG. 51. SEM image of the nickel lattice made as described in Example 14.
Figure 52:
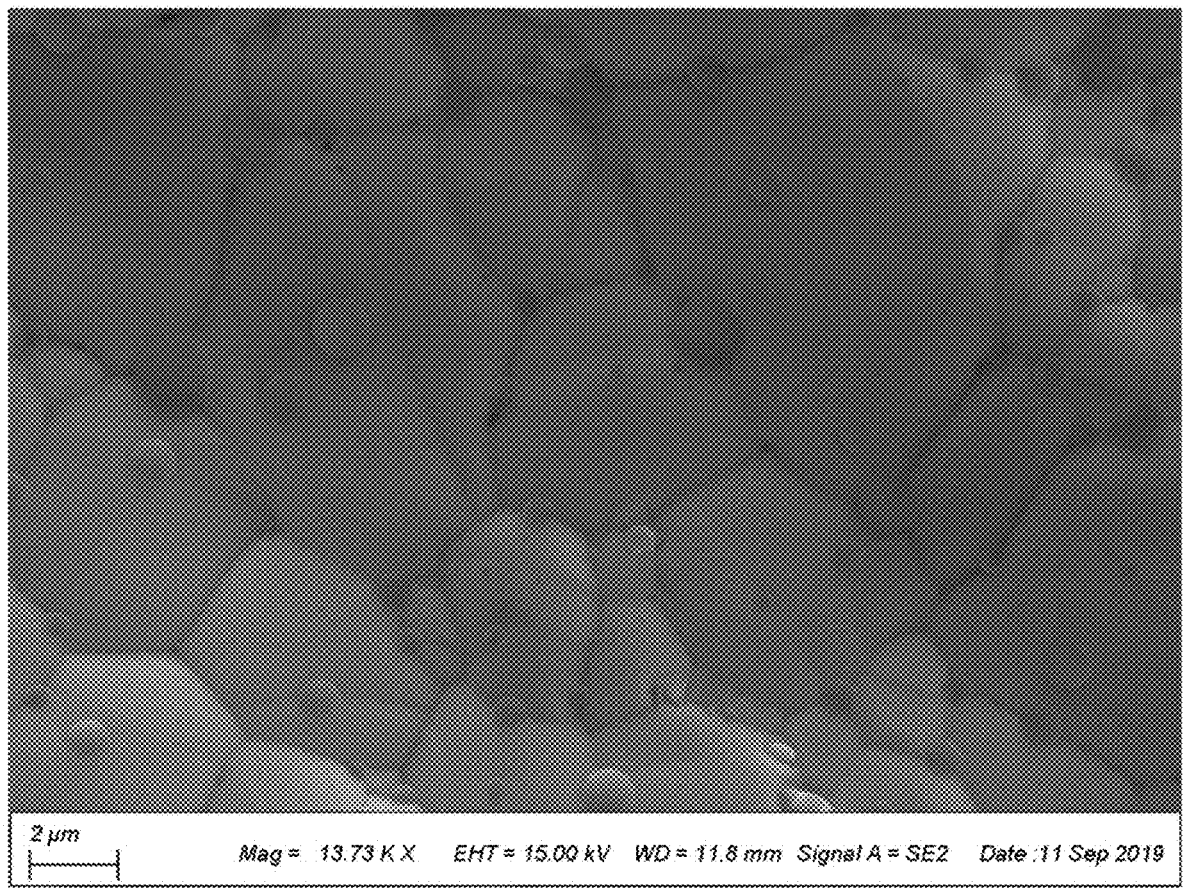
FIG. 52. SEM image of the microstructure of the nickel lattice made as described in Example 14.

FIGS. 51 and 52 show scanning electron microscope (SEM) images of the nickel lattice described in FIGS. 50A-50B, with increasing magnification.

Figure 53:
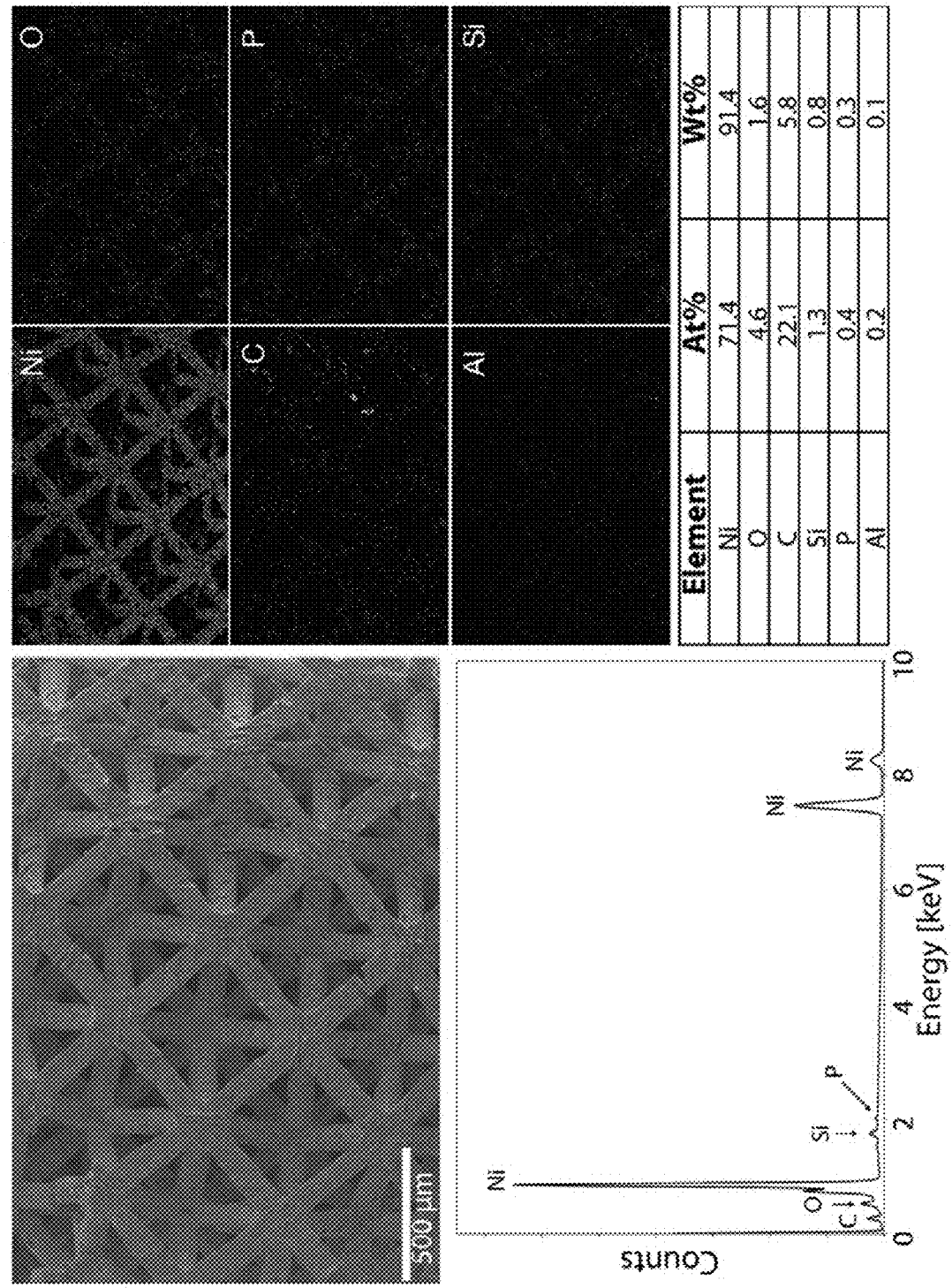
FIG. 53. Clockwise from top left—SEM image of the area being probed with EDS. Corresponding elemental maps, nickel, oxygen, carbon, phosphorous, aluminum, and silicon were detected. Table of elements in both atomic and weight percentages. The EDS spectrum, with peaks indexed to the appropriate element.

To confirm the composition of the material, energy dispersive X-ray spectroscopy (EDS) was used to obtain elemental maps of the material, as shown in FIG. 53.

Figure 54:
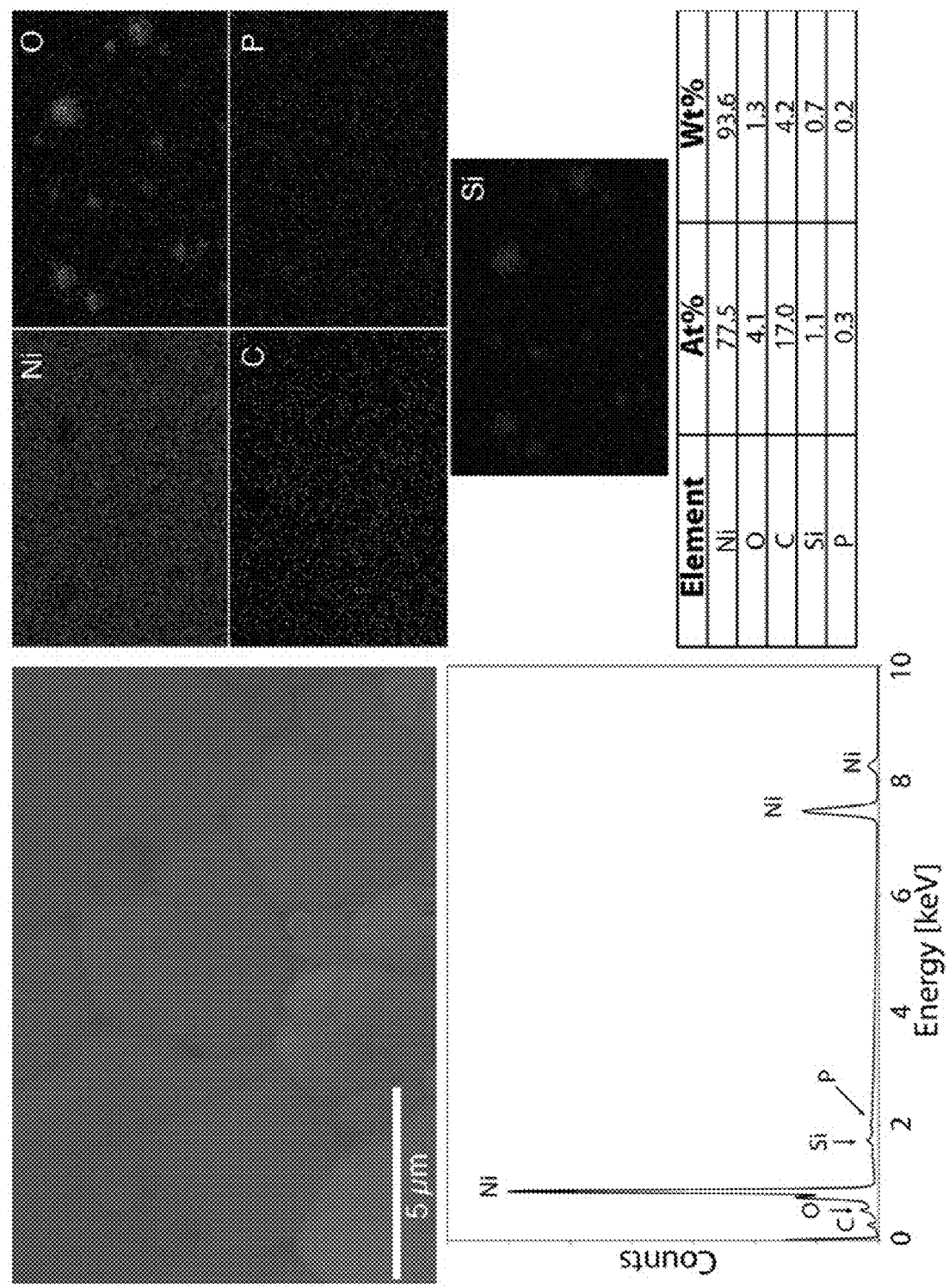
FIG. 54. Clockwise from top left—SEM image of the area being probed with EDS. Corresponding elemental maps, nickel, oxygen, carbon, phosphorous, and silicon were detected. Table of elements in both atomic and weight percentages. The EDS spectrum, with peaks indexed to the appropriate element.
Figure 55:
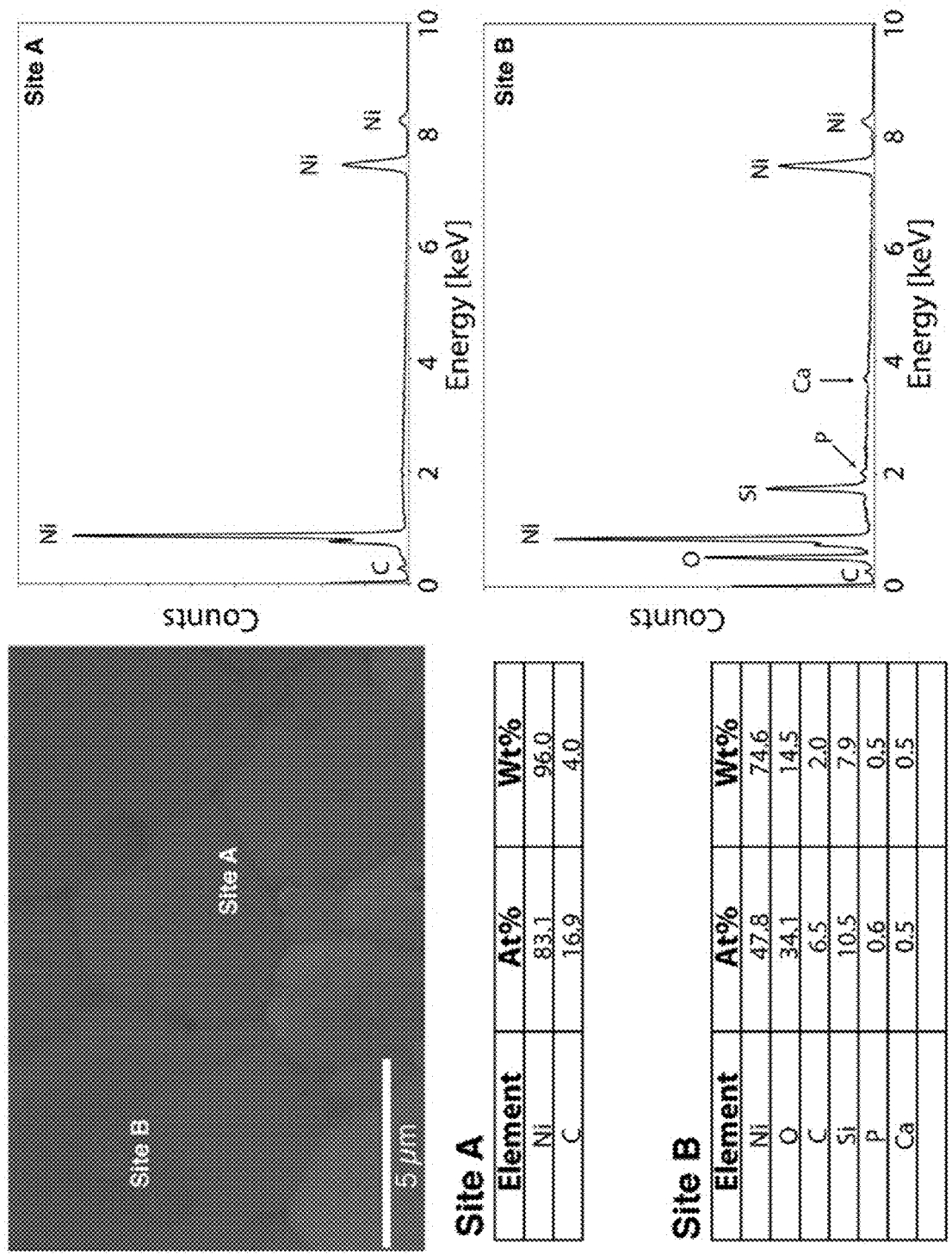
FIG. 55. Clockwise from top left—SEM image of the area being probed with EDS. EDS spectra of the nickel-rich region, labeled as Site A. EDS spectra of the nickel-deficient region, labeled as Site B. Table of elements in both atomic and weight percentages of the elements detected in Site A and Site B.

As seen, the majority element detected with nickel, followed by oxygen. Closer inspection of the microstructure revealed that the nickel was phase segregated from the other elements, as shown in FIG. 54. Spot analysis of the nickel-rich and nickel-deficient regions are shown in FIG. 55.

Example 15: Cobalt Structures Fabricated Via the Four-Stage Process of Projection-Microstereolithography, Swell-In, Calcination, and then Reduction 1) Preparation of Organic "Blank" Photoresin (a Non-aqueous Blank Mixture)

To make the photoresin, 120 g of poly(ethylene glycol) diacrylate (Mw=700 g/mol) (PEGda) was first mixed with 270 mg of Mayzo OB-M1. In a separate vial, 37.5 mL of N,N-dimethylformamide was mixed with 270 mg of Mayzo OB-M1. To this vial, 540 mg of Lucrin TPO-L was added and mixed till a homogenous solution was formed. This was then added to the PEGda solution to give a clear photoresin.

2) Projection-Microstereolithography of the Organic "Blank" Photoresin

Projection-microstereolithography was then used to fabricate 3D structures from the prepared "blank" photoresin. An octet structure was printed from this resin.

3) Swelling-In Process

The 3D octet was then swollen in a cobalt (II) nitrate hexahydrate solution (1.2M) for 2 hours, at 50° C. The structure then turned pink, as shown in FIG. 56.

4) Calcination of Cobalt Containing 3D Structure

The cobalt-containing 3D structure was then calcined in flowing air, at a high throughput pressure of 20 Torr. In brief, the sample was placed on an alumina boat inside a quartz tube, and then evacuated with a vacuum until a pressure of 2 Torr was reached. Air was then allowed to flow in, with the vacuum running, until a steady pressure of 20 Torr was reached. The sample was then heated at a rate of 1° C./min until 700° C., followed by hold at 700° C. for 180 minutes, before cooling at a rate of 2° C./min to room temperature. The calcined structures are seen in FIGS. 57A-57B. The pink structure turned black, which is indicative of its conversion to cobalt oxide.

5) Reduction of Cobalt Oxide Structures

The cobalt oxide structure was then reduced in forming gas (95% $N_2$, 5% $H_2$) at high temperatures. The structure was placed on an alumina boat, inside a quartz tube, and then evacuated using a vacuum. When the pressure inside the tube was approximately 2 Torr, forming gas was slowly introduced into the tube until the tube was at atmospheric pressure. The sample was then heated using the following temperature profile: 3° C./min to 900° C., hold at 900° C. for 6 hours, followed by cooling at 3° C./min to room temperature. Forming gas was flowing through the tube at all times. The black cobalt oxide structure turned into a shiny silver color, which is indicative of its conversion to cobalt. This can be seen in FIGS. 58A-58B.

Figure 60:
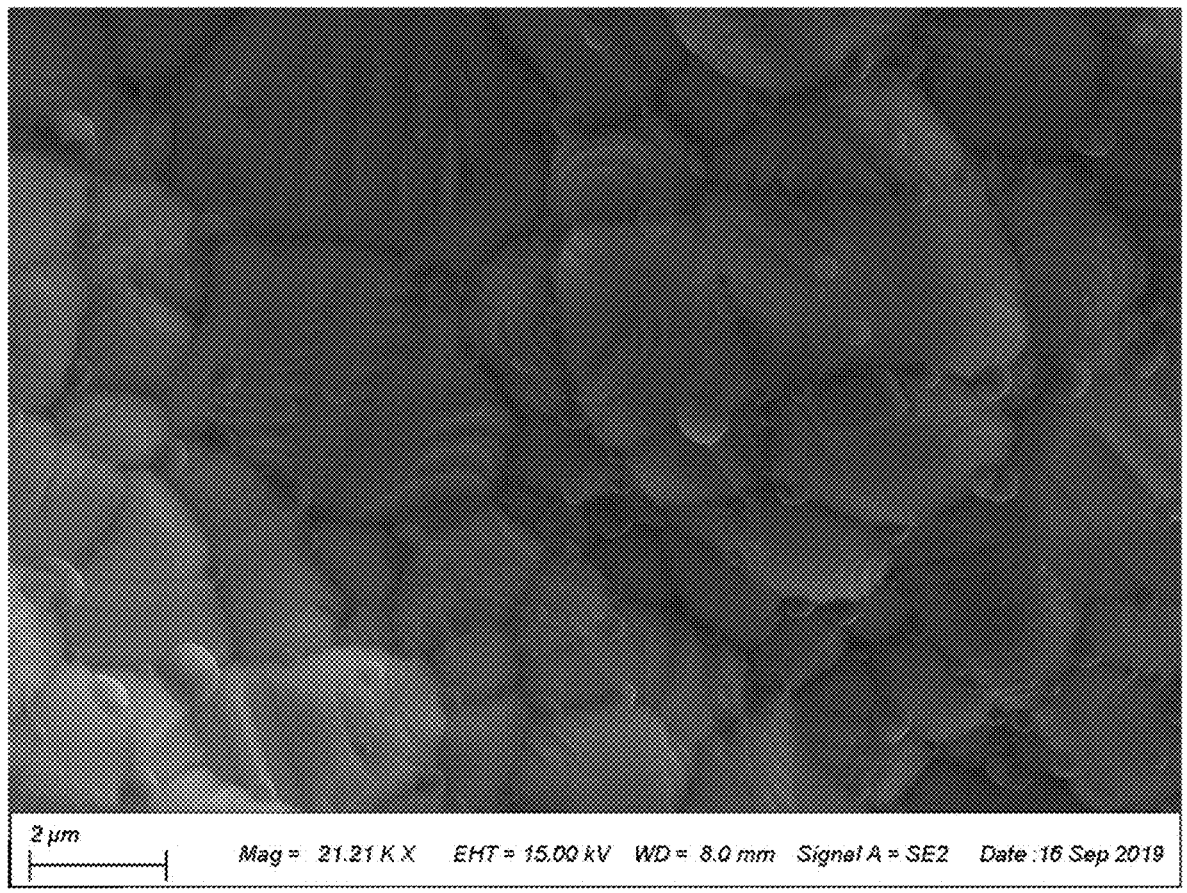
FIG. 60. SEM image of the microstructure of the cobalt lattice made as described in Example 15.

FIGS. 59 and 60 show scanning electron microscope (SEM) images of the cobalt lattice described in FIGS. 58A-58B, with increasing magnification.

Figure 61:
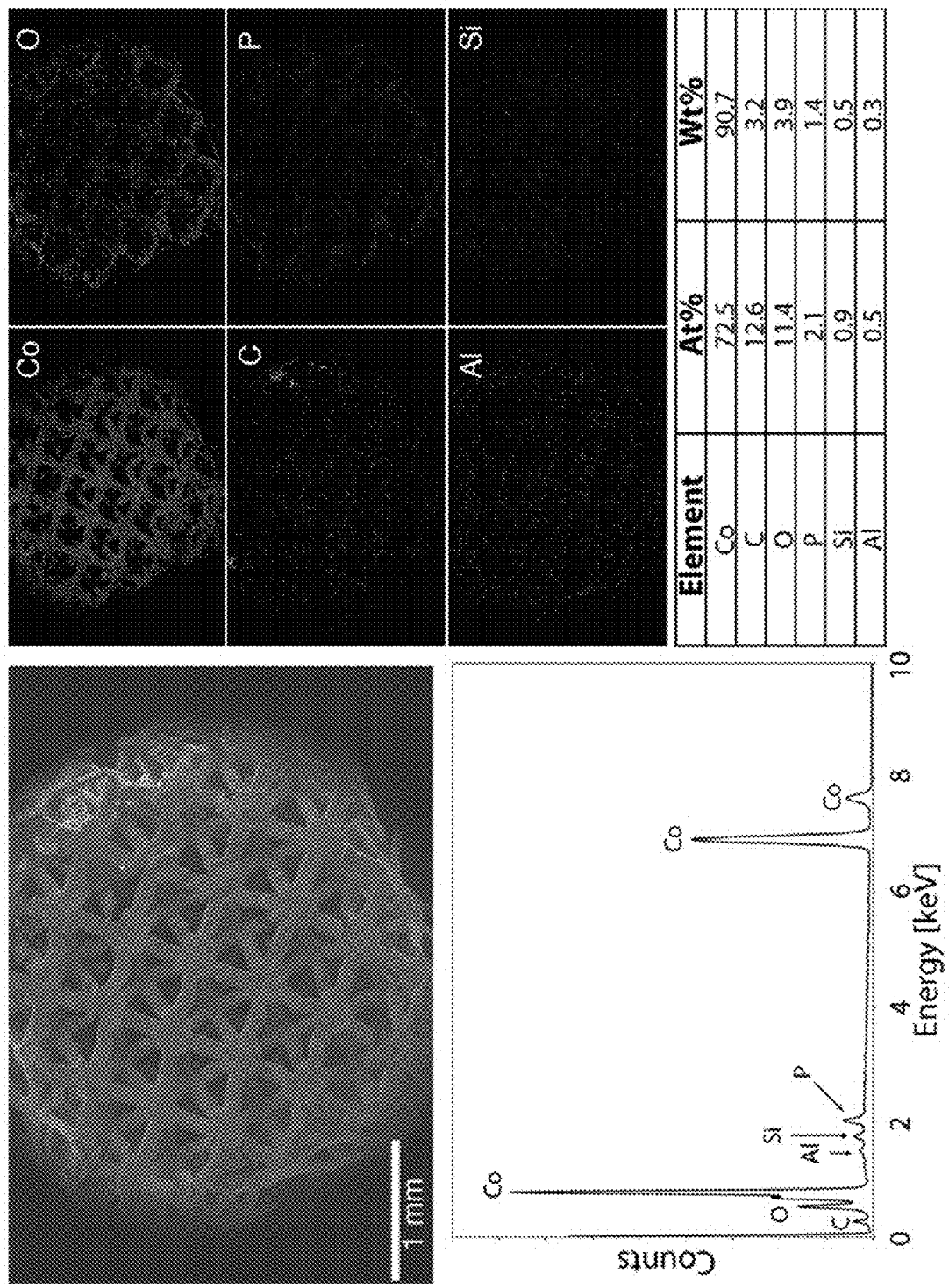
FIG. 61. Clockwise from top left—SEM image of the area being probed with EDS. Corresponding elemental maps, cobalt, oxygen, carbon, phosphorous, aluminum, and silicon were detected. Table of elements in both atomic and weight percentages. The EDS spectrum, with peaks indexed to the appropriate element.

To confirm the composition of the material, energy dispersive X-ray spectroscopy (EDS) was used to obtain elemental maps of the material, as shown in FIG. 61.

Figure 62:
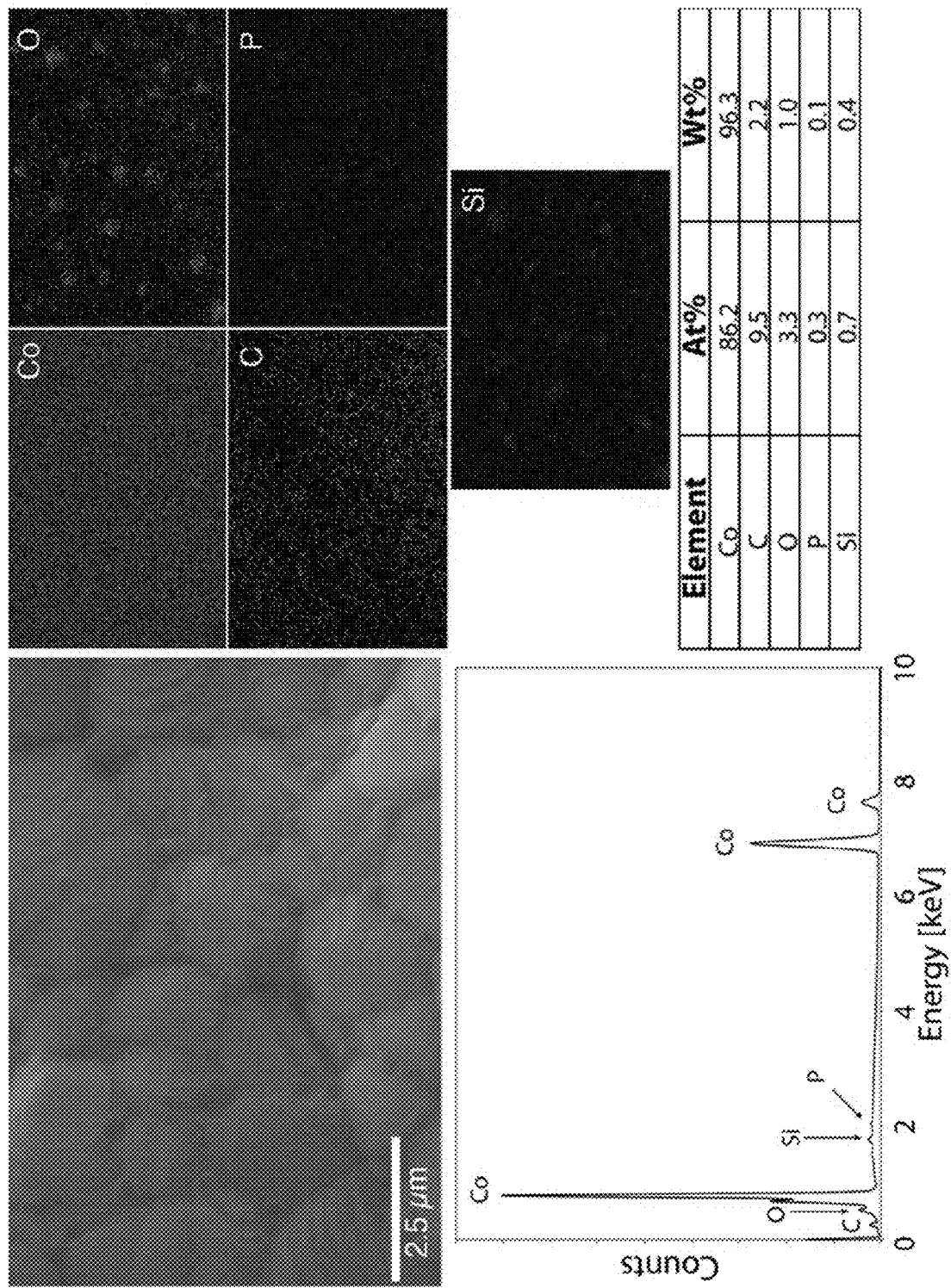
FIG. 62. Clockwise from top left—SEM image of the area being probed with EDS. Corresponding elemental maps, cobalt, oxygen, carbon, phosphorous, and silicon were detected. Table of elements in both atomic and weight percentages. The EDS spectrum, with peaks indexed to the appropriate element.
Figure 63:
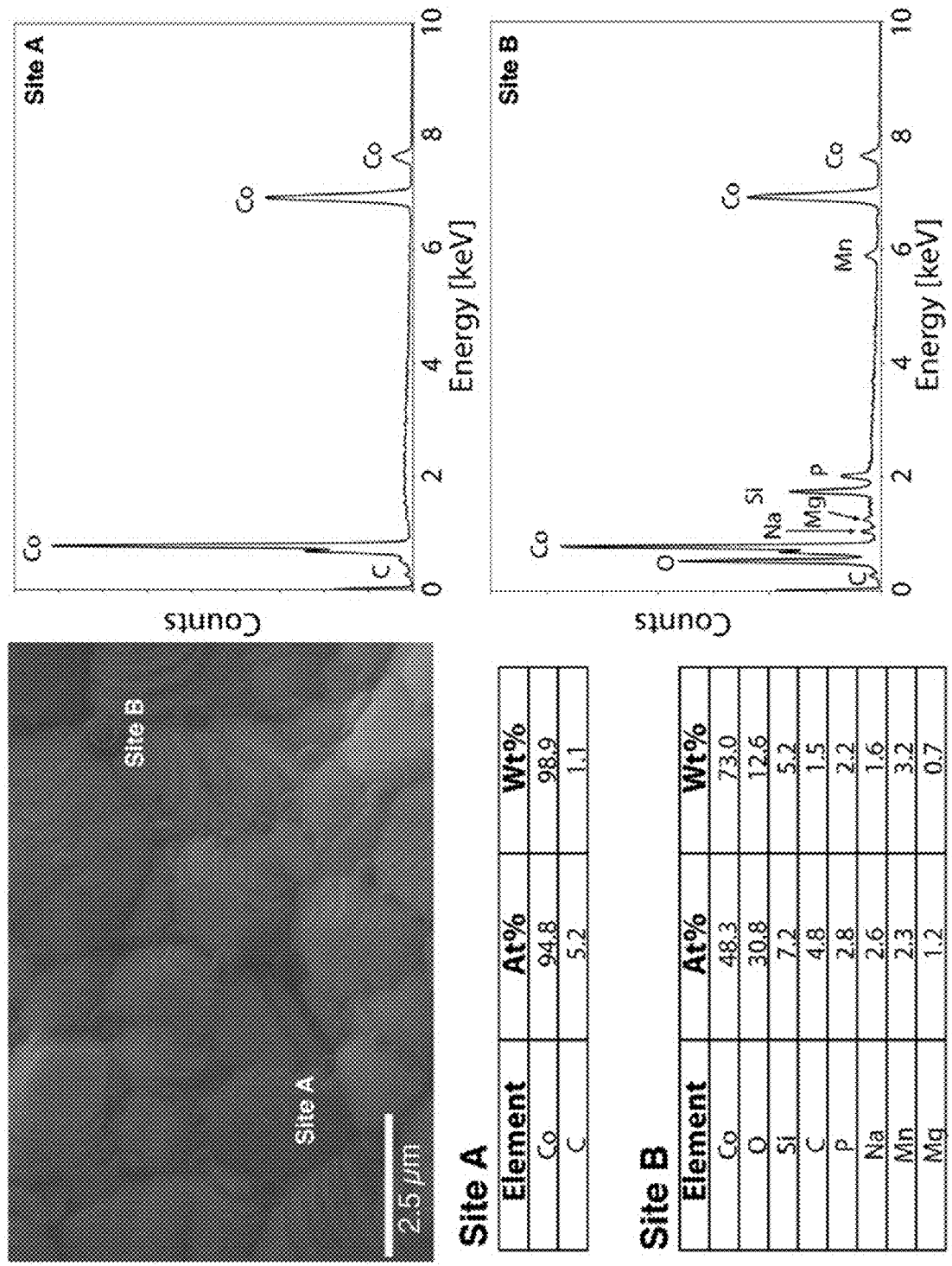
FIG. 63. Clockwise from top left—SEM image of the area being probed with EDS. EDS spectra of the cobalt-rich region, labeled as Site A. EDS spectra of the oxygen-rich region, labeled as Site B. Table of elements in both atomic and weight percentages of the elements detected in Site A and Site B.

As seen, the majority element detected with cobalt, followed by oxygen. Closer inspection of the microstructure revealed that the oxygen was phase segregated from the other elements, as shown in FIG. 62. Spot analysis of the cobalt-rich and oxygen-rich regions are shown in FIG. 63 below.

Example 16: Cobalt Structures Fabricated Via the Four-Stage Process of Projection-Microstereolithography, Swell-In, Calcination, and then Reduction 1) Preparation of Organic "Blank" Photoresin (a Non-aqueous Blank Mixture)

To make the photoresin, 120 g of poly(ethylene glycol) diacrylate (Mw=700 g/mol) (PEGda) was first mixed with 270 mg of Mayzo OB-M1. In a separate vial, 37.5 mL of N,N-dimethylformamide was mixed with 270 mg of Mayzo OB-M1. To this vial, 540 mg of Lucrin TPO-L was added and mixed till a homogenous solution was formed. This was then added to the PEGda solution to give a clear photoresin.

2) Projection-Microstereolithography of the Organic "Blank" Photoresin

Projection-microstereolithography was then used to fabricate 3D structures from the prepared "blank" photoresin. An octet structure was printed from this resin.

3) Swelling-In Process

Figure 64:
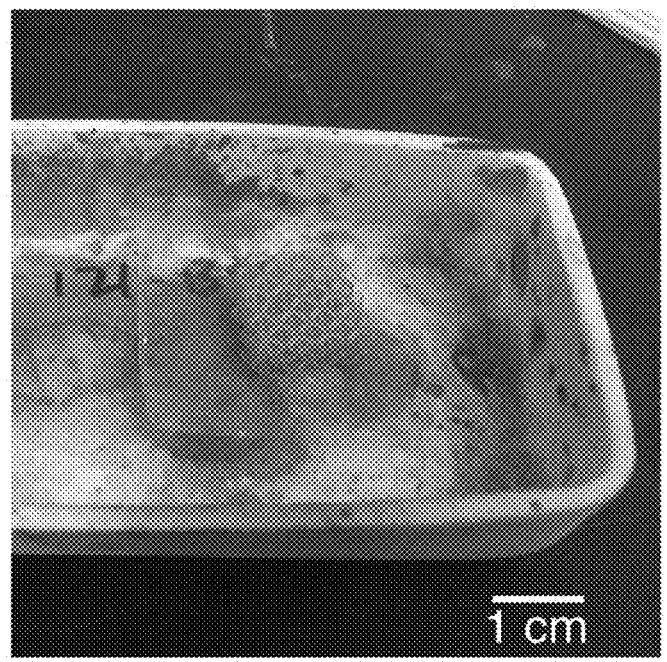
FIG. 64. 3D octet "blank" hydrogel lattice after swelling in a cobalt (II) acetate solution for 2 hours at 50° C.

The 3D octet was then swollen in a cobalt (II) acetate solution (1.2M) for 2 hours, at 50° C. The structure then turned pink, as shown in FIG. 64.

4) Calcination of Cobalt Containing 3D Structure

Figure 65A:
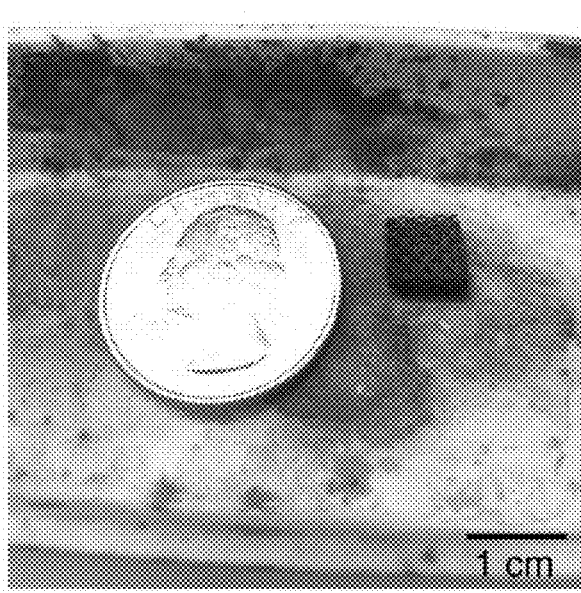
FIG. 65A. Cobalt oxide lattices after calcination of structures swollen with cobalt acetate.
Figure 65B:
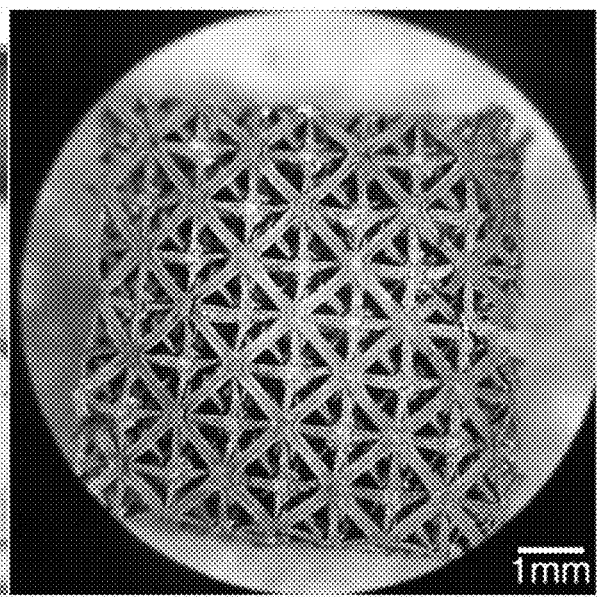
FIG. 65B. Image of the same cobalt oxide octet lattice, as imaged using a stereomicroscope.

The cobalt-containing 3D structure was then calcined in flowing air, at a high throughput pressure of 20 Torr. In brief, the sample was placed on an alumina boat inside a quartz tube, and then evacuated with a vacuum until a pressure of 2 Torr was reached. Air was then allowed to flow in, with the vacuum running, until a steady pressure of 20 Torr was reached. The sample was then heated at a rate of 1° C./min until 700° C., followed by hold at 700° C. for 180 minutes, before cooling at a rate of 2° C./min to room temperature. The calcined structures are seen in FIGS. 65A-65B. The pink structure turned black, which is indicative of its conversion to cobalt oxide.

5) Reduction of Cobalt Oxide Structures

The cobalt oxide structure was then reduced in forming gas (95% $N_2$, 5% $H_2$) at high temperatures. The structure was placed on an alumina boat, inside a quartz tube, and then evacuated using a vacuum. When the pressure inside the tube was approximately 2 Torr, forming gas was slowly introduced into the tube until the tube was at atmospheric pressure. The sample was then heated using the following temperature profile: 3° C./min to 900° C., hold at 900° C. for 6 hours, followed by cooling at 3° C./min to room temperature. Forming gas was flowing through the tube at all times. The black cobalt oxide structure turned into a shiny silver color, which is indicative of its conversion to cobalt. This can be seen in FIGS. 66A-66B.

Figure 66A:
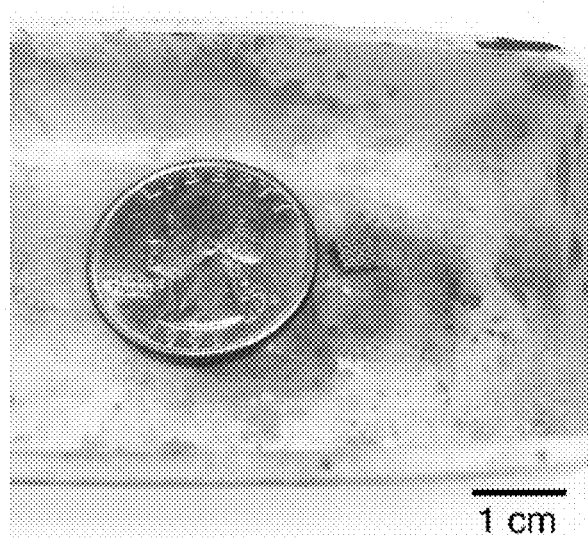
FIG. 66A. Cobalt lattices after reduction.
Figure 66B:
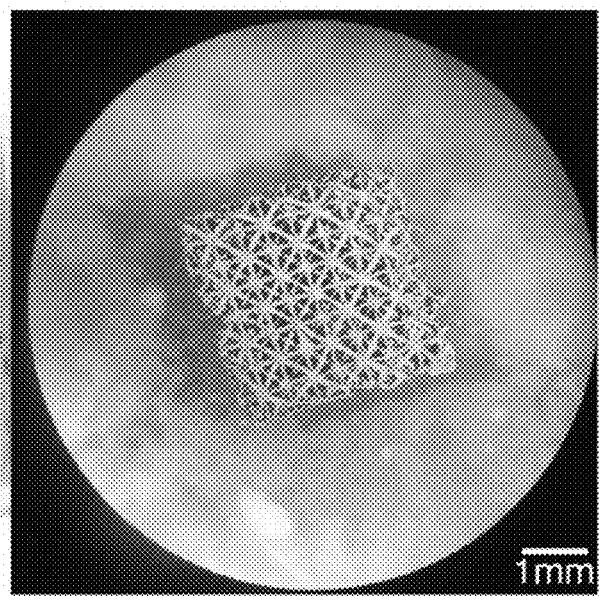
FIG. 66B. Image of the same cobalt octet lattice, as imaged using a stereomicroscope.
Figure 67:
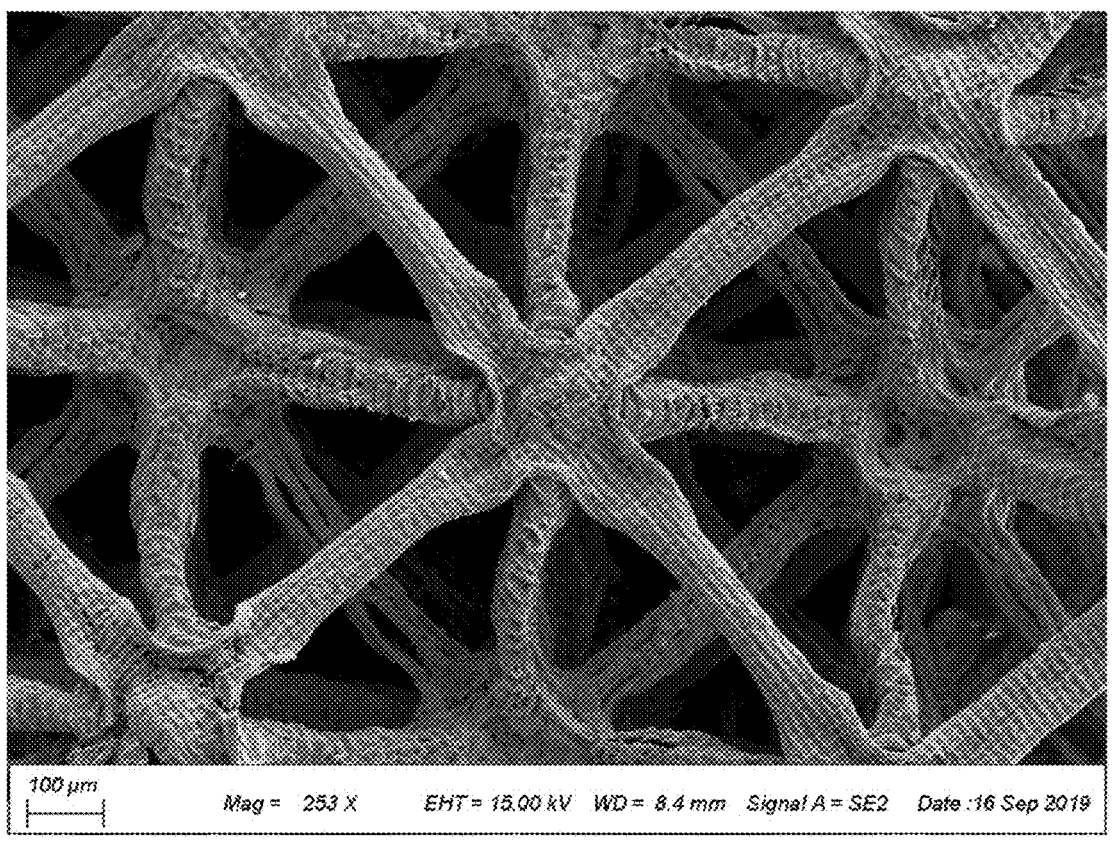
FIG. 67. SEM image of the cobalt lattice made as described in Example 16.
Figure 68:
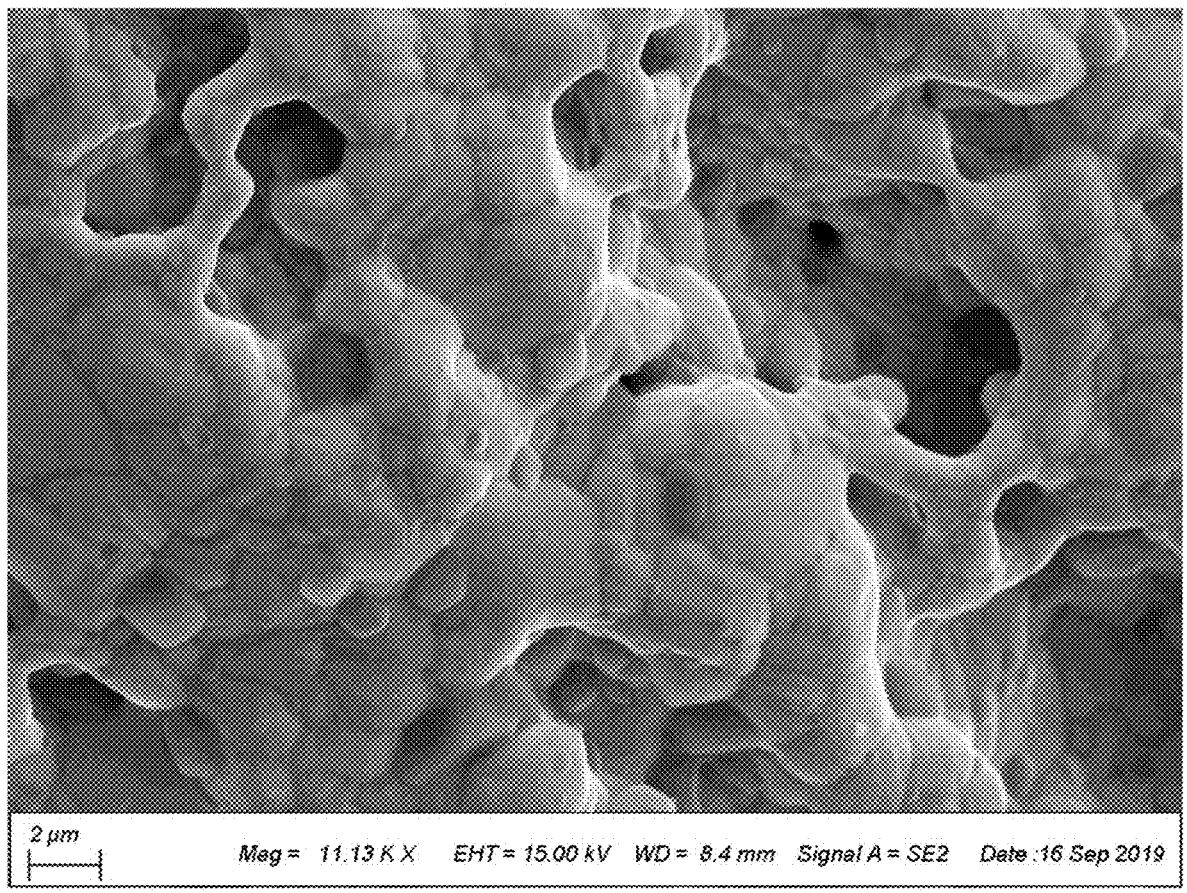
FIG. 68. SEM image of the microstructure of the cobalt lattice made as described in Example 16.

FIGS. 67 and 68 show scanning electron microscope (SEM) images of the cobalt lattice described in FIGS. 66A-66B, with increasing magnification.

Figure 69:
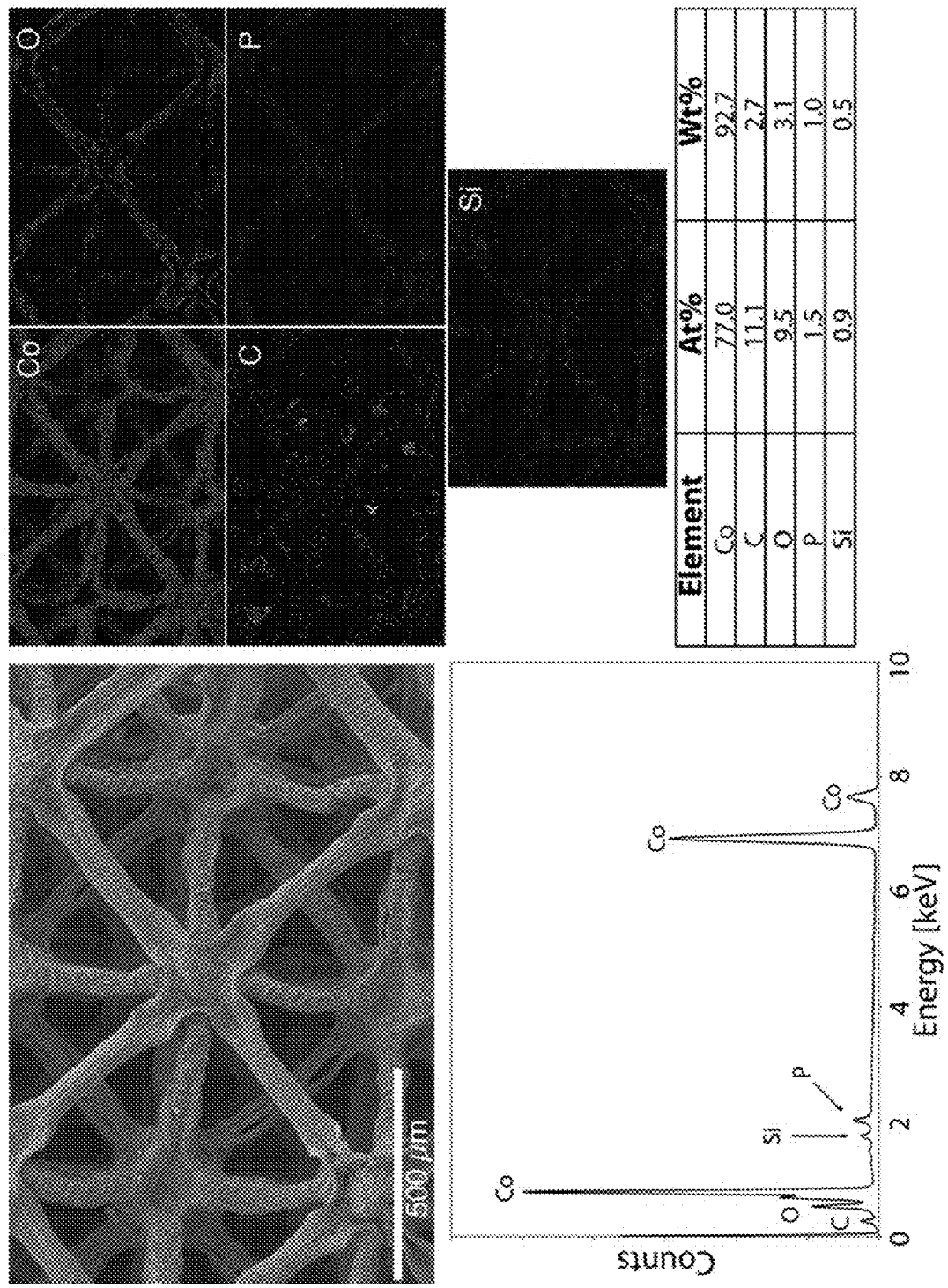
FIG. 69. Clockwise from top left—SEM image of the area being probed with EDS. Corresponding elemental maps, cobalt, oxygen, carbon, phosphorous, and silicon were detected. Table of elements in both atomic and weight percentages. The EDS spectrum, with peaks indexed to the appropriate element.

To confirm the composition of the material, energy dispersive X-ray spectroscopy (EDS) was used to obtain elemental maps of the material, as shown in FIG. 69.

Figure 70:
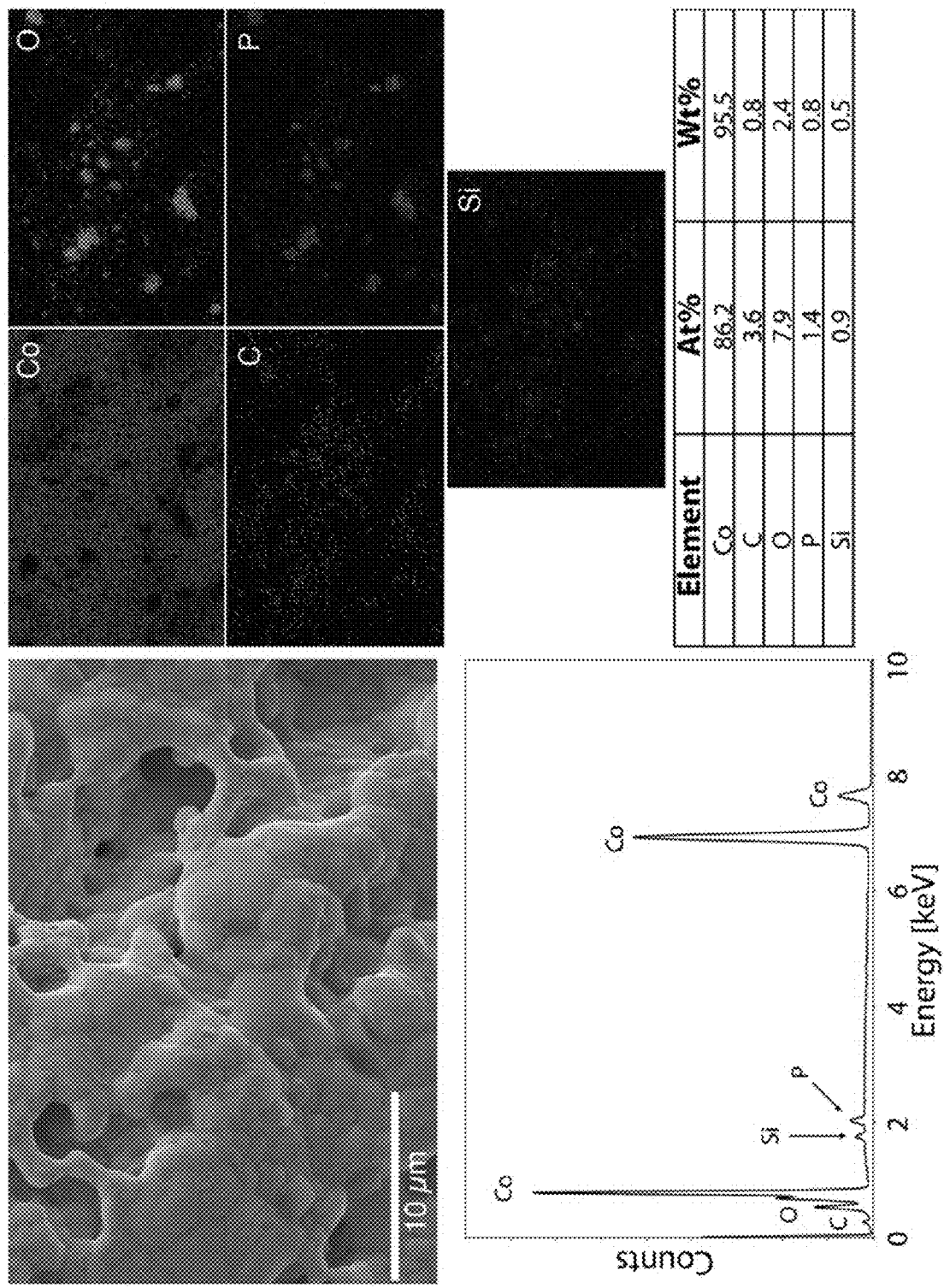
FIG. 70. Clockwise from top left—SEM image of the area being probed with EDS. Corresponding elemental maps, cobalt, oxygen, carbon, phosphorous, and silicon were detected. Table of elements in both atomic and weight percentages. The EDS spectrum, with peaks indexed to the appropriate element.
Figure 71:
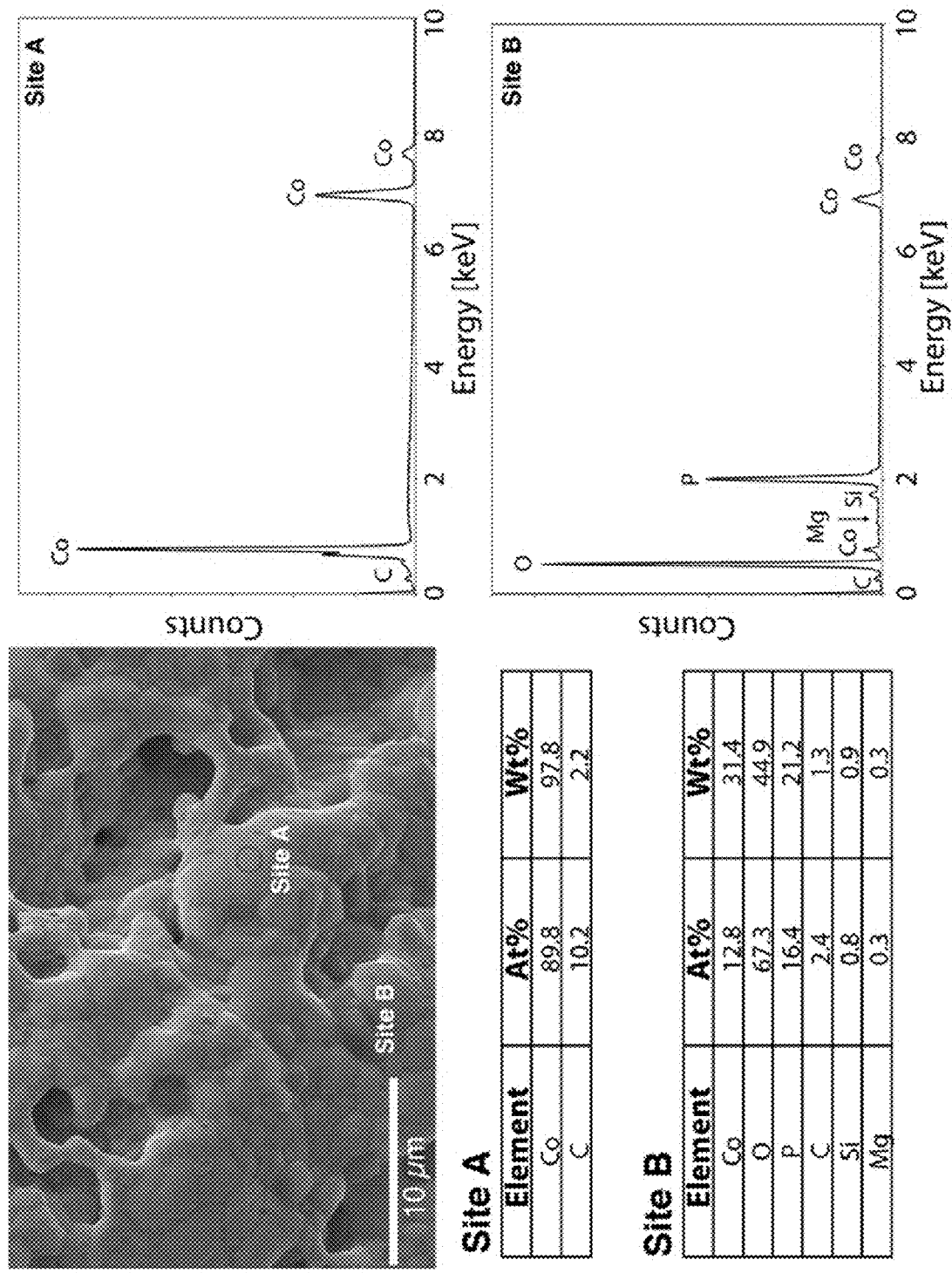
FIG. 71. Clockwise from top left—SEM image of the area being probed with EDS. EDS spectra of the cobalt-rich region, labeled as Site A. EDS spectra of the oxygen-rich region, labeled as Site B. Table of elements in both atomic and weight percentages of the elements detected in Site A and Site B.

As seen, the majority element detected with cobalt, followed by oxygen. Closer inspection of the microstructure revealed that the oxygen was phase segregated from the other elements, as shown in FIG. 70. Spot analysis of the cobalt-rich and oxygen-rich regions are shown in FIG. 71.

Example 17: Copper-Nickel Alloy Structures Fabricated Via the Four-Stage Process of Projection-Microstereolithography, Swell-In, Calcination, and then Reduction 1) Preparation of Organic "Blank" Photoresin (a Non-aqueous Blank Mixture)

To make the photoresin, 120 g of poly(ethylene glycol) diacrylate (Mw=700 g/mol) (PEGda) was first mixed with 270 mg of Mayzo OB-M1. In a separate vial, 37.5 mL of N,N-dimethylformamide was mixed with 270 mg of Mayzo OB-M1. To this vial, 540 mg of Lucrin TPO-L was added and mixed till a homogenous solution was formed. This was then added to the PEGda solution to give a clear photoresin.

2) Projection-Microstereolithography of the Organic "Blank" Photoresin

Projection-microstereolithography was then used to fabricate 3D structures from the prepared "blank" photoresin. An octet structure was printed from this resin.

3) Swelling-In Process

The 3D octet was then swollen in a 1:1 volume ratio of 2.5M copper (II) nitrate hemipentahydrate solution and 2.5M nickel nitrate hexahydrate solution for 2 hours, at 50° C. The structure then turned blue-green/turquoise, as shown in FIGS. 72A-72B.

4) Calcination of Copper-Nickel Containing 3D Structure

The copper-nickel containing 3D structure was then calcined in flowing air, at a high throughput pressure of 20 Torr. In brief, the sample was placed on an alumina boat inside a quartz tube, and then evacuated with a vacuum until a pressure of 2 Torr was reached. Air was then allowed to flow in, with the vacuum running, until a steady pressure of 20 Torr was reached. The sample was then heated at a rate of 1° C./min until 700° C., followed by hold at 700° C. for 180 minutes, before cooling at a rate of 2° C./min to room temperature. The calcined structures are seen in FIGS. 73A-73B. The turquoise structure turned black, which is indicative of its conversion to an oxide.

5) Reduction of Metal Oxide Structures

The metal oxide structure was then reduced in forming gas (95% $N_2$, 5% $H_2$) at high temperatures. The structure was placed on an alumina boat, inside a quartz tube, and then evacuated using a vacuum. When the pressure inside the tube was approximately 2 Torr, forming gas was slowly introduced into the tube until the tube was at atmospheric pressure. The sample was then heated using the following temperature profile: 3° C./min to 900° C., hold at 900° C. for 6 hours, followed by cooling at 3° C./min to room temperature. Forming gas was flowing through the tube at all times. The black metal oxide structure turned into a shiny silver color, which is indicative of its conversion to metal. This can be seen in FIGS. 74A-74B.

Figure 76:
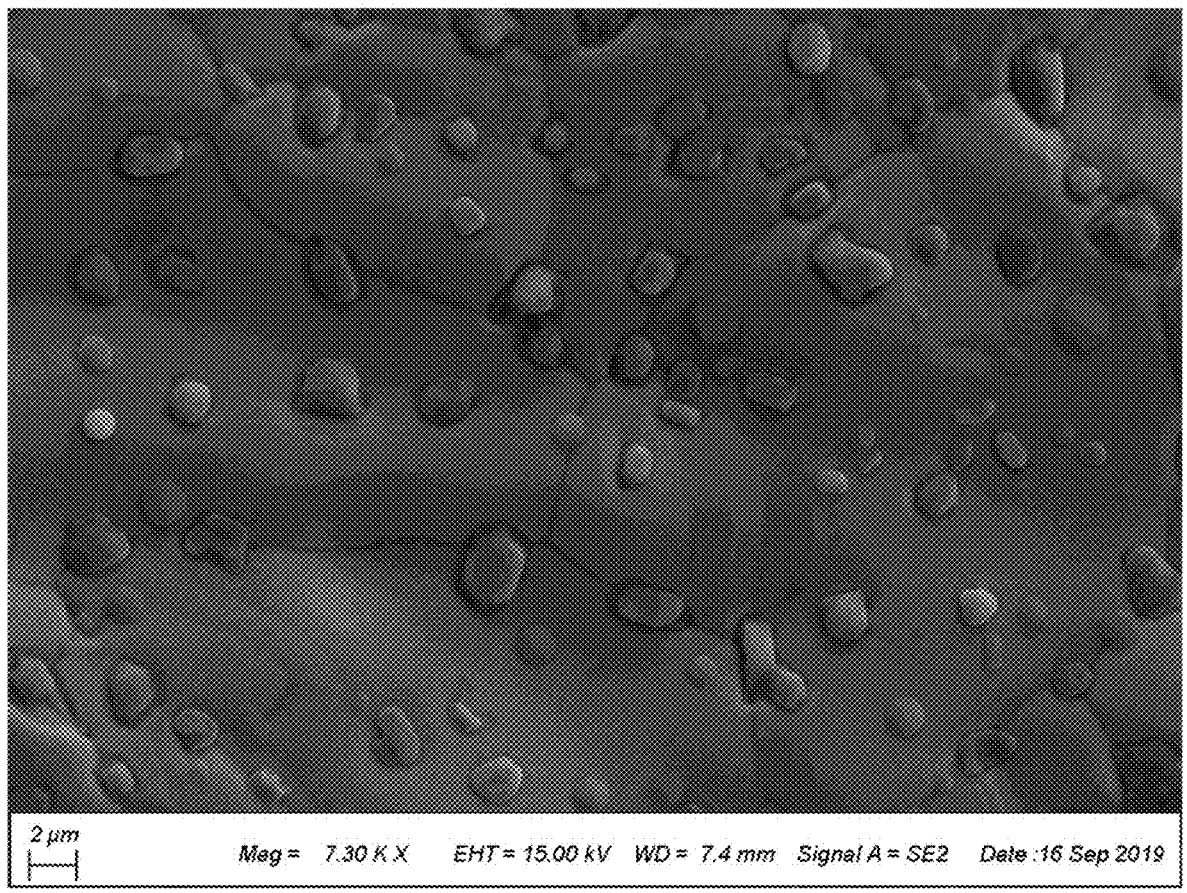
FIG. 76. SEM image of the microstructure of the metal lattice made as described in Example 17.

FIGS. 75 and 76 show scanning electron microscope (SEM) images of the metal lattice described in FIGS. 74A-74B, with increasing magnification.

Figure 77:
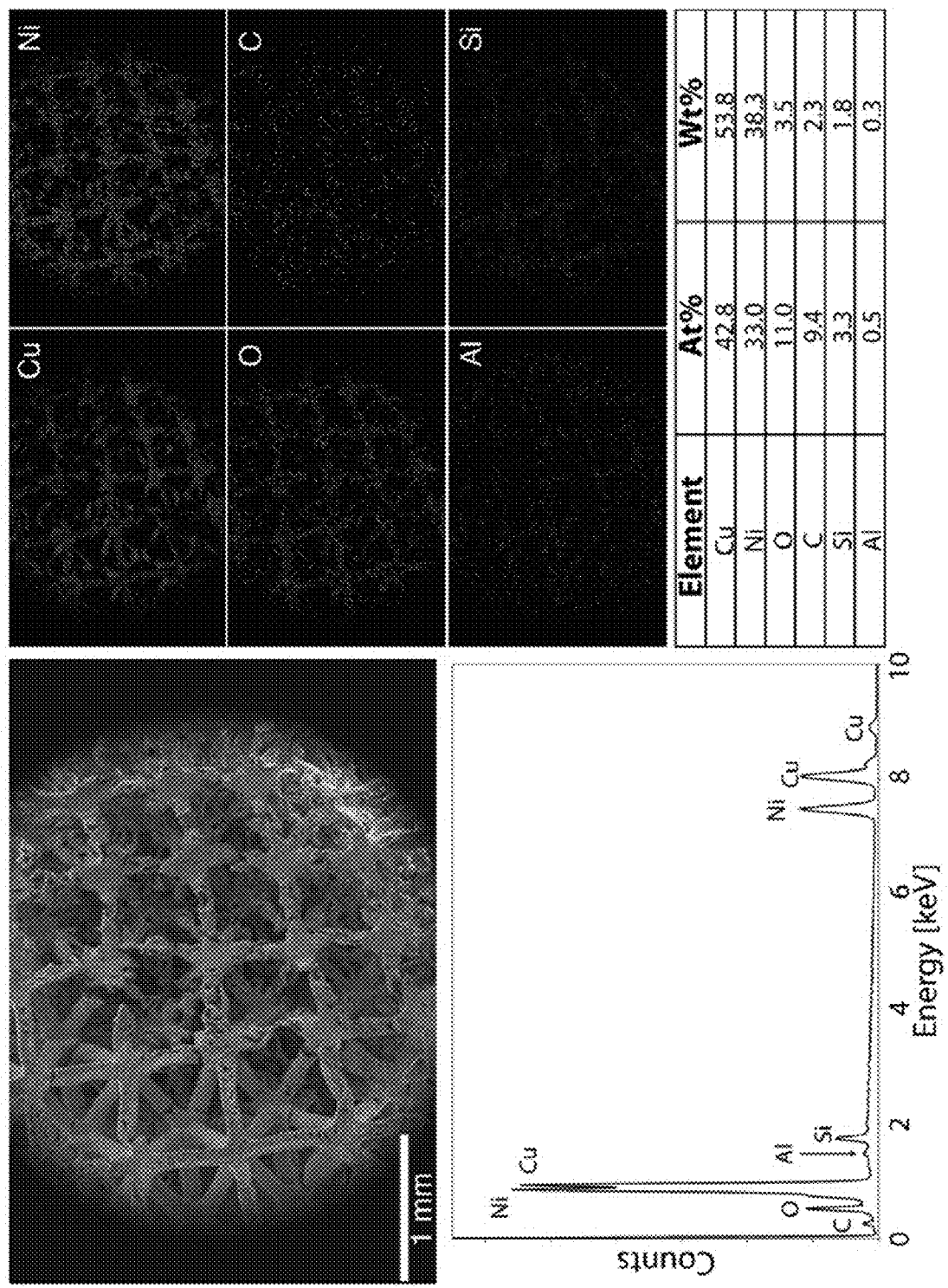
FIG. 77. Clockwise from top left—SEM image of the area being probed with EDS. Corresponding elemental maps, copper, nickel, oxygen, carbon, aluminum, and silicon were detected. Table of elements in both atomic and weight percentages. The EDS spectrum, with peaks indexed to the appropriate element.

To confirm the composition of the material, energy dispersive X-ray spectroscopy (EDS) was used to obtain elemental maps of the material, as shown in FIG. 77.

Figure 78:
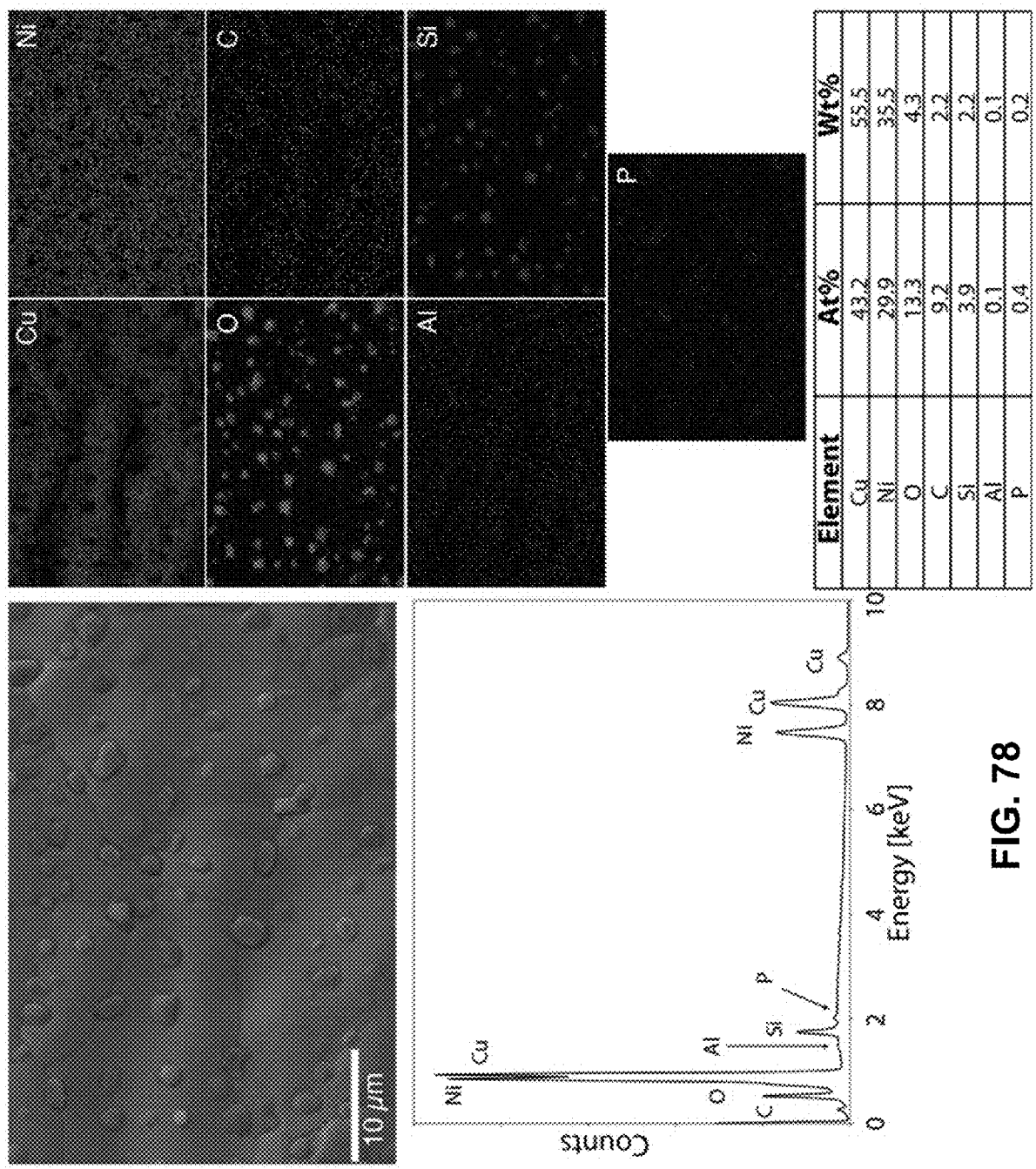
FIG. 78. Clockwise from top left—SEM image of the area being probed with EDS. Corresponding elemental maps, copper, nickel, oxygen, carbon, aluminum, phosphorous, and silicon were detected. Table of elements in both atomic and weight percentages. The EDS spectrum, with peaks indexed to the appropriate element.
Figure 79:
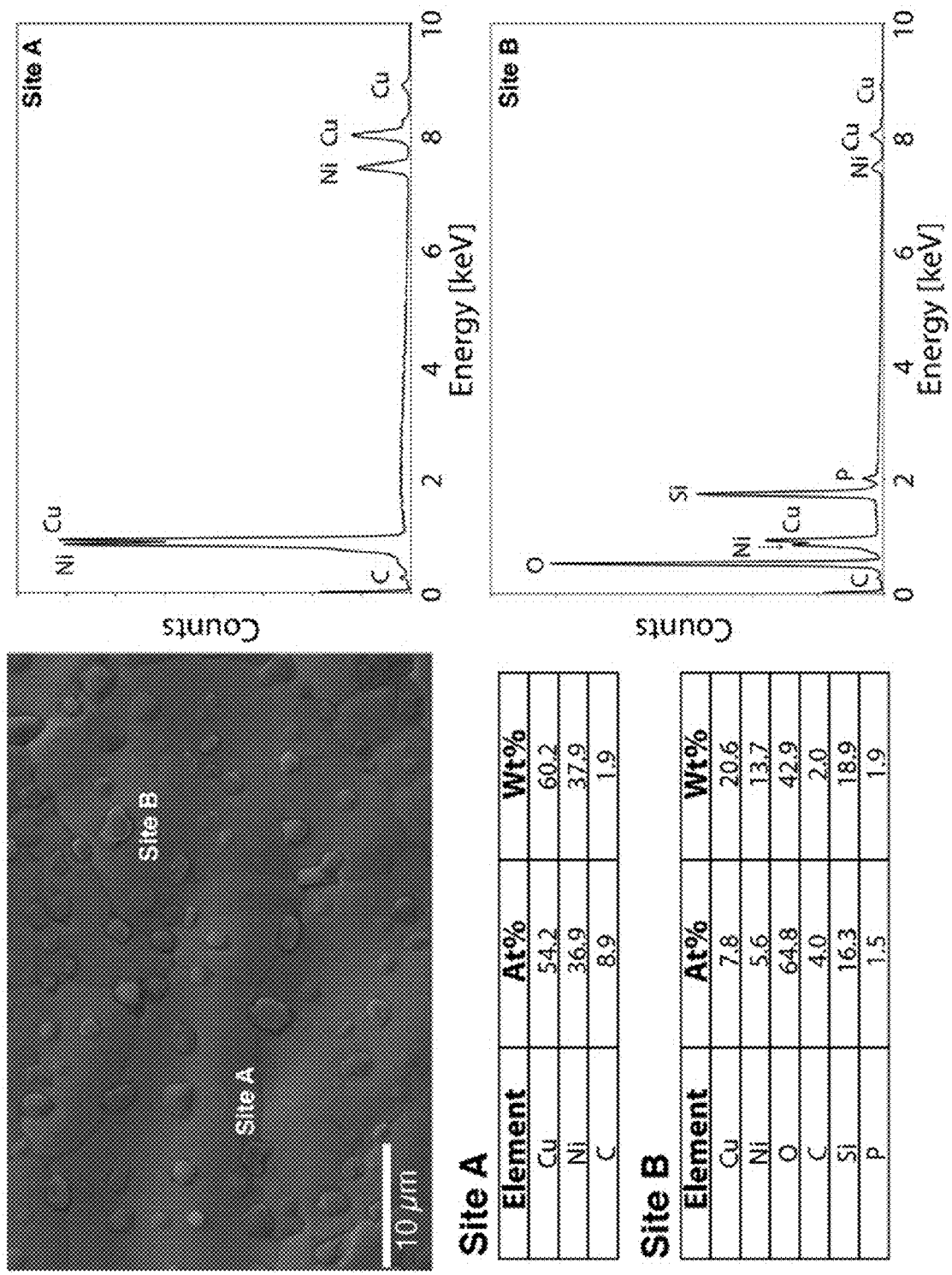
FIG. 79. Clockwise from top left—SEM image of the area being probed with EDS. EDS spectra of the metal-rich region, labeled as Site A. EDS spectra of the oxygen-rich region, labeled as Site B. Table of elements in both atomic and weight percentages of the elements detected in Site A and Site B.

As seen, the majority element detected with copper and nickel, followed by oxygen. Closer inspection of the microstructure revealed that the oxygen was phase segregated from the other elements, as shown in FIG. 78 below. Furthermore, the grains had a homogenous distribution of copper and nickel, implying a single phase—and thus an alloy. Spot analysis of the metal-rich and oxygen-rich regions are shown in FIG. 79.

Example 18: The (Materials) Science of Additive Manufacturing: Chemically-Derived, Fatigueless Ceramics Additive manufacturing (AM), or three-dimensional (3D) printing, represents a set of processes that enable layer-by-layer fabrication of complex 3D structures using a wide range of materials that include ceramics, polymers, and metals. AM has allowed exploiting novel material properties, especially those that arise at the nano-scale, that do not occur in conventional materials. The development of small-scale AM has revolutionized the production of complex parts for aerospace, military, automotive and medical applications, and is enabling major innovations in these areas. Shapes as complex as fractal trusses and as simple as cubes, with vastly multi-scale dimensions, from nanometers for nanophotonics to millimeters for sensors to centimeters for space-relevant technologies been demonstrated. The genesis of materials that are created through virtually every AM method is that they are derived from a photoinitiation-based chemical reaction, with post-processing that requires resist development and (often) heat treatment.

One key distinction of materials science from other disciplines, like physics and chemistry, is its focus on studying material microstructure as its central thread. "Microstructure" generally describes the characteristic features of a material, typically above the atomic scale and often below the continuum scale; and plays a central and critical role in defining and governing material properties through Structure-Processing-Properties triangle of Materials Science. Fully laying out the range of unique microstructures attainable through chemically-derived materials represents a key glaring unknown that is being ubiquitously neglected in virtually all AM processes. The chemical nature of AM'd materials provides a pathway to explore and to eventually engineer unexpected, far-from-equilibrium and convention, microstructures that can drive emergent, unique properties. The overarching goal of this proposal is to develop additive manufacturing syntheses of complex, multi-component and multi-material ceramics (metal oxides, carbides, etc.) that are derived from metal salt-based aqueous photoresins, analyze their microstructure to establish attainable property space, and utilize this knowledge to create fatigueless ceramics with versatile geometries, and when necessary, sub-micron resolution with a vision of developing fatigueless 3D-printed structures.

Additive manufacturing (AM) is of interest where a relatively small number of complex parts is required. In a truly multi-scale enterprise, 3D-printing has been utilized to create a broad range of shapes at different length scales: from nanometers (photonics) to microns (phononics) to millemeters (sensors), etc. Multifunctional metal oxides represent an important class of materials because they exhibit unique properties such as piezoelectricity[1] superconductivity[2] and semiconductivity,[3] rendering them useful in virtually every type of micro/nanosystem device technology. Additive manufacturing (AM) has recently emerged as a frontrunner for the fabrication of three-dimensional metal oxide structures with various geometries. A wide variety of AM techniques currently exist to 3D print metal oxides:[4-6] from laser-based processes like selective laser sintering[7,8], selective laser melting,[9-11] and photolithography,[21-14] to ink-based ones such as fused deposition modeling,[15,16] and inkjet printing.[17,18] These and most other additively manufactured materials are currently being understood in the framework of "enlightened empiricism" at best, i.e. multiple 3D printing processes exist: from 3D printers to two-photon and (micro) stereolithography but the microstructure, chemical composition, and properties of such-produced materials are being cursorily described at best. Nearly each AM technique relies on light to sculpt the prescribed 3D shapes via a photoinitiation reaction, which implies that the material is formed through chemical routes. This is diametrically opposite to the conventional processing of materials via "processes-of-record," as it serves to establish a pathway to create entirely new classes of materials with unique and far-from-equilibrium microstructures and properties. One key aspect of 3D printing processes that gets ubiquitously overlooked is that the chemical synthesis that is used to create the precursor-to-printing resin and the post-processing steps that often involve exposure to focused laser light, development using chemicals, post-development heat treatment, etc. may lead to an altered, far-from-conventional and far-from-equilibrium, microstructure.

Another example of enlightened empiricism is our understanding of fatigue, the most ubiquitous form of fracture, especially in structural materials, that accounts for more than 80% of all in service failures in structural components.[19] Structural integrity criteria depending upon arbitrary and simplistic assumptions[20, etc], and despite numerous investigations over a half a century, only phenomenological and an incomplete mechanistic models have been established, which cause typical fatigue design approaches to be deterministic and uselessly repetitive.[19] A particularly glaring lack of information exists for AM-produced complex geometries under non-trivial loading scenarios.[21,22]

Contemplated here are ranges of possible, often transient attainable microstructures of small-scale, chemically-derived, additively manufactured ceramics with a vision of enabling fatigue-resistant properties. Developing a fundamental scientific understanding of the link between material microstructure generated through chemical synthesis and measurable material properties, i.e. fatigue is critical. Contemplated here are properties, composition, and microstructure of additively manufactured (i.e. 3D printed) ceramics, fatigueless structures, and non-equilibrium, chemically-derived material microstructures Creating materials with multiple functionalities using a minimal number of processing steps represents one of key challenges in our society. Technological demands of $21^{st}$ century require realizing additive manufacturing (AM) at multiple length scales and in three dimensions (3D). The emergence of a new field of three-dimensional (3D) nano- and micro-architected structural "meta-materials" serves as a testament to the unique properties and combinations of de-coupled properties that demand the development of additive manufacturing capabilities to be utilized in society. One common aspect of AM-produced materials is that they are created through chemical synthesis that often involves multiple organic constituents, liquid-state reactions, (laser or UV) light-matter interactions, post-processing, and heat treatment. This chemically-derived nature of AM materials may lead to significantly different solid microstructures, which gives rise to substantially different material properties, defect populations, and susceptibility to failure, especially under fatigue loading. A particularly conspicuous example of this is AM of metals whose strength deteriorates at a dangerously high rate even with modest reductions in size[23], such a drastic reduction in strength inevitably leads to premature failure. The multi-scale nature and sophistication of these materials renders progress in this field to be possible only through massive inter-disciplinary advances in materials science, chemistry, materials processing, optics, mechanics, applied physics, and broad-range computations. Of particular importance is the need to recognize the significant deviations in the (commonly overlooked) attainable microstructures of additively manufactured materials from those of the same materials that are conventionally produced; the importance of developing a deep understanding of the parameter space of chemically-produced materials cannot be overestimated. Beyond the fundamental theme of this proposal, our vision is to utilize the obtained knowledge to eventually create ceramics with 3D geometries and microstructures that are particularly resilient against fatigue. Fatigue is currently the most ubiquitous mode of fracture, responsible for more than 80% of all in service failures in structural components, with available design approaches being empirical, deterministic and practically useless, especially at small scales.

The overarching goal of this proposal is to develop a chemical synthesis route for additive manufacturing of multi-material, multi-component metal oxide-based ceramics, to fully layout their microstructural parameter space as a function of chemically-derived variables, and to realize their potential in creating fatigueless ceramic components. Solving this grand challenge of additively manufacturing fatigueless ceramics through microstructural control of chemically-derived materials will open pathways to enable breakthrough advances in almost every branch of manufacturing and technology.

Technical ceramics are one of the most important classes of materials being used in the world today. These engineered ceramics exhibit unique mechanical, electrical, thermal and even biochemical properties,[24-27] and have found application in virtually every scientific and engineering field. Two key challenges that plague 3D-printed ceramics, especially at small scales, is their shaping and susceptibility to defects because they are brittle and fracture easily at reduced dimensions. Manufacturing processes that are suitable for metals and polymers, such as casting or machining cannot be applied to ceramics due to their high melting points and lack of deformability[28]. Alternative processes like pressing, molding and casting developed specifically for ceramics have severe limitations in terms of accessible geometries, dimensions, and quality because they rely on excessive materials, binders, ceramic precursors and multiple sacrificial steps[29].

Contemplated herein are additive manufacturing syntheses of complex, multi-component and multi-material metal oxides (ceramics) that are derived from metal salt-based aqueous photoresins, analyze their microstructure to establish attainable property space, and utilize this knowledge to create fatigue-less ceramics with versatile geometries and sub-micron resolution. To our knowledge, aqueous metal-salt based resins have not been synthesized or reported for additive manufacturing before.

2.1 Synthesis and 3D Printing of Metal Salt-Containing Aqueous Photoresins

To fabricate arbitrarily shaped 3D metal oxide microstructures, a process that combines the advantages of existing approaches: (1) the simplicity and versatility of slurry methods and (2) high resolution of organic-inorganic photoresists, has to be developed.

Figures 80A, 80B, 80C:
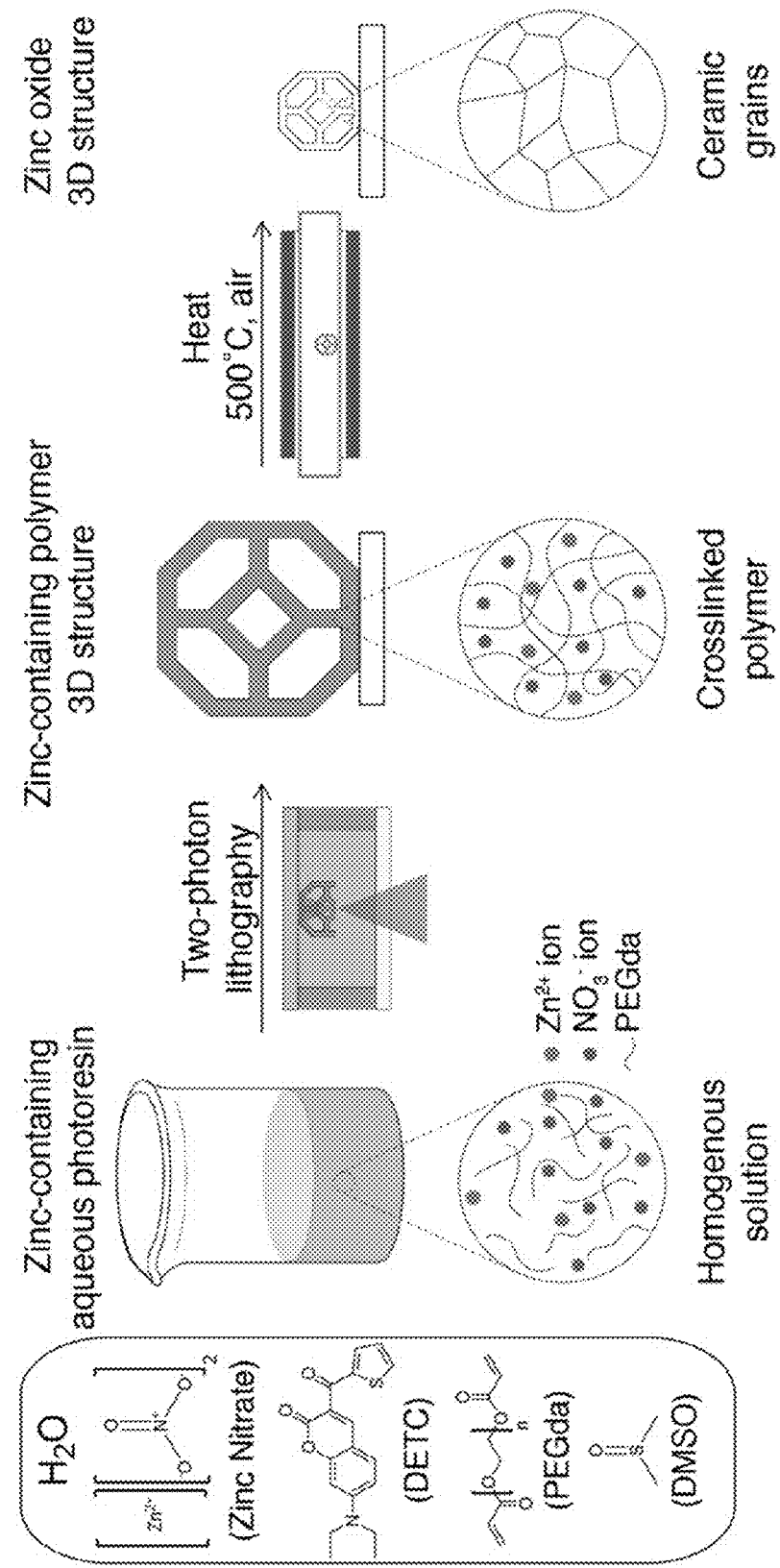
FIGS. 80A-80C. Synthesis route for additive manufacturing of metal oxides. A $Zn^{2+}$ containing aqueous photoresin is prepared by mixing zinc nitrate, water, PEGda, DETC, and DMSO (FIG. 80A). Two-photon lithography is used to 3D print the photoresin (FIG. 80B) followed by calcination at 500° C. to produce a ZnO replica with isotropic linear shrinkage (FIG. 80C)
Figure 81A:
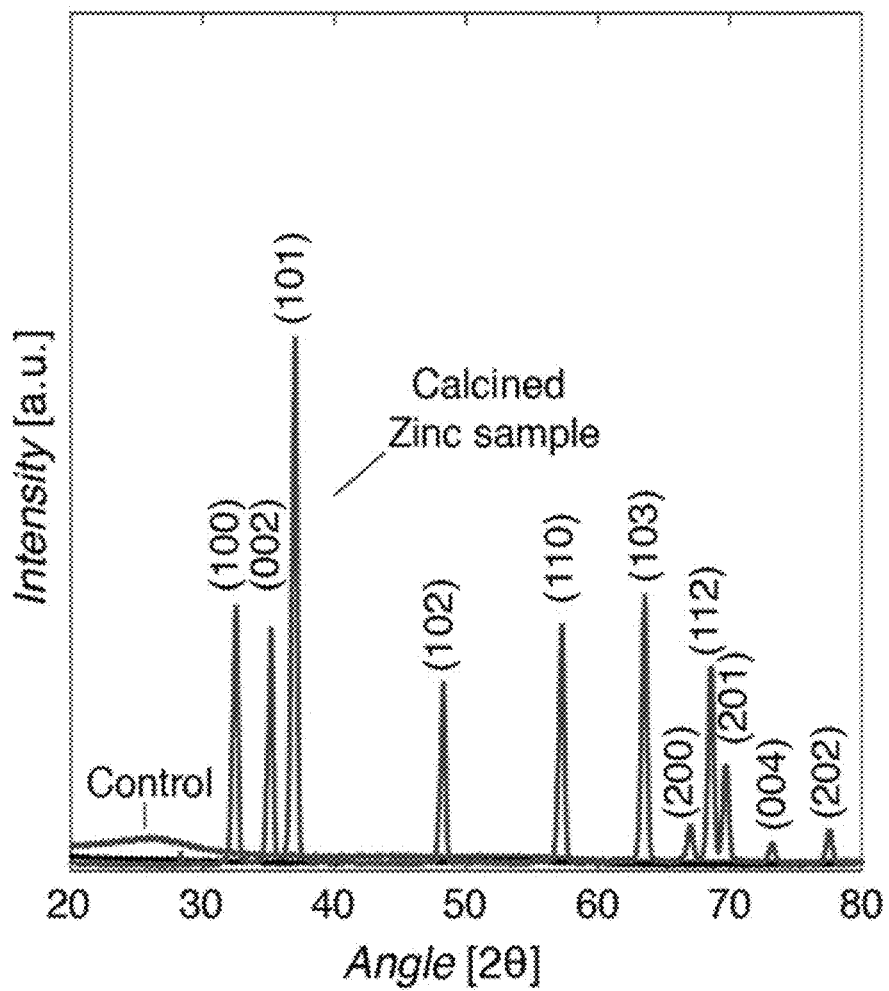
Figure 81B:
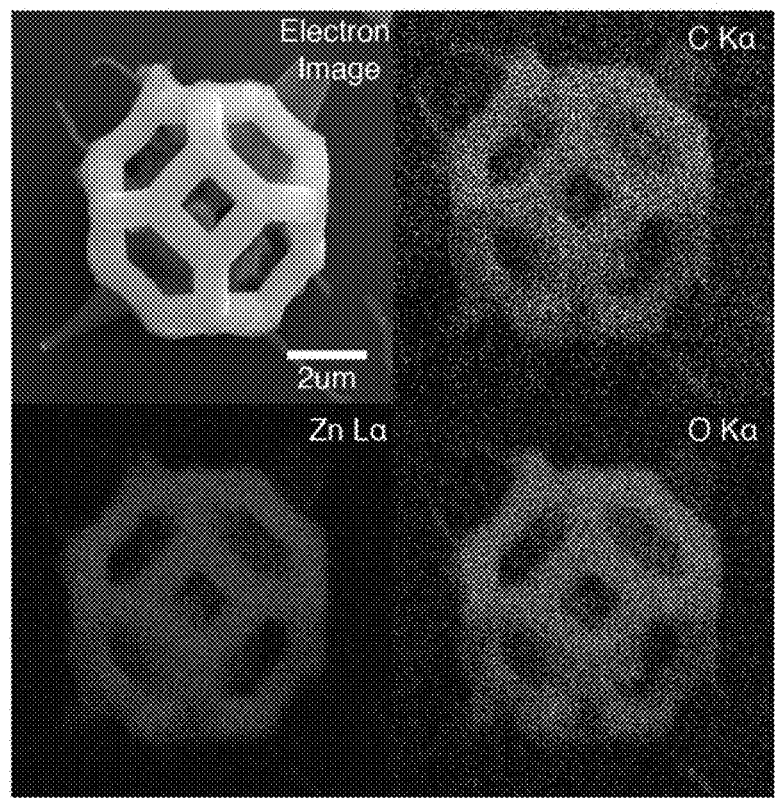
Figure 81C:
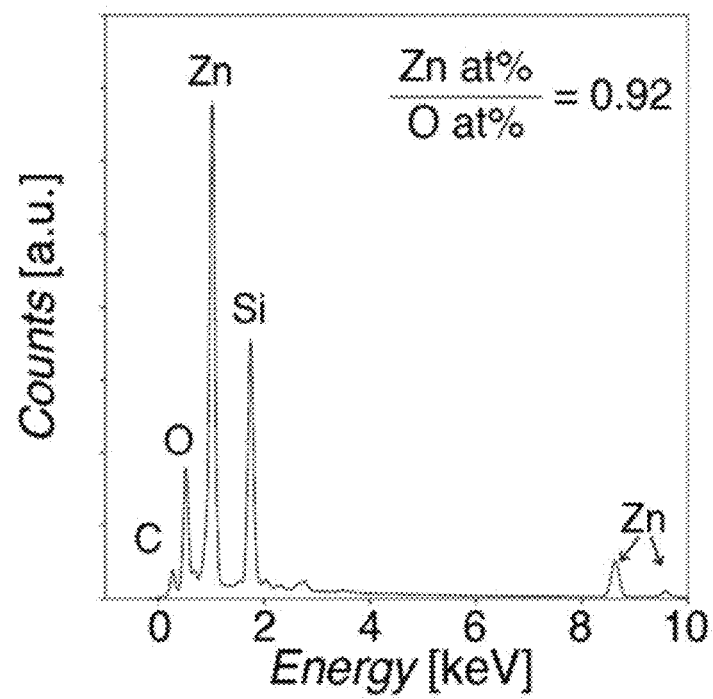

Disclosed herein are simple, inexpensive methods to fabricate 3D printed metal oxide ceramics via a facile, aqueous-resin chemical synthesis process where a preceramic hydrogel part is first 3D printed via photolithography from an aqueous photoresin and then pyrolized[30]. In this process, the aqueous photoresin is a homogeneous solution of dissolved metal salts, water and water-soluble binders, photoinitiators and UV blockers. The novelty of this process is that any water-soluble metal salt can be used, which opens a pathway to produce a wide variety of 3D-shaped ceramics. These aqueous resins are homogenous and non-viscous, which renders them particularly amenable to processing. FIG. 80 demonstrates the basic proposed approach for fabricating 3D printed metal oxides via a three-step process of synthesis, sculpting, and pyrolysis, as well as our preliminary results on synthesizing ZnO and analyzing its microstructure[30].

3.2 Multi-Component, Multi-Material AM Via "Leach and Swell-In" Method (Specific Aim 2)

In the "leach and swell-in" method, a metal-salt containing hydrogel part is first printed via photolithography from a metal-salt containing aqueous photoresin. Site-specific regions of the hydrogel are then immersed in water to leach out the metal salt to form a "semi-blank" hydrogel template, which is then immersed into a salt solution to swell it with the new salt. The swollen hydrogel is proposed synthesis and AM approach to create multi-material shapes by selectively leaching and swelling the designed regions.[31]

The disclosed methods lend themselves to multiple additive manufacturing approaches and to a broad range of ceramics and metals. Multiple reagents can be used to prepare the metal-salt-containing photoresins. Examples include any water-soluble metal salts, i.e. metal nitrates and hydrates, metal acetates and their hydrates; water-soluble photosensitive binders, i.e. poly(ethylene glycol) macromolecules with acrylate functional groups; water-soluble photoinitiators, i.e. ethyl(2,4,6-trimethylbenzoyl)-phenylphosphinate; and water-soluble UV blockers, i.e. disodium 4,4'-bis(2-sulfostyryl)biphenyl. Any photolithography technique can be used to 3D print, including two-photon lithography, stereolithography (SL), micro-SL and projection micro-SL. Pyrolysis process is critical to fabrication process: oxidizing atmosphere will facilitate the formation of metal oxides; inert atmosphere will create metal carbides, and reducing atmosphere will enable pure metal parts.

These methods can make a multitude of multi-component, multi-material ceramics, with a wide range of fully characterized microstructures, that can elicit fatigueless materials that can be used in applications that cannot be addressed with conventional material systems.

REFERENCES CORRESPONDING TO EXAMPLE 18

[1] C. Bowen, H. Kim, P. Weaver, S. Dunn, Energy Environ. Sci. 2014, 7, 25.
[2] R. J. Cava, J. Am. Ceram. Soc. 2000, 83, 5.
[3] T. Zhai, X. Fang, M. Liao, X. Xu, H. Zeng, B. Yoshio, D. Goldberg,
[4] X. Zhou, C. j. Liu, Adv. Funct. Mater. 2017, 27, 1701134.
[5] J. C. Ruiz-Morales, A. TarancoÅLn, J. Canales-VaÅLzquez, J. MeÅLndez-Ramon, L. HernaÅLndez-Afonso, P. Acosta-Mora, J. M. Rueda, R. FernaÅLndez-GonzaÅLlez, Energy Environ. Sci. 2017, 10, 846.
[6] I. Cooperstein, E. Sachyani-Keneth, E. Shukren-Farrell, T. Rosental, X. Wang, A. Kamyshny, S. Magdassi, Adv. Mater. Interfaces 2018, 5, 1800996.
[7] P. Bertrand, F. Bayle, C. Combe, P. Goeuriot, I. Smurov, Appl. Surf. Sci. 2007, 254, 989.
[8] H. Exner, M. Horn, A. Streek, F. Ullmann, L. Hartwig, P. Regenfuss, R. Ebert, Virtual Phys. Prototyping 2008, 3, 3.
[9] J. Wilkes, Y.-C. Hagedorn, W. Meiners, K. Wissenbach, Rapid Prototyping J. 2013, 19, 51.
[10] H. Yves-Christian, W. Jan, M. Wilhelm, W. Konrad, P. Reinhart, Phys. Procedia 2010, 5, 587.
[11] H. Pan, N. Misra, S. H. Ko, C. P. Grigoropoulos, N. Miller, E. E. Haller, O. Dubon, Appl. Phys. A 2009, 94, 111
[12] H. Wu, W. Liu, R. He, Z. Wu, Q. Jiang, X. Song, Y. Chen, L. Cheng, S. Wu, Ceram. Int. 2017, 43, 968.
[13] M. Schwentenwein, J. Homa, Int. J. Appl. Ceram. Technol. 2015, 12, 1.
[14] G. Mitteramskogler, R. Gmeiner, R. Felzmann, S. Gruber, C. Hofstetter, J. Stampfl, J. Ebert, W. Wachter, J. Laubersheimer, Addit. Manuf. 2014, 1-4, 110.
[15] A. Salea, R. Prathumwan, J. Junpha, K. Subannajui, J. Mater. Chem. C 2017, 5, 4614.
[16] J. Zhang, S. Zhao, M. Zhu, Y. Zhu, Y. Zhang, Z. Liu, C. Zhang, J. Mater. Chem. B 2014, 2, 7583.
[17] J. Wang, L. L. Shaw, J. Am. Ceram. Soc. 2006, 89, 3285.
[18] E. Saleh, P. Woolliams, B. Clarke, A. Gregory, S. Greedy, C. Smartt, R. Wildman, I. Ashcroft, R. Hague, P. Dickens, C. Tuck, Addit. Manuf. 2017, 13, 143.
[19] Z. S. Hosseini, M. Dadfarnia, B. P. Somerday, P. Sofronis, R. O. Ritchie, J. Mech. Phys. Solids 2018, 121 341.
[20] P. C. Paris, M. P. Gomez, W. E. Anderson, Trend Eng. 1961, 13, 9.
[21] A. Fatemi, N. Shamsaei, Int. J. Fatigue, 2011, 33, 948.
[22] F. Berto, A. Campagnolo, P. Lazzarin, Fatigue Fract. Engng. Mater. Struct. 2015, 38, 503.
[23] A. Vyatskikh, S. Delalande, A. Kudo, X. Zhang, and J. R. Greer "Additive Manufacturing of 3D Nano-Architected Metals" Nature Comms 9, 593 (2018)
[24] Somiya, S., Advanced technical ceramics. 2012: Elsevier.
[25] Basu, B. and K. Balani, Advanced structural ceramics. 2011: John Wiley & Sons.

[26] Kokubo, T., Bioceramics and their clinical applications. 2008: Elsevier.
[27] Richerson, D. W., Modern ceramic engineering: properties, processing, and use in design. 2005: CRC press.
[28] Rahaman, M. N., Ceramic processing and sintering. 2003: CRC press.
[29] Bauer, W., H.-J. Ritzhaupt-Kleissl, and J. Hausselt, Slip casting of ceramic microcomponents. Microsystem technologies, 1998. 4(3): p. 125-127.
[30] Yee, D., Lifson, M., Greer, J. R. "Additive Manufacturing of 3D Architected Multifunctional Metal Oxides" Advanced Materials doi.org/10.1002/adma.201901345 (2019).

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Certain molecules disclosed herein may contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this invention for a given application. In specific applications, the selection of a given anion or cation for preparation of a salt may result in increased or decreased solubility of that salt.

Every material, lattice, device, system, formulation, combination of components, or method described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for making a metal-containing material, the method comprising steps of:
   forming a blank hydrogel from an aqueous blank mixture using a photopolymerization or forming a blank organogel from a nonaqueous blank mixture using a photopolymerization;
   wherein the aqueous blank mixture comprises water and one or more aqueous photosensitive binders;
   wherein the nonaqueous blank mixture comprises a water-miscible non-water solvent;
   swelling the blank hydrogel or the blank organogel using an aqueous metal salt mixture to form a metal-containing hydrogel;
      wherein the aqueous metal salt mixture comprises water and one or more aqueous metal salts; and
   thermally treating the metal-containing hydrogel to form the metal-containing material.

2. The method of claim 1, wherein the step of swelling is repeated a plurality of times, each repetition of the swelling comprises using the aqueous metal salt mixture having the one or more metal salts or using a different aqueous metal salt mixture having a different one or more metal salts.

3. The method of claim 1, wherein the metal-containing hydrogel is exposed to a thermal-treatment atmosphere during the thermally treating step; and wherein a composition of the metal-containing material is at least partially determined by a composition of the thermal-treatment atmosphere.

4. The method of claim 3, wherein: (i) the thermal-treatment atmosphere is a reducing atmosphere and at least a portion of the metal-containing structure is a metal or metal alloy due to chemical interaction of the metal-containing hydrogel with the thermal-treatment atmosphere; (ii) the thermal-treatment atmosphere is an oxidizing atmosphere and at least a portion of the metal-containing material is a metal oxide ceramic due to chemical interaction of the metal-containing hydrogel with the thermal-treatment atmosphere; or (iii) the thermal-treatment atmosphere is an inert atmosphere and at least a portion of the metal-containing material is a metal carbide due to the thermal-treatment atmosphere being an inert atmosphere.

5. The method claim 1, wherein the step of thermally treating comprises a first thermally treating step and a second thermally treating step, wherein:
   the first thermally treating step comprises using a first thermal-treatment atmosphere;
   the second thermally treating step comprises using a second thermal-treatment atmosphere; and
   a composition of the first thermal-treatment atmosphere is different from a composition of the second thermal-treatment atmosphere.

6. The method of claim 5, wherein the first thermally treating step comprises thermally treating the metal-containing hydrogel to form an intermediate metal-containing material; wherein the second thermally treating step comprises thermally treating the intermediate metal-containing material to form the metal-containing material; wherein the first thermal-treatment atmosphere comprises an oxidizing atmosphere and a composition of the intermediate metal-containing material comprises a metal oxide; and wherein the second thermal-treatment atmosphere comprises a reducing atmosphere and a composition of the metal-containing material comprises a metal or metal alloy.

7. The method of claim 1, wherein the aqueous metal salt mixture does not comprise metal-containing particles.

8. The method of claim 1, wherein the aqueous metal salt mixture comprises at least two different aqueous metal salts, each characterized by different metal ions.

9. The method of claim 1, wherein the metal-containing material has a composition comprising at least two metal ions.

10. The method of claim 1, wherein the metal-containing material has a composition characterized as a ternary or higher order material.

11. The method of claim 1, wherein the metal-containing material is a metal or metal alloy, a ceramic, or a carbide material.

12. The method of claim 1, wherein the metal-containing material has structure characterized as a lattice.

13. The method of claim 1, wherein the step of forming the hydrogel comprises patterning or printing the hydrogel.

14. The method of claim 3, wherein the step of forming comprises an additive manufacturing process.

15. The method of claim 1, further comprising using the metal-containing material in an electrode, as a biological scaffold, in a mechanical damping device, in a heat exchanger, as a catalyst, as a solid electrolyte, as a superconductor, as a thermal insulator, as an electrical insulator, as dielectrics, as a sensors, or any combination of these.

16. The method of claim 1, wherein the step of thermally treating comprises pyrolyzing, calcining, sintering, high temperature annealing, or a combination of these.

17. The method of claim 1, wherein the metal-containing hydrogel has structure characterized as architected, having a three-dimensional geometry, and macroscopically monolithic.

18. The method of claim 1, wherein the nonaqueous blank mixture comprises a water-miscible non-water solvent and one or more photosensitive binders.

19. The method of claim 1, wherein the blank hydrogel or the blank organogel comprises less than or equal to 0.6 wt. % of metal and metal-containing chemical species.

20. A method for making a metal-containing material, the method comprising steps of:

swelling a blank hydrogel or a blank organogel with a first aqueous metal salt mixture to form a first metal-containing hydrogel;
  wherein the first aqueous metal salt mixture comprises water and one or more first aqueous metal salts;
  wherein the one or more first aqueous metal salts comprise one or more first metal ions;
  wherein the first metal-containing hydrogel has a first portion and a second portion; wherein the first metal-containing hydrogel comprises the one or more first metal ions both in the first portion and in the second portion;
wherein the method further comprises:
leaching at least a fraction of the one or more first metal ions from the second portion thereby forming a secondary portion of the first metal-containing hydrogel;
  wherein the secondary portion has a lower concentration of the one or more first metal ions than the first portion of the first metal-containing hydrogel;
swelling at least the secondary portion of the first metal-containing hydrogel using a second aqueous metal salt mixture to form a second metal-containing hydrogel;
  wherein the second aqueous metal salt mixture comprises water and one or more second aqueous metal salts;
  wherein the one or more second metal salts comprise one or more second metal ions; and
  wherein the second metal-containing hydrogel has a spatially-varying composition comprising the first portion with the one or more first metal ions and the secondary portion with the one or more second metal ions; and
thermally treating the second metal-containing hydrogel to form the metal-containing material.

21. The method of claim 20, wherein the metal-containing material has a spatially-varying composition comprising a primary composition having the one or more first metal ions and a secondary composition having the one or more second metal ions; and wherein the metal-containing material has a primary portion having the primary composition and a secondary portion having the secondary composition.

22. The method of claim 20, wherein a concentration of the one or more first metal ions in the secondary portion of the second metal-containing hydrogel is less than or equal to 10% of a concentration of the one or more first metal ions in the primary portion of the second metal-containing hydrogel.

23. The method of claim 20, wherein the second metal-containing hydrogel is exposed to a thermal-treatment atmosphere during the step of thermally treating; and wherein a composition of the metal-containing material is at least partially determined by a composition of the thermal-treatment atmosphere.

24. The method of claim 20, wherein the first aqueous metal salt mixture and the second aqueous metal salt mixture do not comprise metal-containing particles.

25. The method of claim 20, wherein the first aqueous metal salt mixture comprises at least two different aqueous metal salts, each characterized by different metal ions.

26. The method of claim 20, wherein the one or more second metal ions are different from the one or more first metal ions.

27. The method of claim 20, comprising (i) a step of forming the blank hydrogel from an aqueous blank mixture using a photopolymerization, or (ii) comprising a step of forming the blank organogel from a nonaqueous blank mixture using a photopolymerization;
  wherein the aqueous blank mixture comprises water and one or more aqueous photosensitive binders; and
  wherein the nonaqueous blank mixture comprises a water-miscible non-water solvent and one or more photosensitive binders.

28. The method of claim 27, wherein the aqueous blank mixture or the nonaqueous blank mixture, respectively, further comprises one or more photoinitiators, one or more UV-blockers, or any combination of these.

29. The method of claim 27, wherein the aqueous blank mixture or the nonaqueous blank mixture, respectively, further comprises one or more aqueous water-soluble binders.

30. The method of claim 20, wherein the blank hydrogel or the blank organogel comprises less than or equal to 0.6 wt. % of metal and metal-containing chemical species.

* * * * *

UNITED STATES PATENT AND TRADEMARK OFFICE
CERTIFICATE OF CORRECTION

PATENT NO. : 11,318,435 B2
APPLICATION NO. : 16/577253
DATED : May 3, 2022
INVENTOR(S) : Yee et al.

Page 1 of 1

It is certified that error appears in the above-identified patent and that said Letters Patent is hereby corrected as shown below:

In the Claims

Claim 14 Column 78, Line 45, replace "claim 3" with --claim 1--.

Signed and Sealed this
Twenty-seventh Day of September, 2022

Katherine Kelly Vidal
*Director of the United States Patent and Trademark Office*